United States Patent [19]

Saitoh et al.

[11] Patent Number: 4,720,443

[45] Date of Patent: Jan. 19, 1988

[54] MEMBER HAVING LIGHT RECEIVING LAYER WITH NONPARALLEL INTERFACES

[75] Inventors: Keishi Saitoh, Ibaraki; Masahiro Kanai, Tokyo; Tetsuo Sueda, Chofu; Teruo Misumi, Kawasaki; Yoshio Tsuezuki, Toride; Kyosuke Ogawa, Tokyo, all of Japan

[73] Assignee: Canon Kabushiki Kaisha, Tokyo, Japan

[21] Appl. No.: 717,821

[22] Filed: Mar. 29, 1985

[30] Foreign Application Priority Data

| Apr. 5, 1984 | [JP] | Japan | 59-68725 |
| Apr. 13, 1984 | [JP] | Japan | 59-75386 |
| Apr. 13, 1984 | [JP] | Japan | 59-75387 |
| Apr. 16, 1984 | [JP] | Japan | 59-76818 |
| Apr. 18, 1984 | [JP] | Japan | 59-77284 |
| Apr. 18, 1984 | [JP] | Japan | 59-78081 |
| Apr. 19, 1984 | [JP] | Japan | 59-79007 |
| Apr. 20, 1984 | [JP] | Japan | 59-79894 |
| Apr. 23, 1984 | [JP] | Japan | 59-81488 |
| Oct. 16, 1984 | [JP] | Japan | 59-215175 |
| Oct. 17, 1984 | [JP] | Japan | 59-216353 |
| Oct. 18, 1984 | [JP] | Japan | 59-217262 |
| Oct. 19, 1984 | [JP] | Japan | 59-218526 |
| Oct. 20, 1984 | [JP] | Japan | 59-219389 |
| Oct. 22, 1984 | [JP] | Japan | 59-220376 |

[51] Int. Cl.$^4$ ............................................. G03G 5/085
[52] U.S. Cl. ..................................... 430/57; 430/65; 430/84; 430/127
[58] Field of Search .................. 430/56, 57, 58, 65, 430/69, 84, 127

[56] References Cited

U.S. PATENT DOCUMENTS

| 4,359,514 | 11/1982 | Shimizu et al. | 430/65 |
| 4,492,745 | 1/1985 | Mimura et al. | 430/67 |
| 4,514,483 | 4/1985 | Matsuura et al. | 430/84 |
| 4,592,981 | 6/1986 | Saitoh et al. | 430/69 |
| 4,592,983 | 6/1986 | Saitoh et al. | 430/69 |
| 4,595,644 | 6/1986 | Saitoh et al. | 430/69 |
| 4,600,671 | 7/1986 | Saitoh et al. | 430/69 |

FOREIGN PATENT DOCUMENTS

| 2733187 | 1/1978 | Fed. Rep. of Germany | 430/65 |
| 56-150754 | 11/1981 | Japan | 430/65 |
| 60031144 | 2/1985 | Japan | 430/69 |

*Primary Examiner*—John L. Goodrow
*Attorney, Agent, or Firm*—Fitzpatrick, Cella, Harper & Scinto

[57] ABSTRACT

A light-receiving member comprises a substrate for light-receiving member and a light-receiving layer of a multi-layer structure having a first layer comprising an amorphous material containing silicon atoms and germanium atoms, a second layer comprising an amorphous material containing silicon atoms and exhibiting a photoconductivity, and a surface layer comprising an amorphous material containing silicon atoms and carbon atoms provided on the substrate successively from the substrate side, said light-receiving layer having at least one pair of nonparallel interfaces within a short range and said nonparallel interfaces being arranged in a large number in at least one direction within the plane perpendicular to the layer thickness direction.

73 Claims, 80 Drawing Figures

(A)

(B)

(C)

(A)

(B)

(C)

MEMBER HAVING LIGHT RECEIVING LAYER WITH NONPARALLEL INTERFACES

CROSS-REFERENCE TO RELATED APPLICATIONS

This application contains subject matter related to commonly assigned, copending application Ser. Nos. 697,141; 699,868; 705,516; 709,888; 720,011; 740,901; 786,970; 725,751; 726,768; 719,980; 739,867; 740,714; 741,300; 753,048; 752,920 and 753,011.

BACKGROUND OF THE INVENTION

1. Field of the invention

This invention relates to a light receiving member having sensitivity to electromagnetic waves such as light [herein used in a broad sense, including ultraviolet rays, visible light, infrared rays, X-rays and gamma-rays]. More particularly, it pertains to a light receiving member suitable for using a coherent light such as laser beam.

2. Description of the prior art

As the method for recording a digital image information as an image, there have been well known the methods in which an electrostatic latent image is formed by scanning optically a light receiving member with a laser beam modulated corresponding to a digital image information, then said latent image is developed, followed by processing such as transfer or fixing, if desired, to record an image. Among them, in the image forming method employing electrophotography, image recording has been generally practiced with the use of a small size and inexpensive He-Ne laser or a semiconductor laser (generally having an emitted wavelength of 650–820 nm).

In particular, as the light receiving member for electrophotography which is suitable when using a semiconductor laser, an amorphous material containing silicon atoms (hereinafter written briefly as "A-Si") as disclosed in Japanese Laid-open patent application Nos. 86341/1979 and 83746/1981 is attracting attention for its high Vickers hardness and non-polluting properties in social aspect in addition to the advantage of being by far superior in matching in its photosensitive region as compared with other kinds of light receiving members.

However, when the photosensitive layer is made of a single A-Si layer, for ensuring dark resistance of $10^{12}$ ohm.cm or higher required for electrophotography while maintaining high photosensitivity, it is necessary to incorporate structurally hydrogen atoms or halogen atoms or boron atoms in addition thereto in controlled form within specific ranges of amounts. Accordingly, control of layer formation is required to be performed severely, whereby tolerance in designing of a light receiving member is considerably limited.

As attempts to enlarge this tolerance in designing, namely to enable effective utilization of its high photosensitivity in spite of somewhat lower dark resistance, there have been proposed a light receiving layer with a multi-layer structure of two or more laminated layers with different conductivity characteristics with formation of a depletion layer within the light receiving layer, as disclosed in Japanese Laid-open patent application Nos. 121743/1979, 4053/1982 and 4172/1982, or a light receiving member with a multi-layer structure in which a barrier layer is provided between the substrate and the photosensitive layer and/or on the upper surface of the photosensitive layer, thereby enhancing apparent dark resistance of the light receiving layer as a whole, as disclosed in Japanese Laid-open patent application Nos. 52178/1982, 52179/1982, 52180/1982, 58159/1982, 58160/1982 and 58161/1982.

According to such proposals, A-Si type light receiving members have been greatly advanced in tolerance in designing of commercialization thereof or easiness in management of its production and productivity, and the speed of development toward commercialization is now further accelerated.

When carrying out laser recording by use of such a light receiving member having a light receiving layer of a multi-layer structure, due to irregularity in thickness of respective layers, and also because of the laser beam which is an coherent monochromatic light, it is possible that the respective reflected lights reflected from the free surface on the laser irradiation side of the light receiving layer and the layer interface between the respective layers constituting the light receiving layer and between the substrate and the light receiving layer (hereinafter "interface" is used to mean comprehensively both the free surface and the layer interface) may undergo interference.

Such an interference phenomenon results in the so-called interference fringe pattern in the visible image formed and causes a poor image. In particular, in the case of forming a medium tone image with high gradation, bad appearance of the image will become marked.

Moreover, as the wavelength region of the semiconductor laser beam is shifted toward longer wavelength, absorption of said laser beam in the photosensitive layer becomes reduced, whereby the above interference phenomenon becomes more marked.

This point is explained by referring to the drawings.

FIG. 1 shows a light $I_0$ entering a certain layer constituting the light receiving layer of a light receiving member, a reflected light $R_1$ from the upper interface 102 and a reflected light $R_2$ reflected from the lower interface 101.

Now, the average layer thickness of the layer is defined as d, its refractive index as n and the wavelength of the light as $\lambda$, and when the layer thickness of a certain layer is ununiform gently with a layer thickness difference of $\lambda/2n$ or more, changes in absorbed light quantity and transmitted light quantity occur depending on to which condition of $2nd = m\lambda$ (m is an integer, reflected lights are strengthened with each other) and $2nd = (m+\frac{1}{2})\lambda$ (m is an integer, reflected lights are weakened with each other) the reflected lights $R_1$ and $R_2$ conform.

In the light receiving member of a multi-layer structure, the interference effect as shown in FIG. 1 occurs at each layer, and there ensues a synergistic deleterious influence through respective interferences as shown in FIG. 2. For this reason, the interference fringe corresponding to said interference fringe pattern appears on the visible image transferred and fixed on the transfer member to cause bad images.

As the method for cancelling such an inconvenience, it has been proposed to subject the surface of the substrate to diamond cutting to provide unevenness of $\pm 500$ Å $-\pm 10000$ Å, thereby forming a light scattering surface (as disclosed in Japanese Laid-open patent application No. 162975/1983); to provide a light absorbing layer by subjecting the aluminum substrate surface to black Alumite treatment or dispersing carbon, color pigment or dye in a resin (as disclosed in Japanese Laid-open patent application No. 165845/1982); and to provide a light scattering reflection preventive layer on the substrate surface by subjecting the aluminum substrate surface to satin-like Alumite treatment or by providing a sandy fine unevenness by sand blast (as disclosed in Japanese Laid-open patent application No. 16554/1982).

However, according to these methods of the prior art, the interference fringe pattern appearing on the image could not completely be cancelled.

For example, because only a large number of unevenness with specific sized are formed on the substrate surface according to the first method, although prevention of appearance of interference fringe through light scattering is indeed effected, regular reflection light component yet exists. Therefore, in addition to remaining of the interference fringe by said regular reflection light, enlargement of irradiated spot occurs due to the light scattering effect on the surface of the substrate to be a cause for substantial lowering of resolution.

As for the second method, such a black Alumite treatment is not sufficient for complete absorption, but reflected light from the substrate surface remains. Also, there are involved various inconveniences. For example, in providing a resin layer containing a color pigment dispersed therein, a phenomenon of degassing from the resin layer occurs during formation of the A-Si photosensitive layer to markedly lower the layer quality of the photosensitive layer formed, and the resin layer suffers from a damage by the plasma during formation of A-Si photosensitive layer to be deteriorated in its inherent absorbing function. Besides, worsening of the surface state deleteriously affects subsequent formation of the A-Si photosensitive layer.

In the case of the third method of irregularly roughening the substrate surface, as shown in FIG. 3, for example, the incident light $I_0$ is partly reflected from the surface of the light receiving layer 302 to become a reflected light $R_1$, with the remainder progressing internally through the light receiving layer 302 to become a transmitted light $I_1$. The transmitted light $I_1$ is partly scattered on the surface of the substrate 301 to become scattered lights $K_1, K_2, K_3 \ldots K_n$, with the remainder being regularly reflected to become a reflected light $R_2$, a part of which goes outside as an emitted light $R_3$. Thus, since the reflected light $R_1$ and the emitted light $R_3$ which is an interferable component remain, it is not yet possible to extinguish the interference fringe pattern.

On the other hand, if diffusibility of the surface of the substrate 301 is increased in order to prevent multiple reflections within the light receiving layer 302 through prevention of interference, light will be diffused within the light receiving layer 302 to cause halation, whereby resolution is disadvantageously lowered.

Particularly, in a light receiving member of a multi-layer structure, as shown in FIG. 4, even if the surface of the substrate 401 may be irregularly roughened, the reflected light $R_2$ from the first layer 402, the reflected light $R_1$ from the second layer 403 and the regularly reflected light $R_3$ from the surface of the substrate 401 are interfered with each other to form an interference fringe pattern depending on the respective layer thicknesses of the light receiving member. Accordingly, in a light receiving member of a multi-layer structure, it was impossible to completely prevent appearance of interference fringes by irregularly roughening the surface of the substrate 401.

In the case of irregularly roughening the substrate surface according to the method such as sand blasting, etc., the roughness will vary so much from lot to lot, and there is also nonuniformity in roughness even in the same lot, and therefore production control could be done with inconvenience. In addition, relatively large projections with random distributions are frequently formed, hence causing local breakdown of the light receiving layer during charging treatment.

On the other hand, in the case of simply roughening the surface of the substrate 501 regularly, as shown in FIG. 5, since the light-receiving layer 502 is deposited along the uneven shape of the surface of the substrate 501, the slanted plane of the unevenness of the substrate 501 becomes parallel to the slanted plane of the unevenness of the light receiving layer 502.

Accordingly, for the incident light on that portion, $2nd_1 = m\lambda$ or $2nd_1 = (m+\frac{1}{2})\lambda$ holds, to make it a light portion or a dark portion. Also, in the light receiving layer as a whole, since there is nonuniformity in which the maximum difference among the layer thicknesses $d_1$, $d_2$, $d_3$ and $d_4$ of the light receiving layer is $\lambda/2n$ or more, there appears a light and dark fringe pattern.

Thus, it is impossible to completely extinguish the interference fringe pattern by only roughening regularly the surface of the substrate 501.

Also, in the case of depositing a light receiving layer of a multi-layer structure on the substrate, the surface of which is regularly roughened, in addition to the interference between the regularly reflected light from the substrate surface and the reflected light from the light receiving layer surface as explained for light receiving member of a single layer structure in FIG. 3, interferences by the reflected lights from the interfaces between the respective layers participate to make the extent of appearance of interference fringe pattern more complicated than in the case of the light receiving member of a single layer structure.

SUMMARY OF THE INVENTION

An object of the present invention is to provide a novel light-receiving member sensitive to light, which has cancelled the drawbacks as described above.

Another object of the present invention is to provide a light-receiving member which is suitable for image formation by use of a coherent monochromatic light and also easy in production management.

Still another object of the present invention is to provide a light-receiving member which can cancel the interference fringe pattern appearing during image formation and appearance of speckles on reversal developing at the same time and completely.

Still another object of the prevent invention is to provide a light-receiving member which is high in dielectric strength and photosensitivity and excellent in electrophotographic characteristics.

It is also another object of the present invention to provide a light-receiving member, which can provide an image of high quality which is high in density, clear in halftone and high in resolution and is suitable for electrophotography.

Still another object of the present invention is to provide a light-receiving member comprising a substrate for light-receiving member and a light-receiving layer of a multi-layer structure having a first layer comprising an amorphous material containing silicon atoms and germanium atoms, a second layer comprising an amorphous material containing silicon atoms and exhibiting photoconductivity and a surface layer comprising an amorphous material containing silicon atoms and carbon atoms provided on said substrate successively from the substrate side, said light-receiving layer having at least one pair of non-parallel interfaces within a short range and said non-parallel interfaces being arranged in a large number in at least one direction within the plane perpendicular to the layer thickness direction and an electrophotographic system by use of the light-receiving member.

Still another object of the present invention is to provide a light-receiving member comprising a substrate for light-receiving member and a light-receiving layer of a multi-layer structure having at least one photosensitive layer comprising an amorphous material containing silicon atoms and a surface layer comprising an amorphous material containing silicon atoms and carbon atoms provided on said substrate successively from the substrate side, said light-receiving layer having at least one pair of non-parallel interfaces within a short range and said non-parallel interfaces being arranged in a large number in at least one direction within the plane perpendicular to the layer thickness direction, and an electrophotographic system by use of the light-receiving member.

DESCRIPTION OF THE PREFERRED EMBODIMENTS

Referring now to the accompnaying drawings, the present invention is to be described in detail.

Figure 1:
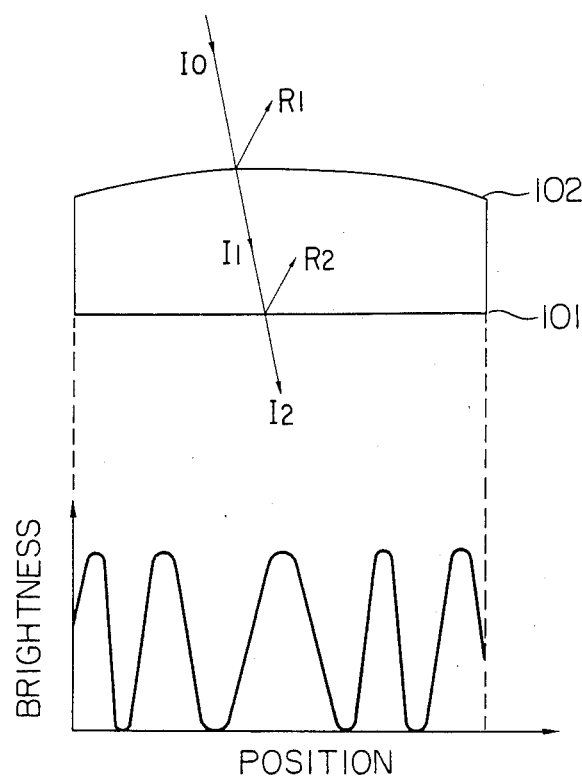
FIG. 1 is a schematic illustration of interference fringe in general.
Figure 2:
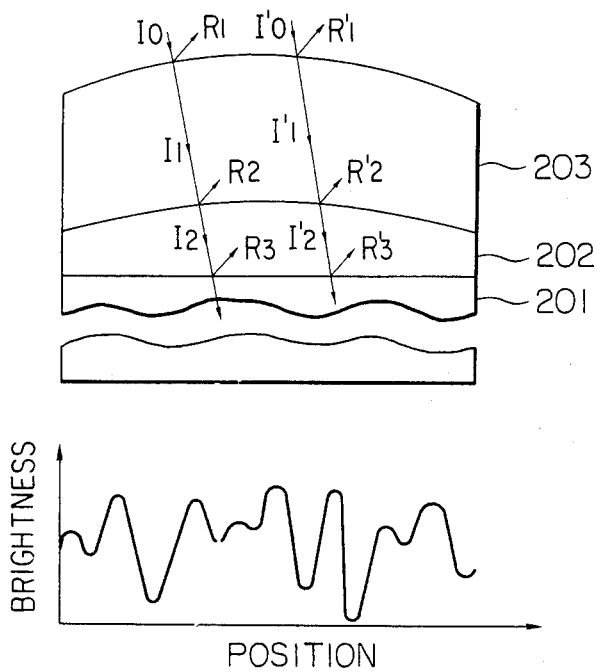
FIG. 2 is a schematic illustration of interference fringe in the case of a multi-layer light-receiving member.
Figure 3:
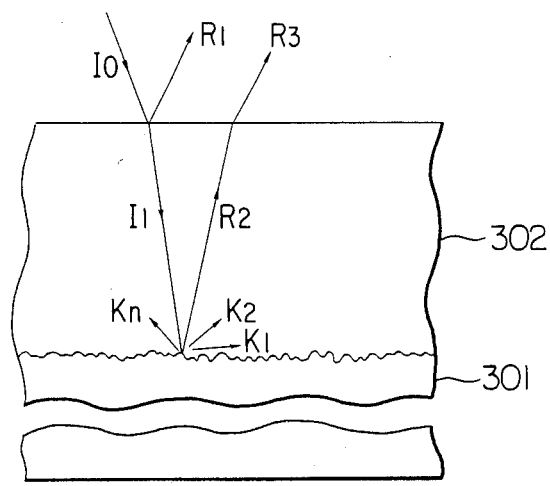
FIG. 3 is a schematic illustration of interference fringe by scattered light.
Figure 4:
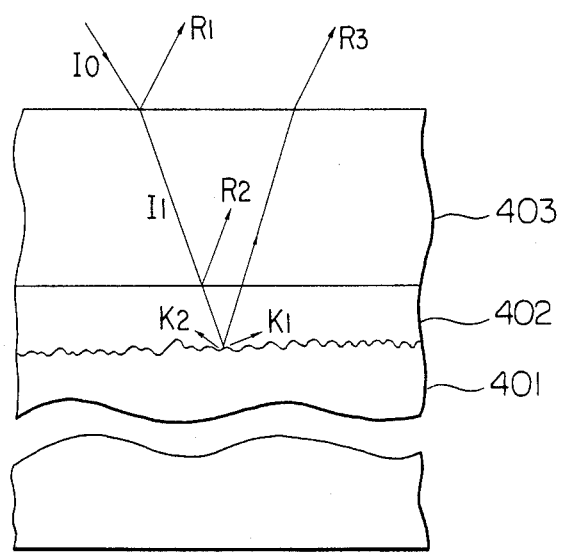
FIG. 4 is a schematic illustration of interference fringe by scattered light in the case of a multi-layer light-receiving member.
Figure 5:
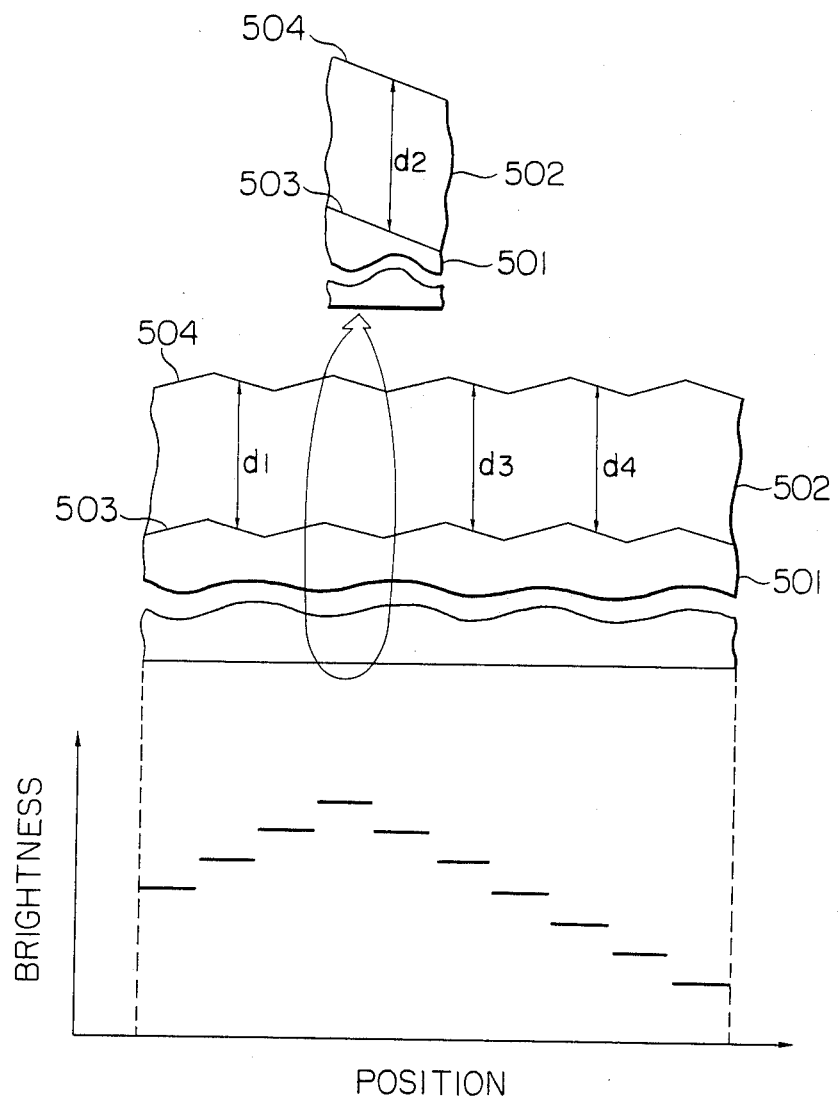
FIG. 5 is a schematic illustration of interference fringe in the case where the interfaces of respective layers of a light-receiving member are parallel to each other.
Figure 6:
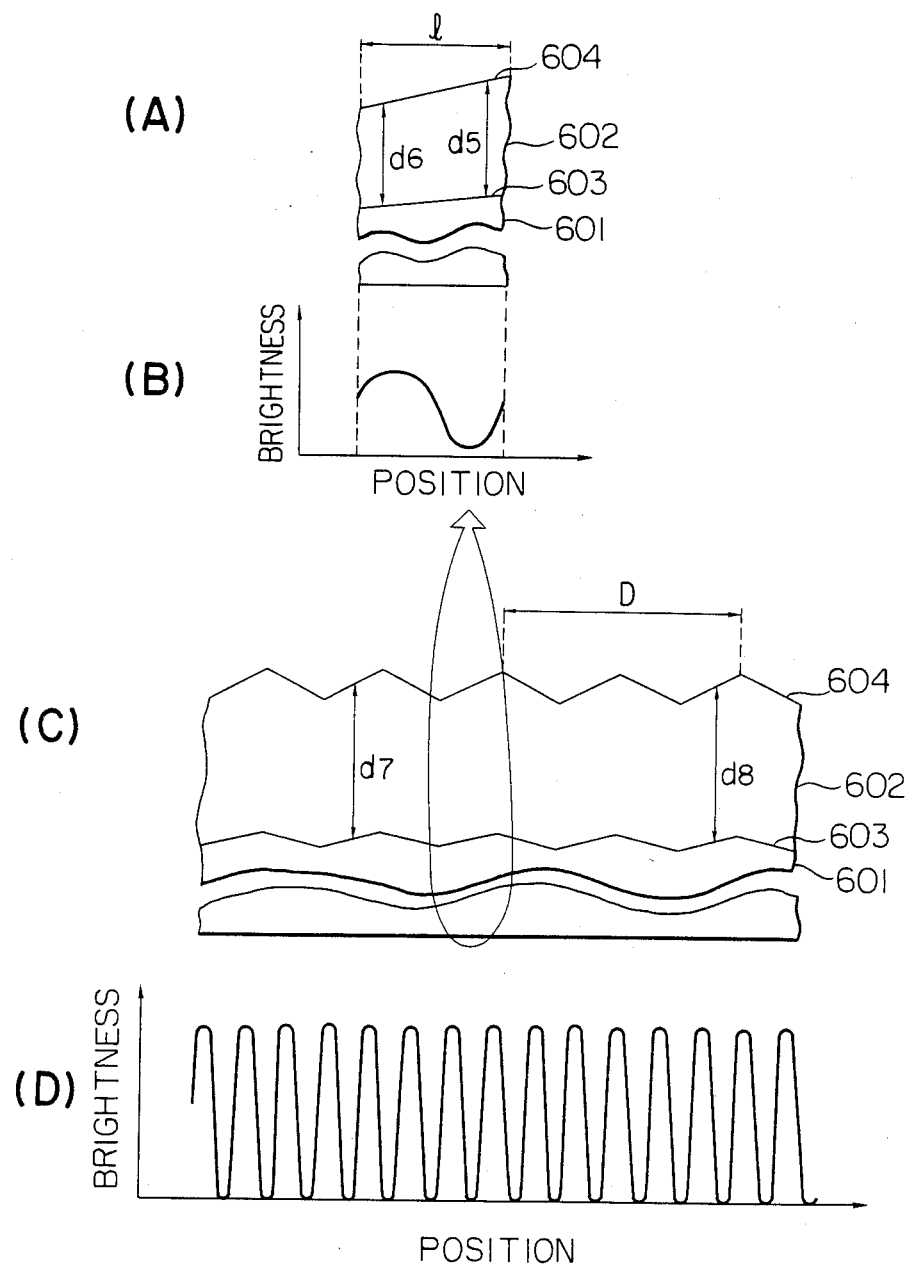
FIGS. 6 (A), (B), (C) and (D) are schematic illustrations of no appearance of interference fringe in the case of non-parallel interfaces between respective layers of a light-receiving member.

FIG. 6 is a schematic illustration for explanation of the basic principle of the present invention.

In the present invention, on a substrate (not shown) having a fine uneven shape smaller than the resolution required for the device, a light-receiving layer of a multi-layer constitution is provided along the uneven slanted plane, with the thickness of the second layer 602 being continuously changed from $d_5$ to $d_6$, as shown enlarged in a part of FIG. 6, and therefore the interface 603 and the interface 604 have respective gradients. Accordingly, the coherent light incident on this minute portion (short range region ) l [indicated schematically in FIG. 6 (C), and its enlarged view shown in FIG. 6 (A)] undergoes interference at said minute portion l to form a minute interference fringe pattern.

Figure 7:
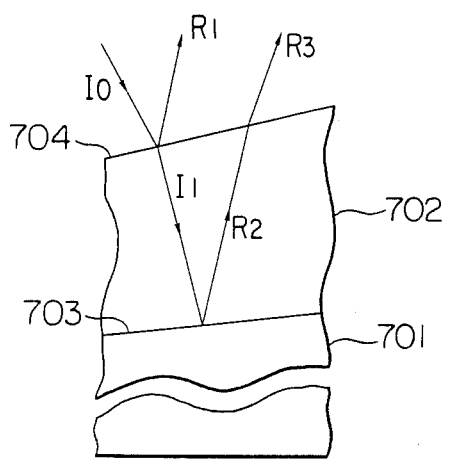
FIGS. 7 (A), (B) and (C) are schematic illustration of comparison of the reflected light intensity between the case of parallel interfaces and non-parallel interfaces between the respective layers of a light-receiving member.
Figure 7:
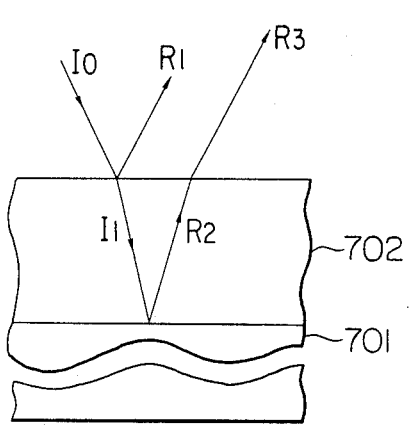
Figure 7:
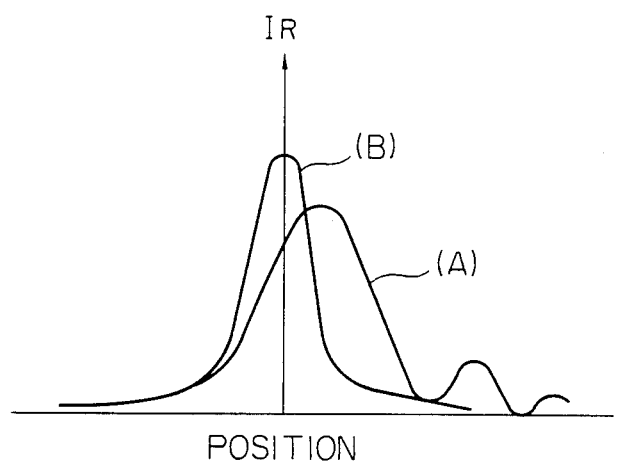
Figure 8:
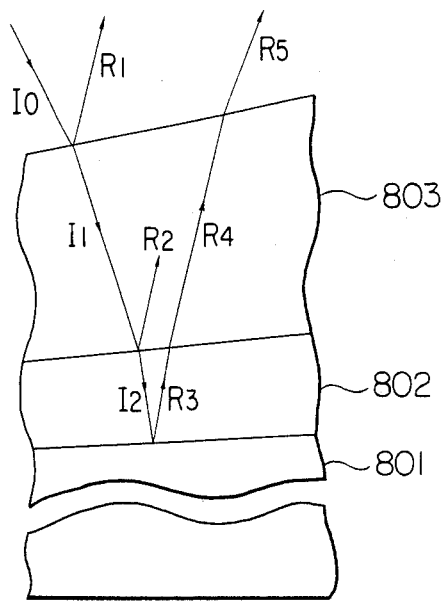
FIG. 8 is a schematic illustration of no appearance of interference fringe in the case of non-parallel interfaces between respective layers.

Also, as shown in FIG. 7, when the interface 703 between the first layer 701 and the second layer 702 and the free surface 704 are non-parallel to each other, the reflected light $R_1$ and the emitted lgiht $R_3$ are different in direction of progress from each other relative to the incident light $I_0$ as shown in FIG. 7 (A), and therefore the degree of interference will be reduced as compared with the case (FIG. 7 (B)) when the interfaces 703 and 704 are parallel to each other.

Accordingly, as shown in FIG. 7 (C), as compared with the case "(B)" where a pair of the interfaces are in parallel relation, the difference in lightness and darkness in the interference fringe pattern becomes negligibly small even if interfered, if any, in the non-parallel case "(A)".

The same is the case, as shown in FIG. 6, even when the layer thickness of the layer 602 may be macroscopically ununiform ($d_7 \neq d_8$), and therefore the incident light quantity becomes uniform all over the layer region (see FIG. 6 (D)).

To describe about the effect of the present invention when coherent light is transmitted from the irradiation side to the first layer in the case of a light-receiving layer of a multi-layer structure, reflected lights $R_1$, $R_2$, $R_3$, $R_4$ and $R_5$ exsit in connection with the incident light $I_0$. Accordingly, at the respective layers, the same phenomenon as described with reference to FIG. 7 occurs.

Therefore, when considered for the light-receiving layer as a whole, interference occurs as a synergetic effect of the respective layers and, according to the present invention, appearance of interference can further be prevented as the number of layers constituting the light-receiving layer is increased.

The interference fringe occurring within the minute portion cannot appear on the image, because the size of the minute portion is smaller than the spot size of the irradiated light, namely smaller than the resolution limit. Further, even if appeared on the image, there is no problem at all, since it is less than resolving ability of the eyes.

In the present invention, the slanted plane of unevenness should desirably be mirror finished in order to direct the reflected light assuredly in one direction.

The size l (one cycle of uneven shape) of the minute portion suitable for the present invention is $l \leq L$, wherein L is the spot size of the irradiation light.

Further, in order to accomplish more effectively the objects of the present invention, the layer thickness difference ($d_5 - d_6$) at the minute portion 1 should desirably be as follows:

$d_5 - d_6 \geq \lambda/2n$ (where $\lambda$ is the wavelength of the irradiation light and n is the refractive index of the second layer 602).

In the present invention, within the layer thickness of the minute portion 1 (hereinafter called as "minute column") in the light-receiving layer of a multi-layer structure, the layer thicknesses of the respective layers are controlled so that at least two interfaces between layers may be in non-parallel relationship, and, provided that this condition is satisfied, any other pair of two interfaces between layers may be in parallel relationship within said minute column.

However, it is desirable that the layers forming parallel interfaces should be formed to have uniform layer thicknesses so that the difference in layer thickness at any two positions may be not more than:

$\lambda/2n$ (n: refractive index of the layer).

For formation of the respective layers of the first layer and the second layer constituting the light-receiving layer, in order to accomplish more effectively and easily the objects of the present invention, the plasma chemical vapor deposition method (PCVD method), the optical CVD method and thermal CVD method can be employed, because the layer thickness can accurately be controlled on the optical level thereby.

The unevenness to be provided on the substrate surface can be formed by fixing a bite having a V-shaped cutting blade at a predetermined position on a cutting working machine such as milling machine, lathe, etc., and cut working accurately the substrate surface by, for example, moving regularly in a certain direction while rotating a cylindrical substrate according to a program previously designed as desired, thereby forming to a desired unevenness shape, pitch and depth. The reverse-V-shaped linear projection produced by the unevenness formed by such a cutting working has a spiral structure with the center axis of the cylindrical substrate as its center. The spiral structure of the reverse-V-shaped projection may be made into a mutiple spiral structure such as double or triple structure or a crossed spiral structure.

Alternatively, a straight line structure along the center axis may also be introduced in addition to the spiral structure.

Figure 9:
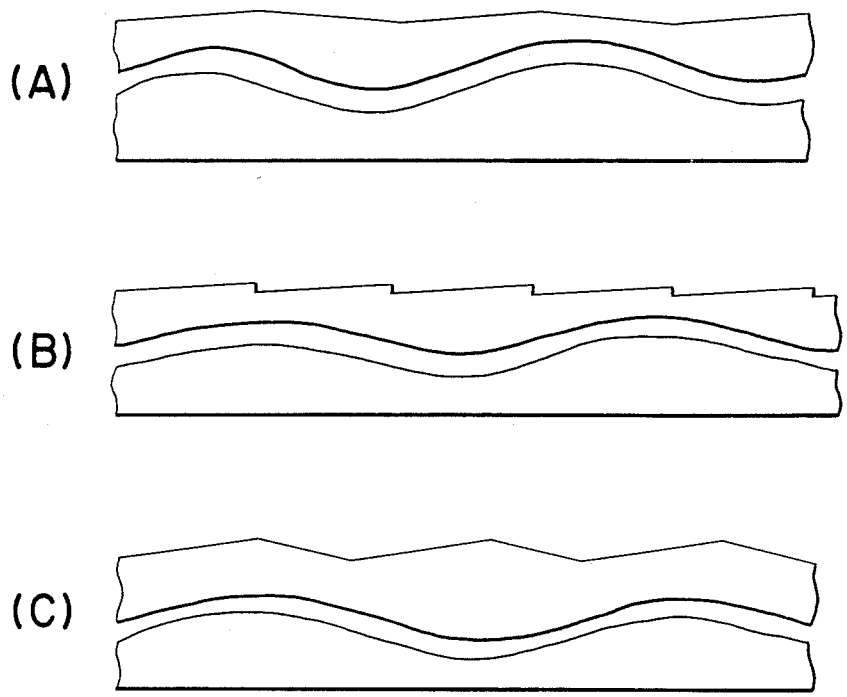
FIGS. 9 (A), (B) and (C) are schematic illustrations of the surface condition of typical substrates.

The shape of the longitudinal section of the protruded portion of the unevenness provided on the substrate surface is made reverse-V-shape in order to ensure managed ununiformization of layer thickness within minute columns of respective layers and good adhesion as well as desired electrical contact between the substrate and the layer provided directly on said substrate, and it should preferably be made as shown in FIG. 9 as isosceles triangle, a right triangle or a scalene triangle. Of these shapes, an isosceles triangle and a right triangle are preferred.

In the present invention, the respective dimensions of the unevenness provided on the substrate surface under managed condition are set so as to accomplish effectively the objects of the present invention in view of the following points.

More specifically, in the first place, the A-Si layer constituting the light receiving layer is sensitive to the structure of the surface on which the layer formation is effected, and the layer quality will be changed greatly depending on the surface condition.

Accordingly, it is desirable to set dimensions of the unevenness to be provided on the substrate surface so that lowering in layer quality of the A-Si layer may not be brought about.

Secondly, when there is extreme unevenness on the free surface of the light-receiving layer, cleaning cannot frequently be performed completely in cleaning step after image formation.

Further, in case of practicing blade cleaning, there is involved the problem that the blade will be damaged more earlier.

As the result of investigations of the problems is layer deposition as described above, problems in process of electrophotography and the conditions for prevention of interference fringe pattern, it has been found that the pitch at the recessed portion on the substrate surface should preferably be 500 $\mu$m to 0.3 $\mu$m, more preferably 200 $\mu$m to 1 $\mu$m, most preferably 50 $\mu$m to 5 $\mu$m.

It is also desirable that the maximum depth of the recessed portion should preferably be made 0.1 $\mu$m to 5 $\mu$m, more preferably 0.3 $\mu$m to 3 $\mu$m, most preferably 0.6 $\mu$m to 2 $\mu$m. When the pitch and the maximum depth of the recessed portions on the substrate surface are within the ranges as specified above, the gradient of the slanted plane at the recessed portion (or linear projection) may preferably be 1° to 20°, more preferably 3° to 15°, most preferably 4° to 10°.

On the other hand, the maximum of the difference in the layer thickness based on such an uniformness in layer thickness of the respective layers formed on such a substrate should preferably be made 0.1 $\mu$m to 2 $\mu$m within the same pitch, more preferably 0.1 $\mu$m to 1.5 $\mu$m, most preferably 0.2 $\mu$m to 1 $\mu$m.

Further, the light-receiving layer in the light-receiving member of the present invention has a multi-layer structure comprising a first layer constituted of an amorphous material containing silicon atoms and germanium atoms and a second layer constituted of an amorphous material containing silicon atoms and exhibiting photoconductivity provided on a substrate successively from the substrate side, and therefore can exhibit very excellent electrical, optical and photoconductive characteristics, dielectric strength as well as good use environmental characteristics.

In particular, when it is applied as a light-receiving member for electrophotography, there is no influence of residual potential on image formation at all, with its electrical properties being stable with high sensitivity and high SN ratio, also excellent in light fatigue resistance and repeated use characteristics, whereby it is possible to obtain repeatedly and stably images of high quality with high density, clear halftone and high resolution.

Further, the light-receiving member of the present invention is high in photosensitivity over the all visible light regions, particularly in photosensitivity to the light of longer wavelength region and is therefore excellent in matching to semiconductor laser and also rapid in light response.

Referring now the drawings, the light-receiving member of the present invention is to be described in detail.

Figure 10:
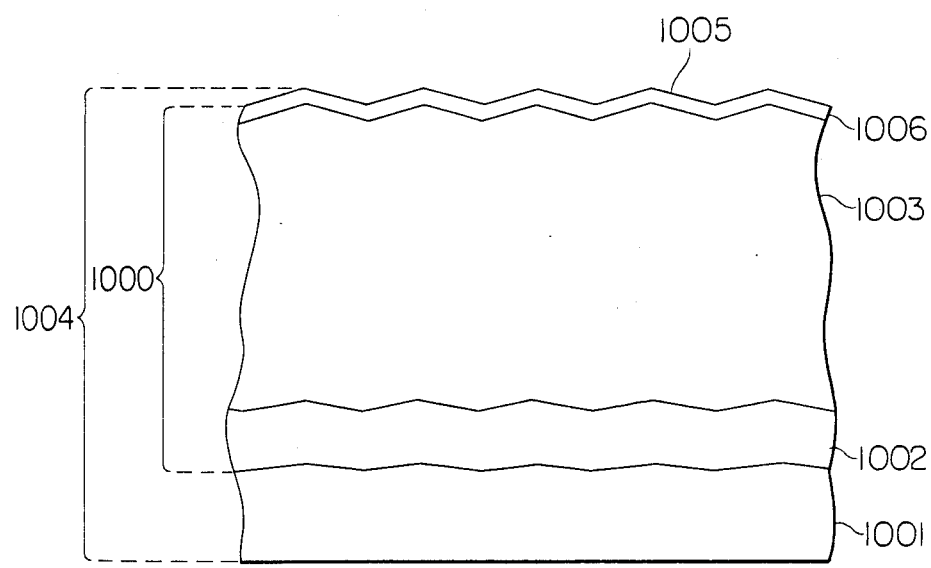
FIGS. 10 and 10A are respectively schematic illustrations of the layer constitution of a light-receiving member.

FIG. 10 shows a schematic illustration for explanation of the layer structure of the preferred embodiment of the light-receiving member of the present invention.

The light-receiving member 1004 shown in FIG. 10 has a light-receiving layer 1000 on a substrate 1001, said light-receiving layer having a free surface 1005 on one end surface.

The light-receiving layer 1000 is constructed of a first layer (G) 1002 comprising A-Si containing germanium atoms and optionally hydrogen atoms and/or halogen atoms (X) (hereinafter abbreviated as "A-SiGe(H,X)", a second layer (S)1003 comprising A-Si optionally containing hydrogen atoms and/or halogen atoms (X) (hereinafter abbreviated as "A-Si(H,X)" and a surface layer 1006 comprising an amorphous material containing silicon atoms and carbon atoms laminated successivily from the substrate side 1001.

The germanium atoms contained in the first layer (G) 1002 may be contained so that the distribution state may be uniform within the first layer (G), or they can be contained continuously in the layer thickness direction in said first layer (G) 1002, being more enriched at the substrate 1001 side toward the side opposite to the side where said substrate 1001 is provided (the surface 1005 side of the light-receiving layer 1001).

When the distribution state of the germanium atoms contained in the first layer (G) is ununiform in the layer thickness direction, it is desirable that the distribution state should be made uniform in the interplanar direction in parallel to the surface of the substrate.

In the present invention, in the second layer (S) provided on the first layer (G), no germanium atoms is contained and by forming a light-receiving layer to such a layer structure, the light-receiving member obtained can be excellent in photosensitivity to the light with wavelengths of all the regions from relatively shorter wavelength to relatively longer wavelength, including visible light region.

Also, when the distribution state of germanium atoms in the first layer (G) is ununiform in the layer thickness direction, the germanium atoms are distributed continuously throughout the whole layer region while giving a change in distribution concentration C of the germanium atoms in the layer thickness direction which is decreased from the substrate toward the second layer (S), and therefore affinity between the first layer (G) and the second layer (S) is excellent. Also, as described as hereinafter, by extremely increasing the distribution concentration C of germanium atoms at the end portion on the substrate side extremely great, the light on the longer wavelength side which cannot substantially be absorbed by the second layer (S) can be absorbed in the first layer (G) substantially completely, when employing a semiconductor laser, whereby interference by reflection from the substrate surface can be prevented.

Also, in the light-receiving member of the present invention, the respective amorphous materials constituting the first layer (G) and the second layer (S) have the common constituent of silicon atoms, and therefore chemical stability can sufficiently be ensured at the laminated interface.

FIGS. 11 through 19 show typical examples of distribution in the layer thickness direction of germanium atoms contained in the first layer region (G) of the light-receiving member in the present invention.

In FIGS. 11 through 19, the abscissa indicates the content C of germanium atoms and the ordinate the layer thickness of the first layer (G), $t_B$ showing the position of the end surface of the first layer (G) on the substrate side and $t_T$ the position of the end surface of the first layer (G) on the side opposite to the substrate side. That is, layer formation of the first layer (G) containing germanium atoms proceeds from the $t_B$ side toward the $t_T$ side.

Figure 11:
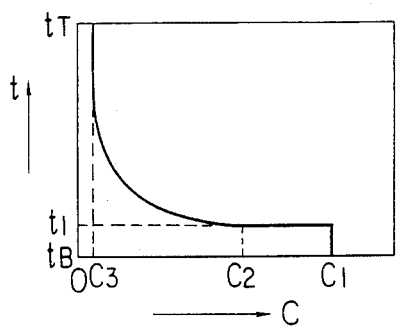
FIGS. 11 through 19 are schematic illustrations of the distribution states of germanium atoms in the first layer.

In FIG. 11, there is shown a first typical embodiment of the depth profile of germanium atoms in the layer thickness direction contained in the first layer (G).

In the embodiment as shown in FIG. 11, from the interface position $t_B$ at which the surface, on which the first layer (G) containing germanium atoms is to be formed, comes into contact with the surface of said first layer (G) to the position $t_1$, germanium atoms are contained in the first layer (G) formed, while the distribution concentration C of germanium atoms taking a constant value of $C_1$, the concentration being gradually decreased from the concentration $C_2$ continuously from the position $t_1$ to the interface position $t_T$. At the interface position $t_T$, the distribution concentration C of germanium atoms is made $C_3$.

Figure 12:
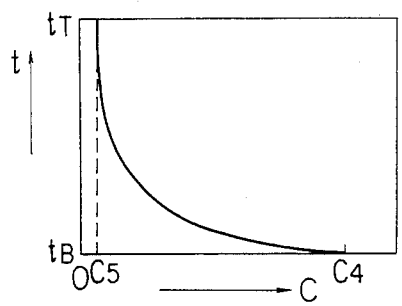

In the embodiment shown in FIG. 12, the distribution concentration C of germanium atoms contained is decreased gradually and continuously from the position $t_B$ to the position $t_T$ from the concentration $C_4$ until it becomes the concentration $C_5$ at the position $t_T$.

Figure 13:
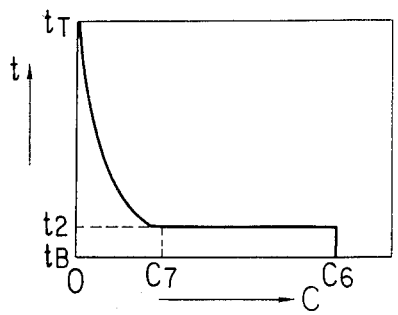

In case of FIG. 13, the distribution concentration C of germanium atoms is made constant as $C_6$ at the position $t_B$, gradually decreased continuously from the position $t_2$ to the position $t_T$, and the concentration C is made substantially zero at the position $t_T$ (substantially zero herein means the content less than the detectable limit).

Figure 14:
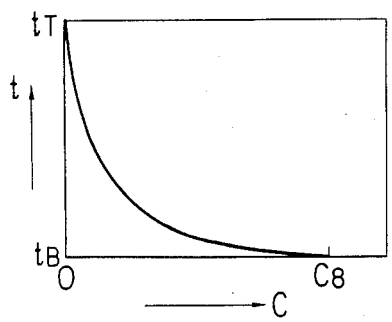

In case of FIG. 14, germanium atoms are decreased gradually and continuously from the position $t_B$ to the position $t_T$ from the concentration $C_8$, until it is made substantially zero at the position $t_T$.

Figure 15:
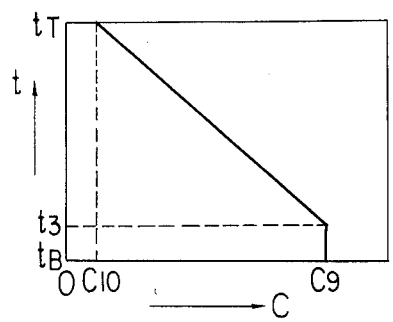

In the embodiment shown in FIG. 15, the distribution concentration C of germanium atoms is constantly $C_9$ between the position $t_B$ and the position $t_3$, and it is made $C_{10}$ at the position $t_T$. Between the position $t_3$ and the position $t_T$, the concentration C is decreased as a first order function from the position $t_3$ to the position $t_T$.

Figure 16:
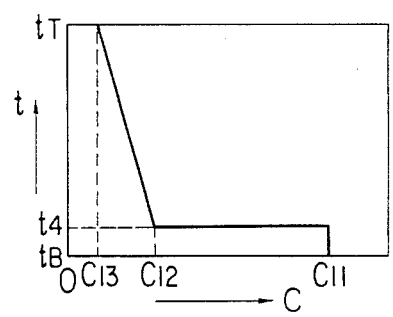

In the embodiment shown in FIG. 16, there is formed a depth profile such that the distribution concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 17:
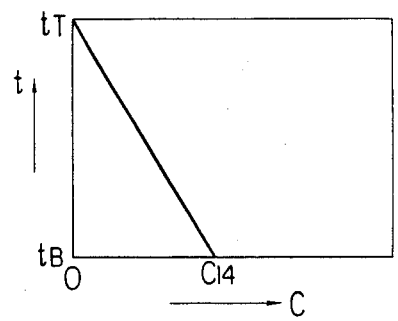

In the embodiment shown in FIG. 17, the distribution concentration C of germanium atoms is decreased as a first order function from the concentration $C_{14}$ to zero from the position $t_B$ to the position $t_T$.

Figure 18:
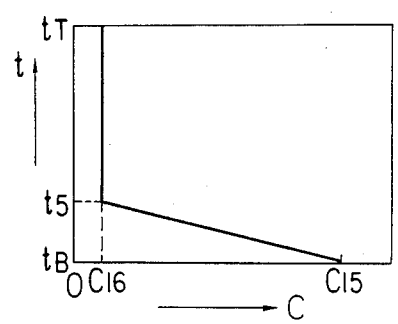

In FIG. 18, there is shown an embodiment, where the distribution concentration C of germanium atoms is decreased as a first order function from the concentration $C_{15}$ to $C_{16}$ from the position $t_B$ to $t_5$ and made constantly at the concentration $C_{16}$ between the position $t_5$ and $t_T$.

Figure 19:
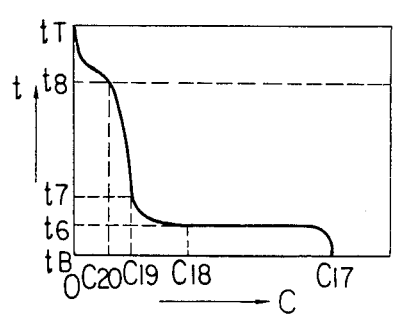

In the embodiment shown in FIG. 19, the distribution concentration C of germanium atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$.

Between the position $t_6$ and the position $t_7$, the concentration is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the first layer (G) in the direction of the layer thickness by referring to FIGS. 11 through 19, when the distribution state of germanium atoms is ununiform in the layer thickness direction, the first layer (G) is provided desirably in a depth profile so as to have a portion enriched in distribution concentration C of germanium atoms on the substrate side and a portion depleted in distribution concentration C of germanium atoms considerably lower than that of the substrate side on the interface $t_T$ side.

The first layer (G) constituting the light-receiving member in the present invention is desired to have a localized region (A) containing germanium atoms at a relatively higher concentration on the substrate side as described above.

In the present invention, the localized region (A), as explained in terms of the symbols shown in FIG. 11 through FIG. 19, may be desirably provided within $5\mu$ from the interface position $t_B$.

In the present invention, the above localized region (A) may be made to be identical with the whole of the layer region ($L_T$) on the interface position $t_B$ to the thickness of $5\mu$, or alternatively a part of the layer region ($L_T$).

It may suitably be determined depending on the characteristics required for the light-receiving layer to be formed, whether the localized region (A) is made a part or whole of the layer region ($L_T$).

The localized region (A) may preferably be formed according to such a layer formation that the maximum value Cmax of the concentrations of germanium atoms in a distribution in the layer thickness direction may preferably be 1000 atomic ppm or more, more preferably 5000 atomic ppm or more, most preferably $1\times 10^4$ atomic ppm or more based on silicon atoms.

That is, according to the present invention, it is desirable that the layer region (G) containing germanium atoms is formed so that the maximum value Cmax of the distribution concentration C may exist within a layer thickness of $5\mu$ from the substrate side (the layer region within $5\mu$ thickness from $t_B$).

In the present invention, the content of germanium atoms in the first layer (G), which may suitably be determined as desired so as to acheive effectively the objects of the present invention, may preferably be 1 to $9.5\times 10^5$ atomic ppm, more preferably 100 to $8\times 10^5$ atomic ppm, most preferably 500 to $7\times 10^5$ atomic ppm.

In the present invention, the layer thickness of the first layer (G) and the thickness of the second layer (S) are one of the important factors for accomplishing effectively the objects of the present invention, and therefore sufficient care should desirably be paid in designing of the light-receiving member so that desirable characteristics may be imparted to the light-receiving member formed.

In the present invention, the layer thickness $T_B$ of the first layer (G) may preferably be 30 Å to $50\mu$, more preferably 40 Å to $40\mu$, most preferably 50Å to $30\mu$.

On the other hand, the layer thickness T of the second layer (S) may be preferably 0.5 to $90\mu$, more preferably 1 to $80\mu$, most preferably 2 to $50\mu$.

The sum of the above layer thicknesses T and $T_B$, namely ($T+T_B$) may be suitably determined as desired in designing of the layers of the light-receiving member, based on the mutual organic relationship between the characteristics required for both layer regions and the characteristics required for the whole light-receiving layer.

In the light-receiving member of the present invention, the numerical range for the above ($T_B+T$) may generally be from 1 to $100\mu$, preferably 1 to $80\mu$, most preferably 2 to $50\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer (G) is $1\times 10^5$ atomic ppm or more, the layer thickness $T_B$ should desirably be made considerably thinner, preferably $30\mu$ or preferably $25\mu$ or less, most preferably $20\mu$ or less.

In the present invention, illustrative of halogen atoms (X), which may optionally be incorporated in the first layer (G) and the second layer (S) constituting the light-receiving layer, are fluorine, chlorine, bormine and iodine, particularly preferably fluorine and chlorine.

In the present invention, formation of the first layer (G) constituted of A-SiGe(H,X) may be conducted according to the vacuum deposition method utilizing discharging phenomenon, such as glow discharge method, sputtering method or ion-plating method. For example, for formation of the first layer (G) constituted of A-SiGe(H,X) according to the glow discharge method, the basic procedure comprises introducing a starting gas for Si supply capable of supplying silicon atoms (Si), a starting gas for Ge supply capable of supplying germanium atoms (Ge) optionally together with a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting layer formation on the surface of a substrate placed at a predetermined position while controlling the depth profile of germanium atoms according to a desired rate of change curve to form a layer constituent of A-SiGe (H,X). Alternatively, for formation according to the sputtering method, when carrying out sputtering by use of two sheets of targets of a target constituted of Si and a target constituted of Ge, or a target of a mixture of Si and Ge in an atmosphere of an inert gas such as Ar, He, etc. or a gas mixture based on these gases, a gas for introduction of hydrogen atoms (H) and/or a gas for introduction of halogen atoms (X) may be introduced, if desired, into a deposition chamber for sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred because of easiness in handling during layer formation and high efficiency for supplying Si.

As the substances which can be used as the starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred because of easiness in handling during layer formation and high efficiency for supplying Ge.

Effective starting gases for introduction of halogen atoms to be used in the present invention may include a large number of halogenic compounds, as exemplified preferably by halogenic gases, halides, interhalogen compounds, or gaseous or gasifiable halogenic compounds such as silane derivatives substituted with halogens.

Further, there may also be included gaseous or gasifiable hydrogenated silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the light-receiving member of the present invention is formed according to the glow discharge method by employment of such a silicon compound containing halogen atoms, it is possible to form the first layer (G) constituted of A-SiGe containing halogen atoms on a desired substrate without use of a hydrogenated silicon gas as the starting gas capable of supplying Si together with the starting gas for Ge supply.

In the case of forming the first layer (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the first layer (G) and exciting glow discharge to form a plasma atmosphere of these gases, whereby the first layer (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

For formation of the first layer (G) comprising A-SiGe(H,X) according to the reactive sputtering method or the ion plating method, for example, in the case of the sputtering method, two sheets of a target of Si and a target of Ge or a target of Si and Ge is employed and subjected to sputtering in a desired gas plasma atmosphere. In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $siH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc. Among these substances, halides containing halogen atoms can preferably be used as the starting material for introduction of halogens, because hydrogen atoms, which are very effective for controlling electrical or photoelectric characteristics, can be introduced into the layer simultaneously with introduction of halogen atoms during formation of the first layer (G).

For introducing hydrogen atoms structurally into the first layer (G), other than those as mentioned above, $H_2$ or a hydrogenated silicon such as $SiH_4$; $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer (G) constituting the light-receiving layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer (G), for example, the substrate temperature and/or the amount of the starting materials used for incorporation of hydrogen atoms (H) or halogen atoms (X) to be introduced into the deposition device system, discharging power, etc. may be controlled.

In the present invention, for formation of the second layer (S) constituted of A-Si(H,X), the starting materials (I) for formation of the first layer (G), from which the starting materials for the starting gas for supplying Ge are omitted, are used as the starting materials (II) for formation of the second layer (S), and layer formation can be effected following the same procedure and conditions as in formation of the first layer (G).

More specifically, in the present invention, formation of the second layer region (S) constituted of a-Si(H,X) may be carried out according to the vacuum deposition method utilizing discharging phenomenon such as the glow discharge method, the sputtering method or the ion-plating method. For example, for formation of the second layer (S) constituted of A-Si(H,X) according to the glow discharge method, the basic procedure comprises introducing a starting gas for Si supply capable of supplying silicon atoms (Si) as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising A-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

In the present invention, the amount of hydrogen atoms (H) or the amount of halogen atoms (X) or the sum of the amounts of hydrogen atoms and halogen atoms (H+X) to be contained in the second layer (S) constituting the light-receiving layer to be formed should preferably be 1 to 40 atomic %, more preferably 5 to 30 atomic %, most preferably 5 to 25 atomic %.

In the light-receiving member 1004, by incorporating a substance (C) for controlling conductivity in at least the first layer (G) 1002 and/or the second layer (S) 1003, desired conductivity characteristics can be given to the layer containing said substance (C).

In this case, the substance (C) for controlling conductivity may be contained throughout the whole layer region in the layer containing the substance (C) or contained locally in a part of the layer region of the layer containing the substance (C).

Also, in the layer region (PN) containing said substance (C), the distribution state of said substance (C) in the layer thickness direction may be either uniform or nonuniform, but desirably be made uniform within the plane in parallel to the substrate surface. When the distribution state of the substance (C) is nonuniform in the layer thickness direction, and when the substance (C) is to be incorporated in the whole layer region of the first layer (G), said substance (C) is contained in the first layer (G) so that it may be more enriched on the substrate side of the first layer (G).

Thus, in the layer region (PN), when the distribution concentration in the layer thickness direction of the above substance (C) is made nonuniform, optical and electrical junction at the contacted interface with other layers can further be improved.

In the present invention, when the substance (C) for controlling conductivity is incorporated in the first layer (G) so as to be locally present in a part of the layer region, the layer region (PN) in which the substance (C) is to be contained is provided as an end portion layer region of the first layer (G), which is to be determined case by case suitably as desired depending on.

In the present invention, when the above substance (C) is to be incorporated in the second layer (S), it is desirable to incorporate the substance (C) in the layer region including at least the contacted interface with the first layer (G).

When the substance (C) for controlling conductivity is to be incorporated in both the first layer (G) and the second layer (S), it is desirable that the layer region containing the substance (C) in the first layer (G) and the layer region containing the substance (C) in the second layer (S) may contact each other.

Also, the above substance (C) contained in the first layer (G) may be either the same as or different from that contained in the second layer (S), and their contents may be either the same or different.

However, in the present invention, when the above substance (C) is of the same kind in the both layers, it is preferred to make the content in the first layer (G) sufficiently greater, or alternatively to incorporate substances (C) with different electrical characteristics in respective layers desired.

In the present invention, by incorporating a substance (C) for controlling conductivity in at least the first layer (G) and/or the second layer (S) constituting the light-receiving layer, conductivity of the layer region containing the substance (C) [which may be either a part or the whole of the layer region of the first layer (G) and/or the second layer (S)] can be controlled as desired. As a substance (C) for controlling conductivity characteristics, there may be mentioned so called impurities in the field of semiconductors. In the present invention, there may be included p-type impurities giving p-type condutivity characteristics and n-type impurities and/or giving n-type conductivity characteristics to A-Si(H,X) and/or A-SiGe(H,X) constituting the light receiving layer to be formed.

More specifically, there may be mentioned as p-type impurities atoms belonging to the group III of the periodic table (Group III atoms), such as B (boron), Al(aluminum), Ga(gallium), In(indium), Tl(thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the layer region (PN) may be suitably be determined depending on the conductivity required for said layer region (PN), or when said layer region (PN) is provided in direct contact with the substrate, the organic relationships such as relation with the characteristics at the contacted interface with the substrate, etc.

Also, the content of the substance (C) for controlling conductivity is determined suitably with due considerations of the relationships with characteristics of other layer regions provided in direct contact with said layer region or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by making the content of said substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the substrate side into the light-receiving layer can be effectively inhibited when the free surface of the light-receiving layer is subjected to the charging treatment to ⊕ polarity. On the other hand, when the substance to be incorporated is a n-type impurity, migration of positive holes injected from the substrate side into the light-receiving layer may be effectively inhibited when the free surface of the light-receiving layer is subjected to the charging treatment to ⊖ polarity.

In the case as mentioned above, the layer region (Z) at the portion excluding the above layer region (PN) under the basic constitution of the present invention as described above may contain a substance for controlling conductivity of the other polarity, or a substance for controlling conductivity having characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the layer region (PN) and the layer region (Z), the content in the layer region (Z) should preferably be 30 atomic ppm or less.

In the present invention, it is also possible to provide a layer region containing a substance for controlling conductivity having one polarity and a layer region containing a substance for controlling conductivity having the other polarity in direct contact with each other, thus providing a so called depletion layer at said contact region.

In short, for example, a layer containing the aforesaid p-type impurity and a layer region containing the aforesaid n-type impurity are provided in the light-receiving layer in direct contact with each other to form the so called p-n junction, whereby a depletion layer can be provided.

FIGS. 27 through 35 show typical examples of the depth profiles in the layer thickness direction of the substance (C) contained in the layer region (PN) in the light-receiving layer of the present invention. In each of these Figures, representations of layer thickness and concentration are shown in rather exaggerated forms for illustrative purpose; since the difference between respective Figures will be indistinct if represented by the real values as such, and it should be understood that these Figures are schematic in nature. As practical distribution, the values of ti ($1 \leq i \leq 9$) or Ci ($1 \leq i \leq 17$) should be chosen so as to obtain desired distribution concentration lines, or values obtained by multiplying the distribution curve as a whole with an appropriate coefficient should be used.

In FIGS. 27 through 35, the abscissa shows the distribution concentration C of the substance (C), and the ordinate the layer thickness of the layer region (PN), $t_B$ indicating the position of the end surface on the substrate side of the layer region (G) and $t_T$ the position of the end surface on the side opposite to the substrate side. Thus, layer formation of the layer region (PN) containing the substance (C) proceeds from the $t_B$ side toward the $t_T$ side.

Figure 27:
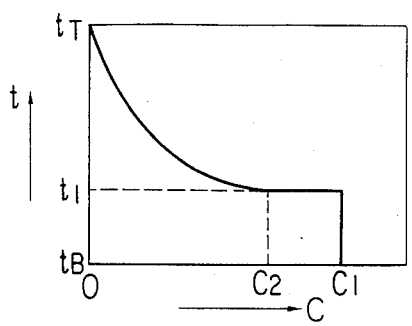
FIGS. 27 through 35 are schematic illustrations of the distribution state of the substance (C) in the layer region (PN)

FIG. 27 shows a first typical example of the depth profile of the substance (C) in the layer thickness direction contained in the layer region (PN).

In the embodiment shown in FIG. 27, from the interface position $t_B$ where the surface at which the layer region (PN) containing the substance (C) contacts the surface of said layer (G) to the position $t_1$, the substance (C) is contained in the layer region (PN) formed while the distribution concentration C of the substance (C) taking a constant value of $C_1$, and the concentration is gradually decreased from the concentration $C_2$ continuously from the position $t_1$ to the interface position $t_T$. At the interface position $t_T$, the distribution concentration C of the substance (C) is made substantially zero (here substantially zero means the case of less than detectable limit).

Figure 28:
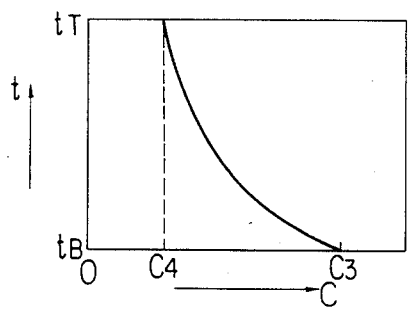

In the embodiment shown in FIG. 28, the distribution concentration C of the substance (C) contained is decreased from the position $t_B$ to the position $t_T$ gradually and continuously from the concentration $C_3$ to the concentration $C_4$ at $t_T$.

Figure 29:
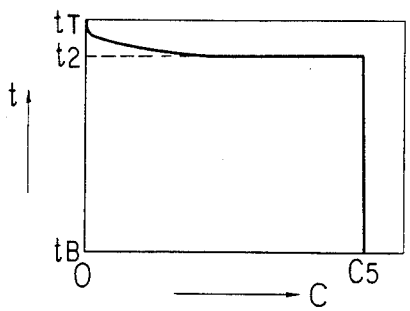

In the case of FIG. 29, from the position $t_B$ to the position $t_2$, the distribution concentration C of the substance (C) is made constantly at $C_5$, while between the position $t_2$ and the position $t_T$, it is gradually and continuously decreased, until the distribution concentration is made substantially zero at the position $t_T$.

Figure 30:
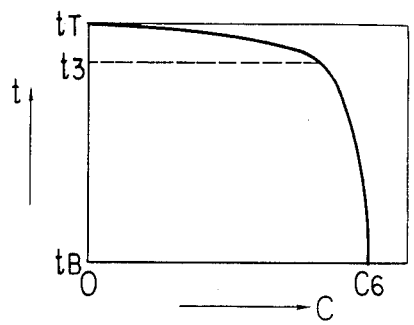

In the case of FIG. 30, the distribution concentration C of the substance (C) is first decreased continuously and gradually from the concentration $C_6$ from the position $t_B$ to the position $t_3$, from where it is abruptly decreased to substantially zero at the position $t_T$.

Figure 31:
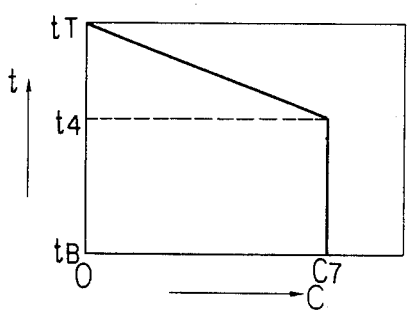

In the embodiment shown in FIG. 31, the distribution concentration of the substance (C) is constantly $C_7$ between the position $t_B$ and the position $t_T$, and the distribution concentration is made zero at the position $t_T$. Between the $t_4$ and the position $t_T$, the distribution concentration C is decreased as a first order function from the position $t_4$ to the position $t_T$.

Figure 32:
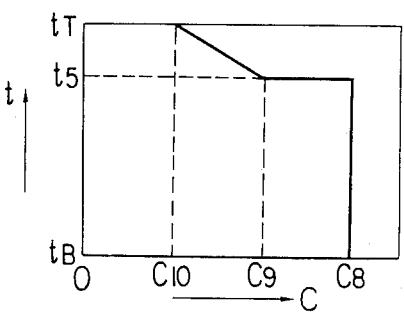

In the embodiment shown in FIG. 32, the distribution concentration C takes a constant value of $C_8$ from the position $t_B$ to the position $t_5$, while it was decreased as a first order function from the concentration $C_9$ to the concentration $C_{10}$ from the position $t_5$ to the position $t_T$.

Figure 33:
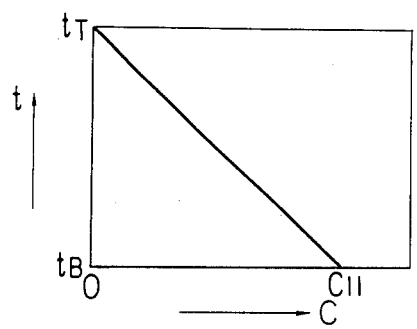

In the embodiment shown in FIG. 33, from the position $t_B$ to the position $t_T$, the distribution concentration C of the substance (C) is decreased continuously as a first order function from the concentration $C_{11}$ to zero.

Figure 34:
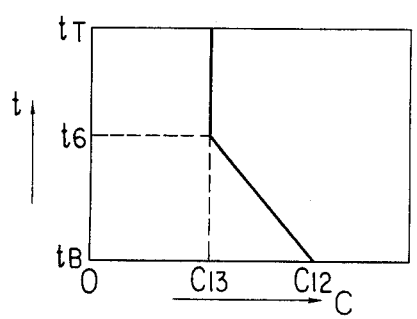

In FIG. 34, there is shown an embodiment, in which, from the position $t_B$ to the position $t_6$, the distribution concentration C of the substance C is decreased as a first order function from the concentration $C_{12}$ to the concentration $C_{13}$, and the concentration is made a constant value of $C_{13}$ between the position $t_6$ and the position $t_T$.

Figure 35:
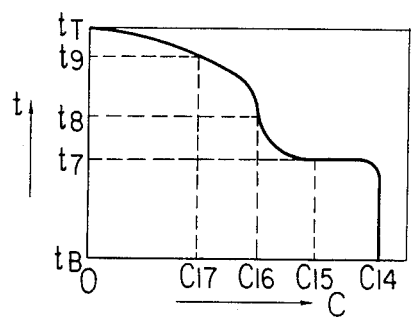

In the embodiment shown in FIG. 35, the distribution concentration C of the substance (C) is $C_{14}$ at the position $t_B$, which is gradually decreased initially from $C_{14}$ and then abruptly near the position $t_7$, where it is made $C_{15}$ at the position $t_7$.

Between the position $t_7$ and the position $t_8$, the concentration is initially abruptly decreased and then moderately gradually, until it becomes $C_{16}$ at the position $t_8$, and between the position $t_8$ and the position $t_9$, the concentration is gradually decreased to reach $C_{17}$ at the position $t_9$. Between the position $t_9$ and the position $t_T$, the concentration is decreased from $C_{17}$, following the curve with a shape as shown in Figure, to substantially zero.

As described above by referring to some typical examples of depth profiles in the layer thickness direction of the substance (C) contained in the layer region (PN) shown FIGS. 27 through 35, it is desirable in the present invention that a depth profile of the substance (C) should be provided in the layer region (PN) so as to have a portion with relatively higher distribution concentration C of the substance (C) on the substrate side, while having a portion on the interface $t_T$ side where said distribution concentration is made considerably lower as compared with the substrate side.

The layer region (PN) constituting the light-receiving member in the present invention is desired to have a localized region (B) containing the substance (C) preferably at a relatively higher concentration on the substrate side as described above.

In the present invention, the localized region (B) as explained in terms of the symbols shown in FIGS. 27 through 35, may be desirably provided within $5\mu$ from the interface position $t_B$.

In the present invention, the above localized region (B) may be made to be identical with the whole of the layer region (L) from the interface position $t_B$ to the thickness of $5\mu$, or alternatively a part of the layer region (L)

It may suitably be determined depending on the characteristics required for the light-receiving layer to be formed whether the localized region (B) should be made a part or the whole of the layer region (L).

For formation of the layer region (PN) containing the aforesaid substance (C) by incorporating a substance (C) for controlling conductivity such as the group III atoms or the group V atoms structurally into the light-receiving layer, a starting material for introduction of the group III atoms or a starting material for introduction of the group V atoms may be introduced under gaseous state into a deposition chamber together with other starting materials for formation of the respective layers during layer formation.

As the starting material which can be used for introduction of the group III atoms, it is desirable to use those which are gaseous at room temperature under atmospheric pressure or can readily be gasified under layer forming conditions. Typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H-$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydrides such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $SbCl$, $BiH_3$, $BiCl_3$, $BiBr_3$ and the like effectively as the starting material for introduction of the group V atoms.

In the light-receiving member 1004 shown in FIG. 10, the surface layer 1006 formed on the second layer 1003 has a free surface and is provided for accomplishing the objects of the present invention primarily in humidity resistance, continuous repeated use characteristic, dielectric strength, use environment characteristic, mechanical durability, light-receiving characteristic, etc.

The surface layer 1006 in the present invention is constituted of an amorphous material containing silicon atoms (Si) and carbon atoms (C), optionally together with hydrogen atoms (H) and/or halogen atoms (X) (hereinafter written as "$A-(Si_xC_{1-x})_y(H,X)_{1-y}$", wherein $0 < x, y < 1$).

Formation of the surface layer 1006 constituted of $A-(Si_xC_{1-x})_y(H,X)_{1-y}$ may be performed according the the plasma CVD method such as the glow discharge method, the photo CVD method, the thermal CVD method, the sputtering method, the electron beam method, etc. These preparation methods may be suitably selected depending on various factors such as the preparation conditions, the extent of the load for capital investment for installations, the production scale, the desirable characteristics required for the light-receiving member to be prepared, etc. For the advantages of relatively easy control of the preparation conditions for preparing light-receiving members having desired characteristics and easy introduction of carbon atoms and halogen atoms with silicon atoms (Si) into the surface layer 1006 to be prepared, there may preferably be employed the glow discharge method or the sputtering method.

Further, in the present invention, the glow discharge method and the sputtering method may be used in combination in the same device system to form the surface layer 1006.

For formation of the surface layer 1006 accoridng to the glow discharge method, starting gases for formation of $A-(Si_xC_{1-x})_y(H,X)_{1-y}$, which may optionally be mixed with a diluting gas at a predetermined mixing ratio, may be introduced into a deposition chamber for vacuum deposition in which a substrate is placed, and glow discharge is excited in the deposition chamber to form the gases as introduced into a gas plasma, thereby depositing $A-(Si_xC_{1-x})_y(H,X)_{1-y}$ on the first, and the second layers already formed on the substrate.

In the present invention, as starting gases for formation of $A-(Si_xC_{1-x})_y(H,X)_{1-y}$, there may be employed most of substances containing at least one of silicon atoms (Si), carbon atoms (C), hydrogen atoms (H) and halogen atoms (X) as constituent atoms which are gaseous or gasified substances of readily gasifiable ones.

For example, when employing a starting gas containing Si as constituent atom as one of Si, C, H and X, a mixture of a starting gas containing Si as constituent atom, a starting gas containing C as constituent atom and optionally a starting gas containing H as constituent atom and/or a starting gas containing X as constituent atom at a desired mixing ratio, or a mixture of a starting gas containing Si as constituent atom and a starting gas containing C and H as constituent atoms and/or a starting gas containing C and X as constituent atoms also at a desired ratio, or a mixutre of a starting gas containing Si as constituent atom and a starting gas containing three constituent atoms of Si, C and H or a starting gas containing three constituent atoms of Si, C and X.

Alternatively, it is also possible to use a mixture of a starting gas containing Si and H as constituent atoms with a starting gas containing C as constituent atom or a mixture of a starting gas containing Si and X as constituent atoms and a starting gas containing C as constituent atom.

In the present invention, suitable halogen atoms (X) contained in the surface layer 1006 are F, Cl, Br and I, particularly preferably F and Cl.

In the present invention, as the starting gases to be effectively used for formation of the surface layer 1006, there may be employed gaseous or readily gasifiable substances at room temperature under normal pressure.

In the present invention, the starting gas to be effectively used for formation of the surface layer 1006 may include hydrogenated silicon gases, for example, silanes such as $SiH_4$, $Si_2H_6$, $Si_3H_8$, $Si_4H_{10}$ and the like; compounds containing C and H as constituent atoms such as saturated hydrocarbons having 1 to 4 carbon atoms, ehtylenic hydrocarbons having 2 to 4 carbon atoms, acetylenic hydrocarbons having 2 to 3 carbon atoms, single substances of halogen, hydrogen halides, interhalogen compounds, halogenated silicon, halo-substituted hydrogenated silicon, hydrogenated silicon, etc.

More specifically, there may be included, saturated hydrocarbons such as methane ($CH_4$), ethane ($C_2H_6$), propane ($C_3H_8$), n-butane ($n-C_4H_{10}$), pentane ($C_5H_{12}$); ehtylenic hydrocarbons such as ehylene ($C_2H_4$), propylene ($C_3H_6$), butene-1 ($C_4H_8$), butene-2 ($C_4H_8$), isobutylene ($C_4H_8$), pentene ($C_5H_{10}$); acetylenic hydrocarbons such as acetylene ($C_2H_2$), mehtyl acetylene ($C_3H_4$), butyne ($C_4H_6$); single substances of halogen such as fluorine, chlorine, bromine and iodine; hydrogen halides such as HF, HI, HCl, and HBr; interhalogen compounds such as BrF, ClF, $ClF_3$, $ClF_5$, $BrF_3$, $BrF_5$, $IF_7$, $IF_5$, ICl, and IBr; halogenated silicon such as $SiF_4$, $Si_2F_6$, $SiCl_3Br$, $SiCl_2Br_2$, $SiClBr_3$, $SiCl_3I$, $SiBr_4$; halo-substituted hydrogenated silicon such as $SiH_2F_2$, $SiH_2Cl_2$, $SiHCl_3$, $SiH_3Cl$, $SiH_3Br$, $SiH_2Br_2$ and $SiHBr_3$; hydrogenated silicon such as silanes, including $SiH_4$, $Si_2H_6$, $Si_3H_8$ and $Si_4H_{10}$.

Otherwise, it is also possible to use halo-substituted paraffinic hydrocarbons such as $CF_4$, $CCl_4$, $CBr_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc.; silane derivatives, including alkyl silanes such as $Si(CH_3)_4$, $Si(C_2H_5)_4$, etc. and halo-containing alkyl silanes such as $SiCl(CH_3)_3$, $SiCl_2(CH_3)_2$, $SiCl_3CH_3$, etc. as effective ones.

The starting materials for formation of the surface layer 1006 may be selected and employed as desired in formation of the surface layer 1006 so that silicon atoms, carbon atoms, halogen atoms, optionally together with hydrogen atoms may be contained at a predetermined composition ratio in the surface layer 1006 to be formed.

For example, $Si(CH_3)_4$ as the material capable of incorporating easily silicon atoms, carbon atoms and hydrogen atoms and forming a layer having desired characteristics and $SiHCl_3$, $SiCl_4$, $SiH_2Cl_2$ or $SiH_3Cl$ as the material for incorporating halogen aotms may be mixed at a predetermined mixing ratio and introduced under gaseous state into a device for formation of the surface layer 1006, followed by excitation of glow discharge, whereby there can be formed a surface layer 1006 constituted of $A-(Si_xC_{1-x})-(Cl+H)_{1-y}$.

For formation of the surface layer 1006 according to the sputtering method, a single crystalline or polycrystalline Si wafer or C wafer or a wafer containing Si and C mixed therein is used as target and subjected to sputtering in an atmosphere of various gases containing halogen atoms and/or hydrogen atoms as constituent atoms.

For example, when Si wafer is used as target, a starting gas for introducing C and H and/or X which may be diluted with a diluting gas, if desired, is introduced into a deposition chamber for sputtering to form a gas plasma therein and effect sputtering of the Si wafer.

Alternatively, Si and C as separate targets or one sheet target of a mixture of Si and C can be used and sputtering is effected in a gas atmosphere containing hydrogen atoms and/or halogen atoms. As the starting gas for introduction of C, H and X, there may be employed those for formation of the surface layer 1006 as mentioned in the glow discharge as described above as effective gases also in case of sputtering.

In the present invention, as the diluting gas to be used in formation of the surface layer 1006 by the glow discharge method or the sputtering method, there may be included the so-called rare gases such as He, Ne and Ar as preferable ones.

The surface layer 1006 in the present invention should be carefully formed so that the required characteristics may be given exactly as desired.

That is, the material containing Si, C and optionally H and/or X can take various forms from crystalline to amorphous, electrical properties from conductive through semi-conductive to insulating and photoconductive properties from photoconductive to nonphotoconductive depending on the preparation conditions. Therefore, in the present invention, the preparation conditions are strictly selected as desired so that there may be fromed $A-(si_xC_{1-x})_y(H,X)_{1-y}$ having desired characteristics depending on the purpose.

For example, when the surface layer 1006 is to be provided primarily for the purpose of improvement of dielectric strength, the amorphous material for constitution of the surface layer is prepared as an amorphous material having marked electric insulating behaviours under the use environment.

Alternatively, when the primary purpose for provision of the surface layer 1006 is improvement of of continuous repeated use characteristics or environmental use characteristics, the degree of the above electric insulating property may be alleviated to some extent and $A-(Si_xC_{1-x})_y(H,X)_{1-y}$ may be prepared as an amorphous material having sensitivity to some extent to the light irradiated.

In forming the surface layer 1006 comprising $A-(Si_xC_{1-x})_y(H,X)_{1-y}$ surface of the second layer, the substrate temperature during layer formation is an important factor having influences on the structure and the characteristics of the layer to be formd, and it is desired in the present invention to control severely the substrate temperature during layer formation so that $A-(Si_xC_{1-x})_y(H,X)_{1-y}$ having intended characteristics may be prepared as desired.

As the substrate temperature in forming the surface layer 1006 for accomplishing effectively the objects in the present invention, there may be selected suitably the optimum temperature range in conformity with the method for forming the surface layer 1006 in carrying out formation thereof, preferably 20 to 400° C., more preferably 50 to 350° C., most preferably 100 to 300° C.

For formation of the surface layer 1006, the glow discharge method or the sputtering method may be advantageously adopted because severe control of the composition ratio of atoms constituting the layer or control of layer thickness can be conducted with relative ease as compared with other methods. In case when the surface layer 1006 is to be formed according to these layer forming methods, the discharging power during layer formation is one of important factors influencing the characteristics of $A-(Si_xC_{1-x})_y(H,X)_{1-y}$ to be prepared, similarly as the aforesaid substrate temperature.

The discharging power condition for preparing effectively $A-(Si_xC_{1-x})_y(H,X)_{1-y}$ having characteristics for accomplishing the objects of the present invention with good productivity may preferably be 10 to 1000 W, more preferably 20 to 750 W, most preferably 50 to 650 W.

The gas pressure in a deposition chamber may preferably be 0.01 to 1 Torr, more preferably 0.1 to 0.5 Torr.

In the present invention, the above numerical ranges may be mentioned as preferable numerical ranges for the substrate temperature, discharging power for preparation of the surface layer 1006. However, these factors for layer formation should not be determined separately independently of each other, but it is desirable that the optimum values of respective layer forming factors should be determined based on mutual organic realtionships so that the surface layer comprising $A-(Si_xC_{1-x})_y(H,X)_{1-y}$ having desired characteristics may be formed.

The contents of carbon atoms in the surface layer 1006 in the light-receiving member of the present invention are important factors for obtaining the desired characteristics to accomplish the objects of the present invention, similarly as the conditions for preparation of the surface layer 1006.

The contents of carbon atoms contained in the surface layer 1006 in the present invention are determined as desired depending on the species of the amorphous material constituting the surface layer 1006 and its characteristics.

More specifically, the amorphous material represented by the above formula $A-(Si_xC_{1-x})_y(H,X)_{1-y}$ may be classified into an amorphous material constituted of silicon atoms and carbon atoms (hereinafter written as "$A-Si_aC_{1-a}$", where $0<a<1$), an amorphous material constituted of silicon atoms, carbon atoms and hydrogen atoms (hereinafter written as $A-(Si_bC_{1-b})_cH_{1-c}$, where $0<b$, $C<1$) and an amophous material constituted of silicon atoms, carbon atoms, halogen atoms and optionally hydrogen atoms (hereinafter written as "$A-(Si_dC_{1-d})_e(H,X)_{1-e}$", where $0<d$, $e<1$).

In the present invention, when the surface layer 1006 is to be constituted of $A-Si_aC_{1-a}$, the content of carbon atoms (C) in the surface layer 1006 may generally be $1\times10^{-3}$ to 90 atomic %, more preferably 1 to 80 atomic %, most preferably 10 to 75 atomic %, namely in terms of representation by a, a being preferably 0.1 to 0.99999, more preferably 0.2 to 0.99, most preferably 0.25 to 0.9.

In the present invention, when the surface layer 1006 is to be constituted of $A-(Si_bC_{1-b})_cH_{1-c}$, the content of carbon atoms may preferably be $1\times10^{-3}$ to 90 atomic %, more preferably 1 to 90 atomic %, most preferably 10 to 85 atomic %, the content of hydrogen atoms preferably 1 to 40 atomic %, more preferably 2 to 35 atomic %, most preferably 5 to 30 atomic %, and the light-receiving member formed when the hydrogen content is within these ranges can be sufficiently applicable as excellent one in practical aspect.

That is, in terms of the representation by the above $A-(Si_bC_{1-b})_cH_{1-c}$, b should preferably be 0.1 to 0.99999, more preferably 0.1 to 0.99, most preferably 0.15 to 0.9, and c preferably 0.6 to 0.99, more preferably 0.65 to 0.98, most preferably 0.7 to 0.95.

When the surface layer 1006 is to be constituted of $A-(Si_dCl-d)_e(H,X)_{1-e}$, the content of carbon atoms may preferably be $1\times10^{-3}$ to 90 atomic %, more preferably 1 to 90 atomic %, most preferably 10 to 85 atomic %, the content of halogen atoms preferably 1 to 20 atomic %. When the content of halogen atoms is within these ranges, the light-receiving member prepared is sufficiently applicable in practical aspect. The content of hydrogen atoms optionally contained may preferably be 19 atomic % or less, more preferably 13 atomic % or less.

That is, in terms of representation by d and e in the above $A-(Si_dC_{1-d})_e(H,X)_{1-e}$, d should preferably be 0.1 to 0.99999, more preferably 0.1 to 0.99, most preferably 0.15 to 0.9, and e preferably 0.8 to 0.99, more preferably 0.82 to 0.99, most preferably 0.85 to 0.98.

The range of the numerical value of layer thickness of the surface layer 1006 is one of important factors for accomplishing effectively the objects of the present invention, and it should desirably be determined depending on the intended purpose so as to effectively accomplish the objects of the present invention.

The layer thickness of the surface layer 1006 is also required to be determined as desired suitably with due considerations about the relationships with the contents of carbon atoms therein, the relationship with the layer thicknesses of the first layer and the second layer, as well as other organic relationships with the characteristics required for respective layers.

In addition, it is also desirable to have considerations from economical point of view such as productivity or capability of bulk production The surface layer 1006 in the present invention is desired to have a layer thickness preferably of 0.003 to $30\mu$, more preferably 0.004 to $20\mu$, most preferably 0.005 to $10\mu$.

In the light-receiving member of the present invention, for the purpose of obtaining higher photosensitivity and dark resistance, and further for the purpose of improving adhesion between the substrate and the light-receiving layer, at least one kind of atoms selected from oxygen atoms, and nitrogen atoms can be contained in the light-receiving layer in either uniform or ununiform distribution state in the layer thickness direction. Such atoms (ON) to be contained in the light-receiving layer may be contained therein throughout the whole layer region of the light-receiving layer or localized by being contained in a part of the layer region of the light-receiving layer.

The distribution concentration C (ON) of the atoms (ON) should desirably be uniform within the plane parallel to the surface of the substrate.

In the present invention, the layer region (ON) where atoms (ON) are contained is provided so as to occupy the whole layer region of the light-receiving layer when it is primarily intended to improve photosensitivity and dark resistance, while it is provided so as to occupy the end portion layer region on the substrate side of the light-receving layer when it is primarily intended to strengthen adhesion between the substrate and the light-receiving layer.

In the former case, the content of atoms (ON) contained in the layer region (ON) should desirably be made relatively smaller in order to maintain high photosensitivity, while in the latter case relatively larger in order to ensure reinforcement of adhesion to the substrate.

In the present invention, the content of the atoms (ON) to be contained in the layer region (ON) provided in the light-receiving layer can be selected suitably in organic relationship with the characteristics required for the layer region (ON) itself, or with the characteristic at the contacted interface with the substrate when the said layer region (ON) is provided in direct contact with the substrate, etc.

When other layer regions are to be provided in direct contact with the layer region (ON) the content of the atoms (ON) may suitably be selected with due considerations about the characteristics of said other layer regions or the characteristics at the contacted interface with said other layer regions.

The amount of the atoms (ON) contained in the layer region (ON) may be determined as desired depending on the characteristics required for the light-receiving member to be formed, but it may preferably be 0.001 to 50 atomic %, more preferably 0.002 to 40 atomic %, most preferably 0.003 to 30 atomic %.

In the present invention, when the layer region (ON) occupies the whole region of the light-receiving layer or, although not occupying the whole region, the proportion of the layer thickness $T_O$ of the layer region (ON) occupied in the layer thickness T of the light-receiving layer is sufficiently large, the upper limit of the content of the atoms (ON) contained in the layer region (ON) should desirably be made sufficiently smaller than the value as specified above.

In the case of the present invention, when the proportion of the layer thickness $T_O$ of the layer region (ON) occupied relative to the layer thickness T of the light-receiving layer is 2/5 or higher, the upper limit of the atoms (ON) contained in the layer region (ON) should desirably be made 30 atomc % or less, more preferably 20 atomic % or less, most preferably 10 atomic % or less.

According to a preferred embodiment of the present invention, it is desirable that the atoms (ON) should be contained in at least the above first layer to be provided directly on the substrate. In short, by incorporating the atoms (ON) at the end portion layer region on the substrate side in the light-receiving layer, it is possible to effect reinforcement of adhesion between the substrate and the light-receiving layer.

Further, in the case of nitrogen atoms, for exaple, under the co-presence with boron atoms, improvement of dark resistance and improvement of photosensitivity can further be ensured, and therefore they should preferably be contained in a desired amount in the light-receiving layer.

Plural kinds of these atoms (ON) may also be contained in the light-receiving layer. For example, oxygen atoms may be contained in the first layer, nitrogen atoms in the second layer, or alternatively oxygen atoms and nitrogen atoms may be permitted to be co-present in the same layer region.

FIGS. 43 through 51 show typical examples ununiform depth profiles in the layer thickness direction of the atoms (ON) contained in the layer region (ON) in the light-receiving member of the present invention.

In FIGS. 43 through 51, the abscissa indicates the distribution concentration C of the atoms (ON), and the ordinate the layer thickness of the layer region (ON), $t_B$ showing the position of the end surface of the layer region on the substrate side, while $t_T$ shows the position of the end face of the layer region (ON) opposite to the substrate side. Thus, layer formation of the layer region (ON) containing the atoms (ON) proceeds from the $t_B$ side toward the $t_T$ side.

Figure 43:
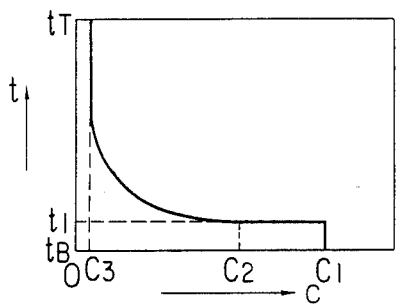
FIGS. 43 through 51 are schematic illustrations of the distribution states of the atoms (ON) in the layer region (ON).

FIG. 43 shows a first typical embodiment of the depth profile in the layer thickness direction of the atoms (ON) contained in the layer region (ON).

In the embodiment shown in FIG. 43, from the interface position $t_B$ where the surface on which the layer region (ON) containing the atoms (ON) are contained in the layer region (ON) to be formed while the distribution concentration of the atoms (ON) taking formed contacts the surface of said layer region (ON) to the position of $t_1$, the atoms (ON) is a constant value of $C_1$, said distribution concentration being gradually continuously reduced from $C_2$ from the position $t_1$ to the interface position $t_T$, until at the interface position $t_T$, the distribution concentration C is made $C_3$.

Figure 44:
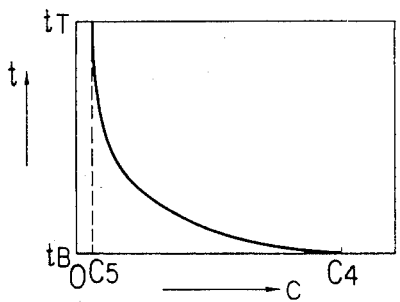

In the embodiment shown in FIG. 44, the distribution concentration C of the atoms (ON) contained is reduced gradually continuously from the concentration $C_4$ from the position $t_B$ to the position $t_T$, at which it becomes the concentration $C_5$.

Figure 45:
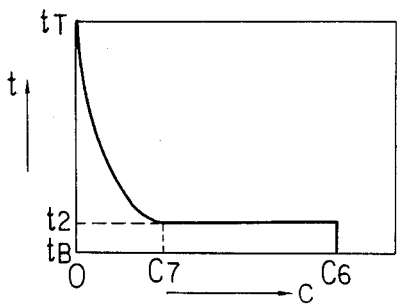

In the case of FIG. 45, from the position $t_B$ to the position $t_2$, the distribution concentration of the atoms (ON) is made constantly at $C_6$, reduced gradually continuously from the concentration $C_7$ between the position $t_2$ and the position $t_T$, until at the position $t_T$, the distribution concentration C is made substantially zero (here substantially zero means the case of less than the detectable level).

Figure 46:
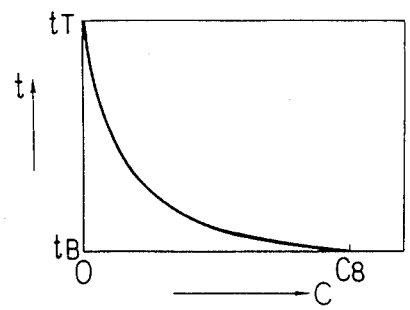

In the case of FIG. 46, the distribution concentration C of the atoms (ON) is reduced gradually continuously from the concentration $C_8$ from the position $t_B$ up to the position $t_T$, to be made substantially zero at the position $t_T$.

Figure 47:
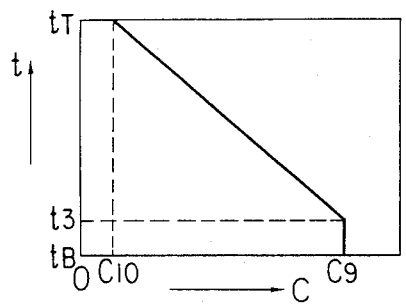

In the embodiment shown in FIG. 47, the distribution concentration C of the atoms (ON) is made constantly $C_9$ between the position $t_B$ and the position $t_3$, and it is made the concentration $C_{10}$ at the position $t_T$. Between the position $t_3$ and the position $t_T$, the distribution concentration C is reduced from the concentration $C_9$ to substantially zero as a first order function from the position $t_3$ to the position $t_T$.

Figure 48:
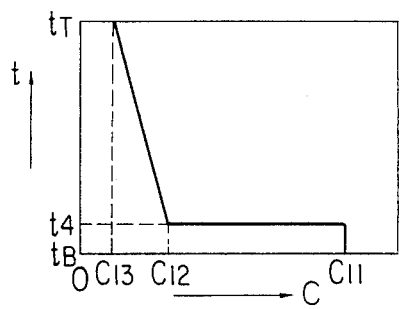

In the embodiment shown in FIG. 48, from the position $t_B$ to the position $t_4$, the distribution concentration C takes a constant value of $C_{11}$, while the distribution state is changed to a first order function in which the concentration is decreased from the concentration $C_{12}$ to the concentration $C_{13}$ from the position $t_4$ to the position $t_T$, and the concentration C is made substantially zero at the position $t_T$.

Figure 49:
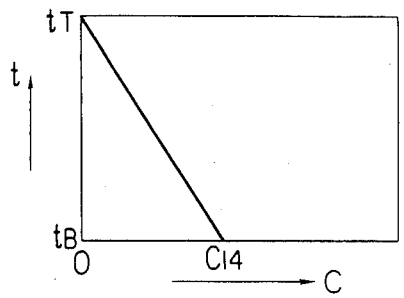

In the embodiment shown in FIG. 49, from the position $t_B$ to the position $t_T$, the distribution concentration C of the atoms (ON) is reduced as a first order function from the concentration $C_{14}$ to substantially zero.

Figure 50:
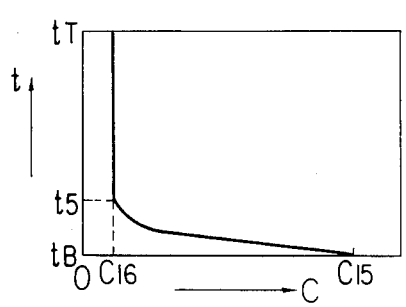

In FIG. 50, there is shown an embodiment, wherein from the position $t_B$ to the position $t_5$, the distribution concentration of the atoms (ON) is reduced approximately as a first order function from the concentration $C_{15}$ to $C_{16}$, and it is made constantly $C_{16}$ between the position t and the position $t_T$.

Figure 51:
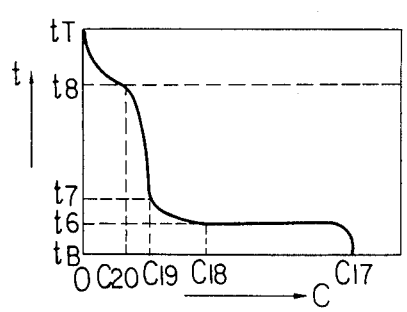

In the embodiment shown in FIG. 51, the distribution concentration C of the atoms (ON) is $C_{17}$ at the position $t_B$, and, toward the position $t_6$, this $C_{17}$ reduced gradually and then abruptly reduced near the position $t_6$, until it is made the concentration $C_{18}$ the position $t_6$.

Between the position $t_6$ and the position $t_7$, the concentration is initially reduced abruptly and thereafter gently gradually reduced to become $C_{19}$ at the position $t_7$, and between the position $t_7$ and the position $t_8$, it is reduced very gradually to become $C_{20}$ at the position $t_8$. Between the position $t_8$ and the position $t_T$, the concentration is reduced from the concentration $C_{20}$ to substantially zero along a curve with a shape as shown in the Figure.

As described above about some typical examples of depth profiles in the layer thickness direction of the atoms (ON) contained in the layer region (ON) by referring to FIGS. 43 through 51, it is desirable in the present invention that, when the atoms (ON) are to be contained ununiformly in the layer region (ON), the atoms (ON) should be distributed in the layer region (ON) with higher concentration on the substrate side, while having a portion considerably depleted in concentration on the interface $t_T$ side as compared with the substrate side.

The layer region (ON) containing atoms (ON) should desirably be provided so as to have a localized region (B) containing the atoms (ON) at a relatively higher concentration on the substrate side as described above, and in this case, adhesion between the substrate and the light-receiving layer can be further improved.

The above localized region (B) should desirably be provided within $5\mu$ from the interface position $t_B$, as explained in terms of the symbols indicated in FIGS. 43 through 51.

In the present invention, the above localized region (B) may be made the whole of the layer region ($L_T$) from the interface position $t_B$ to $5\mu$ thickness or a part of the layer region ($L_T$).

It may suitably be determined depending on the characteristics required for the light-receiving layer to be formed whether the localized region (B) is made a part or the whole of the layer region ($L_T$).

The localized region (B) should preferably be formed to have a depth profile in the layer thickness direction such that the maximum value Cmax of the distribution concentration of the atoms (ON) may preferably be 500 atomic ppm or more, more preferably 800 atomic ppm or more, most preferably 1000 atomic ppm or more.

In other words, in the present invention, the layer region (ON) containing the atoms (ON) should preferably be formed so that the maximum value Cmax of the distribution concentration C may exist within $5\mu$ layer thickness from the substrate side (in the layer region with $5\mu$ thickness from $t_B$).

In the present invention, when the layer region (ON) is provided so as to occupy a part of the layer region of the light-receiving layer, the depth profile of the atoms (ON) should desirably be formed so that the refractive index may be changed moderately at the interface between the layer region (ON) and other layer regions By doing so, reflection of the light incident upon the light-receiving layer from the interface between contacted interfaces can be inhibited, whereby appearance of interference fringe pattern can more effectively be prevented.

It is also preferred that the distribution concentration C of the atoms (ON) in the layer region (ON) should be changed along a line which is changed continuously and moderately, in order to give smooth refractive index change In this regard, it is preferred that the atoms (ON) should be contained in the layer region (ON) so that the depth profiles as shown, for example, in FIGS. 43 through 46, FIG. 49 and FIG. 51 may be assumed.

In the present invention, for provision of a layer region (ON) containing the atoms (ON) in the light-receiving layer, a starting material for introduction of the atoms (ON) may be used together with the starting material for formation of the light-receiving layer during formation of the light-receiving layer and incorporated in the layer formed while controlling its amount.

When the glow discharge method is employed for formation of the layer region (ON), a starting material for introduction of the atoms (ON) is added to the material selected as desired from the starting materials for formation of the light-receiving layer as described above. For such a starting material for introduction of the atoms (ON), there may be employed most of gaseous or gasified gasifiable substances containing at least the atoms (ON) as the constituent atoms.

More specifically, there may be included, for example, oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ), dinitrogen pentaoxide ($N_2O_5$) nitrogen trioxide ($NO_3$); lower siloxanes containing silicon atom (Si), oxygen atom (O) and hydrogen atom (H) as constituent atoms, such as disiloxane ($H_3SiOSiH_3$), trisiloxane ($H_3SiOSiH_2OSiH_3$), and the like; nitrogen ($N_2$), ammonia ($NH_3$), hydrazine ($H_2NNH_2$), hydrogen azide ($HN_3$), ammonium azide ($NH_4N_3$), nitrogen trifluoride ($F_3N$), nitrogen tetrafluoride ($F_4N$) and so on.

In the case of the sputtering method, as the starting material for introduction of the atoms(ON), there may also be employed solid starting materials such as $SiO_2$, $Si_3N_4$ and carbon black in addition to those gasifiable as enumerated for the glow discharge method. These can be used in the form of a target for sputtering together with the target of Si, etc.

In the present invention, when forming a layer region (ON) containing the atoms (ON) during formation of the light-receiving layer, formation of the layer region (ON) having a desired depth profile in the direction of layer thickness formed by varying the distribution concentration C of the atoms (ON) contained in said layer region (ON) may be conducted in the case of glow discharge by introducing a starting gas for introduction of the atoms (ON) the distribution concentration C of which is to be varied into a deposition chamber, while varying suitably its gas flow rate according to a desired change rate curve.

For example, by the manual method or any other method conventionally used such as an externally driven motor, etc., the opening of a certain needle valve provided in the course of the gas flow channel system may be gradually varied. During this operation, the rate of variationis not necessarily required to be linear, but the flow rate may be controlled according to a variation rate curve previously designed by means of, for example, a microcomputer to give a desired content curve.

When the layer region (ON) is formed according to the sputtering method, formation of a desired depth profile of the atoms (ON) in the layer thickness direction by varying the distribution concentration C of the atoms (ON) may be performed first similarly as in the case of the glow discharge method by employing a starting material for introduction of the atoms (ON) under gaseous state and varying suitably as desired the gas flow rate of said gas when introduced into the deposition chamber. Secondly, formation of such a depth profile can also be achieved by previously changing the composition of a target for sputtering. For example, when a target comprising a mixture of Si and $SiO_2$ is to be used, the mixing ratio of Si to $SiO_2$ may be varied in the direction of layer thickness of the target.

The substrate to be used in the present invention may be either electroconductive or insulating. As the electroconductive substrate, there may be mentioned metals such as NiCr, stainless steel, Al, Cr, Mo, Au, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the light-receiving member 1004 in FIG. 10 is to be used as the light-receiving member for electrophotography, it may desirably be formed into an endless belt or a cylinder for use in continuous high speed copying. The substrate may have a thickness, which is conveniently determined so that the light-receiving member as desired may be formed. When the light-receiving member is required to have a flexibility, the substrate is made as thin as possible, so far as the function of a support can be exhibited. However, in such a case, the thickness is generally $10\mu$ or more from the points of fabrication and handling of the substrate as well as its mechanical strength.

Figure 10A:
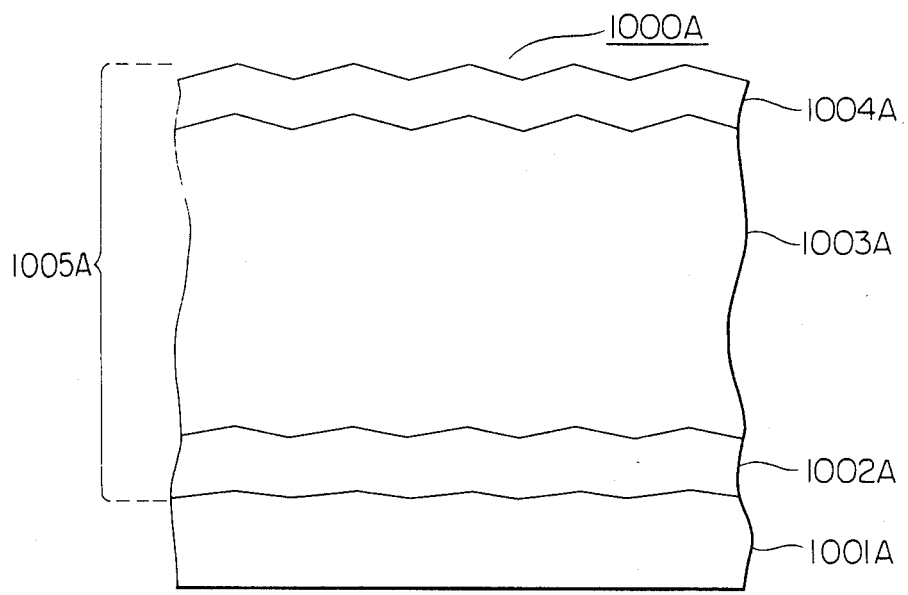

Referring now to FIG. 10A, another preferred embodiment of the light-receiving member of the present invention having a multi-layer constitution is to be described.

The light-receiving member 1000A shown in FIG. 10A has a light-receiving layer 1005A on a substrate 1001A which is subjected to surface cutting working so as to achieve the objects of the invention, said light-receiving layer 1005A being constituted of a charge injection preventive layer 1002A, a photosensitive layer 1003A and a surface layer 1004A from the side of the substrate 1001A.

In the light-receiving member 1000A shown in FIG. 10A, the substrate 1001A, the photosensitive layer 1003A, the surface layer 1004A are the same as the substrate 1001, the second layer (S) 1003 and the surface layer 1006, respectively, in the light sensitive member 1000 as shown in FIG. 10.

The charge injection preventive layer 1002A is provided for the purpose of preventing injection of charges into the photosensitive layer 1003A from the substrate 1001A side, thereby increasing apparent resistance.

The charge injection preventive layer 1002A is constituted of A-Si containing hydrogen atoms and/or halogen atoms (X) (hereinafter written as "A-Si(H,X)") and also contains a substance (C) for controlling conductivity.

In the present invention, the content of the substance (C) for controlling conductivity contained in the charge injection preventive layer 1002A may be suitably be selected depending on the charge injection preventing characteristic required, or when the charge injection preventive layer 1002A is provided on the substrate 1001A directly contacted therewith, the organic relationship such as relation with the characteristic at the contacted interface with the substrate 1001A. Also, the content of the substance (C) for controlling conductivity is selected suitably with due considerations of the relationships with characteristics of other layer regions provided in direct contact with the above large injection preventive layer or the characteristics at the contacted interface with said other layer regions.

The content of the substance (C) for controlling conductivity contained in the large injection preventive layer 1002A should preferably be 0.001 to $5\times10^4$ atomic ppm, more preferably 0.5 to $1\times10^4$ atomic ppm, most preferably 1 to $5\times10^3$ atomic ppm.

By making the content of the substance (C) in the charge injection preventive layer 1002A preferably 30 atomic ppm or more, more preferably 50 atomic ppm or more, most preferably 100 atomic ppm or more, for example, in the case when the substance (C) to be incorporated is a p-type impurity mentioned above, migration of electrons injected from the substrate side into the photosensitive layer 1005A can be effectively inhibited when the free surface of the light-receiving layer 1005A is subjected to the charging treatment to ⊕ polarity. On the other hand, when the substance (C) to be incorporated is a n-type impurity as mentioned above, migration of positive holes injected from the substrate 1001A side into the photosensitive layer 1005A can be more effectively inhibited when the free surface of the light-receiving layer 1005A is subjected to the charging treatment to ⊖ polarity.

The charge injection preventive layer 1002A may have a thickness preferably of 30 Å to $10\mu$, more preferably of 40 Å to $8\mu$, most preferably of 50 Å to $5\mu$.

The photosensitive layer 1003A may contain a substance for controlling conductivity of the other polarity than that of the substance for controlling conductivity contained in the charge injection preventive layer 1002A, or a substance for controlling conductivity of the same polarity may be contained therein in an amount by far smaller than that practically contained in the charge injection preventive layer 1002A.

In such a case, the content of the substance for controlling conductivity contained in the above photosensitive layer 1003A can be determined adequately as desired depending on the polarity or the content of the substance contained in the charge injection preventive layer 1002A, but it is preferably 0.001 to 1000 atomic ppm, more preferably 0.05 to 500 atomic ppm, most preferably 0.1 to 200 atomic ppm.

When the same kind of a substance for controlling conductivity is contained in the charge injection preventive layer 1002A and the photosensitive layer 1003A, the content in the photosensitive layer 1003A should preferably be 30 atomic ppm or less.

In the light-receiving member 1000A as shown in FIG. 10A, the amount of hydrogen atoms (H) or the amount of halogen atoms (X) or the sum of the amounts of hydrogen atoms and halogen atoms (H+X) to be contained in the charge injection preventive layer 1002A should preferably be 1 to 40 atomic %, more preferably 5 to 30 atomic %.

As halogen atoms (X), F, Cl, Br and I may be included and among them, F and Cl may preferably be employed.

In the light-receiving member shown in FIG. 10A, a so-called barrier layer comprising an electrically insulating material may be provided in place of the charge injection preventive layer 1002A. Alternatively, it is also possible to use said barrier layer in combination with the charge injection preventive layer 1002A.

As the material for forming the barrier layer, there may be included inorganic insulating materials such as $Al_2O_3$, $SiO_2$, $Si_3N_4$, etc. or organic insulating materials such as polycarbonate, etc.

The light-receiving layer 1000A shown in FIG. 10A can accomplish the objects of the present invention more effectively by incorporating either one of oxygen atoms and nitrogen atoms in the light-receiving layer 1005A, similarly as in the light-receiving layer 1000 in the light-receiving member 1004 shown in FIG. 10.

Figure 26:
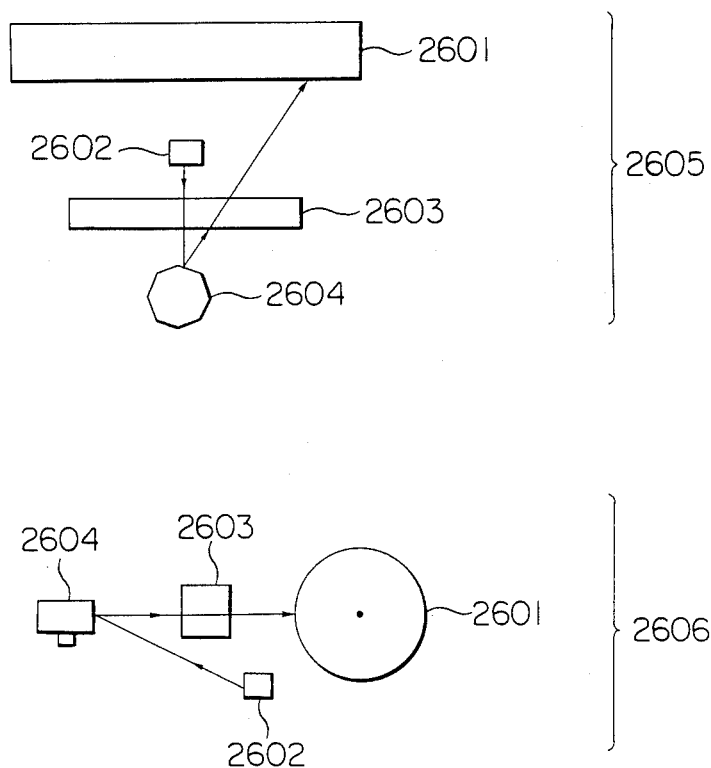
FIG. 26 is a schematic illustration of the image forming device employed in Examples.

FIG. 26 is a schematic illustration of an example of the image forming device employing electrophotographic technique in which the light-receiving member of the present invention is mounted.

In this Figure, 2601 is a drum-shaped light-receiving member of the present invention prepared for use in electrophotography, 2602 is a semiconductor laser device which the light source for applying exposure on the light-receiving member 2601 corresponding to the information to be recorded, 2603 is a $f\theta$ lens, 2604 is a polygon-mirror, 2605 shows the plane view of the device and 2606 shown the side view of the device.

In FIG. 26, devices to be generally employed for practicing electrophotographic image formation, such as developing device, transfer device, fixing device, cleaning device, etc., are not shown.

Next, an example of the process for producing the light-receiving member of this invention is to be briefly described.

Figure 20:
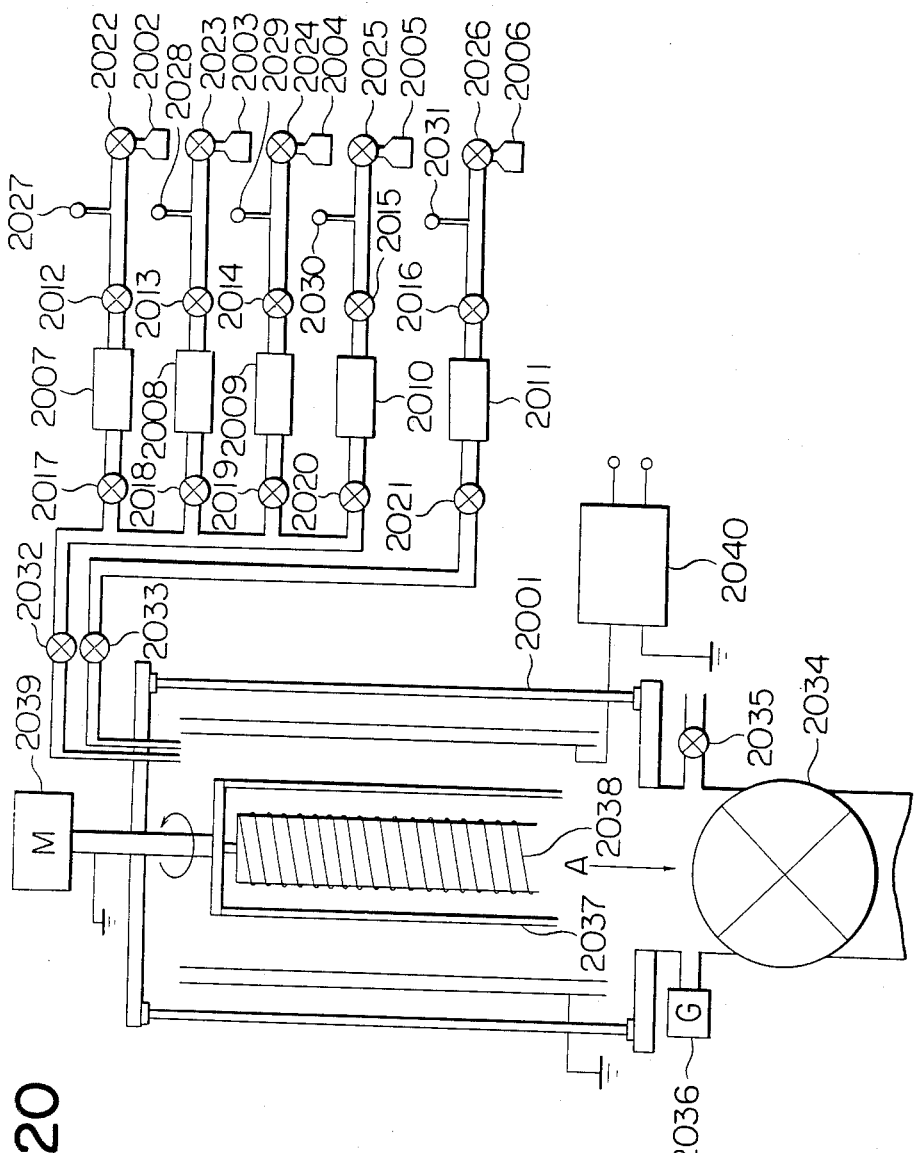
FIG. 20 and FIG. 63 are schematic illustrations of the vacuum deposition devices for preparation of the light-receiving members employed in Examples.

FIG. 20 shows one example of a device for producing a light-receiving member.

In the gas bombs 2002 to 2006, there are hermetically contained starting gases for formation of the light-receiving member of the present invention For example, 2002 is a bomb containing $SiH_4$ gas (purity 99.999%, hereinafter abbreviated as $SiH_4$), 2003 is a bomb contaiing $GeH_4$ (purity 99.999%, hereinafter abbreviated as $GeH_4$), 2004 is a bomb containing NO gas (purity 99.99%, hereinafter abbreviated as NO), 2005 is bomb containing $B_2H_6$ gas diluted with $H_2$ (purity 99.999%, hereinafter abbreviated as $B_2H_6/H_2$) and 2006 is a bomb containing $H_2$ gas (purity: 99.999%).

For allowing these gases to flow into the reaction chamber 2001, on confirmation of the valves 2022 to 2026 of the gas bombs 2002 to 2006 and the leak valve 2035 to be closed, and the inflow valves 2012 to 2016, the outflow valves 2017 to 2021 and the auxiliary valves 2032 and 2033 to be opened, the main valve 2034 is first opened to evacuate the reaction chamber 2001 and the gas pipelines. As the next step, when the reading on the vacuum indicator 2036 becomes $5 \times 10^{-6}$ Torr, the auxiliary valves 2032, 2033 and the outflow valves 2017 to 2021 are closed.

Referring now to an example of forming a light-receiving layer on the cylindrical substrate 2037, $SiH_4$ gas from the gas bomb 2002, $GeH_4$ gas from the gas bomb 2003, NO gas from the gas bomb 2004, $B_2H_6/H_2$ gas from the gas bomb 2005 and $H_2$ gas from the gas bomb 2006 are permitted to flow into the mass-flow controllers 2007, 2008, 2009, 2010 and 2011, respectively, by opening the valves 2022, 2023, 2024, 2025 and 2026 and controlling the pressures at the output pressure gauges 2027, 2028, 2029 2030 and 2031 to 1 $Kg/cm^2$ and opening gradually the inflow valves 2012, 2013, 2014, 2015 and 2016, respectively. subsequently, the outflow valves 2017, 2018, 2019, 2020 and 2021 and the auxiliary valves 2032 and 2033 were gradually opened to permit respective gases to flow into the reaction chamber 2001. The outflow valves 2017, 2018, 2019, 2020 and 2021 are controlled so that the flow rate ratio of $SiH_4$ gas, $GeH_4$ gas, $B_2H_6/H_2$ gas, NO gas and $H_2$ may have a desired value and opening of the main valve 2034 is also controlled while watching the reading on the vacuum indicator 2036 so that the pressure in the reaction chamber 2001 may reach a desired value. And, after confirming that the temperature of the substrate 2037 is set at 50° to 400° C. by the heater 2038, the power source 2040 is set at a desired power to excite glow discharge in the reaction chamber 2001, simultaneously with controlling of the distributed concentrations of germanium atoms and boron atoms to be contained in the layer formed by carrying out the operation to change gradually the openings of the valves 2018, 2020 by the manual method or by means of an externally driven motor, etc. thereby changing the flow rates of $GeH_4$ gas and $B_2H_6$ gas according to previously designed change rate curves.

By maintaining the glow discharge as described above for a desired period time, the first layer (G) is formed on the substrate 2037 to a desired thickness. At the stage when the first layer (G) is formed to a desired thickness, the second layer (S) containing substantially no germanium atom can be formed on the first layer (G) by maintaining glow discharge according to the same conditions and procedure as those in formation of the first layer (G) except for closing completely the outflow valve 2018 and changing, if desired, the discharging conditions. Also, in the respective layers of the first layer (G) and the second layer (S), by opening or closing as desired the outflow valves 2019 or 2020, oxygen atoms or boron atoms may be contained or not, or oxygen atoms or boron atoms may be contained only in a part of the layer region of the respective layers.

When nitrogen atoms are to be contained in place of oxygen atoms, layer formation may be conducted by replacing NO gas in the gas bomb 2004 with $NH_3$ gas or $N_2$ gas. Also, when the kinds of the gases employed are desired to be increased, bombs of desirable gases may be provided additionally before carrying out layer formation similarly. During layer formation, for uniformization of the layer formation, it is desirable to rotate the substrate 2037 by means of a motor 2039 at a constant speed.

The present invention is described in more detail by referring to the following Examples.

EXAMPLE 1

By means of a lathe, an aluminum substrate was worked to have the surface characteristic of No. 101 A shown in Table 1A.

Next, by use of the deposition device shown in FIG. 20, following various procedures under the conditions as shown in Table 2A, a light-receiving member for electrophotography of A-Si was deposited on the above aluminum substrate.

The layer thickness distribution of the light-receiving member for electrophotography of A-Si:H thus prepared was measured by an electron microscope to find that the average layer thickness difference was 0.1 μm between the center and both ends of the A-Ge:H layer and 2 μm between the center and both ends of the A-Si:H layer, with the layer thickness difference at the minute portion being less than 0.1 μm in the A-SiGe:H layer and 0.3 μm in the A-Si:H layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 2

By means of a lathe, an aluminum substrate was worked by the same manner as in Example 1 to have the surface characteristic of No. 102 A shown in Table 1A.

Next, by use of the deposition device shown in FIG. 20, following the same procedures as in Example 1 under the conditions as shown in Table 3A, a light-receiving member for electrophotography of A-Si was deposited on the above aluminum substrate.

The layer thickness distribution of the light-receiving member for electrophotography of A-Si:H thus prepared was measured by an electron microscope to find that the average layer thickness difference was 0.1 μm between the center and both ends of the A-SiGe:H layer and 2 μm between the center and both ends of the A-Si:H layer, with the layer thickness difference at the minute portion being less than 0.1 μm in the A-SiGe:H layer and 0.3 μm in the A-Si:H layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 3

By means of a lathe, an aluminum substrate was worked by the same manner as in Example 1 to have the surface characteristic of No. 103 A shown in Table 1A.

Next, by use of the deposition device shown in FIG. 20, following the same procedures as in Example 1 under the conditions as shown in Table 4A, a light-receiving member for electrophotography of A-Si was deposited on the above aluminum substrate.

The layer thickness distribution of the light-receiving member for electrophotography of A-Si:H thus prepared was measured by an electron microscope to find that the average layer thickness difference was 0.6 μm between the center and both ends of the A-SiGe:H layer and 2 μm between the center and both ends of the A-Si:H layer, with the layer thickness difference at the minute portion being 0.1 μm in the A-SiGe:H layer and 0.3 μm in the A-Si:H layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 4

By means of a lathe, an aluminum substrate was worked by the same manner as in Example 1 to have the surface characteristic of No. 104 A shown in Table 1A.

Next, by use of the deposition device shown in FIG. 20, following the same procedure as in Example 1 under the conditions as shown in Table 5A, a light-receiving member for electrophotography of A-Si was deposited on the above aluminum substrate.

The layer thickness distribution of the light-receiving member for electrophotography of A-Si:H thus prepared was measured by an electron microscope to find that the average layer thickness difference was 0.8 μm between the center and both ends of the A-SiGe:H layer and 2 μm between the center and both ends of the A-Si:H layer, with the layer thickness difference at the minute portion being 0.15 μm in the A-SiGe:H layer and 0.3 μm in the A-Si:H layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 5

On an aluminum substrate having the same shape as in Example 1, a light-receiving layer comprising a first layer, a second layer and a surface layer was deposited in the following manner.

First, explanation is made about the different points from Example 1 in the device shown in FIG. 20. In this Example, during deposition of the first layer, a target for sputtering comprising Si and Ge with a thickness of 5 mm was placed on the surface of the cathode electrode; during deposition of the second layer, a target for sputtering comprising Si with a thickness of 5 mm on the surface of the cathode electrode; and during deposition of the surface layer, a target for sputtering comprising Si and a target for sputtering comprising graphite with area ratio as shown in Table 6A on the surface.

Next, the preparation procedure is to be explained. Similarly as in Example 1, the inner pressure of the deposition device was reduced to $10^{-7}$ Torr, and the aluminum substrate temperature was maintained constantly at 250° C. Then, by permitting Ar gas to flow at 200 SCCM and $H_2$ gas at 100 SCCM, the main valve 2034 was controlled so that the inner pressure within the deposition device may become $5 \times 10^{-3}$ Torr. And, by means of a high frequency power source, a high frequency power of 300 W was charged between the cathode electrode and the aluminum substrate to excite glow discharging. Thus, a first layer was deposited to 5

μm. Then, the target comprising Si and Ge was replaced with the target comprising Si, and a second layer was deposited under the same conditions to 20 μm thickness.

Thereafter, the target comprising Si was removed and replaced with the target comprising Si and the target comprising graphite, and a surface layer was deposited to 0.3 μm under the same conditions. The surface of the surface layer was found to be substantially parallel to the surface of the second layer.

The conditions during preparation of the surface layer were changed as shown in Table 6A to prepare light-receiving members.

Each of the thus prepared light-receiving members for electrophotography was subjected to image exposure with laser beam in the same manner as in Example 1 and the steps of image formation, developing and cleaning were repeated for 50,000 times and then image evaluation was conducted to obtain the results as shown in Table 6A.

EXAMPLE 6

Light-receiving members for electrophotography were prepared, respectively, in the same manner as in Example 1 except for varying the content ratios of silicon atoms to carbon atoms in the surface layer by varying the flow rate ratios of $SiH_4$ gas to $CH_4$ gas during formation of the surface layer. Each of the thus prepared light-receiving members for electrophotography was subjected to image exposure with laser beam in the same manner as in Example 1 and the steps of image formation, developing and cleaning were repeated for 50,000 times and then image evaluation was conducted to obtain the results as shown in Table 7A.

EXAMPLE 7

Light-receiving members for electrophotography were prepared, respectively, in the same manner as in Example 1 except for varying the content ratios of silicon atoms to carbon atoms in the surface layer by varying the flow rate ratios of $SiH_4$ gas, $SiF_4$ gas and $CH_4$ gas during formation of the surface layer.

Each of the thus prepared light-receiving members for electrophotography was subjected to image exposure with laser beam in the same manner as in Example 1 and the steps of image formation, developing and cleaning were repeated for 50,000 times and then image evaluation was conducted to obtain the results as shown in Table 8A.

EXAMPLE 8

Light-receiving members for electrophotography were prepared, respectively, in the same manner as in Example 1 except for varying the layer thickness of the surface layer. For each of the thus prepared light-receiving members for electrophotography the steps of image formation, developing and cleaning were repeated similarly as in Example 1 to obtain the results as shown in Table 9A.

EXAMPLE 9

Light-receiving members for electrophotography were prepared in the same manner as in Example 1 except for changing the discharging power during preparation of the surface layer to 300 W and making the average layer thickness 2 μm. The average layer thickness difference in the surface layer of the light-receiving member for electrophotography was found to be 0.5 μm between the center and both ends thereof, with the layer thickness difference at the minute portion being 0.1 μm.

In such a light-receiving member, no interference fringe was observed, and when the steps of image formation, developing and cleaning were repeated by means of the same device as in Example 1, practically satisfactory durability could be obtained.

EXAMPLE 10

Figure 21:
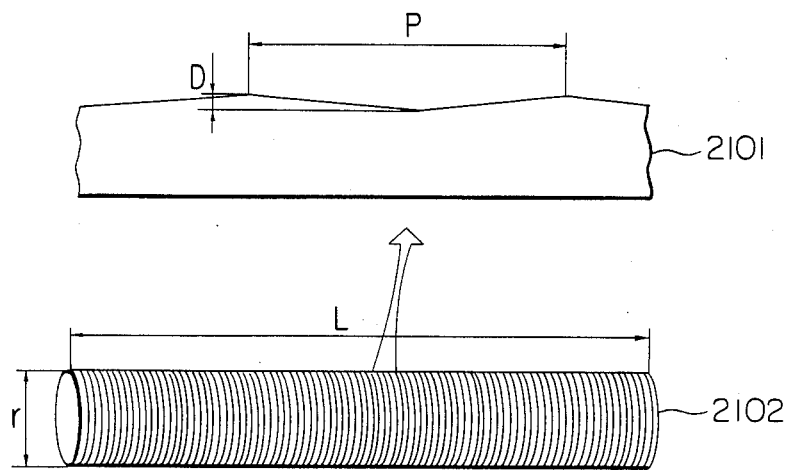
FIG. 21, FIG. 64 and FIG. 65 are schematic illustrations of the surface states of the aluminum substrates employed in Examples.

In this Example, a semiconductor laser (wavelength 780 nm) with a spot diameter of 80 μm was employed. Accordingly, by means of a lathe, a spiral groove with a pitch (P) of 25 μm and a depth (D) of 0.8 S was made on a cylindrical aluminum substrate (length (L): 357 mm, outer diameter (r): 80 mm) on which A-Si:H is to be deposited. The shape of the groove is shown in FIG. 21.

Next, under the conditions as shown in Table 1aB, by use of the film depositing device shown in FIG. 20, following the predetermined operational procedure, an A-Si type light-receiving member for electrophotography having surface layers deposited thereon was prepared.

NO gas was introduced by setting the mass flow controller so that the initial value of the NO gas flow rate may be 3.4 vol. % based on the sum of the $SiH_4$ gas flow rate and the $GeH_4$ gas flow rate.

Also, deposition of the surface layer formed primarily of silicon atoms and carbon atoms was carried out as follows.

That is, after deposition of the second layer, the respective mass flow controllers corresponding to the respective gases were set so that the $CH_4$ gas flow rate relative to the $SiH_4$ gas flow rate may be $SiH_4/CH_4 = 1/30$, and glow discharging was excited at a high frequency power of 300 W to form the surface layer.

Figure 64:
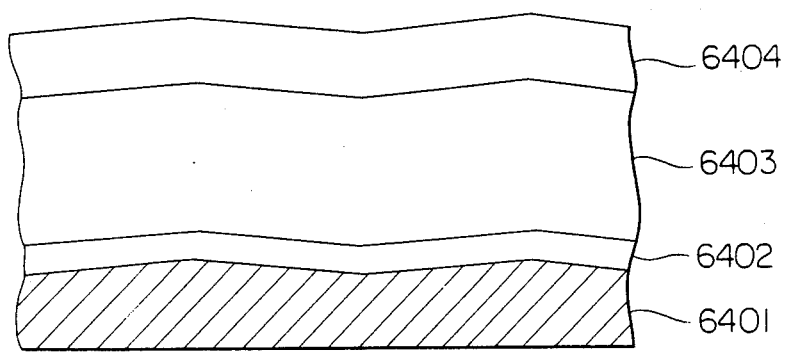

Separately, when the first layer, the second layer and the surface layer were formed on the cylindrical aluminum substrate with the same surface characteristic according to the same conditions and preparation means as described above except for changing the high frequency power to 40 W, the surface of the light-receiving layer was found to be parallel to the surface of the substrate 1301 as shown in FIG. 64. The layer thickness difference in the entire thickness between the center and both ends of the aluminum substrate was found to be 1 μm.

Figure 65:
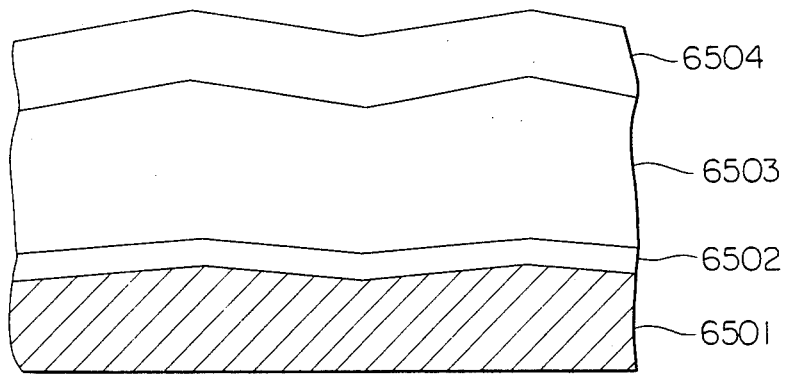

Also, when the above high frequency power was changed to 160 W, the surface of the light-receiving layer and the surface of the substrate 1401 were found to be non-parallel to each other as shown in FIG. 65. In this case, the average layer thickness difference between the center and both ends of the aluminum substrate was 2 μm.

For the two kinds of light-receiving members for electrophotography as described above, image exposure was conducted by means of the device as shown in FIG. 26 with a semiconductor laser of 780 nm wavelength at a spot diameter of 80 μm, followed by developing and transfer to obtain an image. In the light-receiving member with the surface characteristic as shown in FIG. 64 at a high frequency power of 40 W during layer formation, an interference fringe pattern was observed.

On the other hand, in the light-receiving member having the surface characteristic as shown in FIG. 65, no interference fringe pattern was observed to give a product exhibiting practically satisfactory electrophotographic characteristics.

EXAMPLE 11

The surfaces of cylindrical aluminum substrates were worked by a lathe under the conditions as shown in Table 1B. On these cylindrical aluminum substrates (Sample Nos. 101B–108B), light-receiving members for electrophotography were prepared under the same condition as in Example 10 when no interference fringe pattern was observed (high frequency power 160 W) (Sample Nos. 111B–118B).

The average layer thickness difference between the center and both ends of the aluminum substrate of the light-receiving member for electrophotography was found to be 2.2 μm.

The cross-sections of these light-receiving members for electrophotography were observed by an electron microscope for measurement of the difference within the pitch in the second layer to give the results as shown in Table 2B. For these light-receiving members, similarly as in Example 10, by use of a semiconductor laser of 780 nm wavelength in the device as shown in FIG. 26, image exposure was effected at a spot diameter of 80 μm to obtain the results shown in Table 2B.

EXAMPLE 12

Light-receiving members were prepared under the same conditions as in Example 11 except for the following points. The layer thickness of the first layer was made 10 μm, and the average layer thickness difference between the center and both ends of the first layer was 1.2 μm, with the average difference in layer thickness between the center and both ends of the second layer being 2.3 μm. The thicknesses of the respective layers of No. 121B–128B were measured by an electron microscope to give the results as shown in Table 3B. For these light-receiving members, image exposure was conducted in the same image exposure device as in Example 10 obtain the results shown in Table 3B.

EXAMPLE 13

Light-receiving members having the first layer containing nitrogen provided on aluminum substrates (Nos. 101B–108B) having the surface characteristics shown in Table 1B were prepared under the conditions shown in Table 4B (Sample Nos. 401B–408B).

The cross-sections of the light-receiving members prepared under the above conditions were observed by an electron microscope. The average layer thickness difference between the center and both ends of the first layer was found to be 0.09 μm, while that of the second layer 3 μm.

The layer thickness difference within short ranges in the second layer of the respective light-receiving members were the values as shown in Table 5B. When these light-receiving members were subjected to image exposure, respectively, with laser beam, similarly as in Example 10, the results as shown in Table 5B were obtained.

EXAMPLE 14

Light-receiving members having the first layer containing nitrogen provided on aluminum substrates (Nos. 101B–108B) having the surface characteristics shown in Table 1B were prepared under the conditions shown in Table 6B (Sample Nos. 501B–508B).

The cross-sections of the light-receiving members prepared under the above conditions were observed by an electron microscope. The average layer thickness difference between the center and both ends of the first layer was found to be 0.3 μm, while that of the second layer 3.2 μm.

The layer thickness differences within short ranges in the second layer of the respective light-receiving members were the values as shown in Table 7B. When these light-receiving members were subjected to image exposure, respectively, with laser beam, similarly as in Example 10, the results as shown in Table 7B were obtained.

EXAMPLE 15

Light-receiving members having the first layer containing oxygen provided on aluminum substrates (Nos. 101B–108B) having the surface characteristics shown in Table 1B were prepared under the conditions shown in Table 8B (Sample Nos. 901B–908B).

The cross-sections of the light-receiving members prepared under the above conditions were observed by an electron microscope. The average layer thickness difference between the center and both ends of the first layer was found to be 0.08 μm, while that of the second layer 2.5 μm.

The layer thickness differences within short ranges in the second layer of the respective light-receiving members were the values as shown in Table 9B. When these light-receiving members were subjected to image exposure, respectively, with laser beam, similarly as in Example 10, the results as shown in Table 9B were obtained.

EXAMPLE 16

Light-receiving members having the first layer containing oxygen provided on aluminum substrates (Nos. 101B–108B) having the surface characteristics shown in Table 1B were prepared under the conditions shown in Table 10B (Sample Nos. 1101B–1108B).

The cross-sections of the light-receiving members prepared under the above conditions were observed by an electron microscope. The average layer thickness difference between the center and both ends of the first layer was found to be 1.1 μm, while that of the second layer 3.4 μm.

The layer thickness differences within short ranges in the second layer of the respective light-receiving members were the values as shown in Table 11B. When these light-receiving members were subjected to image exposure, respectively, with laser beam, similarly as in Example 10, the results as shown in Table 11B were obtained.

EXAMPLE 17

A light-receiving member was prepared under the same conditions as in Example 10 in the case of a high frequency power of 160 W except that the NO gas flow rate was changed during formation of the first layer relative to the sum of the $SiH_4$ gas flow rate and the $GeH_4$ gas flow rate as shown in FIG. 49 until the NO gas flow rate may become zero on completion of layer formation. Separately, when the first layer and the second layer were formed on the substrate according to the same conditions and preparation means as described above except for changing the high frequency power to 40 W, the surface of the light-receiving layer was found to be parallel to the surface of the substrate 1301 as shown in FIG. 64. The layer thickness difference in the entire thickness between the center and both ends of the aluminum substrate was found to be 1 μm.

Also, when the above high frequency power was changed to 160 W, the surface of the second layer 1403 and the surface of the substrate 1401 were found to be non-parallel to each other as shown in FIG. 65. In this case, the average layer thickness difference between the center and both ends of the aluminum substrate was 2 μm.

For the two kinds of light-receiving members for electrophotography as described above, image exposure was conducted by means of the device as shown in FIG. 26 with a semiconductor laser of 780 nm wavelength at a spot diameter of 80 μm, followed by developing and transfer to obtain an image. In the light-receiving member with the surface characteristic as shown in FIG. 64 at a high frequency power of 40 W during layer formation, an interference fringe pattern was observed.

On the other hand, in the light-receiving member having the surface characteristic as shown in FIG. 65, no interference fringe pattern was observed to give a produce exhibiting practically satisfactory electrophotographic characteristics.

EXAMPLE 18

The surfaces of cylindrical aluminum substrates were worked by a lathe under the conditions as shown in Table 1B. On these cylindrical aluminum substrates (Sample Nos. 101B–108B), light-receiving members for electrophotography were prepared under the same condition as in Example 17 when no interference fringe pattern was observed (high frequency power 160 W) (Sample Nos. 1201B–1208B).

The average layer thickness difference between the center and both ends of the aluminum substrate of the light-receiving member for electrophotography was found to be 2.2 μm.

The cross-sections of these light-receiving members for electrophotography were observed by an electron microscope for measurement of the difference within the pitch in the second layer to give the results as shown in Table 12B. For these light-receiving members, similarly as in Example 17, by use of a semiconductor laser of 780 nm wavelength in the device as shown in FIG. 26, image exposure was effected at a spot diameter of 80 μm to obtain the results shown in Table 12B.

EXAMPLE 19

Light-receiving members were prepared under the same conditions as in Example 18 except for the following points. The layer thickness of the first layer was made 10 μm, and the average layer thickness difference between the center and both ends of the first layer was 1.2 μm, with the average difference in layer thickness between the center and both ends of the second layer being 2.3 μm. The thicknesses of the respective layers of No. 1301B–1308B were measured by an electron microscope to give the results as shown in Table 13B. For these light-receiving members, image exposure was conducted in the same image exposure device as in Example 10 to obtain the results shown in Table 13B.

EXAMPLE 20

Light-receiving members having the first layer containing nitrogen provided on aluminum substrates (Nos. 101B–108B) having the surface characteristics shown in Table 1B were prepared following the same conditions and procedure as in Example 18 except for changing the conditions to that shown in Table 14B (Sample Nos. 1501B–1508B).

The cross-sections of the light-receiving members prepared under the above conditions were observed by an electron microscope. The average layer thickness difference between the center and both ends of the first layer was found to be 0.09 μm, while that of the second layer 3 μm.

The layer thickness differences within short ranges in the second layer of the respective light-receiving members were the values as shown in Table 15B.

When these light-receiving members were subjected to image exposure, respectively, with laser beam, similarly as in Example 10, the results as shown in Table 15B were obtained.

EXAMPLE 21

Light-receiving members having the first layer containing nitrogen provided on aluminum substrates (Nos. 101B–108B) having the surface characteristics shown in Table 1B were prepared following the same conditions and procedure as in Example 18 except for using the conditions shown in Table 16B (Sample Nos. 1701B–1708B).

The cross-sections of the light-receiving members prepared under the above conditions were observed by an electron microscope. The average layer thickness difference between the center and both ends of the first layer was found to be 0.3 μm, while that of the photosensitive layer 0.3 μm.

The layer thickness differences within short ranges in the respective light-receiving members (Sample Nos. 1701B–1708B) were the values as shown in Table 17B.

When these light-receiving members were subjected to image exposure, respectively, with laser beam, similarly as in Example 10, the results as shown in Table 17B were obtained.

EXAMPLE 22

Light-receiving members having the first layer containing oxygen provided on aluminum substrates (Nos. 101B–108B) having the surface characteristics shown in Table 1B were prepared following the same conditions and procedure as in Example 18 except for using the conditions shown in Table 18B (Sample Nos. 1901B–1908B).

The cross-sections of the light-receiving members prepared under the above conditions were observed by an electron microscope. The average layer thickness difference between the center and both ends of the first layer was found to be 0.08 μm, while that of the photosensitive layer 2.5 μm.

The layer thickness differences within short ranges in the respective light-receiving members (Sample Nos. 1901B–1908B) were the values as shown in Table 19B.

When these light-receiving members were subjected to image exposure, respectively, with laser beam, similarly as in Example 10, the results as shown in Table 19B were obtained.

EXAMPLE 23

Light-receiving members having the first layer containing oxygen provided on aluminum substrates (Nos. 101B–108B) having the surface characteristics shown in Table 1B were prepared following the same conditions and procedure as in Example 18 except for the conditions shown in Table 20B (Sample Nos. 2101B–2108B).

The cross-sections of the light-receiving members prepared under the above conditions were observed by an electron microscope. The average layer thickness difference between the center and both ends of the first layer was found to be 1.1 μm, while that of the photosensitive layer 3.4 μm.

The layer thickness differences within short ranges in the second layers of respective light-receiving members (Sample Nos. 2101B–2108B) were the values as shown in Table 21B.

When these light-receiving members were subjected to image exposure, respectively, with laser beam, similarly as in Example 10, the results as shown in Table 21B were obtained.

EXAMPLE 24

By means of the device shown in FIG. 20, on a cylindrical aluminum substrate (cylinder No. 105B), under the respective conditions as shown in Table 22B to Table 25B, layer formation was carried out while changing the gas flow rate ratio of NO and $SiH_4$ with lapse of time for layer formation according to the change rate curves shown in FIG. 66 to FIG. 69 to prepare respective light-receiving members for electrophotography (Sample Nos. 2202B–2204B).

Each of the thus obtained light-receiving members was evaluated of its characteristics according to the same conditions and means as in Example 10 to find that there was no interference fringe pattern observed with naked eyes at all, and satisfactorily good electrophotographic characteristics suitable for the object of the invention could be exhibited.

EXAMPLE 25

Figure 66:
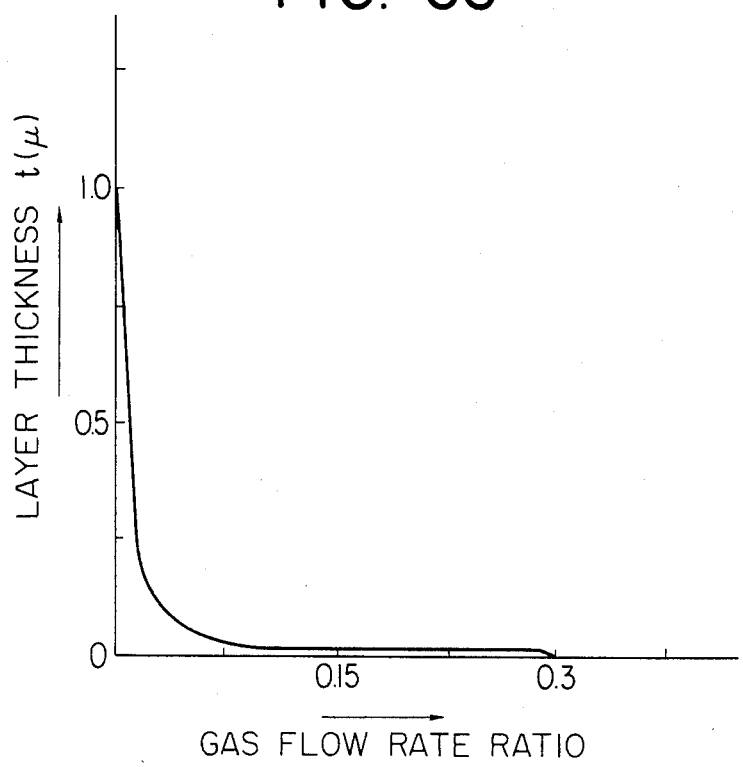
Figure 67:
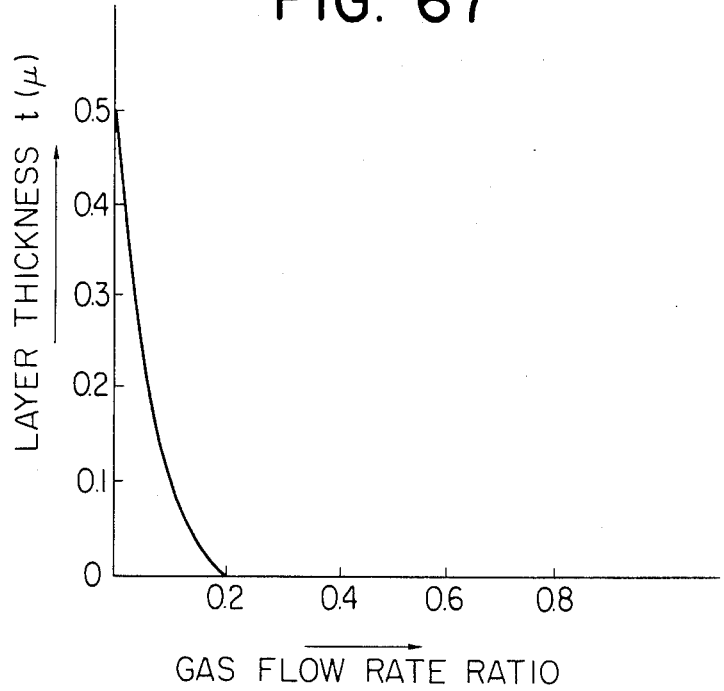

By means of the device shown in FIG. 20, on a cylindrical aluminum substrate (cylinder No. 105B), under the respective conditions as shown in Table 26B, layer formation was carried out while changing the gas flow rate ratio of NO and $SiH_4$ with lapse of time for layer formation according to the change rate curve shown in FIG. 66 to prepare respective light-receiving members for electrophotography.

The thus obtained light-receiving member was evaluated of its characteristics according to the same conditions and means as in Example 10 to find that there was no interference fringe pattern observed with naked eyes at all, and satisfactorily good electrophotographic characteristics suitable for the object of the invention could be exhibited.

EXAMPLE 26

Figure 68:
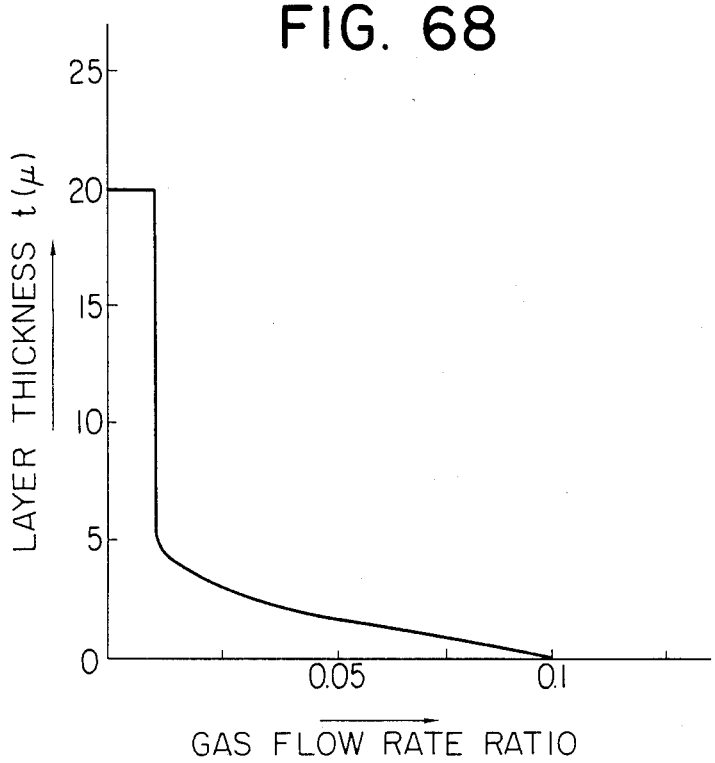
Figure 69:
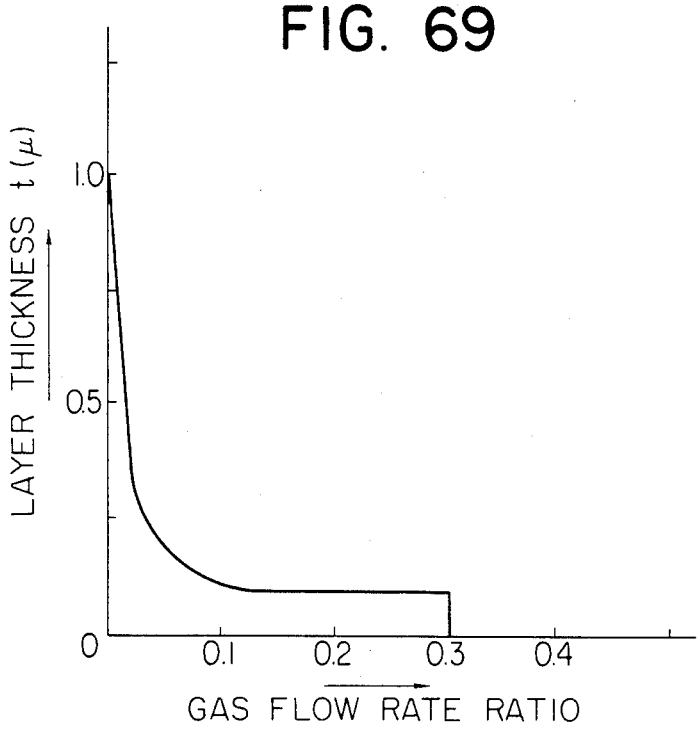

By means of the device shown in FIG. 20. on a cylindrical aluminum substrate (cylinder No. 105B), under the respective conditions as shown in Table 27B to Table 28B, layer formation was carried out while changing the gas flow rate ratio of $NH_3$ and $SiH_4$ and the gas flow rate ratio of $N_2O$ and $SiH_4$ with lapse of time for layer formation according to the change rate curve shown in FIG. 68 to prepare respective light-receiving members for electrophotography (Sample Nos. 2206B–2207B).

Each of the thus obtained light-receiving members was evaluated of its characteristics according to the same conditions and means as in Example 10 to find that there was no interference fringe pattern observed with naked eyes at all, and satisfactorily good electrophotographic characteristics suitable for the object of the invention could be exhibited.

EXAMPLE 27

By using the aluminum substrate (length (L) 357 mm, outer diameter (r) 80 mm) as employed in Example 10 and forming the surface layer according to the sputtering method, otherwise following the same conditions and procedure as in Example 10, A-Si type light-receiving members for electrophotography were prepared (Sample Nos. 2901B–2907B). During these operations, the contents of Si and C were changed as shown in Table 29B by changing the areas of Si target and C target.

Formation of the surface layer was carried out as follows. That is, after formation of the second layer, the substrate having formed layers to said layer was taken out from the deposition device as shown in FIG. 20, the hydrogen ($H_2$) gas bomb in said device was replaced with an argon (Ar) bomb, the device was cleaned internally and a target for sputtering with a thickness of 5 mm comprising Si and a target for sputtering with a thickness of 5 mm comprising graphite were placed on the surface of the cathode electrode so that the area ratio of these targets may be as indicated in Table 29B. Then, the substrate on which the second layer has been formed was set in the device and with introduction of argon gas after evacuation, glow discharging is excited at a high frequency power of 300 W thereby effecting sputtering of materials for the surface layer on the cathode electrode to form the surface layer.

Each of the thus prepared light-receiving members for electrophotography was subjected to image exposure by the image exposure device as shown in FIG. 26 (laser beam wavelength 780 nm, spot diameter 80 μm) and the steps of image formation, developing and cleaning were repeated for 50,000 times and then image evaluation was conducted to obtain the results as shown in Table 29B.

EXAMPLE 28

Light-receiving members for electrophotography were prepared, respectively, in the same manner as in Example 10 in the case when no interference fringe was observed except for varying the content ratio of silicon atoms to carbon atoms in the surface layer by varying the flow rate ratios of $SiH_4$ gas to $CH_4$ gas during formation of the surface layer. Each of the thus prepared light-receiving members for electrophotography was subjected to image exposure with laser beam in the same manner as in Example 10 and the steps of image formation, developing and cleaning were repeated for 50,000 times and then image evaluation was conducted to obtain the results as shown in Table 30B.

EXAMPLE 29

Light-receiving members for electrophotography were prepared, respectively, in the same manner as in Example 10 in the case when no interference fringe was observed except for varying the content ratio of silicon atoms to carbon atoms in the surface layer by varying the flow rate ratios of $SiH_4$ gas, $SiF_4$ gas and $CH_4$ gas during formation of the surface layer.

Each of the thus prepared light-receiving members for electrophotography was subjected to image exposure with laser beam in the same manner as in Example 10 and the steps of image formation, developing and cleaning were repeated for 50,000 times and then image evaluation was conducted to obtain the results as shown in Table 31B.

EXAMPLE 30

Light-receiving members for electrophotography were prepared, respectively, in the same manner as in Example 10 in the case when no interference fringe was observed except for varying the layer thickness of the surface layer. For each of the thus prepared light-receiving members for electrophotography the steps of image formation, developing and cleaning were repeated similarly as in Example 10 to obtain the results as shown in Table 32B.

EXAMPLE 31

Light-receiving member for electrophotography was prepared in the same manner as in Example 10 under the conditions where no interference fringe was observed except for changing the discharging power during preparation of the surface layer to 300 W and making the average layer thickness 2 μm. The average layer thickness difference in the surface layer of the light-receiving member for electrophotography was found to be 0.5 μm between the center and both ends thereof, with the layer thickness difference at the minute portion being 0.1 μm.

In such a light-receiving member, no interference fringe was observed, and when the steps of image formation, developing and cleaning were repeated by means of the same device as in Example 10, practically satisfactory durability could be obtained.

EXAMPLE 32

By means of a lathe, an aluminum substrate (length (L): 357 mm, outerdiameter (r): 80 mm) was worked as shown in FIG. 21 (P: pitch, D: depth) under the conditions shown in Table 2C (Nos. 201C–204C).

Next, light-receiving members for electrophotography of A-Si:H were prepared following various procedures using the deposition device in FIG. 20 under the conditions shown in Table 1C (Sample Nos. 201C–204C).

Figure 22:
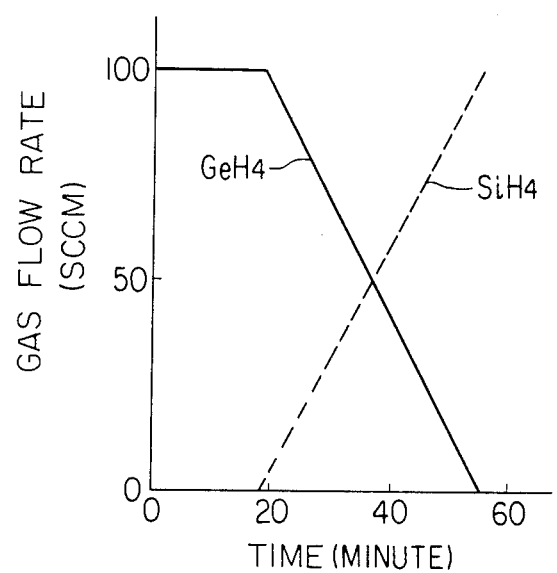
FIGS. 22 through 25, FIGS. 36 through 42, FIGS. 52 through 59, FIGS. 60 through 62, FIGS. 66 through FIGS. 80 are schematic illustrations of the changes in gas flow rates of the respective gases in Examples.

In forming the A-Si:Ge:H layer of the first layer, the respective mass flow controllers for GeH$_4$ and SiH$_4$ were controlled by a computer (HP 9845B) so that the flow rates of GeH$_4$ and SiH$_4$ became those as shown in FIG. 22.

The thickness of each layer of the light-receiving members thus prepared was measured using an electron microscope to obtain the results as shown in Table 2C (Nos. 201C–204C).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 201C–204C, no interference fringe pattern was observed and proved to be satisfactory for practical application.

EXAMPLE 33

By means of a lathe, an aluminum substrate (length (L): 357 mm, outerdiameter (r): 80 mm) was worked as shown in FIG. 21 (P: pitch, D: depth) under the conditions shown in Table 3C (Nos. 301C–304C).

Next, light-receiving members for electrophotography of A-Si:H were prepared following various procedures using the deposition device in FIG. 20 under the conditions shown in Table 1C (Sample Nos. 301C–304C).

Figure 23:
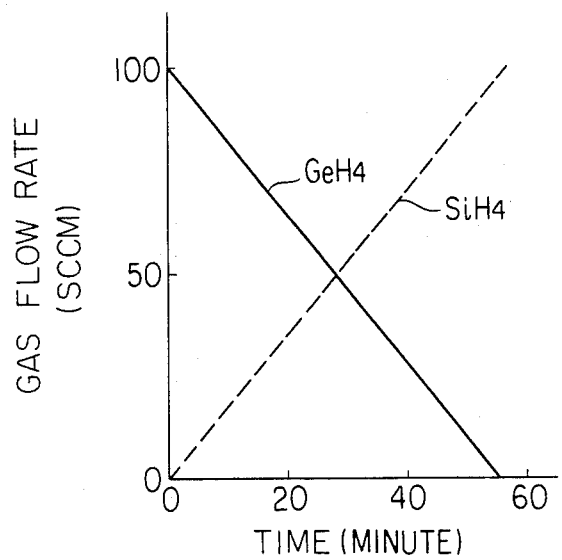

In forming the A-Si:Ge:H layer of the first layer, the respective mass flow controllers for GeH$_4$ and SiH$_4$ were controlled by a computer (HP 9845B) so that the flow rates of GeH$_4$ and SiH$_4$ became those as shown in FIG. 23.

The thickness of each layer of the light-receiving members thus prepared was measured using an electron microscope to obtain the results as shown in Table 3C (Nos. 301C–304C).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 301C–304C, no interference fringe pattern was observed and proved to be satisfactory for practical application.

EXAMPLE 34

By means of a lathe, an aluminum substrate (length (L): 357 mm, outerdiameter (r): 80 mm) was worked as shown in FIG. 21 (P: pitch, D: depth) under the conditions shown in Table 5C (Sample Nos. 501C–504C).

Next, light-receiving members for electrophotography of A-Si:H were prepared following various procedures using the deposition device in FIG. 20 under the conditions shown in Table 4C (Sample Nos. 501C–504C).

Figure 24:
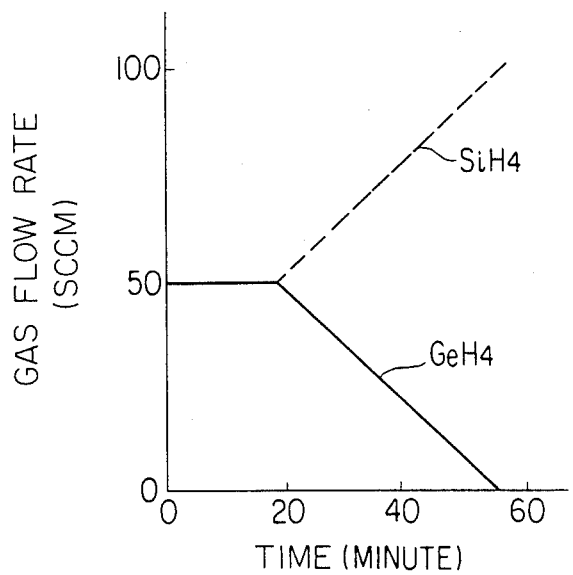

In forming the A-Si:Ge:H layer of the first layer, the respective mass flow controllers for GeH$_4$ and SiH$_4$ were controlled by a computer (HP 9845B) so that the flow rates of GeH$_4$ and SiH$_4$ became those as shown in FIG. 24.

The thickness of each layer of the light-receiving members thus prepared was measured using an electron microscope to obtain the results as shown in Table 5C (Nos. 501C–504C).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 501C–504C, no interference fringe pattern was observed and proved to be satisfactory for practical application.

EXAMPLE 35

By means of a lathe, an aluminum substrate (length (L): 357 mm, outerdiameter (r): 80 mm) was worked as shown in FIG. 21 (P: pitch, D: depth) under the conditions shown in Table 6C (Sample Nos. 601C–604C).

Next, light-receiving members for electrophotography of A-Si:H were prepared following various procedures using the deposition device in FIG. 20 under the conditions shown in Table 4C (Sample Nos. 601C–604C).

Figure 25:
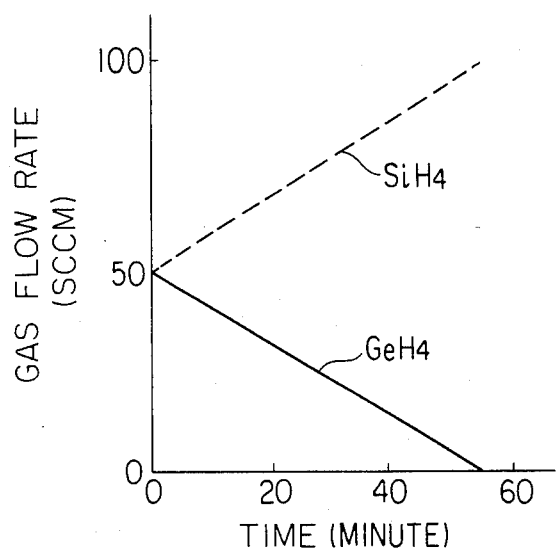

In forming the A-Si:Ge:H layer of the first layer, the respective mass flow controllers for GeH$_4$ and SiH$_4$ were controlled by a computer (HP 9845B) so that the flow rates of GeH$_4$ and SiH$_4$ became those as shown in FIG. 25.

The thickness of each layer of the light-receiving members thus prepared was measured using an electron microscope to obtain the results as shown in Table 6C (Nos. 601C–604C).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 601C–604C, no interference fringe pattern was observed and proved to be satisfactory for practical application.

EXAMPLE 36

On an aluminum substrate having the same shape as Sample No. 201C of Example 32, a light-receiving layer comprising a first layer, a second layer and a surface layer was deposited in the following manner.

First, explanation is made about the points different from Example 32 in the device shown in FIG. 20. In this Example, during deposition of the first layer, a target for sputtering comprisng Si and Ge with a thickness of 5 mm was placed on the surface of the cathode electrode; during deposition of the second layer, a target for sputtering comprising Si with a thickness of 5 mm on the surface of the cathode electrode; and during deposition of the surface layer, a target for sputtering comprising Si and a target for sputtering comprising graphite with area ratio as shown in Table 7C on the surface.

Next, the preparation procedure is to be explained. Similarly as in Example 32, the deposition device was reduced to $10^{-7}$ Torr, and the aluminum substrate temperature was maintained constantly at 250° C. Then, by permitting Ar gas to flow at 200 SCCM and $H_2$ gas at 100 SCCM, the main valve 2034 was controlled so that the inner pressure within the deposition device may become $5 \times 10^{-3}$ Torr. And, by means of a high frequency power source, a high frequency power of 300 W was charged between the cathode electrode and the aluminum substrate to excite glow discharging. Thus, a first layer was deposited to 5 μm. Then, the target comprising Si and Ge was replaced with the target comprising Si, and a second layer was deposited under the same conditions to 20 μm thickness.

Thereafter, the target comprising Si was removed and replaced with the target comprising Si and the target comprising graphite, and a surface layer was deposited to 0.3 μm under the same conditions. The surface of the surface layer was found to be substantially parallel to the surface of the second layer.

The conditions during preparation of the surface layer were changed as shown in Table 7C to prepare light-receiving members.

Each of the thus prepared light-receiving members for electrophotography was subjected to image exposure with laser beam in the same manner as in Example 32 and the steps of image formation, developing and cleaning were repeated for 50,000 times and then image evaluation was conducted to obtain the results as shown in Table 7C.

EXAMPLE 37

Light-receiving members for electrophotography were prepared, respectively, in the same manner as Sample No. 201C in Example 32 except for varying the content ratios of silicon atoms to carbon atoms in the surface layer by varying the flow rate ratios of $SiH_4$ gas to $CH_4$ gas during formation of the surface layer. Each of the thus prepared light-receiving members for electrophotography was subjected to image exposure with laser beam in the same manner as in Example 32 and the steps of image formation, developing and cleaning were repeated for 50,000 times and then image evaluation was conducted to obtain the results as shown in Table 8C.

EXAMPLE 38

Light-receiving members for electrophotography were prepared, respectively, in the same manner as Sample No. 201C in Example 32 except for varying the content ratios of silicon atoms to carbon atoms in the surface layer by varying the flow rate ratios of $SiH_4$ gas, $SiF_4$ gas and $CH_4$ gas during formation of the surface layer.

Each of the thus prepared light-receiving members for electrophotography was subjected to image exposure with laser beam in the same manner as in Example 32 and the steps of image formation, developing and cleaning were repeated for 50,000 times and then image evaluation was conducted to obtain the results as shown in Table 9C.

EXAMPLE 39

Light-receiving members for electrophotography were prepared, respectively, in the same manner as Sample 201C in Example 32 except for varying the layer thickness of the surface layer. For each of the thus prepared light-receiving members for electrophotography the steps of image formation, developing and cleaning were repeated similarly as in Example 32 to obtain the results as shown in Table 10C.

EXAMPLE 40

Light-receiving member for electrophotography was prepared in the same manner as Sample No. 201C in Example 32 except for changing the discharging power during preparation of the surface layer to 300 W and making the average layer thickness 2 μm. The average layer thickness difference in the surface layer of the light-receiving member for electrophotography was found to be 0.5 μm at the center and both ends thereof, with the layer thickness difference at the minute portion being 0.1 μm.

In such a light-receiving member, no interference fringe was observed, and when the steps of image formation, developing and cleaning were repeated by means of the same device as in Example 32, practically satisfactory durability could be obtained.

EXAMPLE 41

By means of a lathe, an aluminum substrate (length (L): 375 mm, outerdiameter (r): 80 mm) was worked to the surface characteristic as shown in FIG. 21 under the conditions shown in Table 1aD (Sample Nos. BD–ED). The respective symbols of BD–ED in the Table representing the surface conditions of the substrate correspond to (BD)–(ED) in Table 1aD, respectively.

Next, A-Si type light-receiving members for electrophotography were prepared following predetermined procedure using the deposition device in FIG. 20 under the conditions shown in Table 1D (Sample Nos. 201D–204D).

In forming the first layer, the respective mass flow controllers 2007 and 2008 for $GeH_4$ and $SiH_4$ were controlled by a computer (HP 9845B) so that the flow rates of $GeH_4$ and $SiH_4$ became those as shown in FIG. 24. Deposition of the surface layer formed primarily of silicon atoms and carbon atoms was carried out as follows. That is, after deposition of the second layer, the respective mass flow controllers corresponding to the respective gases were set so that the CH$_4$ gas flow rate relative to the SiH$_4$ gas flow rate may be SiH$_4$/CH$_4$=1/30 as shown in Table 1D, and glow discharging was excited at a high frequency power of 300 W to form the surface layer.

The thickness of each layer of the light-receiving members thus prepared was measured using an electron microscope to obtain the results as shown in Table 2D (Nos. 201D-204D).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 201D-204D, no interferenece fringe pattern was observed and proved to be satisfactory for practical application.

EXAMPLE 42

By means of a lathe, an aluminum substrate (length (L): 357 mm, outerdiameter (r): 80 mm) was worked as to the surface characteristics (BD)–(ED) as shown in Table 1aD.

Next, A-Si type light-receiving members for electrophotography were prepared following various procedures using the deposition device in FIG. 20 under the conditions shown in Table 3D (Sample Nos. 401D–404D).

In forming the first layer, the respective mass flow controllers 2007 and 2008 for GeH$_4$ and SiH$_4$ were controlled by a computer (HP 9845B) so that the flow rates of GeH$_4$ and SiH$_4$ became those as shown in FIG. 23.

The thickness of each layer of the light-receiving members thus prepared was measured using an electron microscope to obtain the results as shown in Table 4D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 401D–404D, no interference fringe pattern was observed and proved to be satisfactory for practical application.

EXAMPLE 43

By means of a lathe, an aluminum substrate (length (L): 357 mm, outerdiameter (r): 80 mm) was worked as to the surface characteristics (BD)–(ED) as shown in Table 1aD.

Next, A-Si type light-receiving members for electrophotography were prepared following various procedures using the deposition device in FIG. 20 in the same manner as in Example 41 except for using the conditions shown in Table 5D (Sample Nos. 601D–604D).

In forming the first layer, the respective mass flow controllers 2007 and 2008 for GeH$_4$ and SiH$_4$ were controlled by a computer (HP 9845B) so that the flow rates of GeH$_4$ and SiH$_4$ became those as shown in FIG. 24.

The thickness of each layer of the light-receiving members thus prepared was measured using an electron microscope to obtain the results as shown in Table 6D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 601D-604D, no interference fringe pattern was observed and proved to be satisfactory for practical application.

EXAMPLE 44

By means of a lathe, an aluminum substrate (length (L): 375 mm, outerdiameter (r): 80 mm) was worked as to the surface characteristics (BD)–(ED) as shown in Table 1aD.

Next, A-Si type light-receiving members for electrophotography were prepared following various procedures using the deposition device in FIG. 20 in the same manner as Example 41 except for using the conditions shown in Table 7D (Sample Nos. 801D–804D).

In forming the first layer, the respective mass flow controllers 2007 and 2008 for GeH$_4$ and SiH$_4$ were controlled by a computer (HP 9845B) so that the flow rates of GeH$_4$ and SiH$_4$ became those as shown in FIG. 25.

The thickness of each layer of the light-receiving members thus prepared was measured using an electron microscope to obtain the results as shown in Table 8D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 801D–804D, no interference fringe pattern was observed and proved to be satisfactory for practical application.

EXAMPLE 45

Following the same conditions and procedure as in Example 44, except for changing NH$_3$ to NO gas, A-Si type light-receiving members for electrophotography were prepared.

Each of the light-receiving members for electrphotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 46

Following the same conditions and procedure as in Example 44, except for changing NH$_3$ gas to N$_2$ gas, A-Si type light-receiving members for electrophotography were prepared.

Each of the light-receiving members for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 47

Figure 70:
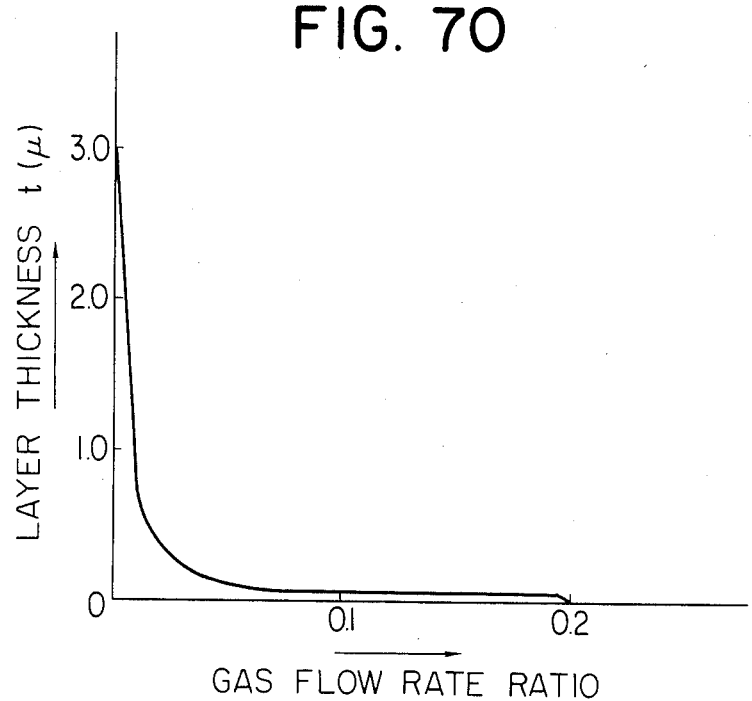

By means of the film depositing device shown in FIG. 20, on aluminum substrates (Cylinder No. 202D), light-receiving members for electrophotography were prepared under the same conditions as in Example 41 except for changing the flow rate ratio NO gas with the time for layer formation according to the change rate curve of the gas flow rate ratio as shown in FIG. 70 under the conditions shown in Table 9D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 48

Figure 71:
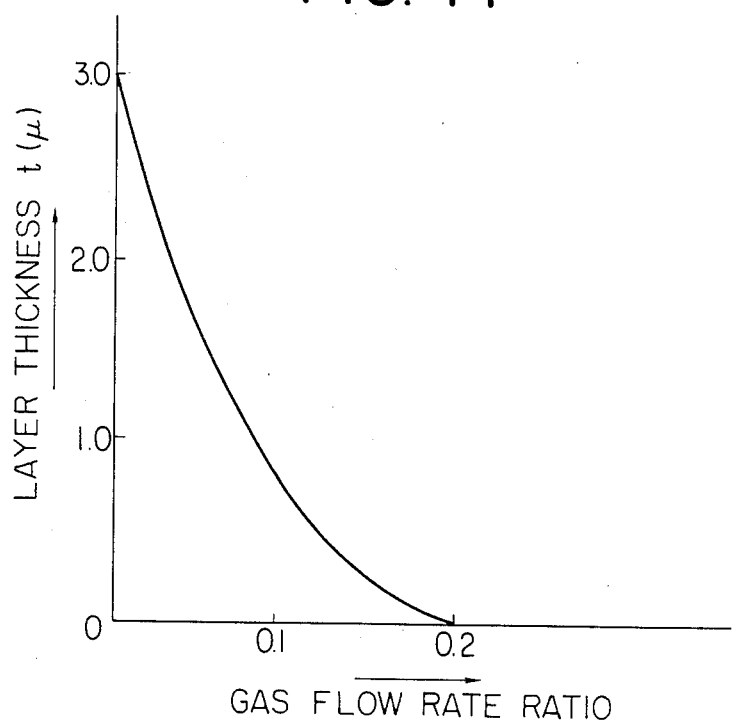

By means of the film depositing device shown in FIG. 20, on aluminum substrates (Cylinder No. 202D), light-receiving members for electrophotography were prepared under the same conditions as in Example 41 except for changing the flow rate ratio of $NH_3$ gas with the time for layer formation according to the change rate curve of the gas flow rate ratio as shown in FIG. 71 under the conditions shown in Table 10D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 49

Figure 80:
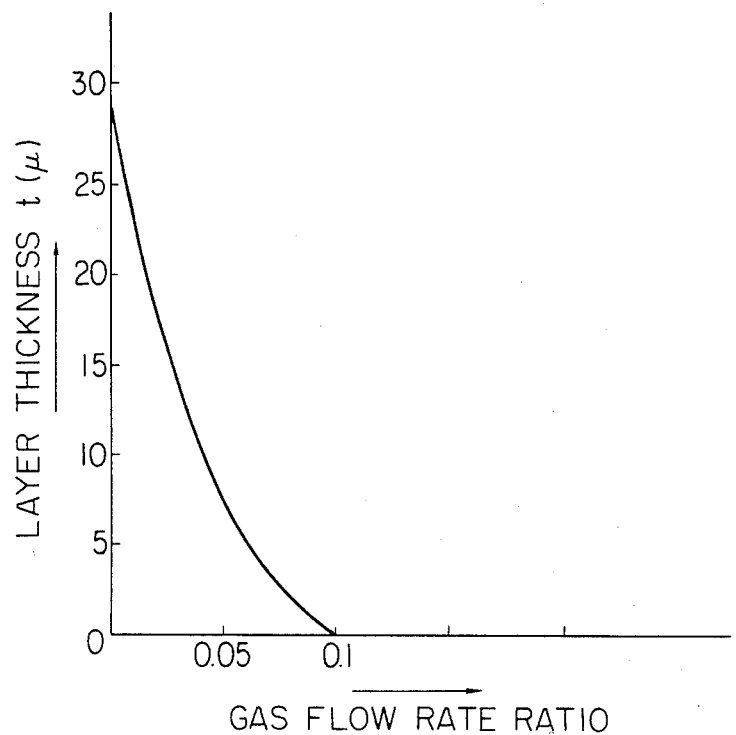

By means of the film depositing device shown in FIG. 20, on aluminum substrates (Cylinder No. 202D), light-receiving members for electrophotography were prepared under the same conditions as in Example 41 except for changing the flow rate ratio of NO gas with the time for layer formation according to the change rate curve of the gas flow rate ratio as shown in FIG. 80 under the conditions shown in Table 11D.

The light-receiving member for electrophotography as prepared above was subjected to image exposure by means of a device as shown in FIG. 26 (wavelength of laser beam: 780 nm, spot diameter 80 μm) followed by development and transfer to obtain an image. In any of the images, no interference fringe pattern was observed and proved to be satisfactory for practical application.

EXAMPLE 50

Following the same conditions and procedure as in Example 49, except for changing NO gas used in Example 49 to $NH_3$, A-Si type light-receiving members for electrophotography were prepared.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 51

Following the same conditions and procedure as in Example 49, except for changing NO gas used in Example 49 to $N_2O$ gas, A-Si type light-receiving members for electrophotography were prepared.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 52

Figure 72:
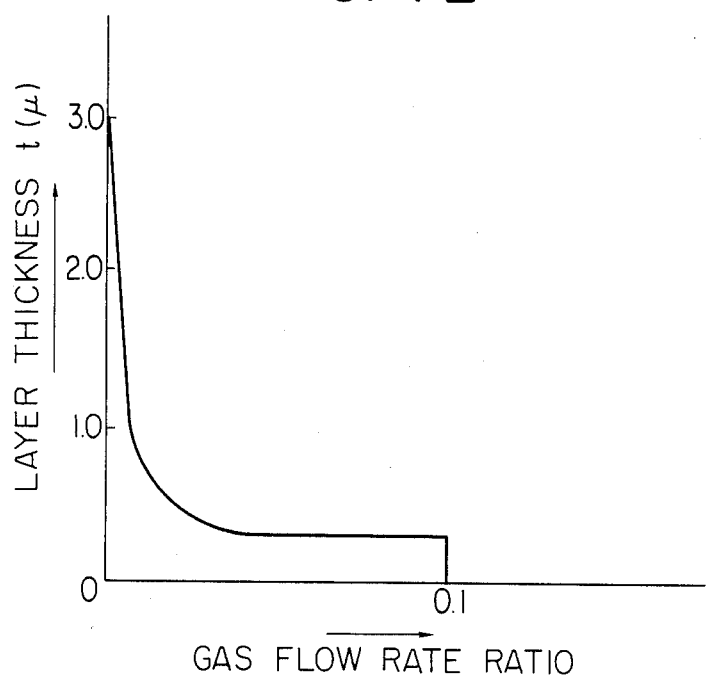
Figure 73:
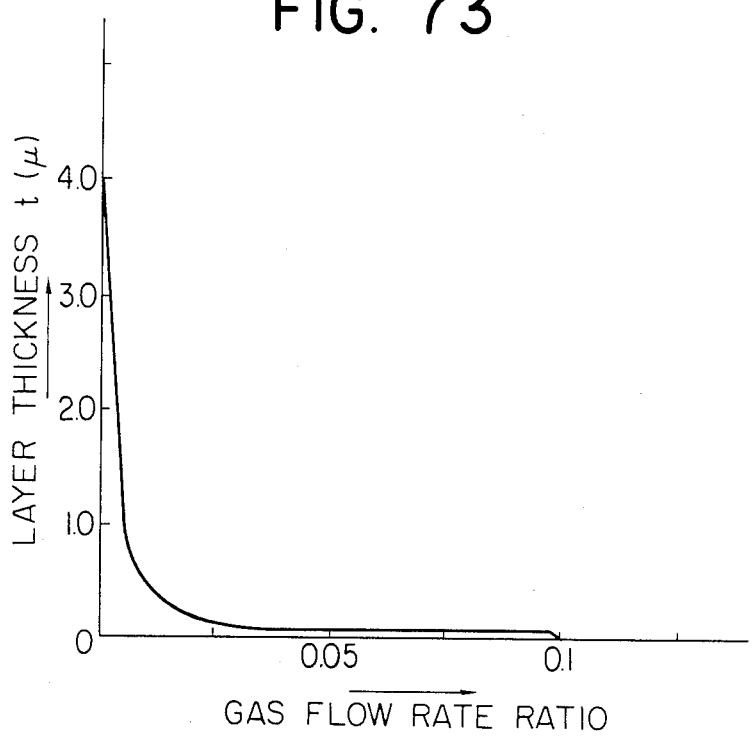
Figure 74:
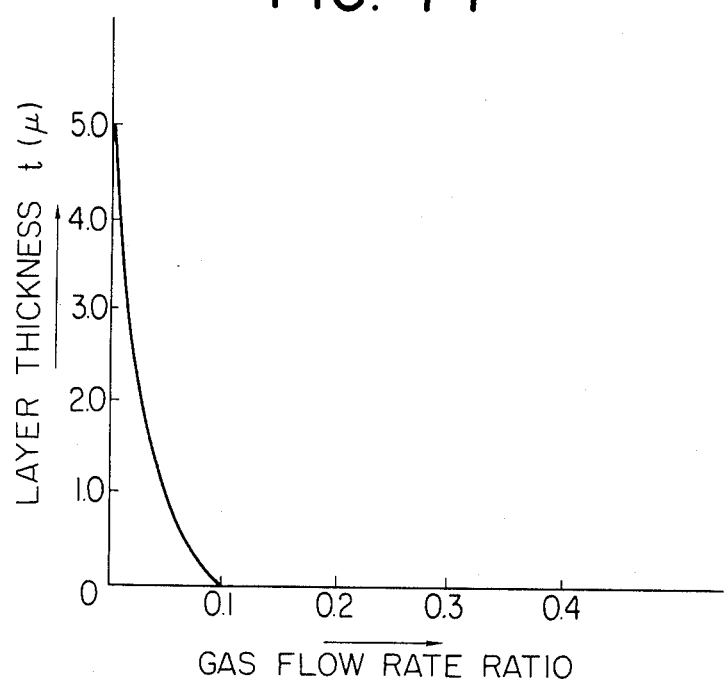
Figure 75:
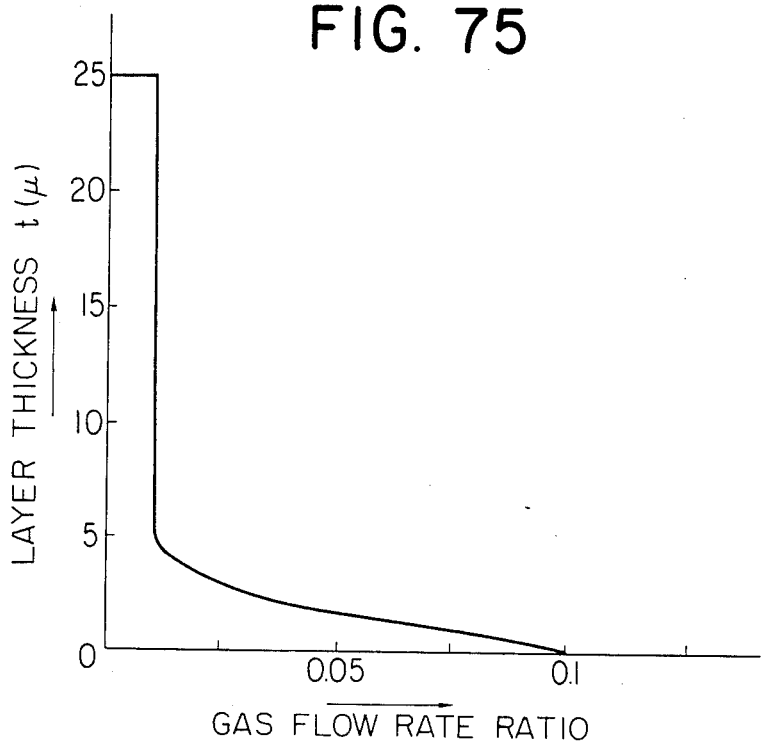
Figure 76:
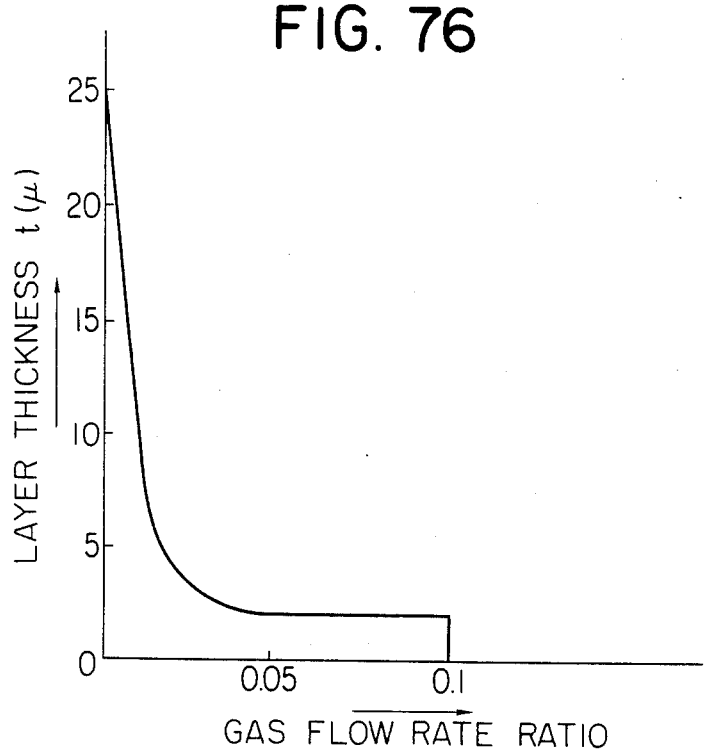

By means of the film depositing device shown in FIG. 20, on aluminum substrates (Cylinder No. 202D), light-receiving members for electrophotography were prepared under the same conditions as in Example 41 except for changing the flow rate ratio of $N_2O$ gas with the time for layer formation according to the change rate curve of the gas flow rate ratio as shown in FIG. 72 under the conditions shown in Table 12D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 53

By means of the film deposition device shown in FIG. 20, on aluminum substrates (Cylinder No. 202D), light-receiving members for electrophotography were prepared following the same conditions and procedure as in Example 41 except for changing the content ratio of silicon atoms to carbon atoms in the surface layer by changing the flow rate ratio of $SiH_4$ gas and $CH_4$ gas during surface layer formation as shown in Table 13D (Sample Nos. 2701D-2708D).

The light-receiving member for electrophotography as prepared above as subjected to image exposure by means of a device as shown in FIG. 26 (wavelength of laser beam: 780 nm, spot diameter 80 μm), and after the steps of image formation, developing and cleaning were repeated for 50,000 times, image evaluation was conducted to give the results as shown in Table 13D.

EXAMPLE 54

By means of the film depositing device shown in FIG. 20, on aluminum substrates (Cylinder No. 202D), light-receiving members for electrophotography were prepared following the same conditions and procedure as in Example 53 except for changing the flow rate ratio of $SiH_4$ gas, $CH_4$ gas and $SiF_4$ gas during surface formation as shown in Table 14D (Sample Nos. 2801D-2808D).

The light-receiving member for electrophotography as prepared above was subjected to image exposure by means of a device as shown in FIG. 26 (wavelength of laser beam: 780 nm, spot diameter 80 μm), and after the steps of image formation, developing and cleaning were repeated for 50,000 times, image evaluation was conducted to give the results as shown in Table 14D.

EXAMPLE 55

By using the aluminum substrate (Cylinder No. 202D) and forming the surface layer according to the sputtering method, otherwise following the same conditions and procedure as in Example 41, A-Si type light-receiving members for electrophotography were prepared (Sample Nos. 2901D-2907D). During these operations, the content ratio of Si and C were changed as shown in Table 15D by changing the area ratio of Si target and C target.

Formation of the surface layer was carried out as follows. That is, after formation of the second layer, the substrate having formed layers to said layer was taken out from the deposition device as shown in FIG. 20, the hydrogen ($H_2$) gas bomb in said device was replaced with an argon (Ar) bomb, the device was cleaned internally and a target for sputtering with a thickness of 5 mm comprising Si and a target for sputtering with a thickness of 5 mm comprising graphite were placed on one surface of the cathode electrode so that the area ratio of these targets may be as indicated in Table 15D. Then, the substrate having formed layers to the second layer was set in the device and with introduction of argon gas after evacuation, glow discharging is exited at a high frequency power of 300 W thereby effecting sputtering of the surface layer materials on the cathode electrode to form the surface layer.

Each of the thus prepared light-receiving members for electrophotography was subjected to image exposure by the image exposure device as shown in FIG. 26 (laser beam wavelength 780 nm, spot diameter 80 μn) and the steps of image formation, developing and cleaning were repeated for 50,000 times and then image evaluation was conducted to obtain the results as shown in Table 15D.

EXAMPLE 56

By means of a lathe, an aluminum substrate (length (L): 357 mm, outerdiameter (r): 80 mm) was worked as shown in FIG. 21 (P: pitch, D: depth) under the conditions shown in Table 2E (Cylinder Nos. 201E–204E).

Next, light-receiving members for electrophotography were prepared following various procedures using the deposition device in FIG. 20 under the conditions shown in Table 1E (Sample Nos. 201E–204E).

The thickness of each layer of the light-receiving members thus prepared was measured using an electron microscope to obtain the results as shown in Table 2E (Nos. 201E–204E).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 57

By means of a lathe, an aluminum substrate (length (L): 357 mm, outer diameter (r): 80 mm) was worked as shown in FIG. 21 (P: pitch, D: depth) under the conditions shown in Table 4E (Cylinder Nos. 401E–404E).

Next, a light-receiving member for electrophotography was prepared following various procedures using the film deposition device in FIG. 20 under the conditions as shown in Table 3E (Sample Nos. 401E–404E).

The thickness of each layer of the light-receiving members thus prepared was measured using an electron microscope to obtain the results as shown in Table 4E (Nos. 401E–404E).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 58

By means of a lathe, an aluminum substrate (length (L): 357 mm, outerdiameter (r): 80 mm) was worked as shown in FIG. 21 (P: pitch, D: depth) under the conditions shown in Table 6E (Cylinder Nos. 601E–604E).

Next, a light-receiving member for electrophotography was prepared following various procedures using the film deposition device in FIG. 20 under the conditions as shown in Table 5E (Sample Nos. 601E–604E).

The thickness of each layer of the light-receiving members thus prepared was measured using an electron microscope to obtain the results as shown in Table 6E (Nos. 601E–604E).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 59

By means of a lathe, an aluminum substrate (length (L): 357 mm, outer diameter (r): 80 mm) was worked as shown in FIG. 21 (P: pitch, D: depth) under the conditions shown in Table 8E (Cylinder Nos. 801E–804E).

Next, a light-receiving member for electrophotography was prepared following various procedures using the film deposition device in FIG. 20 under the conditions as shown in Table 7E (Sample Nos. 801E–804E).

The thickness of each layer of the light-receiving members thus prepared was measured using an electron microscope to obtain the results as shown in Table 8E (Nos. 801E–804E).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 60

By means of a lathe, an aluminum substrate (length (L) 357 mm, outerdiameter (r): 80 mm) was worked as shown in FIG. 21 (P: pitch, D: depth) under the conditions shown in Table 7E (Cylinder Nos. 1001E–1004E).

Next, a light-receiving member for electrophotography was prepared following various procedures using the film deposition device in FIG. 20 under the conditions as shown in Table 9E (Sample Nos. 1001E–1004E).

The thickness of each layer of the light-receiving members thus prepared was measured using an electron microscope to obtain the results as shown in Table 10E (Nos. 1001E–1004E).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 61

By means of a lathe, an aluminum substrate (length (L): 357 mm, outerdiameter (r): 80 mm) was worked as shown in FIG. 21 (P: pitch, D: depth) under the conditions shown in Table 12E (Cylinder Nos. 1201E-1204E).

Next, a light-receiving member for electrophotography was prepared following various procedures using the film deposition device in FIG. 20 under the conditions as shown in Table 11E (Sample Nos. 1201E-1204E).

The thickness of each layer of the light-receiving members thus prepared was measured using an electron microscope to obtain the results as shown in Table 12E (Nos. 1201E-1204E).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 62

By means of a lathe, an aluminum substrate (length (L): 357 mm, outerdiameter (r): 80 mm) was worked as shown in FIG. 21 (P: pitch, D: depth) under the conditions shown in Table 14E (Cylinder Nos. 1401E-1404E).

Next, a light-receiving member for electrophotography was prepared following various procedures using the film deposition device in FIG. 20 under the conditions as shown in Table 13E (Sample Nos. 1401E-1404E).

The thickness of each layer of the light-receiving members thus prepared was measured using an electron microscope to obtain the results as shown in Table 14E (Nos. 1401E-1404E).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 63

By means of a lathe, an aluminum substrate (length (L): 357 mm, outerdiameter (r): 80 mm) was worked as shown in FIG. 21 (P: pitch, D: depth) under the conditions shown in Table 16E (Cylinder Nos. 1601E-1604E).

Next, a light-receiving member for electrophotography was prepared following various procedures using the film deposition device in FIG. 20 under the conditions as shown in Table 15E (Sample Nos. 1601E-1604E).

The thickness of each layer of the light-receiving members thus prepared was measured using an electron microscope to obtain the results as shown in Table 16E (Nos. 1601E-1604E).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 64

By means of a lathe, an aluminum substrate (length (L): 357 mm, outerdiameter (r): 80 mm) was worked as shown in FIG. 21 (P: pitch, D: depth) under the conditions shown in Table 18E (Cylinder Nos. 1801E-1804E).

Next, a light-receiving member for electrophotography was prepared following various procedures using the film deposition device in FIG. 20 under the conditions as shown in Table 17E (Sample Nos. 1801E-1804E).

The thickness of each layer of the light-receiving members thus prepared was measured using an electron microscope to obtain the results as shown in Table 18E (Nos. 1801E-1804E).

The light-receiving member for electrophotography as prepared above was subjected to image exposure by means of a device as shown in FIG. 26 (wavelenth of laser beam: 780 nm, spot diameter 80 $\mu$m), followed by development and transfer to obtain an image. The image was free from any interference fringe pattern observed and proved to be satisfactory for practical application.

EXAMPLE 65

By means of a lathe, an aluminum substrate (length (L): 357 mm, outerdiameter (r): 80 mm) was worked as shown in FIG. 21 (P: pitch, D: depth) under the conditions shown in Table 20E (Cylinder Nos. 2001E-2004E).

Next, a light-receiving member for electrophotography was prepared following various procedures using the film deposition device in FIG. 20 under the conditions as shown in Table 19E (Sample Nos. 2001E-2004E).

The thickness of each layer of the light-receiving members thus prepared was measured using an electron microscope to obtain the results as shown in Table 20E (Nos. 2001E-2004E).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 66

By means of a lathe, an aluminum substrate (length (L): 357 mm, outerdiameter (r): 80 mm) was worked as shown in FIG. 21 (P: pitch, D: depth) under the conditions shown in Table 22E (Cylinder Nos. 2201E-2204E).

Next, a light-receiving member for electrophotography was prepared following various procedures using the film deposition device in FIG. 20 under the conditions as shown in Table 21E (Sample Nos. 2201E-2204E).

The thickness of each layer of the light-receiving members thus prepared was measured using an electron microscope to obtain the results as shown in Table 22E (Nos. 2201E-2204E).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 67

By means of a lathe, an aluminum substrate (length (L): 357 mm, outerdiameter (r): 80 mm) was worked as shown in FIG. 21 (P: pitch, D: depth) under the conditions shown in Table 24E (Cylinder Nos. 2401E–2404E).

Next, a light-receiving member for electrophotography was prepared following various procedures using the film deposition device in FIG. 20 under the conditions as shown in Table 23E (Sample Nos. 2401E–2404E).

The thickness of each layer of the light-receiving members thus prepared was measured using an electron microscope to obtain the results as shown in Table 24E (Nos. 2401E–2404E).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 68

By means of a lathe, an aluminum substrate (length (L): 357 mm, outerdiameter (r): 80 mm) was worked as shown in FIG. 21 (P: pitch, D: depth) under the conditions shown in Table 26E (Cylinder Nos. 2601E–2604E).

Next, a light-receiving member for electrophotography was prepared following various procedures using the film deposition device in FIG. 20 under the conditions as shown in Table 25E (Sample Nos. 2601E–2604E).

The thickness of each layer of the light-receiving members thus prepared was measured using an electron microscope to obtain the results as shown in Table 26E (Nos. 2601E–2604E).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 69

By means of a lathe, an aluminum substrate (length (L): 357 mm, outerdiameter (r): 80 mm) was worked as shown in FIG. 21 (P: pitch , D: depth) under the conditions shown in Table 28E (Cylinder Nos. 2801E–2804E).

Next, a light-receiving member for electrophotography was prepared following various procedures using the film deposition device in FIG. 20 under the conditions as shown in Table 27E (Sample Nos. 2801E–2804E)

The thickness of each layer of the light-receiving members thus prepared was measured using an electron microscope to obtain the results as shown in Table 28E (Nos. 2801E–2804E).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 70

For examples 56 through 69, light-receiving members for electrophotography (Sample Nos. 2901E–2956E) were prepared by use of $PH_3$ gas diluted with $H_2$ to 3000 vol. ppm in place of $B_2H_6$ gas diluted with $H_2$ to 3000 vol. ppm.

Other preparation conditions were the same as in Examples 56 through 69.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 71

On an aluminum substrate having the same shape as in Example 56, a light-receiving layer comprising a first layer, a second layer and a surface layer was deposited according to the sputtering method in the following manner.

First, explanation is made about the different points from Example 56 in the device shown in FIG. 20. In this Example, during deposition of the first layer, a target for sputtering comprising Si and Ge with a thickness of 5 mm was placed on the surface of the cathode electrode; during deposition of the second layer, a target for sputtering comprising Si with a thickness of 5 mm on one surface of the cathode electrode; and during deposition of the surface layer, a target for sputtering comprising Si and a target for sputtering comprising graphite with area ratio as shown in Table 29E on the surface.

Next, the preparation procedure is to be explained. Similarly as Sample No. 201E in Example 56, the deposition device was reduced to $10^{-7}$ Torr, and the aluminum substrate temperature was maintained constantly at 250° C. Then, by permitting Ar gas to flow at 200 SCCM and $H_2$ gas at 100 SCCM, the main valve 1134E was controlled so that the inner pressure within the deposition device may become $5\times10^{-3}$ Torr. And, by means of a high frequency power source, a high frequency power of 300 W was charged between the cathode electrode and the aluminim substrate to excite glow discharging. Thus, a first layer was deposited to 5 μm. Then, the target comprising Si and Ge was replaced with the target comprising Si, and a second layer was deposited under the same conditions to 20 μm thickness.

Thereafter, the target comprising Si on the cathode electrode was removed and replaced with the target comprising Si and the target comprising graphite, and a surface layer was deposited to 0.3 μm under the same conditions. The surface of the surface layer was found to be substantially parallel to the surface of the second layer.

The conditions during preparation of the surface layer were changed as shown in Table 29E to prepare light-receiving members.

Each of the thus prepared light-receiving members for electrophotography was subjected to image exposure with laser beam in the same manner as in Example 56 and the steps of image formation, developing and cleaning were repeated for 50,000 times and then image evaluation was conducted to obtain the results as shown in Table 29E.

EXAMPLE 72

Light-receiving members for electrophotography were prepared, respectively, in the same manner as Sample No. 201E in Example 56 except for varying the content ratios of silicon atoms to carbon atoms in the surface layer by varying the flow rate ratios of $SiH_4$ gas to $CH_4$ gas during formation of the surface layer. Each of the thus prepared light-receiving members for electrophotography was subjected to image exposure with laser beam in the same manner as in Example 56 and the steps of image formation, developing and cleaning were repeated for 50,000 times and then image evaluation was conducted to obtain the results as shown in Table 30E.

EXAMPLE 73

Light-receiving members for electrophotography were prepared, respectively, in the same manner as Sample No. 201E in Example 56 except for varying the content ratios of silicon atoms to carbon atoms in the surface layer by varying the flow rate ratios of $SiH_4$ gas, $SiF_4$ gas and $CH_4$ gas during formation of the surface layer.

Each of the thus prepared light-receiving members for electrophotography was subjected to image exposure with laser beam in the same manner as in Example 56 and the steps of image formation, developing and cleaning were repeated for 50,000 times and then image evaluation was conducted to obtain the results as shown in Table 31E.

EXAMPLE 74

Light-receiving members for electrophotography were prepared, respectively, in the same manner as Sample No. 201E in Example 56 except for varying the layer thickness of the surface layer. For each of the thus prepared light-receiving members for electrophotography the steps of image formation, developing and cleaning were repeated similarly as in Example 56 to obtain the results as shown in Table 32E.

EXAMPLE 75

Light-receiving member for electrophotography was prepared in the same manner as Sample No. 201E in Example 56 except for changing the discharging power during preparation of the surface layer to 300 W and making the average layer thickness 2 μm. The average layer thickness difference in the surface layer of the light-receiving member for electrophotography was found to be 0.5 μm between the center and both ends thereof, with the layer thickness difference at the minute portion being 0.1 μm.

In such a light-receiving member, no interference fringe was observed, and when the steps of image formation, developing and cleaning were repeated by means of the same device as in Example 56, practically satisfactory durability could be obtained.

EXAMPLE 76

By means of a lathe, an aluminum substrate (length (L): 357 mm, outerdiameter (r): 80 mm) was worked to the surface characteristic as shown in FIG. 21 under the conditions shown in Table 1aF (Sample Nos. BF–EF). The respective symbols of BF–EF in the Table show below representing the surface conditions of the substrate correspond to (BF)–(EF) in Table 1aF, respectively.

Next, A-Si type light-receiving members for electrophotography were prepared following predetermined procedures using the deposition device in FIG. 20 under the conditions shown in Table 1F (Sample Nos. 201F–204F).

Deposition of the surface layer formed primarily of silicon atoms and carbon atoms was carried out as follows. That is, after deposition of the second layer, the respective mass flow controllers corresponding to the respective gases were set so that the $CH_4$ gas flow rate relative to the $SiH_4$ gas flow rate may be $SiH_4/CH_4 = 1/30$ as shown in Table 1F, and glow discharging was excited at a high frequency power of 300 W to form the surface layer.

The thickness of each layer of the light-receiving members thus prepared was measured using an electron microscope to obtain the results as shown in Table 2F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 77

By means of a lathe, an alominum substrate (length (L): 357 mm, outerdiameter (r): 80 mm) was worked as to the surface characteristics (BF)–(EF) as shown in Table 1aF.

Next, A-Si type light-receiving members for electrophotography were prepared following various procedures using the deposition device in FIG. 20 in the same manner as in Example 76 except for the conditions shown in Table 3F (Sample Nos. 401F–404F).

The thickness of each layer of the light-receiving members thus prepared was measured using an electron microscope to obtain the results as shown in Table 4F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the resulting images, no interference fringe pattern was observed and proved to be satisfactory for practical application.

EXAMPLE 78

By means of a lathe, an aluminum substrate (length (L): 357 mm, outerdiameter (r): 80 mm) was worked as to the surface characteristics (BF)–(EF) as shown in Table 1aF.

Next, A-Si type light-receiving members for electrophotography were prepared following various procedures using the deposition device in FIG. 20 in the same manner as in Example 76 except for the conditions shown in Table 5F (Sample Nos. 601F–604F).

The thickness of each layer of the light-receiving members thus prepared was measured using an electron microscope to obtain the results as shown in Table 6F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 79

By means of a lathe, an aluminum substrate (length (L): 357 mm, outerdiameter (r): 80 mm) was worked as to the surface characteristics (BF)-(EF) as shown in Table 1aF.

Next, A-Si type light-receiving members for electrophotography were prepared following various procedures using the deposition device in FIG. 20 in the same manner as in Example 76 except for under the conditions shown in Table 7F (Sample Nos. 801F-804F).

The thickness of each layer of the light-receiving members thus prepared was measured using an electron microscope to obtain the results as shown in Table 8F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 80

By means of a lathe, an aluminum substrate (length (L): 357 mm, outerdiameter (r): 80 mm) was worked as to the surface characteristics (BF)-(EF) as shown in Table 1aF.

Next, A-Si type light-receiving members for electrophotography were prepared following various procedures using the deposition device in FIG. 20 in the same manner as in Example 76 except for under the conditions shown in Table 9F (Sample Nos. 1001F-1004F).

The thickness of each layer of the light-receiving members thus prepared was measured using an electron microscope to obtain the results as shown in Table 10F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application,

EXAMPLE 81

By means of a lathe, an aluminum substrate (length (L): 357 mm, outerdiameter (r): 80 mm) was worked as to the surface characteristics (BF)-(EF) as shown in Table 1aF.

Next, A-Si type light-receiving members for electrophotography were prepared following various procedures using the deposition device in FIG. 20 in the same manner as in Example 76 except for under the conditions shown in Table 11F (Sample Nos. 1201F-1204F).

The thickness of each layer of the light-receiving members thus prepared was measured using an electron microscope to obtain the results as shown in Table 12F.

The light-receiving member for electrophotography as prepared above was subjected to image exposure by means of a device as shown in FIG. 26 (wavelength of laser beem: 780 nm, spot diameter 80 μm), followed by development and transfer to obtain an image. In the resulting images, no interference fringe pattern was observed and proved to be satisfactory for practical application.

EXAMPLE 82

By means of a lathe, an aluminum substrate (length (L): 357 mm, outerdiameter (r): 80 mm) was worked as to the surface characteristics (BF)-(EF) as shown in Table 1aF.

Next, A-Si type light-receiving members for electrophotography were prepared following various procedures using the deposition device in FIG. 20, in the same manner as in Example 76 except for under the conditions shown in Table 13F (Sample Nos. 1401F-1404F).

Figure 78:
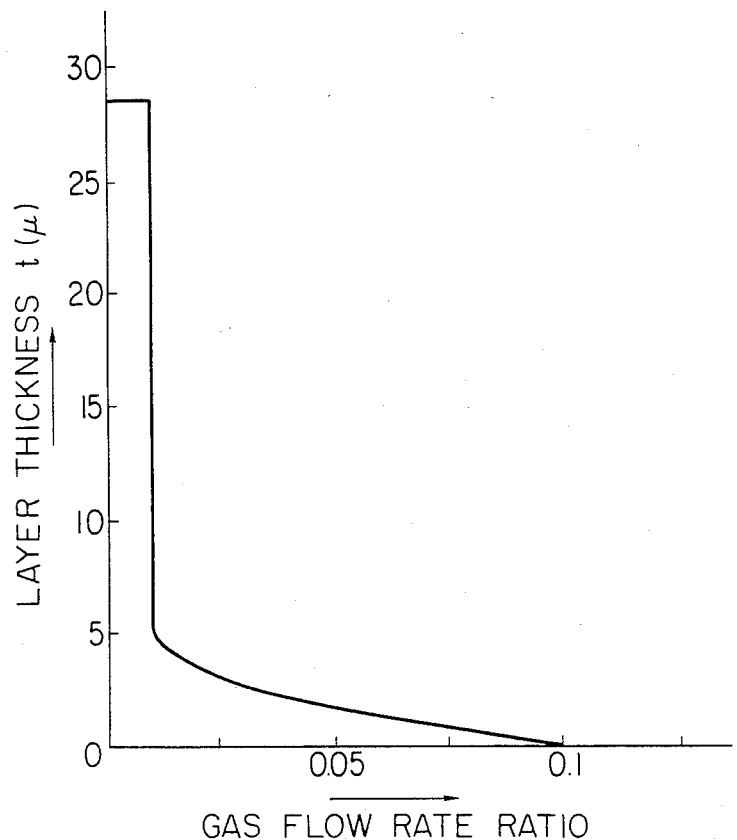

In forming of the first layer, the respective mass flow controller 2009 for $CH_4$ was controlled by a computer (HP 9845B) so that the flow rate ratio of $CH_4$ relative to $SiH_4$ became as shown in FIG. 78.

The thickness of each layer of the light-receiving members thus prepared was measured using an electron microscope to obtain the results as shown in Table 14F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no inteference fringe pattern was observed and proved to be satisfactory for practical application.

EXAMPLE 83

By means of a lathe, an aluminum substrate (length (L): 357 mm, outerdiameter (r): 80 mm) was worked as to the surface characteristics (BF)-(EF) as shown in Table 1aF.

Next, A-Si type light-receiving members for electrophotography were prepared following various procedures using the deposition device in FIG. 20 in the same manner as in Example 76 except for the conditions shown in Table 15F (Sample Nos. 1601F-1604F).

Figure 79:
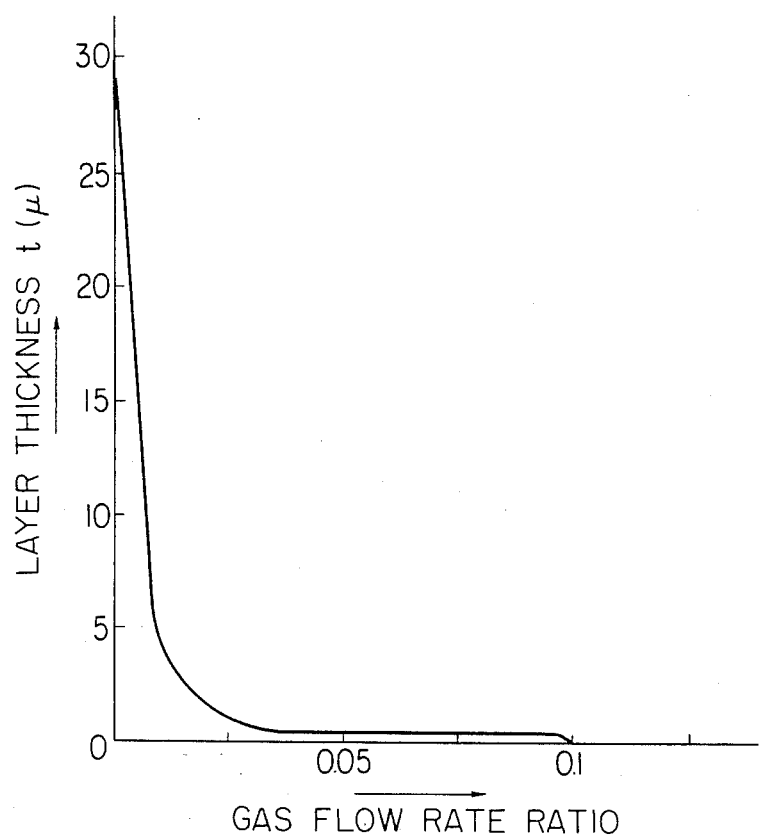

In forming of the first layer, the mass flow controller 2009 for NO was controlled by a computer (HP 9845B) so that the flow rate ratio of NO gas relative to sum of $GeH_4$ and $SiH_4$ became as shown in FIG. 79.

The thickness of each layer of the light-receiving members thus prepared was measured using an electron microscope to obtain the results as shown in Table 16F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 84

By means of a lathe, an aluminum substrate (length (L): 357 mm, outerdiameter (r): 80 mm) was worked as to the surface characteristics (BF)–(EF) as shown in Table 1aF.

Next, light-receiving members for electrophotography were prepared following various procedures using the deposition device in FIG. 20 in the same manner as in Example 76 except for the conditions shown in Table 17F (Sample Nos. 1801F–1804F).

Figure 57:
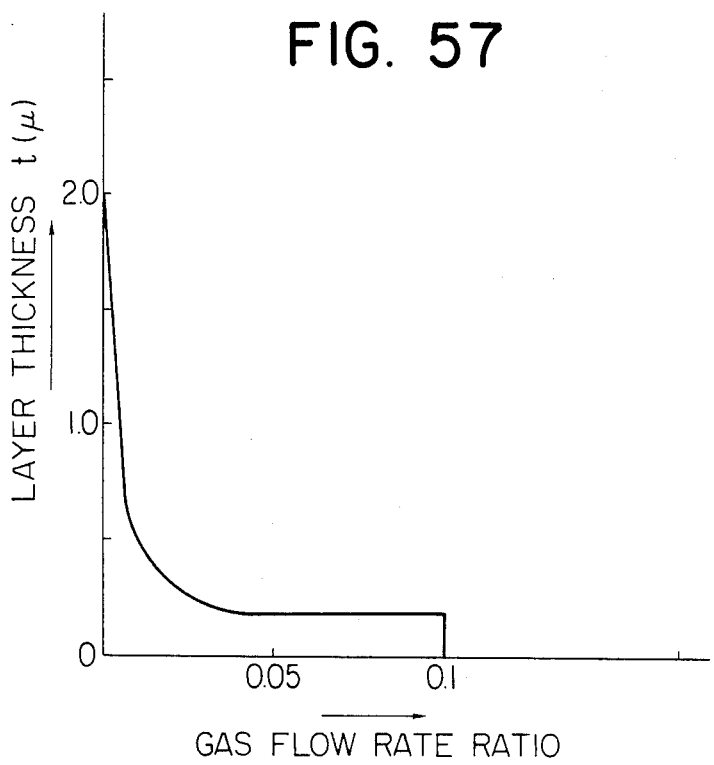

In forming of the first layer, the respective mass flow controllers 2009 for $NH_3$ was controlled by a computer (HP 9845B) so that the flow rate ratio of $NH_3$ gas relative to sum of $GeH_4$ and $SiH_4$ became as shown in FIG. 57.

The thickness of each layer of the light-receiving members thus prepared was measured using an electron microscope to obtain the results as shown in Table 18F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 85

By means of a lathe, an aluminum substrate (length (L): 357 mm, outerdiameter (r): 80 mm) was worked as to the surface characteristics (BF)–(EF) as shown in Table 1aF.

Next, A-Si:H type light-receiving members for electrophotography were prepared following various procedures using the deposition device in FIG. 20 in the same manner as in Example 76 except for the conditions shown in Table 19F (Sample Nos. 2001F–2004F).

The respective mass flow controller 2009 for $N_2O$ was controlled by a computer (HP 9845B) so that the flow rate ratio of $N_2O$ gas relative to sum of $GeH_4$ and $SiH_4$ became as shown in FIG. 80.

The thickness of each layer of the light-receiving members thus prepared was measured using an electron microscope to obtain the results as shown in Table 20F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 86

By means of a lathe, an aluminum substrate (length (L): 357 mm, outerdiameter (r): 80 mm) was worked as to the surface characteristics (BF)–(EF) as shown in Table 1aF.

Next, light-receiving members for electrophotography were prepared following various procedures using the deposition device in FIG. 20 in the same manner as in Example 76 except for the conditions shown in Table 21F (Sample Nos. 2201F–2204F).

The respective mass flow controller 2009 for NO gas was controlled by a computer (HP 9845B) so that the flow rate ratio of NO gas relative to sum of $GeH_4$ and $SiH_4$ became as shown in FIG. 81.

The thickness of each layer of the light-receiving members thus prepared was measured using an electron microscope to obtain the results as shown in Table 22F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 87

By means of a lathe, an aluminum substrate (length (L): 357 mm, outerdiameter (r): 80 mm) was worked as to the surface characterisatics (BF)–(EF) as shown in Table 1aF.

Next, A-Si:H type light-receiving members for electrophotography were prepared following various procedures using the deposition device in FIG. 20 in the same manner as in Example 76 except for the conditions shown in Table 23F (Sample Nos. 2401F–2404F).

Figure 77:
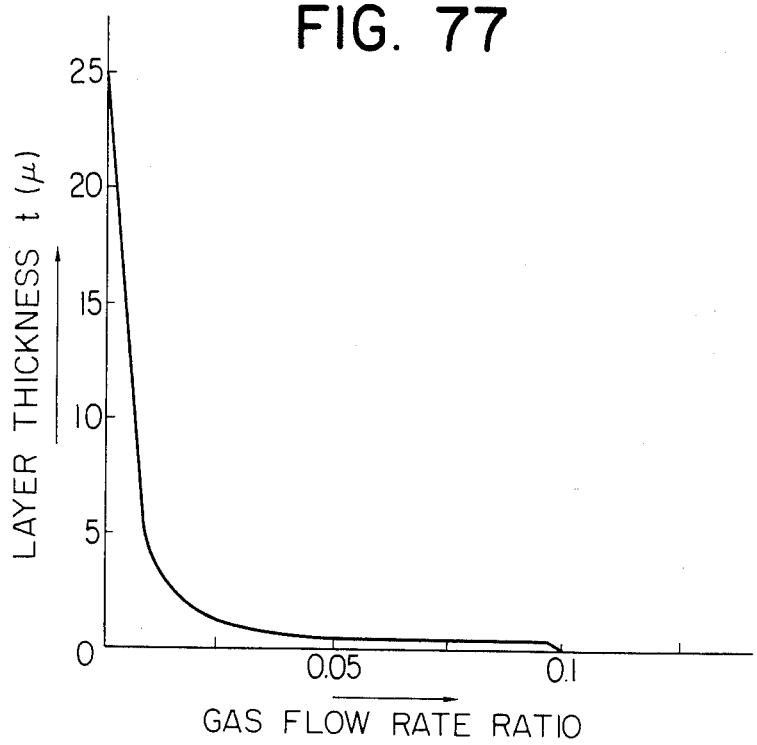

The respective mass flow controller 2009 for $NH_3$ was controlled by a computer (HP 9845B) so that the flow rate ratio of $NH_3$ gas relative to sum of $GeH_4$ and $SiH_4$ became as shown in FIG. 77.

The thickness of each layer of the light-receiving members thus prepared was measured using an electron microscope to obtain the results as shown in Table 24F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 88

By means of a lathe, an aluminum substrate (length (L): 357 mm, outerdiameter (r): 80 mm) was worked as to the surface characteristics (BF)–(EF) as shown in Table 1aF.

Next, light-receiving members for electrophotography were prepared following various procedures using the deposition device in FIG. 20 in the same manner as in Example 76 except for the conditions shown in Table 25F (Sample Nos. 2601F–2604F).

The thickness of each layer of the light-receiving members thus prepared was measured using an electron microscope to obtain the results as shown in Table 26F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the resulting images, no interference fringe pattern was observed and proved to be satisfactory for practical application.

EXAMPLE 89

By means of a lathe, an aluminum substrate (length (L): 357 mm, outerdiameter (r): 80 mm) was worked as to the surface characteristics (BF)–(EF) as shown in Table 1aF.

Next, light-receiving members for electrophotography were prepared following various procedures using the deposition device in FIG. 20 in the same manner as in Example 76 except for the conditions shown in Table 27F (Sample Nos. 2801F–2804F).

The thickness of each layer of the light-receiving members thus prepared was measured using an electron microscope to obtain the results as shown in Table 28F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the resulting images, no interference fringe pattern was observed and proved to be satisfactory for practical application.

EXAMPLE 90

For examples 76 through 89, light-receiving members for electrophotography were prepared by use of $PH_3$ gas diluted with $H_2$ to 3000 vol. ppm in place of $B_2H_6$ gas diluted with $H_2$ to 3000 vol.ppm.

Other preparation conditions were the same as in Examples 76 through 89.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 91

By using the aluminum substrates (Cylinder No. 202F), light-receiving members for electrophotography were prepared under the same conditions as in Example 76 except for changing the content ratio of silicon atoms to carbon atoms in the surface layer by changing the flow rate ratio of $SiH_4$ gas and $CH_4$ gas during surface layer formation as shown in Table 29F (Sample Nos. 2901F–2908F).

The light-receiving member for electrophotography as prepared above was subjected to image exposure by means of a device as shown in FIG. 26 (wavelength of laser beam: 780 nm, spot diameter 80 μm), and after the steps of image formation, developing and cleaning were repeated for 50,000 times, image evaluation was conducted to give the results as shown in Table 29F.

EXAMPLE 92

By using the aluminum substrates (Cylinder No. 202F), light-receiving members for electrophotography were prepared under the same conditions as in Example 91 except for changing the flow rate ratio of $SiH_4$ gas, $CH_4$ gas and $SiF_4$ gas during surface layer formation as shown in Table 30F (Sample Nos. 3001F–3008F).

The light-receiving member for electrophotography as prepared above was subjected to image exposure by means of a device as shown in FIG. 26 (wavelength of laser beam: 780 nm, spot diameter 80 μm), and after the steps of image formation, developing and cleaning were repeated for 50,000 times, image evaluation was conducted to give the results as shown in Table 30F.

EXAMPLE 93

By using the aluminum substrate (length (L) 357 mm, diameter (r) 80 mm) as employed in Example 76 and forming the surface layer according to the sputtering method, otherwise following the same conditions and procedure as in Example 76, A-Si type light-receiving members for electrophotography were prepared (Sample Nos. 3101F–3107F). During these operations, the content ratio of Si and C were changed as shown in Table 31F by changing the area ratio of Si target and C target.

Formation of the surface layer was carried out as follows. That is, after formation of the second layer, the substrate having formed layers to said layer was taken out from the deposition device as shown in FIG. 20, the hydrogen ($H_2$) gas bomb in said device was replaced with an argon (Ar) bomb, the device was cleaned internally and a target for sputtering with a thickness of 5 mm comprising Si and a target for sputtering with a thickness of 5 mm comprising graphite were placed on the surface of the cathode electrode so that the area ratio of these targets may be as indicated in Table 31F. Then, the substrate having formed layers to the second layer was set in the device and with introduction of argon gas after evacuation, glow discharging is excited at a high frequency power of 300 W thereby effecting sputtering of the surface layer materials on the cathode electrode to form the surface layer.

Each of the thus prepared light-receiving members for electrophotography was subjected to image exposure by the image exposure device as shown in FIG. 26 (laser beam wavelength 780 nm, spot diameter 80 μm) and the steps of image formation, developing and cleaning were repeated for 50,000 times and then image evaluation was conducted to obtain the results as shown in Table 31F.

EXAMPLE 94

By means of a lathe, an aluminum substrate (length (L): 357 mm, outerdiameter (r): 80 mm) was worked as shown in FIG. 21 (P: pitch, D: depth) under the conditions shown in Table 2G (Nos. 201G–204G).

Next, light-receiving members for electrophotography of A-Si were prepared following various procedures using the deposition device in FIG. 20 under the conditions shown in Table 1G (Sample Nos. 201G–204G).

In forming the A-Si:Ge:H:B layer of the first layer, the respective mass flow controllers for $GeH_4$ and $SiH_4$ were controlled by a computer (HP 9845B) so that the flow rates of $GeH_4$ and $SiH_4$ became as shown in FIG. 22.

The thickness of each layer of the light-receiving members thus prepared was measured using an electron microscope to obtain the results as shown in Table 2G.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 201G–204G, no interference fringe pattern was observed and proved to be satisfactory for practical application.

EXAMPLE 95

By means of a lathe, an aluminum substrate (length (L): 357 mm, outerdiameter (r): 80 mm) was worked as shown in FIG. 21 (P: pitch, D: depth) under the conditions shown in Table 3G (Nos. 301G–304G).

Next, light-receiving members for electrophotography of A-Si were prepared following various procedures using the deposition device in FIG. 20 under the conditions shown in Table 1G (Sample Nos. 301G–304G).

In forming the A-Si:Ge:H:B layer of the first layer, the respective mass flow controllers for $GeH_4$ and $SiH_4$ were controlled by a computer (HP 9845B) so that the flow rates of GeH₄ and SiH₄ became as shown in FIG. 23.

The thickness of each layer of the light-receiving members thus prepared was measured using an electron microscope to obtain the results as shown in Table 3G.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 301G–304G, no interference fringe pattern was observed and proved to be satisfactory for practical application.

EXAMPLE 96

By means of a lathe, an aluminum substrate (length (L): 357 mm, outerdiameter (r): 80 mm) was worked as shown in FIG. 21 (P: pitch, D: depth) under the conditions shown in Table 5G (Sample Nos. 501G–504G).

Next, light-receiving members for electrophotography of A-Si were prepared following various procedures using the deposition device in FIG. 20 under the conditions shown in Table 4G (Sample Nos. 501G–504G).

In forming the A-Si:Ge:H:B layer of the first layer, the respective mass flow controllers for GeH₄ and SiH₄ were controlled by a computer (HP 9845B) so that the flow rates of GeH₄ and SiH₄ became as shown in FIG. 24.

The thickness of each layer of the light-receiving members thus prepared was measured using an electron microscope to obtain the results as shown in Table 5G.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 501G–504G, no interference fringe pattern was observed and proved to be satisfactory for practical application.

EXAMPLE 97

By means of a lathe, an aluminum substrate (length (L): 357 mm, outerdiameter (r): 80 mm) was worked as shown in FIG. 21 (P: pitch, D: depth) under the conditions shown in Table 6G (Sample Nos. 601G–604G).

Next, light-receiving members for electrophotography of A-Si were prepared following various procedures using the deposition device in FIG. 20 under the conditions shown in Table 4G (Sample Nos. 601G–604G).

In forming the A-Si:Ge:H:B layer of the first layer, the respective mass flow controllers for GeH₄ and SiH₄ were controlled by a computer (HP 9845B) so that the flow rates of GeH₄ and SiH₄ became as shown in FIG. 25.

The thickness of each layer of the light-receiving members thus prepared was measured using an electron microscope to obtain the results as shown in Table 6G.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 601G–604G, no interference fringe pattern was observed and proved to be satisfactory for practical application.

EXAMPLE 98

By means of a lathe, an aluminum substrate (length (L): 357 mm, outerdiameter (r): 80 mm) was worked as shown in FIG. 21 (P: pitch, D: depth) under the conditions shown in Table 8G.

Next, light-receiving members for electrophotography were prepared following various procedures using the depositiondevice in FIG. 20 under the conditions shown in Table 7G (Sample Nos. 801G–804G).

In forming the A-Si:Ge:H:B layer of the first layer, the respective mass flow controllers for GeH₄ and SiH₄ were controlled by a computer (HP 9845B) so that the flow rates of GeH₄ and SiH₄ became as shown in FIG. 22.

The thickness of each layer of the light-receiving members thus prepared was measured using an electron microscope to obtain the results as shown in Table 8G.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 99

By means of a lathe, an aluminum substrate (length (L): 357 mm, outerdiameter (r): 80 mm) was worked as shown in FIG. 21 (P: pitch, D: depth) under the conditions shown in Table 10G.

Next, light-receiving members for electrophotography were prepared following various procedures using the deposition device in FIG. 20 under the conditions shown in Table 9G (Sample Nos. 1001G–1004G).

In forming the A-Si:Ge:H:B layer of the first layer, the respective mass flow controllers for GeH₄ and SiH₄ were controlled by a computer (HP 9845B) so that the flow rates of GeH₄ and SiH₄ became as shown in FIG. 24.

The thickness of each layer of the light-receiving members thus prepared was measured using an electron microscope to obtain the results as shown in Table 10G.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images no interference fringe pattern was observed and proved to be satisfactory for practical application.

EXAMPLE 100

By means of a lathe, an aluminum substrate (length (L) 357 mm, outerdiameter (r): 80 mm) was worked as shown in FIG. 21 (P: pitch, D: depth) under the conditions shown in Table 12G.

Next, light-receiving members for electrophotography of A-Si:H were prepared following various procedures using the deposition device in FIG. 20 under the conditions shown in Table 11G (Sample Nos. 1201G–1204G).

In forming the A-Si:Ge:H:B layer of the first layer, the respective mass flow controllers for GeH₄ and SiH₄ were controlled by a computer (HP 9845B) so that the flow rates of GeH₄ and SiH₄ became as shown in FIG. 25.

The thickness of each layer of the light-receiving members thus prepared was measured using an electron microscope to obtain the results as shown in Table 12G.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 101

By means of a lathe, an aluminum substrate (length (L) 357 mm, outerdiameter (r): 80 mm) was worked as shown in FIG. 21 (P: pitch, D: depth) under the conditions shown in Table 14G.

Next, light-receiving members for electrophotography were prepared following various procedures using the deposition device in FIG. 20 under the conditions shown in Table 13G (Sample Nos. 1401G–1404G).

In forming the A-Si:Ge:H:B layer of the first layer, the respective mass flow controllers for $GeH_4$ and $SiH_4$ were controlled by a computer (HP 9845B) so that the flow rates of $GeH_4$ and $SiH_4$ became as shown in FIG. 23.

The thickness of each layer of the light-receiving members thus prepared was measured using an electron microscope to obtain the results as shown in Table 14G.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 102

For examples 94 through 101, light-receiving members for electrophotography (Sample Nos. 2001G–2032G) were prepared by use of $PH_3$ gas diluted with $H_2$ to 3000 vol.ppm in place of $B_2H_6$ gas diluted with $H_2$ to 3000 vol.ppm.

Other preparation conditions were the same as in Examples 94 through 101.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 103

On an aluminum substrate having the same shape of Example 94, a light-receiving layer comprising a first layer, a second layer and a surface layer was deposited in the following manner.

First, explanation is made about the different points from Example 94 in the device shown in FIG. 20. In this Example, during deposition of the first layer, a target for sputtering comprising Si and Ge with a thickness of 5 mm was placed on one surface of the cathode electrode; during deposition of the second layer, a target for sputtering comprising Si with a thickness of 5 mm on one surface of the cathode electrode; and during deposition of the surface layer, a target for sputtering comprising Si and a target for sputtering comprising graphite with area ratio as shown in Table 15G on one surface.

Next, the preparation procedure is to be explained. Similarly as Sample No. 201G in Example 94, the deposition device was reduced to $10^{-7}$ Torr, and the aluminum substrate temperature was maintained constantly at 250° C. Then, by permitting Ar gas to flow at 200 SCCM and $H_2$ gas at 100 SCCM, the main valve 2034 was controlled so that the inner pressure within the deposition device may become $5 \times 10^{-3}$ Torr And, by means of a high frequency power source, a high frequency power of 300 W was charged between the cathode electrode and the aluminum substrate to excite glow discharging. Thus, a first layer was deposited to 5 μm. Then, the target comprising Si and Ge was replaced with the target comprising Si, and a second layer was deposited under the same conditions to 20 μm thickness.

Thereafter, the target comprising Si was removed and replaced with the target comprising Si and the target comprising graphite, and a surface layer was deposited to 0.3 μm under the same conditions. The surface of the surface layer was found to be substantially parallel to the surface of the second layer.

The conditions during preparation of the surface layer were changed as shown in Table 15G to prepare light-receiving members.

Each of the thus prepared light-receiving members for electrophotography was subjected to image exposure with laser beam in the same manner as in Example 94 and the steps of image formation, developing and cleaning were repeated for 50,000 times and then image evaluation was conducted to obtain the results as shown in Table 15G.

EXAMPLE 104

Light-receiving members for electrophotography were prepared, respectively, in the same manner as Sample No. 201G in Example 94 except for varying the content ratios of silicon atoms to carbom atoms in the surface layer by varying flow rate ratios of $SiH_4$ gas to $CH_4$ gas during formation of the surface layer. Each of the thus prepared light-receiving members for electrophotography was subjected to image exposure with laser beam in the same manner as in Example 94 and the steps of image formation, developing and cleaning were repeated about 50,000 times and then image evaluation was conducted to obtain the results as shown in Table 16G.

EXAMPLE 105

Light-receiving members for electrophotography were prepared, respectively, in the same manner as Sample No. 201G in Example 94 except for varying the content ratios of silicon atoms to carbon atoms in the surface layer by varying the flow rate ratios of $SiH_4$ gas, $SiF_4$ gas and $CH_4$ gas during formation of the surface layer.

Each of the thus prepared light-receiving members for electrophotography was subjected to image exposure with laser beam in the same manner as in Example 94 and the steps of image formation, developing and cleaning were repeated for 50,000 times and then image evaluation was conducted to obtain the results as shown in Table 17G.

EXAMPLE 106

Light-receiving members for electrophotography were prepared, respectively, in the same manner as Sample No. 201G in Example 94 except for varying the layer thickness of the surface layer. For each of the thus prepared light-receiving members for electrophotography the steps of image formation, developing and cleaning were repeated for 50,000 times similarly as in Example 94 to obtain the results as shown in Table 18G.

EXAMPLE 107

Light-receiving member for electrophotography was prepared in the same manner as Sample No. 201 G in Example 94 except for changing the discharging power during preparation of the surface layer to 300 W and making the average layer thickness 2 μm. The average layer thickness difference in the surface layer of the light-receiving member for electrophotography was found to be 0.5 μm at the center and both ends thereof, with the layer thickness difference at the minute portion being 0.1 μm.

In such a light-receiving member, no interference fringe was observed, and when the steps of image formation, developing and cleaning were repeated by means of the same device as in Example 94, practically satisfactory durability could be obtained.

EXAMPLE 108

By means of a lathe, an aluminum substrate (length (L): 357 mm, outerdiameter(r): 80 mm) was worked to the surface characteristic as shown in FIG. 21 under the conditions shown in Table 1aH (Sample Nos. BH–EH).

Next, A-Si type light-receiving members for electrophotography were prepared following predetermined operational procedures using the film deposition device in FIG. 20 under the conditions shown in Table 1H (Sample Nos. 201H-204H).

In forming the A-Si:Ge:H:B:O layer of the first layer, the respective mass flow controllers 2007, 2008 and 2010 were controlled by a computer (HP 9845B) so that the flow rates of GeH$_4$ and SiH$_4$ became as shown in FIG. 22. Deposition of the surface layer formed primarily of silicon atoms and carbon atoms was carried out as follows. That is, after deposition of the second layer, the respective mass flow controllers corresponding to the respective gases were set so that the CH$_4$ gas flow rate relative to the SiH$_4$ gas flow rate may be SiH$_4$/CH$_4$=1/30 as shown in Table 1H, and glow discharging was excited at a high frequency power of 300 W to form the surface layer.

The thickness of each layer of the light-receiving members thus prepared was measured using an electron microscope to obtain the results as shown in Table 2H.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 109

By means of a lathe, an aluminum substrate (length (L): 357 mm, outerdiameter (r): 80 mm) was worked to the surface characteristic as shown in FIG. 21 under the conditions shown in Table 6H (FH–IH).

In forming the A-Si:Ge:H:B:O layer of the first layer under Table 1H, the respective mass flow controllers 2008 and 2007 for GeH$_4$ and SiH$_4$ were controlled by a computer (HP 9845B) so that the flow rates of GeH$_4$ and SiH$_4$ became as shown in FIG. 23.

Other than above procedures, the film deposition device in FIG. 20 was used in a way similar to Example 108 to produce a light-receiving member of A-Si type for electrophotography (Sample Nos. 301H–304H).

The thickness of the first and second layers of the light-receiving members thus prepared was measured to obtain the results as shown in Table 3H.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 110

Following the same conditions and procedure as in Example 108, except for changing NO gas to NH$_3$ gas, A-Si type light-receiving members for electrophotography were prepared (Sample Nos. 401H–404H).

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 111

Following the same conditions and procedure as in Example 108, except for changing NO gas to N$_2$O gas, A-Si type light-receiving members for electrophotography were prepared (Sample Nos. 501H–504H).

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 112

By means of a lathe, an aluminum substrate (length (L): 357 mm, outerdiameter (r): 80 mm) was worked as to the surface characteristics as shown in FIG. 21 under the condition as shown in Table 1aH.

Next, A-Si type light-receiving members for electropjotography were prepared following various procedures using the deposition film device in FIG. 20 in the same manner as in Example 108 except for the conditions shown in Table 4H (Sample Nos. 601H–604H).

In forming the A-Si:Ge:H:B:N layer of the first layer, the respective mass flow controllers 2008 and 2009 for GeH$_4$ and SiH$_4$ were controlled by a computer (HP 9845B) so that the flow rates of GeH$_4$ and SiH$_4$ became as shown in FIG. 24.

The thickness of the first and the second layers of the light-receiving members thus prepared was measured to obtain the results as shown in Table 5H.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 113

By means of a lathe, an aluminum substrate (length (L): 357 mm, outerdiameter (r): 80 mm) was worked as to the surface characteristics as shown in FIG. 21 under the condition as shown in Table 1bH.

Next, A-Si type light-receiving members for electrophotography were prepared following various procedures using the film deposition device in FIG. 20 in the same manner as in Example 108 except for the conditions shown in Table 4H (Sample Nos. 701H–704H).

In forming the A-Si:Ge:H:B:N layer of the first layer, the respective mass flow controllers 2008 and 2007 for $GeH_4$ and $SiH_4$ were controlled by a computer (HP 9845B) so that the flow rates of $GeH_4$ and $SiH_4$ became as shown in FIG. 25.

The thickness of the first and the second layers of the light-receiving members thus prepared was measured to obtain the results as shown in Table 6H.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 114

Following the same conditions and procedure as in Example 112, except for changing $NH_3$ gas to NO gas, A-Si type light-receiving members for electrophotography were prepared (Sample Nos. 801H–804H).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 115

Following the same conditions and procedure as in Example 112, except for changing $NH_3$ gas to $N_2$ gas, A-Si type light-receiving members for electrophotography were prepared (Sample Nos. 901H–904H).

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 116

By means of a lathe, an aluminum substrate (length (L): 357 mm, outerdiameter (r): 80 mm) was worked to the surface characteristic as shown in FIG. 21 under the conditions shown in Table 1aH.

Next, light-receiving members for electrophotography were prepared following predetermined procedures using the film deposition device in FIG. 20 in the same manner as in Example 108 except for the conditions shown in Table 7H (Sample Nos. 1001H–1004H).

In forming the A-Si:Ge:H:B:O:N layer of the first layer, the respective mass flow controllers 2008 and 2007 for $GeH_4$ and $SiH_4$ were controlled by a computer (HP 9845B) so that the flow rates of $GeH_4$ and $SiH_4$ became as shown in FIG. 22.

Also, the flow rate ratio of $N_2O$ gas relative to the sum of $GeH_4$ gas and $SiH_4$ gas was changed following the change rate curve as shown in FIG. 72.

The thickness of the first and the second layers of the light-receiving members thus prepared was measured to obtain the results as shown in Table 8H.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 117

Following the same conditions and procedure as in Example 116, except for changing $N_2O$ gas to NO gas, A-Si type light-receiving members for electrophotography were prepared (Sample Nos. 1101H–1104H).

The light-receiving member for electrophotography as prepared above was subjected to image exposure by means of a device as shown in FIG. 26 (wavelength of laser beam: 780 nm, spot diameter 80 μm), followed by development and transfer to obtain an image. In the image, no interference fringe pattern was observed and proved to be satisfactory for practical application.

EXAMPLE 118

Following the same conditions and procedure as in Example 116, except for changing $N_2O$ gas to $NH_3$ gas, A-Si type light-receiving members for electrophotography were prepared (Sample Nos. 1201H–1204H).

The light-receiving member for electrophotography as prepared above was subjected to image exposure by means of a device as shown in FIG. 26 (wavelength of laser beam: 780 nm, spot diameter 80 μm), followed by development and transfer to obtain an image. In the image, no interference fringe pattern was observed and proved to be satisfactory for practical application.

EXAMPLE 119

By means of a lathe, an aluminum substrate (length (L): 357 mm, outerdiameter (r): 80 mm) was worked to have the surface characteristic as shown in FIG. 21 under the conditions shown in Table 1aH.

Next, light-receiving members for electrophotography were prepared following various procedures using the film deposition device in FIG. 20 in the same manner as in Example 108 except for the conditions shown in Table 9H (Sample Nos. 1301H–1304H).

In forming the A-Si:Ge:H:B:O layer of the first layer, the respective mass flow controllers 2008 and 2007 for $GeH_4$ and $SiH_4$ were controlled by a computer (HP 9845B) so that the flow rates of $GeH_4$ and $SiH_4$ became as shown in FIG. 22.

Figure 58:
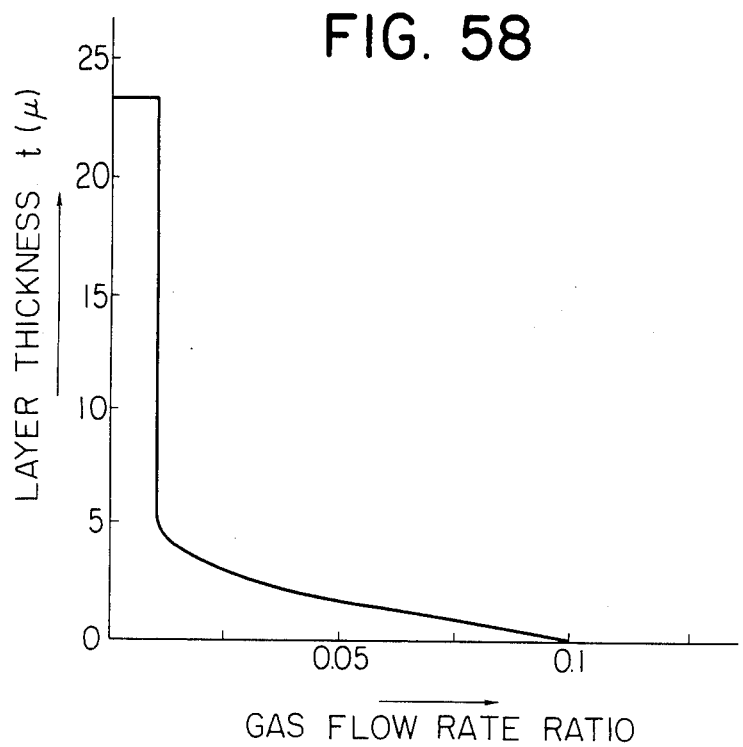

Also, the flow rate ratio of NO gas relative to the sum of $GeH_4$ gas and $SiH_4$ gas was changed following the change rate curve as shown in FIG. 58.

The thickness of the first and the second layers of the light-receiving members thus prepared were measured to obtain the results as shown in Table 10H.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 120

By means of a lathe, an aluminum substrate (length (L): 357 mm, outerdiameter (r): 80 mm) was worked to have the surface characteristic as shown in FIG. 21 under the conditions shown in Table 1aH.

Next, light-receiving members for electrophotography were prepared following various procedures using the film deposition device in FIG. 26 in the same manner as in Example 108 except for the conditions shown in Table 11H (Sample Nos. 1401H–1404H).

In forming the A-Si:Ge:H:B:N layer of the first layer, the respective mass flow controllers 2008 and 2007 for GeH$_4$ and SiH$_4$ were controlled by a computer (HP 9845B) so that the flow rates of GeH$_4$ and SiH$_4$ became as shown in FIG. 25.

Also, the flow rate ratio of NH$_3$ gas relative to the sum of GeH$_4$ gas and SiH$_4$ gas was changed following the change rate curve as shown in FIG. 84.

The thickness of the first and the second layers of the light-receiving members thus prepared were measured to obtain the results as shown in Table 12H.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 121

By means of a lathe, an aluminum substrate (length (L): 357 mm, outerdiameter (r): 80 mm) was worked to have the surface characteristic as shown in FIG. 21 under the conditions shown in Table 1aH.

Next, light-receiving members for electrophotography were prepared following various procedures using the film deposition device in FIG. 20 in the same manner as in Example 108 except for the conditions shown in Table 13H (Sample Nos. 1501H–1504H).

In forming the A-Si:Ge:H:B:O:N layer of the first layer, the respective mass flow controllers 2008 and 2007 for GeH$_4$ and SiH$_4$ were controlled by a computer (HP 9845B) so that the flow rates of GeH$_4$ and SiH$_4$ became as shown in FIG. 23.

Also, the flow rate ratio of N$_2$O gas relative to the sum of GeH$_4$ gas and SiH$_4$ gas was changed following the change rate curve as shown in FIG. 84.

The thickness of the first and the second layers of the light-receiving members thus prepared were measured using an electron microscope to obtain the results as shown in Table 14H.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 122

For examples 108 through 121, light-receiving members for electrophotography (Sample Nos. 1601H–1656H) were prepared by use of PH$_3$ gas diluted with H$_2$ to 3000 vol.ppm in place of B$_2$H$_6$ gas diluted with H$_2$ to 3000 vol.ppm.

Other preparation conditions were the same as in Examples 108 through 121.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 123

By using the substrates of Example 108, A-Si type light-receiving members for electrophotography were prepared under the same conditions as in Example 108 except for changing the content ratio of silicon atoms to carbon atoms in the surface layer by changing the flow rate ratio of SiH$_4$ gas and CH$_4$ gas during surface layer formation as shown in Table 15H (Sample Nos. 2701H–2708H).

The light-receiving member for electrophotography as prepared above was subjected to image exposure by means of a device as shown in FIG. 26 (wavelength of laser beam: 780 nm, spot diameter 80 μm), and after the steps of image formation, developing and cleaning were repeated for 50,000 times, image evaluation was conducted to give the results as shown in Table 15H.

EXAMPLE 124

By using the substrates of Example 108, A-Si type light-receiving members for electrophotography were prepared under the same conditions as in Example 41 except for changing the flow rate ratio of SiH$_4$ gas, CH$_4$ gas and SiF$_4$ gas during surface layer formation as shown in Table 16H (Sample Nos. 2801H–2808H).

The light-receiving member for electrophotography as prepared above was subjected to image exposure by means of a device as shown in FIG. 26 (wavelength of laser beam: 780 nm, spot diameter 80 μm), and after the steps of image formation, developing and cleaning were repeated for 50,000 times, image evaluation was conducted to give the results as shown in Table 16H.

EXAMPLE 125

By using the substrate as employed in Example 108 and forming the surface layer according to the sputtering method, otherwise following the same conditions and procedure as in Example 108, A-Si type light-receiving members for electrophotography were prepared (Sample Nos. 2901H–2907H).

Formation of the surface layer was carried out as follows. That is, after formation of the second layer, the substrate having formed layers to said layer was taken out from the deposition device as shown in FIG. 20, the hydrogen (H$_2$) gas bomb in said device was replaced with an argon (Ar) bomb, the device was cleaned internally and a target for sputtering with a thickness of 5 mm comprising Si and a target for sputtering with a thickness of 5 mm comprising graphite were placed on one surface of the cathode electrode so that the area ratio of these targets may be as indicated in Table 17H. Then, the substrate having formed layers to the second layer was set in the device and with introduction of argon gas after evacuation, glow discharging is exited at a high frequency power of 300 W thereby effecting sputtering of the surface layer materials on the cathode electrode to form the surface layer.

Each of the thus prepared light-receiving members for electrophotography was subjected to image exposure by the image exposure device as shown in FIG. 26 (laser beam wavelength 780 nm, spot diameter 80 μm)

and the steps of image formation, developing and cleaning were repeated for 50,000 times and then image evaluation was conducted to obtain the results as shown in Table 17H.

EXAMPLE 126

By means of a lathe, an aluminum substrate was worked to have the surface characteristic of No. 101I shown in Table 1I.

Next, by use of the deposition device shown in FIG. 20, following various procedures under the conditions as shown in Table 2I, a light-receiving member for electrophotography of A-Si was formed.

The layer thickness distribution of the light-receiving member for electrophotography of A-Si thus prepared was measured by an electron microscope to find that the average layer thickness difference was 0.1 μm between the center and both ends of the first layer and 2 μm between the center and both ends of the second layer, with the layer thickness difference at the minute portion being less than 0.1 μm in the first layer and less than 0.1 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 127

By means of a lathe, an aluminum substrate was worked by the same manner as in Example 126 to have the surface characteristic of No. 102 I shown in Table 1I.

Next, by use of the deposition device shown in FIG. 20, following the same procedures as in Example 126 under the conditions as shown in Table 3I, a light-receiving member for electrophotography of A-Si was deposited on the above aluminum substrate.

The layer thickness distribution of the light-receiving member for electrophotography of A-Si thus prepared was measured by an electron microscope to find that the average layer thickness difference was 0.1 μm between the center and both ends of the first layer and 2 μm between the center and both ends of the second layer, with the layer thickness difference at the minute portion being less than 0.1 μm in the first layer and less than 0.1 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 128

By means of a lathe, an aluminum substrate was worked by the same manner as in Example 126 to have the surface characteristic of No. 103I shown in Table 1I.

Next, by use of the deposition device shown in FIG. 20, following the same procedures as in Example 126 under the conditions as shown in Table 4I, a light-receiving member for electrophotography of A-Si was formed.

The layer thickness distribution of the light-receiving member for electrophotography of A-Si thus prepared was measured by an electron microscope to find that the average layer thickness difference was 0.6 μm between the center and both ends of the first layer and 2 μm between the center and both ends of the second layer, with the layer thickness difference at the minute portion being 0.1 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 129

By means of a lathe, an aluminum substrate was worked by the same manner as in Example 126 to have the surface characteristic of No. 104I shown in Table 1I.

Next, by use of the deposition device shown in FIG. 20, following the same procedures as in Example 126 under the conditions as shown in Table 5I, a light-receiving member for electrophotography of A-Si was formed.

The layer thickness distribution of the light-receiving member for electrophotography of A-Si thus prepared was measured by an electron microscope to find that the average layer thickness difference was less than 0.1 μm between the center and both ends of the first layer and 2 μm between the center and both ends of the second layer, with the layer thickness difference at the minute portion being 0.15 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 130

By means of a lathe, an aluminum substrate (length (L): 357 mm, outerdiameter (r): 80 mm) was worked as shown in FIG. 21 (P: pitch, D: depth) under the conditions shown in Table 7I.

Next, light-receiving members for electrophotography of A-Si were prepared following various procedures using the deposition device in FIG. 20 under the conditions shown in Table 6I (Sample Nos. 701I–704I).

Figure 60:
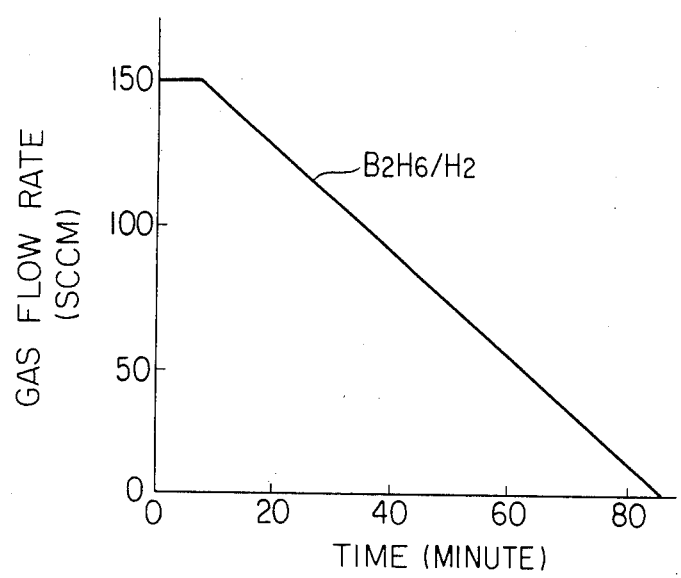

In forming the layer containing boron, the respective mass flow controllers 2010 for $B_2H_6$ and $H_2$ were controlled by a computer (HP 9845B) so that the flow rates of $B_2H_6$ and $H_2$ became as shown in FIG. 60.

The thickness of each layer of the light-receiving members thus prepared was measured using an electron microscope to obtain the results as shown in Table 7I.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 131

By means of a lathe, an aluminum substrate (length (L): 357 mm, outerdiameter (r): 80 mm) was worked as shown in FIG. 21 (P: pitch, D: depth) under the conditions shown in Table 9I.

Next, light-receiving members for electrophotography of A-Si were prepared following various procedures using the deposition device in FIG. 20 under the conditions shown in Table 8I (Sample Nos. 901I–904I).

Figure 61:
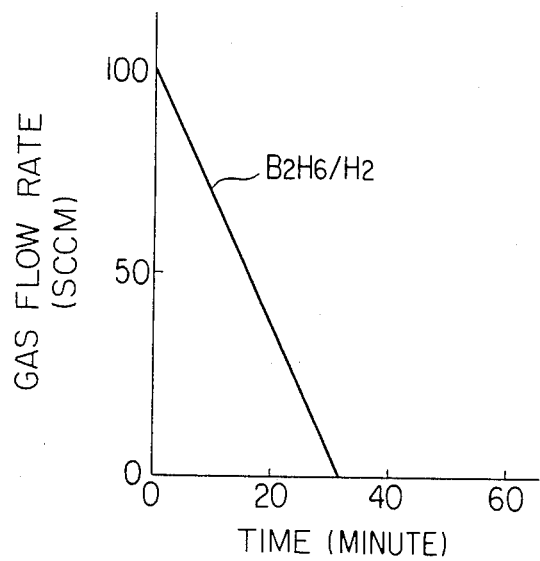

In forming the layer containing boron, the respective mass flow controllers 2010 for $B_2H_6$ and $H_2$ were controlled by a computer (HP 9845B) so that the flow rates of $B_2H_6$ and $H_2$ became as shown in FIG. 61.

The thickness of each layer of the light-receiving members thus prepared was measured using an electron microscope to obtain the results as shown in Table 9I.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In the images, no interference fringe pattern was observed and proved to be satisfactory for practical application.

EXAMPLE 132

By means of a lathe, an aluminum substrate (legnth (L): 357 mm, outerdiameter (r): 80 mm) was worked as shown in FIG. 21 (P: pitch, D: depth) under the conditions shown in Table 11I.

Next, light-receiving members for electrophotography of A-Si were prepared following various procedures using the deposition device in FIG. 20 under the conditions shown in Table 10I (Sample Nos. 1101I–1104I).

In forming the layer containing boron, the respective mass flow controllers 2010 for $B_2H_6$ and $H_2$ were controlled by a computer (HP 9845B) so that the flow rates of $B_2H_6$ and $H_2$ became as shown in FIG. 61.

The thickness of each layer of the light-receiving members thus prepared was measured using an electron microscope to obtain the results as shown in Table 11I.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In the images, no interference fringe pattern was observed and proved to be satisfactory for practical application.

EXAMPLE 133

By means of a lathe, an aluminum substrate (length (L): 357 mm, outerdiameter (r): 80 mm) was worked as shown in FIG. 21 (P: pitch, D: depth) under the conditions shown in Table 13I.

Next, light-receiving members for electrophotography of A-Si:H were prepared following various procedures using the deposition device in FIG. 20 under the conditions shown in Table 12I (Sample Nos. 1301I–1304I).

In forming the layer containing boron, the respective mass flow controllers 1210 for $B_2H_6$ and $H_2$ were controlled by a computer (HP 9845B) so that the flow rates of $B_2H_6$ and $H_2$ became as shown in FIG. 61.

The thickness of each layer of the light-receiving members thus prepared was measured using an electron microscope to obtain the results as shown in Table 13I.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In the images, no interference fringe pattern was observed and proved to be satisfactory for practical application.

EXAMPLE 134

For examples 126 through 133, light-receiving members for electrophotography (Sample Nos. 2001I–2020I) were prepared by use of $PH_3$ gas diluted with $H_2$ to 3000 vol ppm in place of $B_2H_6$ gas diluted with $H_2$ to 3000 vol ppm.

Other preparating conditions were the same as in Examples 126 through 133.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In any of the images, no interference fringe pattern was observed and proved to be satisfactory for practical application.

EXAMPLE 135

On an aluminum substrate having the same shape of Example 126, a light-receiving layer comprising a first layer, a second layer and a surface layer was deposited in the following manner.

First, explanation is made about the different points from Example 126 in the device shown in FIG. 20. In this Example, during deposition of the first layer, a target for sputtering comprising Si and Ge with a thickness of 5 mm was placed on one surface of the cathode electrode; during deposition of the second layer, a target for sputtering comprising Si and Ge with a thickness of 5 mm on one surface of the cathode electrode; and during deposition of the surface layer, a target for sputtering comprising Si and a target for sputtering comprising graphite with area ratio as shown in Table 14I on one surface.

Next, the preparation procedure is to be explained. Similarly as in Example 126, the deposition device was reduced to $10^{-7}$ Torr, and the aluminum substrate temperature was maintained constantly at 250° C. Then, by permitting Ar gas to flow at 200 SCCM and $H_2$ gas at 100 SCCM, the main valve 2034 was controlled so that the inner pressure within the deposition device may become $5 \times 10^{-3}$ Torr. And, by means of a high frequency power source, a high frequency power of 300 W was charged between the cathode electrode and the aluminum substrate to excite glow discharging. Thus, a first layer was deposited to 5 $\mu$m. Then, the target comprising Si and Ge was replaced with the target comprising Si, and a second layer was deposited under the same conditions to 20 $\mu$m thickness.

Thereafter, the target comprising Si was removed and replaced with the target comprising Si and the target comprising graphite, and a surface layer was deposited to 0.3 $\mu$m under the same conditions. The surface of the surface layer was found to be substantially parallel to the surface of the second layer.

The conditions during preparation of the surface layer were changed as shown in Table 14I to prepare light-receiving members.

Each of the thus prepared light-receiving members for electrophotography was subjected to image exposure with laser beam in the same manner as in Example 126 and the steps of image formation, developing and cleaning were repeated for 50,000 times and then image evaluation was conducted to obtain the results as shown in Table 14I.

EXAMPLE 136

Light-receiving members for electrophotography were prepared, respectively, in the same manner as in Example 126 except for varying the content ratios of silicon atoms to carbon atoms in the surface layer by varying the flow rate ratios of $SiH_4$ gas to $CH_4$ gas during formation of the surface layer. Each of the thus prepared light-receiving members for electrophotography was subjected to image exposure with laser beam in the same manner as in Example 126 and the steps of image formation, developing and cleaning were repeated for 50,000 times and then image evaluation was conducted to obtain the results as shown in Table 15I.

EXAMPLE 137

Light-receiving members for electrophotography were prepared, respectively, in the same manner as in Example 126 except for varying the content ratios of silicon atoms to carbon atoms in the surface layer by varying the flow rate ratios of $SiH_4$ gas, $SiF_4$ gas and $CH_4$ gas during formation of the surface layer.

Each of the thus prepared light-receiving members for electrophotography was subjected to image with laser beam in the same manner as in Example 126 and the steps of image formation, developing and cleaning were repeated for 50,000 times and then image evaluation was conducted to obtain the results as shown in Table 16I.

EXAMPLE 138

Light-receiving members for electrophotography were prepared, respectively, in the same manner as in Example 126 except for varying the layer thickness of the surface layer. For each of the thus prepared light-receiving members for electrophotography the steps of image formation, developing and cleaning were repeated similarly as in Example 126 to obtain the results as shown in Table 17I.

EXAMPLE 139

Light-receiving member for electrophotography was prepared in the same manner as in Example 126 except for changing the discharging power during preparation of the surface layer to 300 W and masking the average layer thickness 2 $\mu$m. The average layer thickness difference in the surface layer of the light-receiving member for electrophotography was found to be 0.5 $\mu$m at the center and both ends thereof, with the layer thickness difference at the minute portion being 0.1 $\mu$m.

In such a light-receiving member, no interference fringe was observed, and when the steps of image formation, developing and cleaning were repeated by means of the same device as in Example 126, practically satisfactory durability could be obtained.

EXAMPLE 140

By means of a lathe, an aluminum substrate (length (L): 357 mm, outerdiameter (r): 80 mm) was worked to the surface characteristic as shown in FIG. 21 under the conditions shown in Table 1J (BJ).

Next, A-Si type light-receiving members for electrophotography were prepared following predetermined procedures using the film deposition device in FIG. 20 under the conditions shown in Table 2J.

Deposition of the surface layer formed primarily of silicon atoms and carbon atoms was carried out as follows. That is, after deposition of the second layer, the respective mass flow controllers corresponding to the respective gases were set so that the $CH_4$ gas flow rate relative to the $SiH_4$ gas flow rate may be $SiH_4/CH_4=1/30$ as shown in Table 2J, and glow discharging was excited at a high frequency power of 300 W to form the surface layer.

The layer thickness distribution of the light-receiving member for electrophotography of A-Si thus prepared was measured by an electron microscope to find that the average layer thickness difference was 0.1 $\mu$m between the center and both ends of the first layer and 2 $\mu$m between the center and both ends of the second layer, with the layer thickness difference at the minute portion being less than 0.02 $\mu$m in the first layer and 0.3 $\mu$m in the second layer.

The light-receiving member for electrophotography as prepared above was subjected to image exposure by means of a device as shown in FIG. 26 (wavelength of laser beam. 780 nm, spot diameter 80 $\mu$m), followed by development and transfer to obtain an image. The image was free from any interference fringe pattern observed and proved to be satisfactory for practical application.

EXAMPLE 141

Similarly as described in Example 140, by means of a lathe, an aluminum substrate (legnth (L): 357 mm, outerdiameter (r): 80 mm) was worked as to the surface characteristics as shown in Table 1J(CJ).

Next, A-Si type light-receiving members for electrophotography were prepared following various procedures using the deposition device in FIG. 20 in the same manner as in Example 140 except for the conditions shown in Table 3J (Sample Nos. 301D–304D).

The layer thickness distribution of the light-receiving member for electrophotography of A-Si thus prepared was measured by an electron microscope to find that the average layer thickness difference was 0.1 $\mu$m between the center and both ends of the first layer and 2 $\mu$m between the center and both ends of the second layer, with the layer thickness difference at the minute portion being 0.03 $\mu$m in the first layer and 0.3 $\mu$m in the second layer.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 142

Similarly as described in Example 140, by means of a lathe, an aluminum substrate was worked by the same manner as in Example 140 to have the surface characteristic of No. DJ shown in Table 1J.

Next, by use of the deposition device shown in FIG. 20, following the same procedures as in Example 140 except for using the conditions as shown in Table 4J, a light-receiving member for electrophotography of A-Si was deposited on the above aluminum substrate.

The layer thickness distribution of the light-receiving member for electrophotography of A-Si thus prepared was measured by an electron microscope to find that the average layer thickness difference was 0.6 μm between the center and both ends of the first layer and 2 μm between the center and both ends of the second layer, with the layer thickness difference at the minute portion being 0.01 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 143

Similarly as described in Example 140, by means of a lathe, an aluminum substrate was worked by the same manner as in Example 140 to have the surface characteristic of EJ shown in Table 1J.

Next, by use of the deposition device shown in FIG. 20, following the same procedures as in Example 140 except for using the conditions as shown in Table 5J, a light-receiving member for electrophotography of A-Si was deposited on the above aluminum substrate.

The layer thickness distribution of the light-receiving member for electrophotography of A-Si thus prepared was measured by an electron microscope to find that the average layer thickness difference was 0.8 μm between the center and both ends of the first layer and 2 μm between the center and both ends of the second layer, with the layer thickness difference at the minute portion being 0.15 μm in the first layer and 0.3 μm in the second layer.

The light-receiving member for electrophotography as prepared above was subjected to image exposure by means of a device as shown in FIG. 26 (wavelegnth of laser beam: 780 nm, spot diameter 80 μm), followed by development and transfer to obtain an image. The image was free from any interference fringe pattern observed and proved to be satisfactory for practical application.

EXAMPLE 144

Following the same conditions and procedure as in Example 142, except for changing $N_2O$ gas used in Example 142 to $NH_3$, A-Si type light-receiving members for electrophotography were prepared.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 145

Following the same conditions and procedure as in Example 143, except for changing NO gas used in Example 143 to $N_2$ gas, A-Si type light-receiving members for electrophotography were prepared.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 146

By means of a lathe, an aluminum substrate (legnth (L): 357 mm, outerdiameter (r): 80 mm) was worked as to the surface characteristics (BJ)-(EJ) as shown in Table 1J.

Next, A-Si type light-receiving members for electrophotography were prepared following various procedures using the deposition device in FIG. 20 in the same manner as in Example 140 except for the conditions shown in Table 6J (Sample Nos. 701J–704J).

Figure 56:
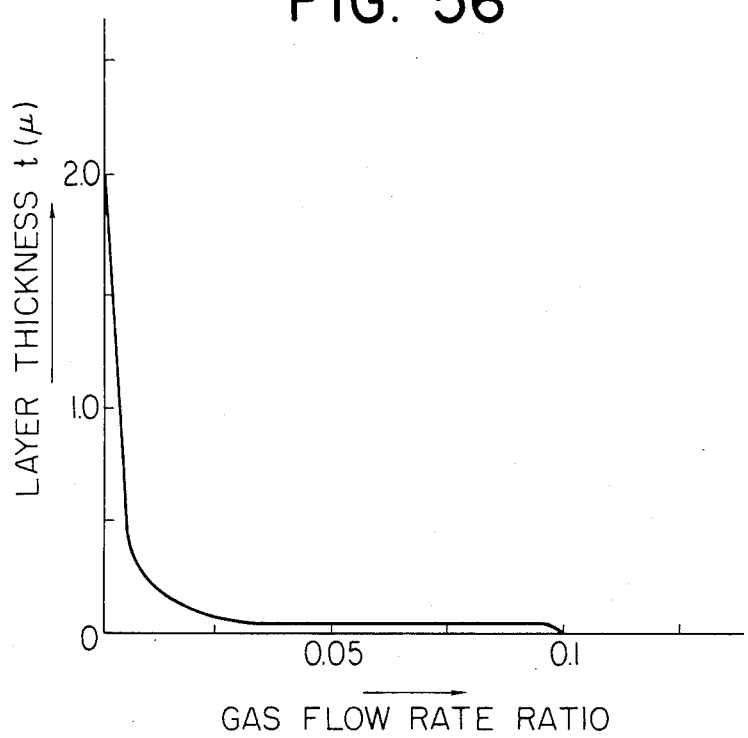

In the layer containing boron, the respective mass flow controllers 2010 and 2009 for $B_2H_6$, $H_2$ and $NH_3$ were controlled by a computer (HP 9845B) so that the flow rates of $B_2H_6$ and $H_2$ became as shown in FIG. 60 and that of $NH_3$ became as shown in FIG. 56.

The thickness of each layer of the light-receiving members thus prepared was measured using an electron microscope to obtain the results as shown in Table 7J.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 147

Following the same conditions and procedure as in Example 146, except for changing $NH_3$ gas used in Example 146 to NO, A-Si type light-receiving members for electrophotography were preapred (Sample Nos. 801J–804J).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 801J–804J, no interference fringe pattern was observed and proved to be satisfactory for practical application.

EXAMPLE 148

Following the same conditions and procedure as in Example 146, except for changing $NH_3$ gas used in Example 146 to $N_2$, A-Si type light-receiving members for electrophotography were prepared (Sample Nos. 901J–904J).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 901J–904J, no interference fringe pattern was observed and proved to be satisfactory for practical application.

EXAMPLE 149

By means of a lathe, an aluminum substrate (length (L): 357 mm, outerdiameter (r): 80 mm) was worked to have the surface characteristic as shown in Table 1J (BJ)-(EJ).

Next, light-receiving members for electrophotography of A-Si type were prepared following various procedures using the film deposition device in FIG. 20 in the same manner as in Example 140 except for the conditions shown in Table 8J (Sample Nos. 1001J–1004J).

In forming the layer containing boron, the respective mass flow controllers 2010 and 2009 for $B_2H_6/H_2$ and $N_2O$ were controlled by a computer (HP 9845B) so that the flow rates of $B_2H_6/H_2$ and $N_2O$ became as shown in FIGS. 61 and 57.

The thickness of each layer of the light-receiving members thus prepared was measured using an electron microscope to obtain the results as shown in Table 9J.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 150

Following the same conditions and procedure as in Example 149, except for changing $CH_4$ gas used in Example 149 to NO, A-Si type light-receiving members for electrophotography were prepared (Sample Nos. 1101J–1104J).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1101J–1104J, no interference fringe pattern was observed and proved to be satisfactory for practical application.

EXAMPLE 151

Following the same conditions and procedure as in Example 149, except for changing $CH_4$ gas used in Example 149 to $NH_3$ gas, A-Si type light-receiving members for electrophotography were prepared (Sample Nos. 1201J–1204J).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1201J–1204J, no interference fringe pattern was observed and proved to be satisfactory for practical application.

EXAMPLE 152

By means of a lathe, an aluminum substrate (length (L): 357 mm, outerdiameter (r): 80 mm) was worked to have the surface characteristic as shown in Table 1J (BJ)–(EJ).

Next, light-receiving members for electrophotography were prepared following various procedures using the deposition device in FIG. 20 in same manner as in the Example 140 except for the conditions shown in Table 10J (Sample Nos. 1301J–1304J).

Figure 62:
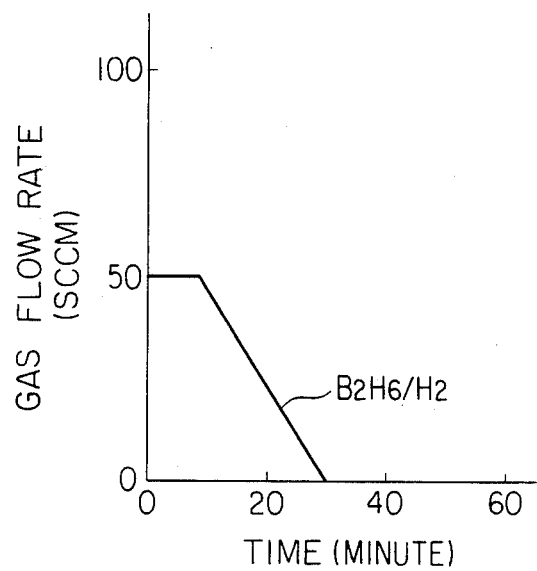

In forming the layer containing boron, the respective mass flow controllers 2010 and 2009 for $B_2H_6/H_2$ and NO were controlled by a computer (HP 9845B) so that the flow rates of $B_2H_6/H_2$ and NO became as shown in FIGS. 62 and 58.

The thickness of each layer of the light-receiving members thus prepared was measured using an electron microscope to obtain the results as shown in Table 11J.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 153

Following the same conditions and procedure as in Example 152, except for changing NO gas used in Example 150 to $NH_3$, A-Si type light-receiving members for electrophotography were prepared (Sample Nos. 1401J–1404J).

The light-receiving member for electrophotography as prepared above was subjected to image exposure by means of a device as shown in FIG. 26 (wavelength of laser beam: 780 nm, a spot diameter 80 μm), followed by development and transfer to obtain an image. In any of the images of Nos. 1401J–1404J, no interference fringe pattern was observed and proved to be satisfactory for practical application.

EXAMPLE 154

Following the same conditions and procedure as in Example 152, except for changing NO gas to $N_2O$ gas used in Example 152, A-Si type light-receiving members for electrophotography were prepared (Sample Nos. 1501J–1504J).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1501J–1504J, no interference fringe pattern was observed and proved to be satisfactory for practical application.

EXAMPLE 155

By means of a lathe, an aluminum substrate (length (L): 357 mm, outerdiameter (r): 80 mm) was worked as to the surface characteristics (BJ)–(EJ) as shown in Table 1J.

Next, light-receiving members for electrophotography were prepared following various procedures using the deposition device in FIG. 20 in the same manner as in Example 140 except for the conditions shown in Table 12J (Sample Nos. 1601J–1604J).

Figure 39:
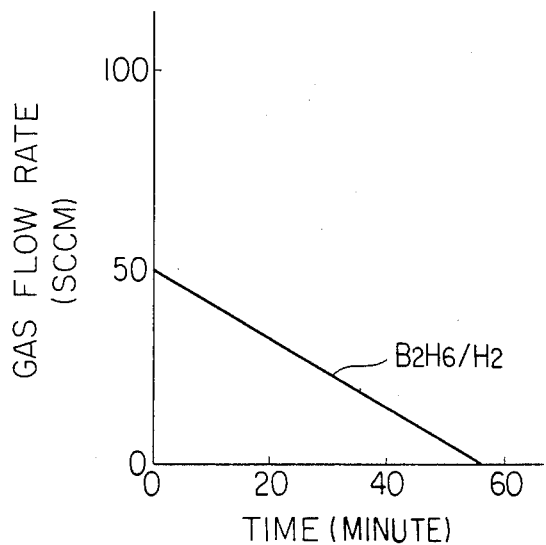
Figure 59:
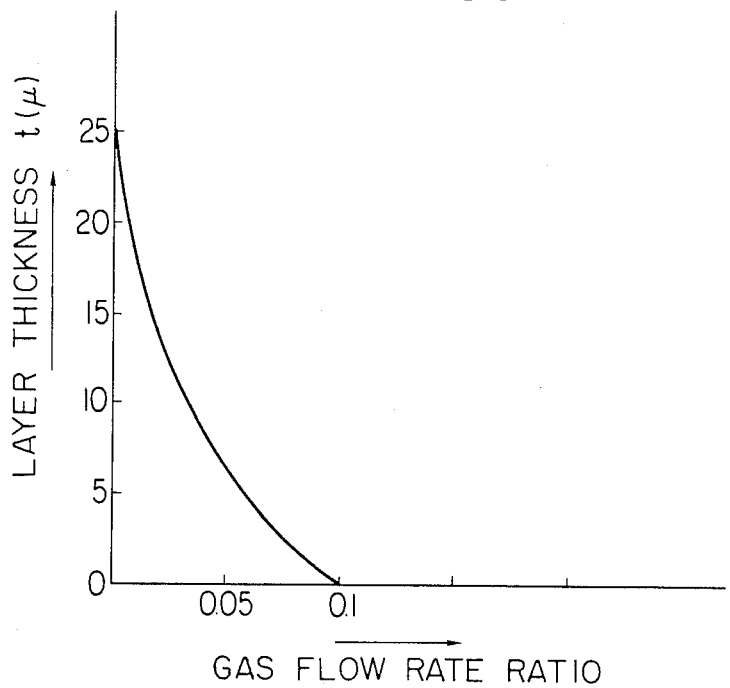

In the layer containing boron, the respective mass flow controllers 2010 and 2009 for $B_2H_6/H_2$ and $NH_3$ were controlled by a computer (HP 9845B) so that the flow rates of $B_2H_6/H_2$ and $NH_3$ became as shown in FIGS. 39 and 59.

The thickness of each layer of the light-receiving members thus prepared was measured using an electron microscope to obtain the results as shown in Table 13J.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the resulting images, no interference fringe pattern was observed and proved to be satisfactory for practical application.

EXAMPLE 156

Following the same conditions and procedure as in Example 155, except for changing NH$_3$ gas used in Example 155 to NO, A-Si type light-receiving members for electrophotography were prepared (Sample Nos. 1701J–1704J).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1701J–1704J, no interference fringe pattern was observed and proved to be satisfactory for practical application.

EXAMPLE 157

Following the same conditions and procedure as in Example 155, except for changing NH$_3$ gas used in Example 155 to N$_2$, A-Si type light-receiving members for electrophotography were prepared (Sample Nos. 1801J–1804J).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1801J–1804J, no interference fringe pattern was observed and proved to be satisfactory for practical application.

EXAMPLE 158

For examples 140 through 157, light-receiving members for electrophotography were prepared by use of PH$_3$ gas diluted with H$_2$ to 3000 vol ppm in place of B$_2$H$_6$ gas diluted with H$_2$ to 3000 vol ppm. (Sample Nos. 1901J–1950J).

Other preparation conditions were the same as in Examples 140 through 157.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1901J–1950J, no interference fringe pattern was observed and proved to be satisfactory for practical application.

EXAMPLE 159

By using aluminum substrates (length (L): 357 mm, diameter (r): 80 mm) worked by a lathe to the surface characteristics as shown in Table 1J (BJ), A-Si type light-receiving members for electrophotography were prepared under the same conditions and procedures as in Example 140, except for changing the flow rate ratio of SiH$_4$ gas and CH$_4$ gas during surface layer formation as shown in Table 14J (Sample Nos. 2701J–2708J).

The light-receiving member for electrophotography as prepared above was subjected to image exposure by means of a device as shown in FIG. 26 (wavelength of laser beam: 780 nm, spot diameter 80 μm), and after the steps of imae formation, developing and cleaning were repeated for 50,000 times, image evaluation was conducted to give the results as shown in Table 14J.

EXAMPLE 160

By using aluminum substrates (length (L): 357 mm, diameter (r): 80 mm) worked by a lathe to the surface characteristic as shown in Table 1J (BJ), A-Si type light-receiving members for electrophotography were prepared under the same conditions as in Example 159 except for changing the flow rate ratio of SiH$_4$ gas, CH$_4$ gas and SiF$_4$ gas during surface layer formation as shown in Table 15J (Sample Nos. 2801J–2808J).

The light-receiving member for electrophotography as prepared above was subjected to image exposure by means of a device as shown in FIG. 26 (wavelength of laser beam: 780 nm, spot diameter 80 μm), and after the steps of image formation, developing and cleaning were repeated for 50,000 times, image evaluation was conducted to give the results as shown in Table 15J.

EXAMPLE 161

By using the aluminum substrate (length (L): 357 mm, diameter (r): 80 mm) worked by a lathe to surface characteristic as shown in Table 1J (BJ), and forming the surface layer in the same conditions and procedure as in Example 140, A-Si type light-receiving members for electrophotography were prepared (Sample Nos. 2901J–2907J) except for changing the areas of Si target and C target as shown in Table 16J.

That is, after formation of the second layer, the substrate having formed layers to said layer was taken out from the deposition device as shown in FIG. 20, the hydrogen (H$_2$) gas bomb in said device was replaced with an argon (Ar) bomb, the device was cleaned internally and a target for sputtering with a thickness of 5 mm comprising Si and a target for sputtering with a thickness of 5 mm comprising graphite were placed on one surface of the cathode electrode so that the area ratio of these targets may be as indicated in Table 16J. Then, the substrate having formed layers to the second layer was set in the device and with introduction of argon gas after evacuation, glow discharging is exited at a high frequency power of 300 W thereby effecting sputtering of tne surface layer materials on the cathode electrode to form the surface layer, comprising silicon atoms and carbon atoms with predetermined mixing ratio on the second layer of the substrates.

Each of the thus prepared light-receiving members for electrophotography was subjected to image exposure by the image exposure device as shown in FIG. 26 (laser beam wavelength 780 nm, spot diameter 80 μm) and the steps of image formation, developing and cleaning were repeated for 50,000 times and then image evaluation was conducted to obtain the results as shown in Table 16J.

EXAMPLE 162

By means of a lathe, four kinds of aluminum substrates (length (L): 357 mm, outerdiameter (r): 80 mm) were worked as shown in FIG. 21 (P: pitch, D: depth) under the conditions shown in Table 2K.

Next, light-receiving members for electrophotography of A-Si type were prepared following various procedures using the deposition device in FIG. 20 under the conditions shown in Table 1K (Sample Nos. 201K–204K).

Figure 36:
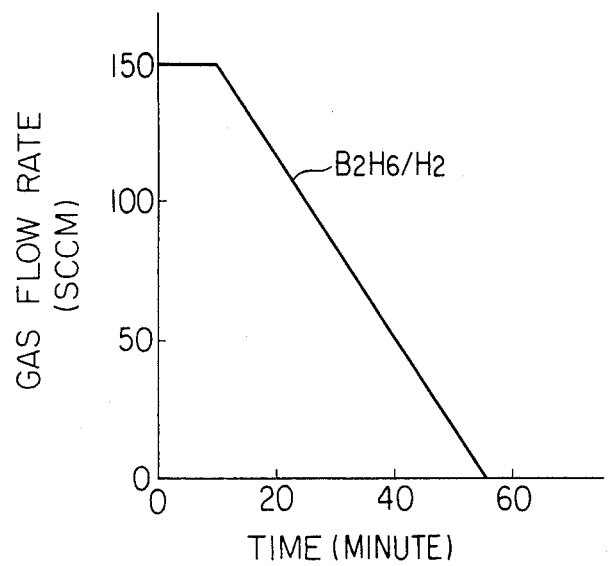

In the first layer, the respective mass flow controllers 2007, 2008 and 2010 for GeH$_4$, SiH$_4$ and B$_2$H$_6$/H$_2$ were controlled by a computer (HP 9845B) so that the flow rates of GeH$_4$, SiH$_4$ and B$_2$H$_6$/H$_2$ became as shown in FIGS. 22 and 36.

The thickness of each layer of the light-receiving members thus prepared was measured using an electron microscope to obtain the results as shown in Table 2K.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 201K-204K, no interference fringe pattern was observed and proved to be satisfactory for practical application.

EXAMPLE 163

By means of a lathe, four kinds of aluminum substrates (length (L): 357 mm, outerdiameter (r): 80 mm) were worked as shown in FIG. 21 (P: pitch, D: depth) under the conditions shown in Table 3K.

Next, light-receiving members for electrophotography of A-Si type were prepared following various procedures using the deposition device in FIG. 20 under the conditions shown in Table 1K (Sample Nos. 301K-304K).

Figure 37:
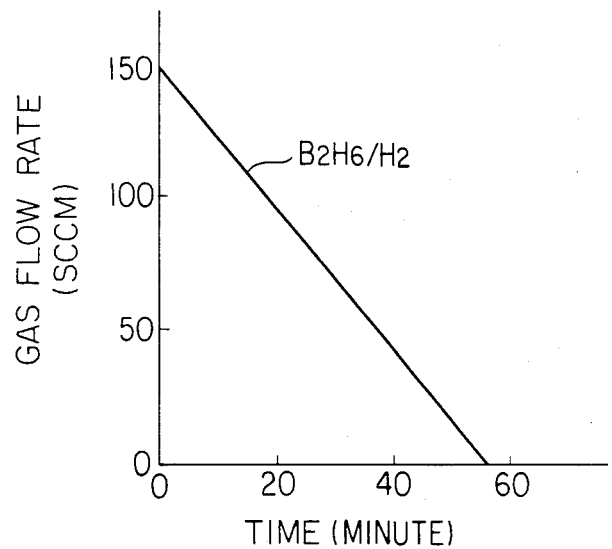

In the first layer, the respective mass flow controllers 2007, 2008 and 2010 were controlled by a computer (HP 9845B) so that the flow rates of GeH$_4$, SiH$_4$ and B$_2$H$_6$/H$_2$ became as shown in FIGS. 23 and 37.

The thickness of each layer of the light-receiving members thus prepared was measured using an electron microscope to obtain the results as shown in Table 3K.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 301K-304K, no interference fringe pattern was observed and proved to be satisfactory for practical application.

EXAMPLE 164

By means of a lathe, four kinds of aluminum substrates (length (L): 357 mm, outerdiameter (r): 80 mm) were worked as shown in FIG. 21 (P: pitch, D: depth) under the conditions shown in Table 5K.

Next, light-receiving members for electrophotography of A-Si type were prepared following various procedures using the deposition device in FIG. 20 under the conditions shown in Table 4K (Sample Nos. 501K-504K).

Figure 38:
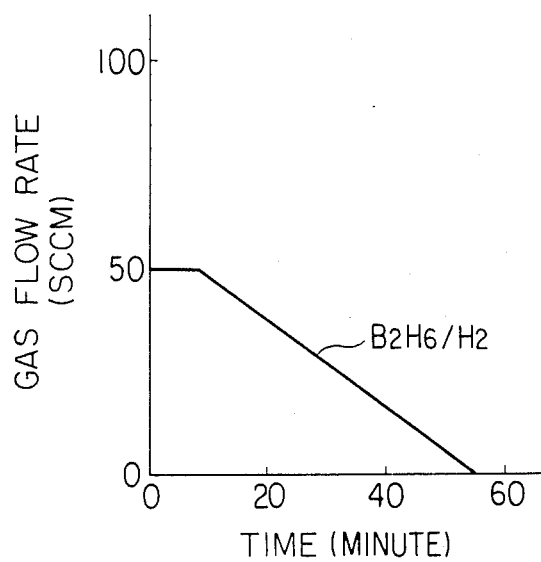

In the first layer, the respective mass flow controllers 2007, 2008 and 2010 were controlled by a computer (HP 9845B) so that the flow rates of GeH$_4$, SiH$_4$ and B$_2$H$_6$/H$_2$ became as shown in FIGS. 24 and 38.

The thickness of each layer of the light-receiving members thus prepared was measured using an electron microscope to obtain the results as shown in Table 5K.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 501K-504K, no interference fringe pattern was observed and proved to be satisfactory for practical application.

EXAMPLE 165

By means of a lathe, four kinds of aluminum substrate (legnth (L): 357 mm, outerdiameter (r): 80 mm) were worked as shown in FIG. 21 (P: pitch, D: depth) under the conditions shown in Table 6K.

Next, light-receiving members for electrophotography of A-Si:H type were prepared following various procedures using the deposition device in FIG. 20 under the conditions shown in Table 4K (Sample Nos. 601K-604K).

In the first layer, the respective mass flow controllers 2007, 2008 and 2010 were controlled by a computer (HP 9845B) so that the flow rates of GeH$_4$, SiH$_4$ and B$_2$H$_6$/H$_2$ became as shown in FIGS. 25 and 39.

The thickness of each layer of the light-receiving members thus prepared was measured using an electron microscope to obtain the results as shown in Table 6K.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 601K-604K, no interference fringe pattern was observed and proved to be satisfactory for practical application.

EXAMPLE 166

By means of a lathe, four kinds of aluminum substrates (legnth (L): 357 mm, outerdiameter (r): 80 mm) were worked as shown in FIG. 21 (P: pitch, D: depth) under the conditions shown in Table 8K.

Next, light-receiving members for electrophotography were prepared following various procedures using the deposition device in FIG. 20 under the conditions shown in Table 7K (Sample Nos. 801K-804K).

Figure 40:
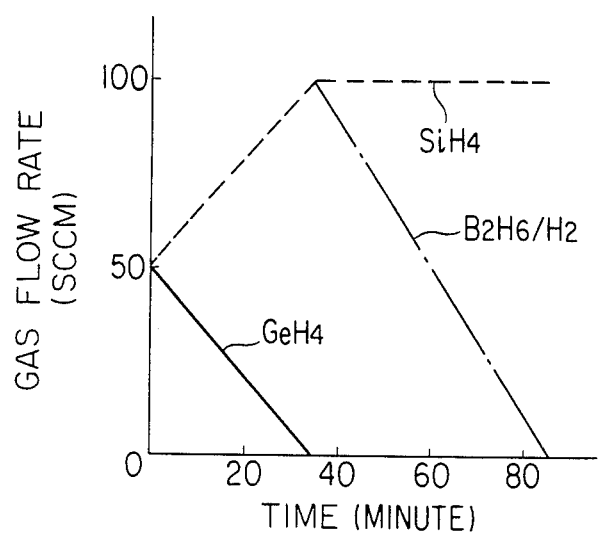

In the A layer and the first layer, the respective mass flow controllers 2007, 2008 and 2010 were controlled by a computer (HP 9845B) so that the flow rates of GeH$_4$, SiH$_4$ and B$_2$H$_6$/H$_2$ became as shown in FIG. 40.

The thickness of each layer of the light-receiving members thus prepared was measured using an electron microscope to obtain the results as shown in Table 8K.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 167

By means of a lathe, four kinds of aluminum substrates (length (L): 357 mm, outerdiameter (r): 80 mm) were worked as shown in FIG. 21 (P: pitch, D: depth) under the conditions shown in Table 10K.

Next, light-receiving members for electrophotography were prepared following various procedures using the deposition device in FIG. 20 under the conditions shown in Table 9K (Sample Nos. 1001K-1004K).

Figure 41:
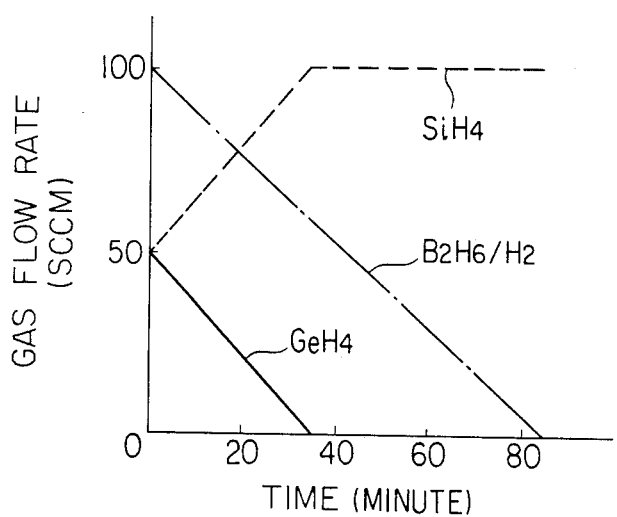

In the A layer and the first layer, the respective mass flow controllers 2007, 2008 and 2010 were controlled by a computer (HP 9845B) so that the flow rates of GeH$_4$, SiH$_4$ and B$_2$H$_6$/H$_2$ became as shown in FIG. 41.

The thickness of each layer of the light-receiving members thus prepared was measured using an electron microscope to obtain the results as shown in Table 10K.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 168

By means of a lathe, four kinds of aluminum substrates (length (L): 357 mm, outerdiameter (r): 80 mm) were worked as shown in FIG. 21 (P: pitch, D: depth) under the conditions shown in Table 12K.

Next, light-receiving members for electrophotography were prepared following various procedures using the deposition device in FIG. 20 under the conditions shown in Table 11K (Sample Nos. 1201K-1204K).

Figure 42:
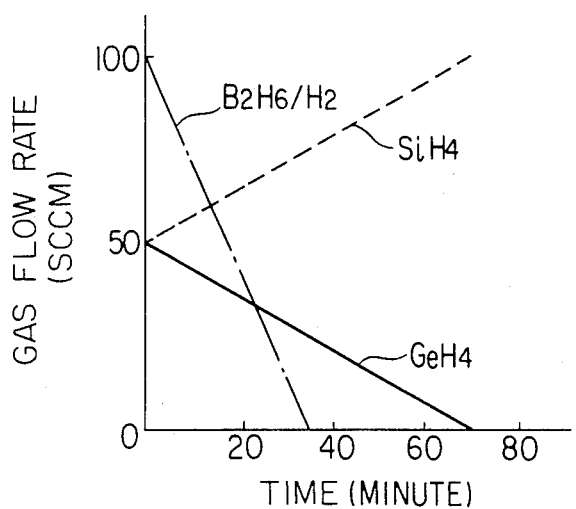

In the A layer and the first layer, the respective mass flow controllers 2007, 2008 and 2010 were controlled by a computer (HP 9845B) so that the flow rates of $GeH_4$, $SiH_4$ and $B_2H_6/H_2$ became as shown in FIG. 42.

The thickness of each layer of the light-receiving members thus prepared was measured using an electron microscope to obtain the results as shown in Table 12K.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 169

On an aluminum substrate having the same shape as Sample No. 201K of Example 162, a light-receiving layer comprising a first layer, a second layer and a surface layer was deposited in the following manner.

First, explanation is made about the different points from Example 162 in the deposition device shown in FIG. 20. In this Example, during deposition of the first layer, a target for sputtering comprising Si and Ge with a thickness of 5 mm was placed on one surface of the cathode electrode; during deposition of the second layer, a target for sputtering comprising Si with a thickness of 5 mm on one surface of the cathode electrode; and during deposition of the surface layer, a target for sputtering comprising Si and a target for sputtering comprising graphite with area ratio as shown in Table 13K on one surface.

Next, the preparation procedure is to be explained. Similarly as in Example 162, the deposition device was reduced to $10^{-7}$ Torr, and the aluminum substrate temperature was maintained constantly at 250° C. Then, by permitting Ar gas to flow at 200 SCCM and $H_2$ gas at 100 SCCM, the main valve 2034 was controlled so that the inner pressure within the deposition device may become $5 \times 10^{-3}$ Torr. And, by means of a high frequency power source, a high frequency power of 300 W was charged between the cathode electrode and the aluminum substrate to excite glow discharging. Thus, a first layer was deposited to 5 μm. Then, the target comprising Si and Ge was replaced with the target comprising Si, and a second layer was deposited under the same conditions to 20 μm thickness.

Thereafter, the target comprising Si was removed and replaced with the target comprising Si and the target comprising graphite, and a surface layer was deposited to 0.3 μm under the same conditions. The surface of the surface layer was found to be substantially parallel to the surface of the second layer.

The conditions during preparation of the surface layer were changed as shown in Table 13K to prepare light-receiving members.

Each of the thus prepared light-receiving members for electrophotography was subjected to image exposure with laser beam in the same manner as in Example 162 and the steps of image formation, developing and cleaning were repeated for 50,000 times and then image evaluation was conducted to obtain the results as shown in Table 13K.

EXAMPLE 170

Light-receiving members for electrophotography were prepared, respectively, in the same manner as Sample No. 201K in Example 162 except for varying the content ratios of silicon atoms to carbon atoms in the surface layer by varying the flow rate ratios of $SiH_4$ gas to $CH_4$ gas during formation of the surface layer.

Each of the thus prepared light-receiving members for electrophotography was subjected to image exposure with laser beam in the same manner as in Example 162 and the steps of image formation, developing and cleaning were repeated for 50,000 times and then image evaluation was conducted to obtain the results as shown in Table 14K.

EXAMPLE 171

Light-receiving members for electrophotography were prepared, respectively, in the same manner as Sample No. 201K in Example 162 except for varying the content ratios of silicon atoms to carbon atoms in the surface layer by varying the flow rate ratios of $SiH_4$ gas, $SiF_4$ gas and $CH_4$ gas during formation of the surface layer.

Each of the thus prepared light-receiving members for electrophotography was subjected to image exposure with laser beam in the same manner as in Example 162 and the steps of image formation, developing and cleaning were repeated for 50,000 times and then image evaluation was conducted to obtain the results as shown in Table 15K.

EXAMPLE 172

Light-receiving members for electrophotography were prepared, respectively, in the same manner as Sample No. 201K in Example 162 except for varying the layer thickness of the surface layer. For each of the thus prepared light-receiving members for electrophotography the steps of image formation, developing and cleaning were repeated similarly as in Example 162 to obtain the results as shown in Table 16K.

EXAMPLE 173

Light-receiving member for electrophotography was prepared in the same manner as Sample No. 201K in Example 162 except for changing the discharging power during preparation of the surface layer to 300 W and masking the average layer thickness 2 μm. The average layer thickness difference in the surface layer of the light-receiving member for electrophotography was found to be 0.5 μm at the center and both ends thereof, with the layer thickness difference at the minute portion being 0.1 μm.

In such a light-receiving member, no interference fringe was observed, and when the steps of image formation, developing and cleaning were repeated by means of the same device as in Example 162, practically satisfactory durability could be obtained.

EXAMPLE 174

By means of a lathe, an aluminum substrate (length (L): 357 mm, outerdiameter (r): 80 mm) was worked to the surface characteristic as shown in FIG. 21 under the conditions shown in Table 1aL (Sample Nos. BL–EL). The respective symbols of BL–EL in the Table show below representing the surface conditions of the substrate correspond to (BL)–(EL) in Table 1aL, respectively.

Next, A-Si type light-receiving members for electrophotography were prepared following predetermined procedures using the film deposition device in FIG. 20 under the conditions shown in Table 1L (Sample Nos. 101L–104L).

In the first layer, the respective mass flow controllers 2007, 2008 and 2010 were controlled by a computer (HP 9845B) so that the flow rates of $GeH_4$, $SiH_4$ and $B_2H_6/H_2$ became as shown in FIGS. 22 and 36. Deposition of the surface layer formed primarily of silicon atoms and carbon atoms was carried out as follows. That is, after deposition of the second layer, the respective mass flow controllers corresponding to the respective gases were set so that the $CH_4$ gas flow rate relative to the $SiH_4$ gas flow rate may be $SiH_4/CH_4=1/30$ as shown in Table 1L, and glow discharging was excited at a high frequency power of 300 W to form the surface layer.

The thickness of each layer of the light-receiving members thus prepared was measured using an electron microscope to obtain the results as shown in Table 2L.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In any of the images of Nos. 101L–104L, no interference fringe pattern was observed and proved to be satisfactory for practical application.

EXAMPLE 175

By means of a lathe, an aluminum substrate (length (L): 357 mm, outerdiameter (r): 80 mm) was worked as to the surface characteristic (BL)–(EL) as shown in Table 1aL.

Next, A-Si type light-receiving members for electrophotography were prepared following various procedures using the film deposition device in FIG. 20 under the conditions shown in Table 1L (Sample Nos. 201L–204L).

In the first layer, the respective mass flow controllers 2007, 2008 and 2010 were controlled by a computer (HP 9845B) so that the flow rates of $GeH_4$, $SiH_4$ and $B_2H_6/H_2$ became as shown in FIGS. 23 and 37.

The thickness of each layer of the light-receiving members thus prepared was measured using an electron microscope to obtain the results as shown in Table 3L.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In any of the images of Nos. 201L–204L, no interference fringe pattern was observed and proved to be satisfactory for practical application.

EXAMPLE 176

By means of a lathe, an aluminum substrate (length (L): 357 mm, outerdiameter (r): 80 mm) was worked as to the surface characteristics (BL)–(EL) as shown in Table 1aL.

Next, A-Si type light-receiving members for electrophotography were prepared following various procedures using the film deposition device in FIG. 20 in the same manner as in Example 174 except for the conditions shown in Table 4L (Sample Nos. 301L–304L).

In the first layer, the respective mass flow controllers 2007, 2008 and 2010 were controlled by a computer (HP 9845B) so that the flow rates of $GeH_4$, $SiH_4$ and $B_2H_6/H_2$ became as shown in FIGS. 24 and 38.

The thickness of each layer of the light-receiving members thus prepared was measured using an electron microscope to obtain the results as shown in Table 5L.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In any of the images of Nos. 301L–304L, no interference fringe pattern was observed and proved to be satisfactory for practical application.

EXAMPLE 177

By means of a lathe, an aluminum substrate (length (L): 357 mm, outerdiameter (r): 80 mm) was worked as to the surface characteristics (BL)–(EL) as shown in Table 1aL.

Next, A-Si type light-receiving members for electrophotography were prepared following various procedures using the film deposition device in FIG. 20 under the conditions shown in Table 4L (Sample Nos. 401L–404L).

In the first layer, the respective mass flow controllers 2007, 2008 and 2010 were controlled by a computer (HP 9845B) so that the flow rates of $GeH_4$, $SiH_4$ and $B_2H_6/H_2$ became as shown in FIGS. 25 and 39.

The thickness of each layer of the light-receiving members thus prepared was measured using an electron microscope to obtain the results as shown in Table 6L.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. In any of the images of Nos. 401L–404 L, no interference fringe pattern was observed and proved to be satisfactory for practical application.

EXAMPLE 178

By means of a lathe, an aluminum substrate (length (L): 357 mm, outerdiameter (r): 80 mm) was worked to the surface characteristic as shown in Table 1aL (Sample Nos. BL–EL).

Next, A-Si type light-receiving members for electrophotography were prepared following predetermined procedures using the film deposition device in FIG. 20 in the same manner as in Example 174 except for the conditions shown in Table 7L (Sample Nos. 501L–504L).

In A layer and the first layer, the respective mass flow controllers 2007, 2008 and 2010 were controlled by a computer (HP 9845B) so that the flow rates of $GeH_4$, $SiH_4$ and $B_2H_6/H_2$ became as shown in FIG. 40.

The thickness of each layer of the light-receiving members thus prepared was measured using an electron microscope to obtain the results as shown in Table 8L.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In the images, no interference fringe pattern was observed and proved to be satisfactory for practical application.

EXAMPLE 179

By means of a lathe, an aluminum substrate (length (L): 357 mm, outerdiameter (r): 80 mm) was worked as to the surface characteristics (BL)-(EL) as shown in Table 1aL.

Next, A-Si type light-receiving members for electrophotography were prepared following various procedures using the film deposition device in FIG. 20 in the same manner as in Example 174 except for the conditions shown in Table 9L (Sample Nos. 601L–604L).

In the A layer and the first layer, the respective mass flow controllers 2007, 2008 and 2010 were controlled by a computer (HP 9845B) so that the flow rates of $GeH_4$, $SiH_4$ and $B_2H_6/H_2$ became as shown in FIG. 41.

The thickness of each layer of the light-receiving members thus prepared was measured using an electron microscope to obtain the results as shown in Table 10L.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 180

By means of a lathe, an aluminum substrate (length (L): 357 mm, outerdiameter (r): 80 mm) was worked as to the surface characteristics (BL)-(EL) as shown in Table 1aL.

Next, A-Si type light-receiving members for electrophotography were prepared following various procedures using the film deposition device in FIG. 20 in the same manner as in Example 174 except for the conditions shown in Table 11L (Sample Nos. 701L–704L).

In the A layer and the first layer, the respective mass flow controllers 2007, 2008 and 2010 were controlled by a computer (HP 9845B) so that the flow rates of $GeH_4$, $SiH_4$ and $B_2H_6/H_2$ became as shown in FIG. 42.

The thickness of each layer of the light-receiving members thus prepared was measured using an electron microscope to obtain the results as shown in Table 12L.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 701L–704L, no interference fringe pattern was observed and proved to be satisfactory for practical application.

EXAMPLE 181

Following the same conditions and procedure as in Example 174, except for changing NO gas used in Example 174 to $NH_3$ gas, A-Si type light-receiving members for electrophotography were prepared (Sample Nos. 801L–804L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 801L–804L, no interference fringe pattern was observed and proved to be satisfactory for practical application.

EXAMPLE 182

Following the same conditions and procedure as in Example 174, except for changing NO gas used in Example 174 to $N_2O$ gas, A-Si type light-receiving members for electrophotography were prepared (Sample Nos. 901L–904L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 901L–904L, no interference fringe pattern was observed and proved to be satisfactory for practical application.

EXAMPLE 183

Following the same conditions and procedure as in Example 176, except for changing $NH_3$ gas used in Example 176 to NO gas, A-Si type light-receiving members for electrophotography were prepared (Sample Nos. 1001L–1004L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1001L–1004L, no interference fringe pattern was observed and proved to be satisfactory for practical application.

EXAMPLE 184

Following the same conditions and procedure as in Example 176, except for changing $NH_3$ gas used in Example 176 to $N_2O$ gas, A-Si type light-receiving members for electrophotography were prepared (Sample Nos. 1101L–1104L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1101L–1104L, no interference fringe pattern was observed and proved to be satisfactory for practical application.

EXAMPLE 185

Following the same conditions and procedure as in Example 178, except for changing $N_2$ gas used in Example 178 to NO gas, A-Si type light-receiving members for electrophotography were prepared (Sample Nos. 1201L–1204L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1201L–1204L, no interference fringe pattern was observed and proved to be satisfactory for practical application.

EXAMPLE 186

Following the same conditions and procedure as in Example 178, except for changing $N_2$ gas used in Example 178 to $NH_3$ gas, A-Si type light-receiving members for electrophotography were prepared (Sample Nos. 1301L–1304L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1301L–1304L, no interference fringe pattern was observed and proved to be satisfactory for practical application.

EXAMPLE 187

By means of a lathe, an aluminum substrate (length (L): 357 mm, outerdiameter (r): 80 mm) was worked as to the surface characteristics (BL)–(EL) as shown in Table 1aL.

Next, A-Si:H type light-receiving members for electrophotography were prepared following various procedures using the deposition device in FIG. 20 in the same manner as in Example 174 except for the conditions shown in Table 13L (Sample Nos. 1401L–1404L).

Figure 52:
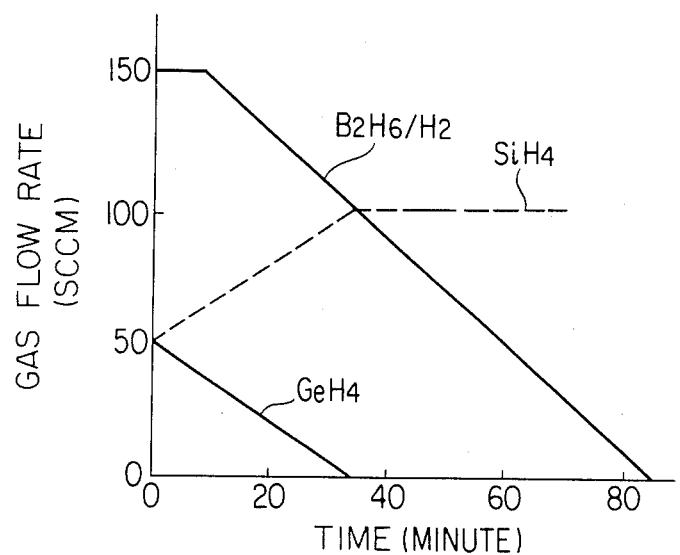

The flow rates of $SiH_4$, $GeH_4$ and $B_2H_6/H_2$ were changed as shown in FIG. 52 and, also for the nitrogen atom containing layer, the flow rate of $NH_3$ was changed as shown in FIG. 56, by controlling respectively the mass-flow controllers 2007, 2008, 2010 and 2009 for $SiH_4$, $GeH_4$, $B_2H_6/H_2$ and $NH_3$ according to a computer (HP 9845B).

The thickness of each layer of the light-receiving members thus prepared was measured using an electron microscope to obtain the results as shown in Table 14L.

The light-receiving member for electrophotography as prepared above was subjected to image exposure by means of a device as shown in FIG. 26 (wavelength of laser beam: 780 nm, spot diameter 80μm), followed by development and transfer to obtain an image. In the image, no interference fringe pattern was observed and proved to be satisfactory for practical application.

EXAMPLE 188

Following the same conditions and procedure as in Example 187, except for changing $NH_3$ gas used in Example 187 to NO gas, A-Si type light-receiving members electrophotography were prepared (Sample Nos. 1501L–1504L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1501L–1504L, no interference fringe pattern was observed and proved to be satisfactory for practical application.

EXAMPLE 189

Following the same conditions and procedure as in Example 187, except for changing $NH_3$ gas used in Example 187 to $N_2$ gas, A-Si type light-receiving members for electrophotography were prepared (Sample Nos. 1601L–1604L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1601L–1604L, no interference fringe pattern was observed and proved to be satisfactory for practical application.

EXAMPLE 190

By means of a lathe, an aluminum substrate (length (L): 357 mm, outerdiameter (r): 80 mm) was worked as to the surface characteristics (BL)–(EL) as shown in Table 1aL.

Next, light-receiving members for electrophotography were prepared following various procedures using the deposition device in FIG. 20 in the same manner as in Example 174 except for the conditions shown in Table 15L (Sample Nos. 1701L–1704L).

Figure 53:
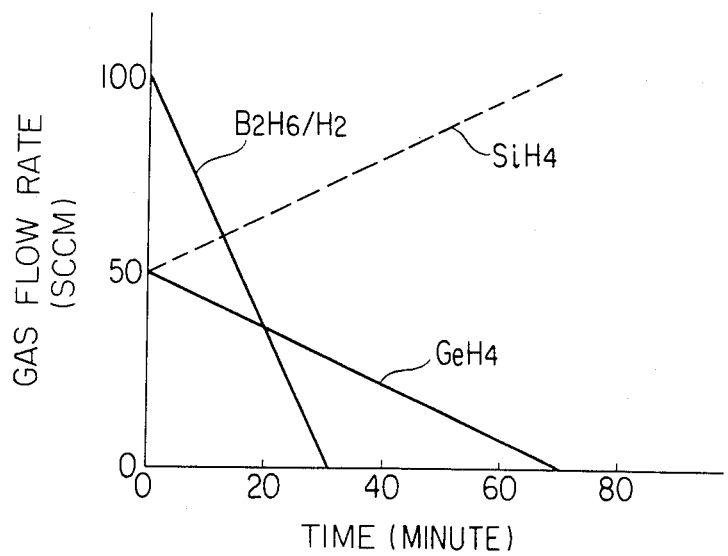

The flow rates of $SiH_4$, $GeH_4$ and $B_2H_6/H_2$ were changed as shown in FIG. 53 and, also for the nitrogen atom containing layer, the flow rate of $N_2$ was changed as shown in FIG. 57, by controlling respectively the mass-flow controllers 2007, 2008, 2010 and 2009 for $SiH_4$, $GeH_4$, $B_2H_6/H_2$ and $N_2$ according to a computer (HP 9845B).

The thickness of each layer of the light-receiving members thus prepared was measured using an electron microscope to obtain the results as shown in Table 16L.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 191

Following the same conditions and procedure as in Example 190, except for changing $N_2$ gas used in Example 190 to NO gas, A-Si type light-receiving members for electrophotography were prepared (Sample Nos. 1801L–1804L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1801L–1804L, no interference fringe pattern was observed and proved to be satisfactory for practical application.

EXAMPLE 192

Following the same conditions and procedure as in Example 190, except for changing $N_2$ gas used in Example 190 to $NH_3$ gas, A-Si type light-receiving members for electrophotography were prepared (Sample Nos. 1901L–1904L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 1901L–1904L, no interference fringe pattern was observed and proved to be satisfactory for practical application.

EXAMPLE 193

By means of a lathe, an aluminum substrate (length (L): 357 mm, outerdiameter (r): 80 mm) was worked as to the surface characteristics (BL)–(EL) as shown in Table 1aL.

Next, light-receiving members for electrophotography were prepared following various procedures using the deposition device in FIG. 20 in the same manner as in Example 174, except for the conditions shown in Table 17L (Sample Nos. 2001L–2004L).

Figure 54:
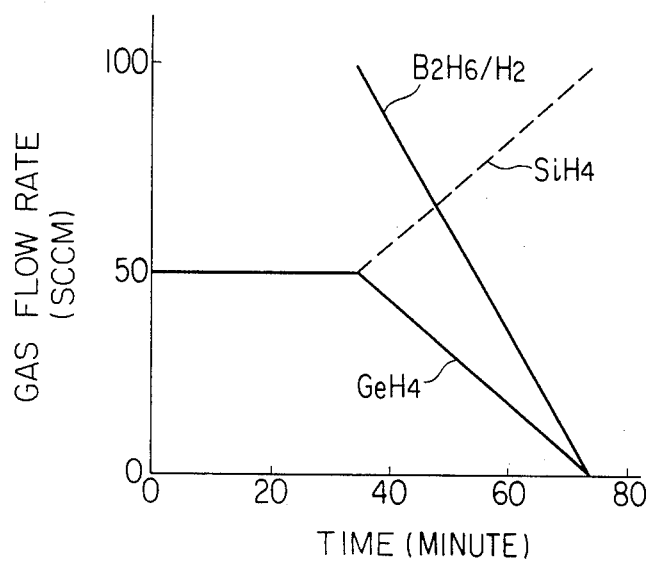

The flow rates of $SiH_4$, $GeH_4$ and $B_2H_6/H_2$ were changed as shown in FIG. 54 and, also for the oxygen atom containing layer, the flow rate of NO gas changed as shown in FIG. 58, by controlling respectively the mass-flow controllers 2007, 2008, 2010 and 2009 for $SiH_4$, $GeH_4$, $B_2H_6/H_2$ and NO according to a computer (HP 9845B).

The thickness of each layer of the light-receiving members thus prepared was measured using an electron microscope to obtain the results as shown in Table 18L.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 194

Following the same conditions and procedure as in Example 193, except for changing NO gas used in Example 193 to $NH_3$, A-Si type light-receiving members for electrophotography were prepared (Sample Nos. 2101L–2104L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 2101L–2104L, no interference fringe pattern was observed and proved to be satisfactory for practical application.

EXAMPLE 195

Following the same conditions and procedure as in Example 193, except for changing NO gas used in Example 193 to $N_2O$, A-Si type light-receiving members for electrophotography were prepared (Sample Nos. 2201L–2204L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 2201L–2204L, no interference fringe pattern was observed and proved to be satisfactory for practical application.

EXAMPLE 196

By means of a lathe, an aluminum substrate (length (L): 357 mm, outerdiameter (r): 80 mm) was worked as to the surface characteristics (BL)–(EL) as shown in Table 1aL.

Next, light-receiving members for electrophotography were prepared following various procedures using the deposition device in FIG. 20 in the same manner as in Example 174 except for the conditions shown in Table 19L (Sample Nos. 2301L–2304L).

Figure 55:
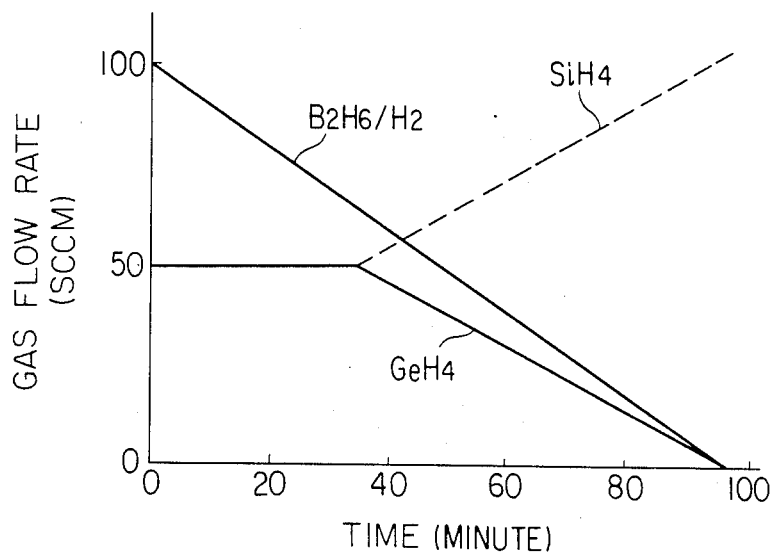

The flow rates of $SiH_4$, $GeH_4$ and $B_2H_6/H_2$ were changed as shown in FIG. 55 and, also for the nitrogen atom containing layer, the flow rate of $NH_3$ was changed as shown in FIG. 59, by controlling respectively the mass-flow controllers 2007, 2008, 2010 and 2009 for $SiH_4$, $GeH_4$, $B_2H_6/H_2$ and $NH_3$ according to a computer (HP 9845B).

The thickness of each layer of the light-receiving members thus prepared was measured using an electron microscope to obtain the results as shown in Table 20L.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 197

Following the same conditions and procedure as in Example 196, except for changing $NH_3$ gas used in Example 196 to NO gas, A-Si type light-receiving members for electrophotography were prepared (Sample Nos. 2401L–2404L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of Nos. 2401L–2404L, no interference fringe pattern was observed and proved to be satisfactory for practical application.

EXAMPLE 198

Following the same conditions and procedure as in Example 196, except for changing $NH_3$ gas used in Example 196 to $N_2$ gas, A-Si type light-receiving members for electrophotography were prepared (Sample Nos. 2501L–2504L).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of NOs. 2501L–2504L, no interference fringe pattern was observed and proved to be satisfactory for practical application.

EXAMPLE 199

For examples 174 through 198, light-receiving members for electrophotography were prepared by use of $PH_3$ gas diluted with $H_2$ to 3000 vol ppm in place of $B_2H_6$ gas diluted with $H_2$ to 3000 vol ppm. (Sample Nos. 2601L–2700L).

Other preparation conditions were the same as in Examples 174 through 198.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the resulting images, no interference fringe pattern was observed and proved to be satisfactory for practical application.

EXAMPLE 200

By using aluminum substrates (length (L): 357 mm, outerdiameter (r): 80 mm) worked by a lathe to the surface characteristic as shown in Table 1aL (BL), A-Si type light-receiving members for electrophotography were prepared under the same conditions and following the same manner as in Example 174 except for changing the content ratio of silicon atoms to carbon atoms in the surface layer by changing the flow rate ratio of $SiH_4$ gas and CH₄ gas during surface layer formation as shown in Table 21L (Sample Nos. 2701L–2708L).

The light-receiving member for electrophotography as prepared above was subjected to image exposure by means of a device as shown in FIG. 26 (wavelength of laser beam: 780 nm spot diameter 80μm), and after the steps of image formation, developing and cleaning were repeated for 50,000 times, image evaluation was conducted to give the results as shown in Table 21L.

EXAMPLE 201

By using aluminum substrates (length (L): 357 mm, outerdiameter (r): 80 mm) worked by a lathe to the surface characteristic as shown in Table 1aL (BL), A-Si type light-receiving members for electrophotography were prepared under the same conditions and following the same manner as in Example 200 except for changing the flow rate ratio of SiH₄ gas, CH₄ gas and SiF₄ gas during surface layer formation as shown in Table 22L (Sample Nos. 2801L–2808L).

The light-receiving member for electrophotography as prepared above was subjected to image exposure by means of a device as shown in FIG. 26 (wavelength of laser beam: 780 nm, spot diameter 80 μm), and after the steps of image formation, developing and cleaning were repeated for 50,000 times and then image evaluation was conducted to obtain the results as shown in Table 22L.

EXAMPLE 202

By using the aluminum substrate (length (L): 357 mm, outerdiameter (r): 80 mm) worked by a lathe to the surface characteristic as shown in Table 1aL (BL) and forming the surface layer according to the sputtering method, otherwise following the same conditions and procedure as in Example 174, A-Si type light-receiving members for electrophotography were prepared (Sample Nos. 2901L–2907L).

Formation of the surface layer was carried out as follows. That is, after formation of the second layer, the substrate having formed layers to said layer was taken out from the deposition device as shown in FIG. 20, the hydrogen (H₂) gas bomb in said device was replaced with an argon (Ar) bomb, the device was cleaned internally and a target for sputtering with a thickness of 5 mm comprising Si and a target for sputtering with a thickness of 5 mm comprising graphite were placed on one surface of the cathode electrode so that the area ratio of these targets may be as indicated in Table 23L. Then, the substrate having formed layers to the second layer was set in the device and with introduction of argon gas after evacuation, glow discharging is exited at a high frequency power of 300 W thereby effecting sputtering of the surface layer materials on the cathode electrode to form the surface layer.

Each of the thus prepared light-receiving members for electrophotography was subjected to image exposure by the image exposure device as shown in FIG. 26 (laser beam wavelength: 780 nm, spot diameter 80 μm) and the steps of image formation, developing and cleaning were repeated for 50,000 times and then image evaluation was conducted to obtain the results as shown in Table 23L.

EXAMPLE 203

In this Example, a semiconductor laser (wave-length: 780 nm) with a spot size of 80 μm was employed. Thus, on a cylindrical aluminum substrate (length (L): 357 mm, outerdiameter (r): 80 mm) on which A-Si is to be deposited, a spiral groove was prepared by a lathe with a pitch (P) of 20μm and a depth (D) of 0.8 S. The form of the groove is shown in FIG. 21.

Figure 63:
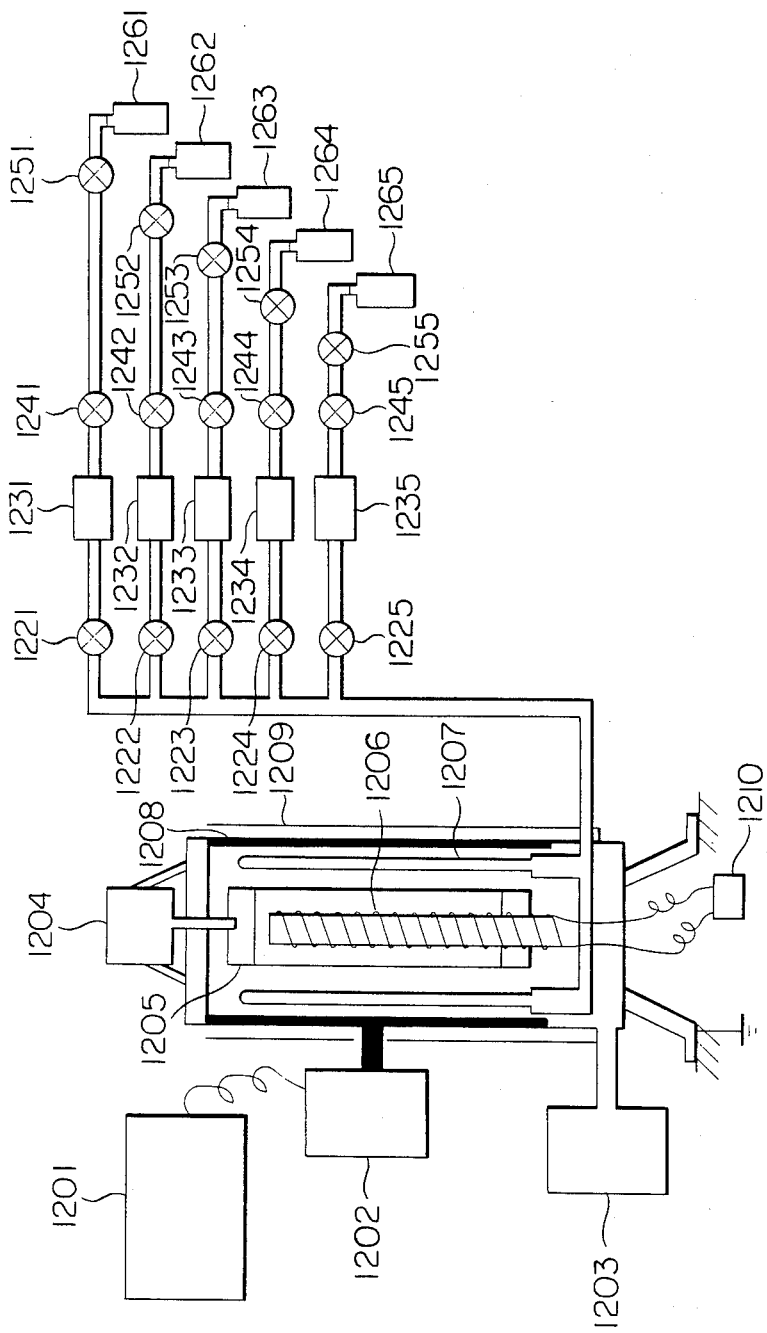

On this aluminum substrate, the charge injection preventive layer and the photosensitive layer were deposited by means of the device as shown in FIG. 63, in the following manner.

First, the constitution of the deposition film forming as shown in FIG. 63 device is to be explained. 1201 is a high frequency power source, 1202 is a matching box, 1203 is a diffusion pump and a mechanical booster pump, 1204 is a motor for rotation of the aluminum substrate, 1205 is an aluminum substrate, 1206 is a heater for heating the aluminum substrate, 1207 is a gas inlet tube, 1208 is a cathode electrode for introduction of high frequency, 1209 is a shield plate, 1210 is a power source for heater, 1221 to 1225, 1241 to 1245 are valves, 1231 to 1235 are mass flow controllers, 1251 to 1255 are regulators, 1261 is a hydrogen (H₂) bomb, 1262 is a silane (SiH₄) bomb, 1263 is a diborane (B₂H₆) bomb, 1264 is a nitrogen monoxide (NO) bomb and 1267 is a methane (CH₄) bomb.

Next, the preparation procedure is to be explained. All of the main cocks of the bombs 1261–1265 were closed, all the mass flow controllers and the valves were opened and the deposition device was internally evacuated by the diffusion pump 1203 to $10^{-7}$ Torr. At the same time, the aluminum substrate 1205 was heated by the heater 1206 to 250° C. and maintained constantly at 250° C. After the temperature of the aluminum substrate 1205 became constantly at 250° C., the valves 1221–1225, 1241–1245 and 1251–1255 were closed, the main cocks of bombs 1261–1265 were opened and the diffusion pump 1203 was changed to the mechanical booster pump. The secondary pressure of the valves equipped with regulators 1251–1255 was set at 1.5 Kg/cm². The mass flow controller 1231 was set at 300 SCCM, and the valves 1241 and 1221 were successively opened to introduce H₂ gas in bomb 1261 into the deposition device.

Next, by setting the mass flow controller 1232 at 150 SCCM, SiH₄ gas in bomb 1262 was introduced into the deposition device according to the same procedure as introduction of H₂ gas. Then, by setting the mass flow controller 1233 so that the flow rate of B₂H₆ gas may be 1600 vol ppm relative to SiH₄ gas flow rate, B₂H₆ gas was introduced into the deposition device according to the same procedure as introduction of H₂ gas.

When the inner pressure in the deposition device was stabilized at 0.2 Torr, the high frequency power source 1201 was turned on and glow discharge was generated between the aluminum substrate 1205 and the cathode electrode 1208 by controlling the matching box 1202, and a A-Si:H layer (p-type A-Si:H layer containing B) was deposited to a thickness of 5 μm at a high frequency power of 150 W (charge injection preventive layer). After deposition of a 5 μm thick A-Si:H layer (p-type), inflow of B₂H₆ was stopped by closing the valve 1223 without discontinuing discharge.

And, A-Si:H layer (non-doped) with a thickness of 20 μm was deposited at a high frequency power of 150 W (photosensitive layer). Then, the setting of the mass-flow controller 1232 was changed to 35 SCCM, CH₄ gas was introduced from a mass-flow controller previously set so that the flow rate ratio of CH₄ gas of 1265 relative to SiH₄ gas might be SiH₄/CH₄=1/30 by opening the valve 1225, and A-SiC(H) was deposited under a high frequency power of 150 W to a thickness of 0.5 μm (surface layer).

With the high frequency power source and all the valves being closed, the deposition device was evacuated, the temperature of the aluminum substrate was lowered to room temperature and the substrate on which the light-receiving layer was formed was taken out.

Separately, when a charge injection preventive layer and a photosensitive layer were formed on the same cylindrical aluminum substrate with the same surface characteristic under the same conditions and according to the same procedure as in the above case the surface of the photosensitive layer 6403 was found to be parallel to the surface of the substrate 6401, as shown in FIG. 64. The difference in the total layer thickness between the center and the both end portions of the aluminum substrate was 1 μm.

When the above high frequency power was made 150 W, the surface of the photosensitive layer 6503 and the surface of the substrate 6501 were unparallel to each other as shown in FIG. 65. In this case, the layer thickness difference in average layer thickness betwen the center and the both end portions was 2 μm.

For the two kinds of the light-receiving members for electrophotography, image exposure was effected by means of the device shown in FIG. 26 with a semiconductor laser of a wavelength 780 nm with a spot size of 80 μm, followed by developing and transfer to obtain images. In the light-receiving member with the surface characteristic as shown in FIG. 64 prepared at a high frequency power of 50 W, interference fringe pattern was observed.

On the other hand, in the light-receiving member having the surface characteristic as shown in FIG. 65, no interference fringe pattern was observed and there could be obtained a member exhibiting practically satisfactory electrophotographic characteristics.

EXAMPLE 204

The surface of cylindrical aluminum substrates were worked by a lathe under the conditions as shown in Table 1M. On these cylindrical aluminum substrates (cylinder NOs. 101M–108M), light-receiving members for electrophotography were prepared under the same condition as in Example 203 when the interference finge pattern disappeared (high frequency power 150 W) (Sample Nos. 111M–118M).

This average layer thickness difference between the center and both ends of the aluminum substrate of the light-receiving member for electrophotography was found to be 2 μm.

The cross-sections of these light-receiving members for electrophotogrraphy were observed by an electron microscope for measurement of the difference within the pitch in the photosensitive layer to give the results as shown in Table 2M. For these light-receiving members, similarly as in Example 203, by use of a semiconductor laser of 780 nm wavelength in the device as shown in FIG. 26, image exposure was effected at a spot diameter of 80 μm to obtain the results shown in Table 2M.

EXAMPLE 205

Light-receiving members were prepared under the same conditions as in Example 203 except for the following points (Sample No. 121M–128M). The layer thickness of the charge injection preventive layer was made 10 μm, and the average layer thickness difference between the center and both ends of the charge injection preventive layer was 1 μm, with the average difference in layer thickness between the center and both ends of the second layer being 2 μm. The thicknesses of the respective layers of each substrates No. 101M–108M were measured by an electron microscope to give the results as shown in Table 3M. For these light-receiving members, image exposure was conducted in the same image exposure device as in Example 203 to obtain the results shown in Table 3M.

EXAMPLE 206

On cylindrical aluminum substrates (cylinder Nos. 201M–207M) having the surface characteristic as shown in Table 4M, light receiving members provided with silicon oxide layer as the charge injection preventive layer were prepared as follows.

The silicon oxide layer was formed under the same conditions as the preparation of the charge injection preventive layer in Example 204, except for changing the flow rate of $SiH_4$ to 50 SCCM and that of NO to 60 SCCM, to a thickness of 0.2 μm.

On the silicon oxide layer was formed a photosensitive layer with a thickness of 20 μμm under the same conditions as in Example 204.

The difference in average layer thickness between the center and both ends of the light-receiving member for electrophotography thus prepared was 1 μm.

When these photosensitive members were observed by an electron microscope, the difference in the layer thickness of the silicon oxide layer within the pitch on the surface of the aluminum cylinder was 0.06 μm. Similarly, the difference in the layer thickness of A-Si:H photosensitive layer can be seen from the results shown in Table 5M. When these light receiving members for electrophotography were subjected to image exposure with laser beam similarly as described in Example 203, the results as shown in Table 5M were obtained.

EXAMPLE 207

Light receiving members having a silicon nitride layer as the charge injection preventive layer provided on cylindrical aluminum substrates having surface charactersitics as shown in Table 4M (Cylinder Nos. 201M–207M) were prepared as follows.

The silicon nitride layer was formed by replacing NO gas with $NH_3$ gas and changing the flow rate of $SiH_4$ gas to 30 SCCM and the flow rate of $NH_3$ gas to 200 SCCM in Example 206, following otherwise the same conditions as in preparation of the charge injection preventive layer in Example 204, to a thickness of 0.2 μm.

On the silicon nitride layer was formed a surface layer with a photosensitive layer (0.5 μ layer thickness) to a thickness of 20 μm similarly as in Example 204 except for changing the high frequency power to 100 W. The difference in average thickness between the center and the both ends of the light receiving member thus prepared was 1 μm.

When the layer thickness difference within each pitch in the light receiving member for electrophotography was measured by an electron microscope, the layer thickness difference was 0.05 μm or less in the silicon nitride layer.

On the other hand, in the A-Si:H photosensitive layer, the layer thickness difference within each pitch can be seen from the results shown in Table 6M.

These light receiving members for electrophotography (Nos. 221M-227M) were subjected to image exposure with laser beam similarly as in Example 203 to obtain the results as shown in Table 6M.

EXAMPLE 208

Light receiving members having a silicon carbide layer provided as the charge injection preventive layer on the cylindrical aluminum substrates (Cylinder Nos. 201M-207M) having surface characteristics as shown in Table 4M were prepared as follows.

The silicon carbide layer was formed with the use of $CH_4$(in place of NO gas in Example 206) gas and $SiH_4$ gas at a flow rate of $CH_4$ gas of 600 SCCM and a flow rate of $SiH_4$ gas of 20 SCCM, following otherwise the same conditions as in preparation of the charge injection preventive layer in Example 204, to a thickness of 0.3 μm.

On the silicon carbide layer, 20 μm A-Si:H photosensitive layer and 0.5 μm surface layer were formed at a high frequency power of 200 W under otherwise the same conditions as in Example 204.

The difference in average layer thickness between the center and the both ends of the A-Si type light-receiving member for electrophotography thus prepared was 1.5 μm.

When the light-receiving member for electrophotography of A-Si type was observed by an electron microscope, the difference in layer thickness within each pitch was 0.07 μm or less) in the silicon carbide layer.

On the other hand, the difference in layer thickness within each pitch in A-Si:H layer can be seen from the results as shown in Table 7M.

These light receiving members for electrophotography (Sample Nos. 231M-237M) were subjected to image exposure with laser beam similarly as in Example 203 to obtain the results as shown in Table 7M.

COMPARATIVE EXAMPLE 1

As a comparative test, an A-Si light receiving member for electrophotography was prepared according to entirely the same method as the light receiving member for electrophotography prepared at a high frequency power of 150 W in Example 203 except for employing an aluminum substrate whose surface had been roughened by the sand blast method in place of the aluminum substrate used in preparation of the light receiving member for electrophotography in Example 203. The surface condition of the aluminum substrate subjected to the surface roughening treatment by the sand blast method was subjected to measurement before provision of the light receiving layer by means of the universal surface shape measuring instrument (SE-3C) produced by Kosaka Research Institute to find that the average surface roughness was 1.8 μm.

The comparative light receiving member for electrophotography was mounted on the device shown in FIG. 26 as employed in Example 203 and similar measurement was conducted. As the result, clear interference fringe was found to be formed in the black image over the whole surface.

EXAMPLE 209

By using the device shown in FIG. 63, on an aluminum substrate having the same shape as in Example 203, a light-receiving layer comprising a charge injection preventive layer, photosensitive layer and a surface layer according to the sputtering method was deposited in the following manner.

First, explanation is made about the different points from Example 203 in the device shown in FIG. 63. In this Example, during deposition of the charge injection preventive layer, and the photosensitive layer, a silicon plate comprising polysilicon with a thickness of 5 mm was placed on the surface of the cathode electrode; during deposition of the surface layer, a polysilicon plate and a graphite plate were placed with area ratio of polisilicon and graphite as shown in Table 8M on the surface. Also valves (1226, 1246, 1256) for introduction of Ar gas (1266) and a mass-flow controller (1236) were newly provided.

Next, the preparation procedure is to be explained. Similarly as in Example 203, the deposition device was reduced to $10^{-7}$ Torr, and the aluminum substrate temperature was maintained constantly at 250° C. Then, by permitting Ar gas at 200 SCCM and $H_2$ gas at 100 SCCM $B_2H_6$ gas at 50 SCCM, mechanical booster pump 1203 was controlled so that the inner pressure within the deposition device may become $5 \times 10^{-3}$ Torr. and, by means of a high frequency power source, a high frequency power of 300 W was charged between the cathode electrode and the aluminum substrate to excite glow discharging. Thus, a charge injection preventive layer was deposited to 5 μm. Then, stop the flow of $B_2H_6$, and photosensitive layer was deposited under the same conditions to 20 μm thickness.

Thereafter, the polysilicon plate on the cathode electrode was removed and replaced with the plate comprising polysilicon and graphite, and a surface layer was deposited to 0.3 μm under the same conditions. The surface of the surface layer was found to be substantially parallel to the surface of the photosensitive layer.

The conditions during preparation of the surface layer were changed as shown in Table 8M to prepare light-receiving members.

Each of the thus prepared light-receiving members for electrophotography was subjected to image exposure with laser beam in the same manner as in Example 203 and the steps of image formation, developing and cleaning were repeated for 50,000 times and then image evaluation was conducted to obtain the results as shown in Table 8M.

EXAMPLE 210

Light-receiving members for electrophotography were prepared, respectively, in the same manner as Sample No. 201C in Example 203 except for varying the content ratios of silicon atoms to carbon atoms in the surface layer by varying the flow rate ratios of $SiH_4$ gas to $C_2H_4$ gas during formation of the surface layer. Each of the thus prepared light-receiving members for electrophotography was subjected to image exposure with laser beam in the same manner as in Example 203 and the steps of image formation, developing and cleaning were repeated for 50,000 times and then image evaluation was conducted to obtain the results as shown in Table 9M.

EXAMPLE 21

Light-receiving members for electrophotography were prepared, respectively, in the same manner as in Example 203 except for varying the content ratios of silicon atoms to carbon atoms in the surface layer by varying the flow rate ratios of $SiH_4$ gas, $SiF_4$ gas and $C_2H_4$ gas during formation of the surface layer.

Each of the thus prepared light-receiving members for electrophotography was subjected to image exposure with laser beam in the same manner as in Example 203 and the steps of image formation, developing and cleaning were repeated for 50,000 times and then image evaluation was conducted to obtain the results as shown in Table 10M.

EXAMPLE 212

Light-receivng members for electrophotography were prepared, respectively, in the same manner as in Example 203 except for varying the layer thickness of the surface layer. For each of the thus prepared light-receiving members for electrophotography the steps of image formation, developing and cleaning were repeated similarly as in Example 203 to obtain the results as shown in Table 11M.

EXAMPLE 213

Light-receiving member for electrophotography was prepared by the same manner as in Example 203 except for changing the high frequency power during preparation of the surface layer to 300 W and masking the average layer thickness 2 $\mu$m. The average layer thickness difference in the surface layer of the light-receiving member for electrophotography was found to be 0.5 $\mu$m at the center and both ends thereof, with the layer thickness difference at the minute portion being 0.1 $\mu$m.

In such a light-receiving member, no interference fringe was observed, and when the steps of image formation, developing and cleaning were repeated by means of the same device as in Example 203, practically satisfactory durability could be obtained.

EXAMPLE 214

In this Example, a semiconductor laser (wavelength: 780 nm) with a spot size of 80 $\mu$m was employed. Thus, on a cylindrical aluminum substrate (length (L) 357 mm, outer diameter (r) 80 mm) on which A-Si:H is to be deposited, a spiral groove was prepared by a lathe with a pitch (P) of 25 $\mu$m and a depth (D) of 0.8S. The form of the groove is shown in FIG. 21.

On this aluminum substrate, the charge injection preventive layer and the photosensitive layer were deposited by means of the device as shown in FIG. 63 in the following manner. All of the main cocks of the bombs 1261–1265 were closed, all the mass flow controllers 1231–1235 and the valves 1221–1225, 1241–1245 were opened and the deposition device was internally evacuated by the diffusion pump 1203 to $10^{-7}$ Torr. At the same time, the aluminum substrate 1205 was heated by the heater 1206 to 250° C. and maintained constantly at 250° C. After the temperature of the aluminum substrate 1205 became constantly at 250° C., the valves 1221–1225, 1241–1245 and 1251–1255 were closed, the main cocks of bombs 1261–1265 were opened and the diffusion pump 1203 was changed to the mechanical booster pump. The secondary pressure of the valves equipped with regulators 1251–1255 was set at 1.5 Kg/cm$^2$. The mass flow controller 1231 was set at 300 SCCM, and the valves 1241 and 1221 were successively opened to introduce H$_2$ gas in bomb 1261 into the deposition device.

Next, by setting the mass flow controller 1232 at 150 SCCM, SiH$_4$ gas in bomb 1262 was introduced into the deposition device according to the same procedure as introduction of H$_2$ gas. Then, by setting the mass flow controller 1233 so that the flow rate of B$_2$H$_6$ gas may be 1600 Vol. ppm relative to SiH$_4$ gas flow rate, B$_2$H$_6$ gas was introduced into the deposition device according to the same procedure as introduction of H$_2$ gas.

Then, by setting the mass-flow controller 1234 so that the NO gas flow rate from the bomb 1264 may be 3.4 Vol. % as the initial value relative to the SiH$_4$ gas flow rate, NO gas was introduced into the deposition device according to the same procedure as in introduction of H$_2$ gas.

When the inner pressure in the deposition device was stabilized at 0.2 Torr, the high frequency power source 1201 was turned on and glow discharge was generated between the aluminum substrate 1205 and the cathode electrode 1208 by controlling the matching box 1202, and a A-Si:H:B:O layer (p-type A-Si:H layer containing B, O) was deposited to a thickness of 5 $\mu$m at a high frequency power of 150 W (charge injection preventive layer).

During this operation, NO gas flow rate was changed relative to SiH$_4$ gas flow rate as shown in FIG. 22, until NO gas flow rate became zero on completion of layer formation.

After deposition of a 5 $\mu$m thick A-Si:H:B:O layer (p-type), inflow of B$_2$H$_6$ and NO were stopped by closing the valves 1223, 1224 without discontinuing discharge.

And, A-Si:H layer (non-doped) with a thickness of 20 $\mu$m was deposited at a high frequency power of 150 W (photosensitive layer). Then, the setting of the mass-flow controller 1232 was changed to 35 SCCM, CH$_4$ gas was introduced from a mass-flow controller previously set so that the flow rate ratio of CH$_4$ gas of 1265 relative to SiH$_4$ gas might be SiH$_4$/CH$_4$=1/30 by opening the valve 1225, and a-SiC(H) was deposited under a high frequency power of 160 W to a thickness of 0.5 $\mu$m (surface layer).

With the high frequency power source and all the valves being closed, the deposition device was evacuated, the temperature of the aluminum substrate was lowered to room temperature and the substrate on which the light-receiving layer was formed was taken out (Sample No. 1-1N).

When the above high frequency power was made 160 W (Sample No. 1- 1N, the surface of the photosensitive layer 6503 and the surface of the substrate 6501 were non-parallel to each other. In this case, the average layer thickness difference between the center and both ends of the aluminum substrate was 2 $\mu$m.

Separately, when a charge injection preventive layer and a photosensitive layer were formed on the same cylindrical aluminum substrate with the same surface characteristic under the same conditions and according to the same procedure as in the above case except for changing the high frequency power to 40 W, the surface of the photosensitive layer 6303 was found to be parallel to the surface of the substrate 6301, as shown in FIG. 64. The difference in the total layer thickness between the center and the both end portions of the substrate 6301 was 1 $\mu$m (Sample No. 1- 2N).

For the two kinds of the light receiving members for electrophotography, image exposure was effected by means of the device shown in FIG. 26 with a semiconductor laser of a wavelength 780 nm with a spot size of 80 $\mu$m, followed by developing and transfer to obtain images. In the light receiving member with the surface characteristic as shown in FIG. 64 prepared at a high frequency power of 50 W, interference fringe pattern was observed (Sample No. 1- 2N).

On the other hand, in the light receiving member having the surface characteristic as shown in FIG. 65, no interference fringe pattern was observed and there could be obtained a member exhibiting practically satisfactory electrophotographic characteristics (Sample No. 1- 1N).

EXAMPLE 215

The surfaces of cylindrical aluminum substrates were worked by a lathe under the conditions as shown in Table 1N. On these cylindrical aluminum substrates (cylinder Nos. 101N–108N), light-receiving members for electrophotography were prepared under the same conditions as in Example 214 when the interference finge pattern disappeared (high frequency power 160 W) (Sample Nos. 111N–118N).

The average layer thickness difference between the center and both ends of the aluminum substrate of the light-receiving member for electrophotography was found to be 2.2 $\mu$m.

The cross-sections of these light-receiving members for electrophotography were observed by an electron microscope for measurement of the difference within the pitch in the second layer to give the results as shown in Table 2N. For these light-receiving members, similarly as in Example 214, by use of a semiconductor laser of 780 nm wavelength in the device as shown in FIG. 26, image exposure was effected at a spot diameter of 80 $\mu$m to obtain the results shown in Table 2N.

EXAMPLE 216

Light-receiving members were prepared under the same conditions as in Example 215 except for the layer thickness of the charge injection preventive layer was made 10 $\mu$m (Sample No. 121N–128N). The average layer thickness difference between the center and both ends of the first layer was 1.2 $\mu$m, with the average difference in layer thickness between teh center and both ends of the photosensitive layer being 2.3 $\mu$m. The thicknesses of the respective layers of No. 121N–128N were measured by an electron microscope to give the results as shown in Table 3N. For these light-receiving members, image exposure was conducted in the same image exposure device as in Example 214 to obtain the results shown in Table 3N.

EXAMPLE 217

Light-receiving members having the charge injection preventive layer containing nitrogen provided on cylindrical aluminum substrates (Nos. 101N–108N) having the surface characteristics shown in Table 1N were prepared under the conditions shown in Table 4N (Sample Nos. 401N–408N). Other preparative conditions were the same as in Example 214.

The cross-sections of the light-receiving members prepared under the above conditions were observed by an electron microscope. The average layer thickness of charge injection preventive layer between the center and both ends of cylinder was found to be less than 0.1 $\mu$m. while that of photo-sensitive layer 3 $\mu$m.

The layer thickness differences within short ranges in the second layer of the respective light-receiving members (Sample No. 401N–408N) were the values as shown in Table 5N. When these light-receiving members were subjected to image exposure, respectively, with laser beam, similarly as in Example 214, the results as shown in Table 5N were obtained.

EXAMPLE 218

Light-receiving members having the charge injection preventive layer containing nitrogen provided on cylindrical aluminum substrates (Nos. 101N–108N) having the surface characteristics shown in Table 1N were prepared under the conditions shown in Table 6N (Sample Nos. 501N–508N). Other preparative conditions were the same as in Example 214.

The cross-sections of the light-receiving members (Sample No. 501N–508N) prepared under the above conditions were observed by an electron microscope. The average layer thickness of the charge injection preventive layer between the center and both ends of the cylinder was found to be 0.3 $\mu$m, while that of the photosensitive layer 3.2 $\mu$m.

The layer thickness differences within short ranges in the photosensitive layer of the respective light-receiving members (Sample No. 501N–508N) were the values as shown in Table 7N. When these light-receiving members were subjected to image exposure, respectively, with laser beam, similarly as in Example 214, the results as shown in Table 7N were obtained.

EXAMPLE 219

By means of the device shown in FIG. 63, on a cylindrical aluminum substrate (cylinder No. 105N), under the respective conditions as shown in Table 8N to Table 11N, layer formation was carried out while changing the gas flow rate ratio of NO and $SiH_4$ with lapse of time for layer formation according to the change rate curves shown in FIG. 66 to FIG. 69 to prepare respective light-receiving members for electrophotography (Sample Nos. 1201N–1204N).

Each of the thus obtained light-receiving members was evaluated of its characteristics according to the same conditions and means as in Example 214 to find that there was no interference fringe pattern observed with naked eyes at all, and satisfactorily good electrophotographics suitable for the object of the invention could be exhibited.

EXAMPLE 220

By means of the device shown in FIG. 63, on a cylindrical aluminum substrate (cylinder No. 105N), under the respective conditions as shown in Table 12N, layer formation was carried out while changing the gas flow rate ratio of NO and $SiH_4$ with lapse of time for layer formation according to the change rate curves shown in FIG. 66 to prepare respective light-receiving members for electrophotography.

Each of the thus obtained light-receiving members was evaluated of its characteristics according to the same conditions and means as in Example 214 to find that there was no interference fringe pattern observed with naked eyes at all, and satisfactorily good electrophotographics suitable for the object of the invention could be exhibited.

EXAMPLE 221

On a aluminum substrate having the same shape as in Example 214, a light-receiving layer comprising a charge injection preventive layer, a photosensitive layer and a surface layer using the device shown in FIG. 63 and by the sputtering method was deposited in the following manner.

First, explanation is made about the different points from Example 214 in the device shown in FIG. 63. In this Example, during deposition of the charge injection preventive layer and the photosensitive layer, a silicon plate comprising polysilicon with a thickness of 5 mm was placed on the surface of the cathode electrode; during deposition of the surface layer, a polysilicon plate and a graphite plate were placed with area ratio of polysilicon and graphite as shown in Table 13N on the surface. Also valves (1226, 1246, 1256) for introduction of Ar gas (1266) and a mass-flow controller (1236) were newly provided.

Next, the preparation procedure is to be explained. Similarly as in Example 214, the deposition device was reduced to $10^{-7}$ Torr, and the aluminum substrate temperature was maintained constantly at 250° C. Then, by permitting Ar gas at 200 SCCM, $H_2$ gas at 100 SCCM and $B_2H_6$ gas at 50 SCCM, the mechanical booster pump 1203 was controlled so that the inner pressure within the deposition device may become $5 \times 10^{-3}$ Torr. And, by means of a high frequency power source, a high frequency power of 300 W was charged between the cathode electrode and the aluminum substrate to excite glow discharging. Thus, a charge injection preventive layer was deposited to 5 μm. Then, stop the flow of $B_2H_6$ and photosensitive layer was deposited under the same conditions to 20 μm thickness.

Thereafter, the polysilicon plate on the cathode electrode was removed and replaced with the plate comprising Si and graphite, and a surface layer was deposited to 0.3 μm under the same conditions as of the photosensitive layer deposition. The surface of the surface layer was found to be substantially parallel to the surface of the photosensitive layer.

The conditions during preparation of the surface layer were changed as shown in Table 13N to prepare light-receiving members.

Each of the thus prepared light-receiving members for electrophotography was subjected to image exposure with laser beam in the same manner as in Example 214 and the steps of image formation, developing and cleaning were repeated for 50,000 times and then image evaluation was conducted to obtain the results as shown in Table 13N.

EXAMPLE 222

Light-receiving members for electrophotography were prepared, respectively, in the same manner as in Example 214 (Sample No. 1-1N) except for varying the content ratios of silicon atoms to carbon atoms in the surface layer by varying the flow rate ratios of $SiH_4$ gas to $CH_4$ gas during formation of the surface layer. Each of the thus prepared light-receiving members for electrophotography was subjected to image exposure with laser beam in the same manner as in Example 214 and the steps of image formation, developing and cleaning were repeated for 50,000 times and then image evaluation was conducted to obtain the results as shown in Table 14N.

EXAMPLE 223

Light-receiving members for electrophotography were prepared, respectively, in the same manner as in Example 214 Sample No. 1-1N except for varying the content ratios of silicon atoms to carbon atoms in the surface layer by varying the flow rate ratios of $SiH_4$ gas, $SiF_4$ gas and $CH_4$ gas during formation of the surface layer.

Each of the thus prepared light-receiving members for electrophotography was subjected to iamge exposure with laser beam in the same manner as in Example 214 and the steps of image formation, developing and cleaning were repeated for 50,000 times and then image evaluation was conducted to obtain the results as shown in Table 15N.

EXAMPLE 224

Light-receiving members for electrophotography were prepared, respectively, in the same manner as in Example 214 Sample No. 1-1N except for varying the layer thickness of the surface layer. For each of the thus prepared light-receiving members for electrophotography the steps of image formation, developing and cleaning were repeated similarly as in Example 214 to obtain the results as shown in Table 16N.

EXAMPLE 225

Light-receiving member for electrophotography was prepared in the same manner as in Example 214 except for changing the high frequency power during preparation of the surface layer to 300 W and making the average layer thickness 2 μm. The average layer thickness difference in the surface layer of the light-receiving member for electrophotography was found to be 0.5 μm between the center and both ends thereof, with the layer thickness difference at the minute portion being 0.1 μm.

In such a light-receiving member, no interference fringe was observed, and when the steps of image formation, developing and cleaning were repeated by means of the same device as in Example 214, practically satisfactory durability could be obtained.

EXAMPLE 226

In this Example, a semiconductor laser (wavelength: 780 nm) with a spot size of 80 μm was employed. Thus, on a cylindrical aluminum substrate (length (L) 357 mm, outer diameter (r) 80 mm) on which A-Si:H is to be deposited, a spiral groove was prepared by a lathe with a pitch (P) of 25 μm and a depth (D) of 0.8 S. The form of the groove is shown in FIG. 21.

On this aluminum substrate, the charge injection preventive layer, the photosensitive layer and surface layer were formed by means of the device as shown in FIG. 63 in the following manner.

All of the main cocks of the bombs 1261-1265 were closed, all the mass flow controllers and the valves were opened and the deposition device was internally evacuated by the diffusion pump 1203 to $10^{-7}$ Torr. At the same time, the aluminum substrate 1205 was heated by the heater 1206 to 250° C. and maintained constantly at 250° C. After the temperature of the aluminum substrate 1205 became constantly at 250° C., the valves 1221-1225, 1241-1245 and 1251-1255 were closed, the main cocks of bombs 1261-1265 were opened and the diffusion pump 1203 was changed to the mechanical booster pump. The secondary pressure of the valves equipped with regulators 1251-1255 was set at 1.5 Kg/cm². The mass flow controller 1231 was set at 300 SCCM, and the valves 1241 and 1221 were successively opened to introduce $H_2$ gas in bomb 1261 into the deposition device.

Next, by setting the mass flow controller 1232 at 150 SCCM, $SiH_4$ in bomb 1262 was introduced into the deposition device according to the same procedure as introduction of $H_2$ gas. Then, by setting the mass flow controller 1233 so that the flow rate of $B_2H_6$ gas was introduced into the deposition device according to the same procedure as introduction of $H_2$ gas.

Then, by setting the mass-flow controller 1234 so that the NO gas flow rate from the bomb 1264 may be 3.4 Vol. % as the initial value relative to the $SiH_4$ gas flow rate, NO gas was introduced into the deposition device according to the same procedure as in introduction of $H_2$ gas.

When the inner pressure in the deposition device was stabilized at 0.2 Torr, the high frequency power source 1201 was turned on and glow discharge was generated between the aluminum substrate 1205 and the cathode electrode 1208 by controlling the matching box 1202, and an A-Si:H:B layer (p-type A-Si:H layer containing B) was deposited to a thickness of 5 μm at a high frequency power of 160 W (charge injection preventive layer). After deposition of a 5 μm thick A-Si:H:B layer (p-type), inflow of $B_2H_6$ was stopped by closing the valve 1223 without discontinuing discharge.

And, A-Si:H layer (non-doped)with a thickness of 20 μm was deposited at a high frequency power of 160 W (photosensitive layer). Then, the setting of the mass-flow controller 1232 was changed to 35 SCCM, $CH_4$ gas was introduced from a mass-flow controller previously set so that the flow rate ratio of $CH_4$ of 1265 relative to $SiH_4$ gas might be $SiH_4/CH_4 = 1/30$ by opening the valve 1225, and A-SiC(H) as deposited under a high frequency power of 160 W to a thickness of 0.5 μm (surface layer).

With the high frequency power source and all the valves being closed, the deposition device was evacuated, the temperature of the aluminum substrate was lowered to room temperature and the substrate on which the light-receiving layer was formed was taken out (Sample No. 1-1P).

Separately, when a charge injection preventive layer and a photosensitive layer were formed on the same cylindrical aluminum substrate with the same surface characteristic under the same conditions and according to the same procedure as in the above case except for changing the high frequency power to 40 W the surface of the photosensitive layer 6403 was found to be parallel to the surface of the substrate 6401, as shown in FIG. 64. The difference in the total layer thickness between the center and the both end portions of the aluminum substrate was 1 μm (Sample No. 1-2P).

When the above high frequency power was made 160 W, the surface of the photosensitive layer 6503 and the surface of the substrate 6501 were unparallel to each other as shown in FIG. 65. In this case, the laeyr thickness difference in average layer thickness between the center and the both end portions was 2 μm.

For the two kinds of the light receiving members for electrophotography, image exposure was effected by means of the device shown in FIG. 26 with a semiconductor laser of a wavelength 780 nm with a spot size of 80 μm, followed by developing and transfer to obtain images. In the light receiving member with the surface characteristic as shown in FIG. 64 prepared at a high frequency power of 40 W, interference fringe pattern was observed.

On the other hand, in the light receiving member having the surface characteristic (Sample No. 1-1P) as shown in FIG. 65, no interference fringe pattern was observed and there could be obtained a member exhibiting practically satisfactory electrophotographic characteristics.

EXAMPLE 227

The surfaces of cylindrical aluminum substrates were worked by a lathe under the conditions as shown in Table 1P. On these cylindrical aluminum substrates (Sample Nos. 101P-108P), light-receiving members for electrophotography were prepared under the same condition as in Example 224 when the interference fringe pattern disappeared (high frequency power 160 W) (Sample Nos. 111P-118P).

The average layer thickness difference between the center and both ends of the aluminum substrate of the light-receiving member for electrophotography was found to be 2.2 μm.

The cross-sections of these light-receiving members for electrophotography were observed by an electron microscope for measurement of the difference within the pitch in the photosensitive layer to give the results as shown in Table 2P. For these light-receiving members, similarly as in Example 226, by use of a semiconductor laser of 780 nm wavelength in the device as shown in FIG. 26, image exposure was effected at a spot diameter of 80 μm to obtain the results shown in Table 2P.

EXAMPLE 228

Light-receiving members were prepared under the same conditions as in Example 227 except for the following points. The layer thickness of the charge injection preventive layer was made 10 μm, and the average layer thickness difference between the center and both ends of charge injection preventive layer was 1.2 μm, with the average difference in layer thickness between the center and both ends of the photosensitive layer being 2.3 μm. The thicknesses of the respective layers of Nos. 121P-128P were measured by an electron microscope to give the results as shown in Table 3P. For these light-receiving members, image exposure was conducted in the same image exposure device as in Example 226 to obtain the results shown in Table 3P.

EXAMPLE 229

Light-receiving members having the charge injection preventive layer containing nitrogen provided on cylindrical aluminum substrates (Sample Nos. 101P-108P) haivng the surface characteristics shown in Table 1P were prepared following the conditions shown in Table 4P (Sample Nos. 401P-408P).

The cross-sections of the light-receiving members prepared under the above conditions were observed by an electron microscope. The average layer thickness difference between the center and both ends of the charge injection preventive layer was found to be less than 0.1 μm, while that of the photosensitive layer 3 μm.

The layer thickness differences within short ranges in the second layer of the respective light-receiving members were the values as shown in Table 5P.

When these light-receiving members were subjected to image exposure, respectively, with laser beam, similarly as in Example 224, the results as shown in Table 5P were obtained.

EXAMPLE 230

Light-receiving members having the charge injection preventive layer containing nitrogen provided on cylindrical aluminum substrates (Nos. 101P-108P) having the surface characteristics shown in Table 1P were prepared under the conditions shown in Table 6P (Sample Nos. 501P–508P).

The cross-sections of the light-receiving members prepared under the above conditions were observed by an electron microscope. The average layer thickness difference between the center and both ends of the charge injection preventive layer was found to be 0.3 μm, while that of the photosensitive layer 3.2 μm.

The layer thickness differences within short ranges in the photosensitive layer of the respective light-receiving members were the values as shown in Table 7P. When these light-receiving members were subjected to image exposure, respectively, with laser beam, similarly as in Example 226, the results as shown in Table 7P were obtained.

EXAMPLE 231

By means of the device shown in FIG. 63, on an aluminum substrate having the same shape as in Example 226, a light-receiving layer comprising a charge injection preventive layer, a photosensitive layer and a surface layer according to the sputtering method was deposited in the following manner.

First, explanation is made about the different points from Example 226 in the device shown in FIG. 63. In this Example during deposition of the charge injection preventive layer and the photosensitive layer, a target for sputtering a silicon plate comprising polysilicon with a thickness of 5 mm was placed on the surface of the cathode electrode; during deposition of the surface layer, a polysilicon plate and a graphite plate were placed with area ratio of polysilicon and graphite as shown in Table 8P on the surface. Also valves (1226, 1246, 1256) for introduction of Ar gas (1266) and a mass-flow controller (1236) were newly provided.

Next, the preparation procedure is to be explained. Similarly as in Example 226, the deposition device was reduced to $10^{-7}$ Torr, and the aluminum substrate temperature was maintained constantly at 250° C. Then, by permitting Ar gas 200 SCCM and $H_2$ gas at 100 SCCM and $B_2H_6$ gas to 50 SCCM, the mechanical booster pump 1203 was controlled so that the inner pressure within the deposition device may become $5 \times 10^{31}$ 3 Torr. And, by means of a high frequency power source, a high frequency power of 300 W was charged between the cathode electrode and the aluminum substrate to excite glow discharging. Thus, a charge injection preventive layer was deposited to 5 μm. Then, stop the flow of $B_2H_6$, and a photosensitive layer was deposited under the same conditions to 20 μm thickness.

Thereafter, the polysilicon plate on the cathode electrode was removed and replaced with the plate comprising polysilicon and graphite and a surface layer was deposited to 0.3 μm under the same conditions as that of the photosensitive layer. The surface of the surface layer was found to be substantially parallel to the surface of the photosensitive layer.

The conditions during preparation of the surface layer were changed as shown in Table 8P to prepare light-receiving members.

Each of the thus prepared light-receiving members for electrophotography was subjected to image exposure with laser beam in the same manner as in Example 226 and the steps of image formation, developing and cleaning were repeated for 50,000 times and then image evaluation was conducted to obtain the results as shown in Table 8P.

EXAMPLE 232

Light-receiving members for electrophotography were prepared, respectively, in the same manner as in Example 226 (Sample No. 1-1P) except for varying the content ratios of silicon atoms to carbon atoms in the surface layer by varying the flow rate ratios of $SiH_4$ gas to $CH_4$ gas during formation of the surface layer. Each of the thus prepared light-receiving members for electrophotography was subjected to image exposure with laser beam in the same manner as in Example 226 and the steps of image formation, developing and cleaning were repeated for 50,000 times and then image evaluation was conducted to obtain the results as shown in Table 9P.

EXAMPLE 233

Light-receiving members for electrophotography were prepared, respectively, in the same manner as in Example 226 (Sample No. 1-1P) except for varying the content ratios of silicon atoms to carbon atoms in the surface layer by varying the flow rate ratios of $SiH_4$ gas. $SiF_4$ gas and $CH_4$ gas during formation of the surface layer.

Each of the thus prepared light-receiving members for electrophotography was subjected to iamge exposure with laser beam in the same manner as in Example 226 and the steps of image formation, developing and cleaning were repeated for 50,000 times and then image evaluation was conducted to obtain the results as shown in Table 10P.

EXAMPLE 234

Light-receiving members for electrophotography were prepared, respectively, in the same manner as in Example 226 (Sample No. 1-1P) except for varying the layer thickness of the surface layer. For each of the thus prepared light-receiving members for electrophotography the steps of image formation, developing and cleaning were repeated similarly as in Example 226 to obtain the results as shown in Table 11P.

EXAMPLE 235

Light-receiving member for electrophotography was prepared in the same manner as in Example 226 (Samaple No. 1-1P) except for changing the high frequency power during preparation of the surface layer to 300 W and making the layer thickness 2 μm. The average layer thickness difference in the surface layer of the light-receiving member for electrophotography was found to be 0.5 μm the center and both ends thereof, with the layer thickness difference at the minute portion being 0.1 μm.

In such a light-receiving member, no interference fringe was observed, and when the steps of image formation, developing and cleaning were repeated by means of the same device as in Example 226, practically satisfactory durability could be obtained.

TABLE 1A

| No. | 101A | 102A | 103A | 104A |
|---|---|---|---|---|
| Pitch (μm) | 50 | 40 | 25 | 10 |
| Depth (μm) | 2.1 | 1.7 | 0.8 | 0.6 |
| Angle (degree) | 5.0 | 4.8 | 3.7 | 6.8 |

TABLE 2A

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 1 |
| | $GeH_4$ | 100 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 3A

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 14 | 3 |
| | $SiH_4$ | 50 | | | |
| | $GeH_4$ | 100 | | | |
| Second layer | $H_2$ | 300 | 300 | 24 | 20 |
| | $SiH_4$ | 300 | | | |
| Surface layer | $SiH_4$ | 20 | 300 | 1 | 0.5 |
| | $CH_4$ | 600 | | | |

TABLE 4A

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 12 | 5 |
| | $SiH_4$ | 100 | | | |
| | $GeH_4$ | 50 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 5A

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 8 | 7 |
| | $SiH_4$ | 135 | | | |
| | $GeH_4$ | 15 | | | |
| Second layer | $H_2$ | 300 | 300 | 24 | 20 |
| | $SiH_4$ | 300 | | | |
| Surface layer | $SiH_4$ | 20 | 300 | 1 | 0.7 |
| | $CH_4$ | 600 | | | |

TABLE 6A

| Sample No. | 501A | 502A | 503A | 504A | 505A | 506A | 507A |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | △ | ○ | ◎ | ◎ | ○ | △ | x |

◎: Very good
○: Good
△: Practically satisfactory
x: Image defect formed

TABLE 7A

| Sample No. | 601A | 602A | 603A | 604A | 605A | 606A | 607A | 608A |
|---|---|---|---|---|---|---|---|---|
| $SiH_4$:$CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ○ | ◎ | ◎ | ◎ | ○ | △ | x |

◎: Very good
○: Good
△: Practically satisfactory
x: Image defect formed

TABLE 8A

| Sample No. | 701A | 702A | 703A | 704A | 705A | 706A | 707A | 708A |
|---|---|---|---|---|---|---|---|---|
| $SiH_4$:$SiF_4$:$CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ○ | ◎ | ◎ | ◎ | ○ | △ | x |

◎: Very good
○: Good
△: Practically satisfactory
x: Image defect formed

TABLE 9A

| Sample No. | Thickness of surface layer ($\mu$) | Results |
|---|---|---|
| 801A | 0.001 | Image defect liable to be formed |
| 802A | 0.02 | No image defect formed up to successive copying for 20,000 times |
| 803A | 0.05 | Stable up to successive copying for 50,000 times |
| 804A | 1 | Stable up to successive copying for 200,000 times |

TABLE 1B

| NO | 101B | 102B | 103B | 104B | 105B | 106B | 107B | 108B |
|---|---|---|---|---|---|---|---|---|
| Pitch ($\mu$m) | 600 | 200 | 100 | 50 | 40 | 25 | 10 | 5.0 |
| Depth ($\mu$m) | 1.0 | 10 | 1.8 | 2.1 | 1.7 | 0.8 | 0.2 | 2 |
| Angle (degree) | 0.2 | 5.7 | 2.1 | 5.0 | 4.8 | 3.7 | 2.3 | 38 |

TABLE 1aB

| | Starting gas | Gas flow rate (SCCM) | Discharging power (W) | Layer thickness ($\mu$m) |
|---|---|---|---|---|
| First layer | $H_2$ | 300 | 160 | 5 |
| | $GeH_4$ | 50 | | |
| | $SiH_4$ | 100 | | |
| | NO | | | |
| Second layer | $H_2$ | 300 | 150 | 20 |
| | $SiH_4$ | 300 | | |
| Surface layer | $SiH_4$ | 20 | 300 | 0.32 |
| | $CH_4$ | 600 | | |

TABLE 2B

| No. | 111B | 112B | 113B | 114B | 115B | 116B | 117B | 118B |
|---|---|---|---|---|---|---|---|---|
| No.* | 101B | 102B | 103B | 104B | 105B | 106B | 107B | 108B |
| Difference in layer thickness ($\mu$m) | 0.06 | 0.08 | 0.16 | 0.18 | 0.41 | 0.31 | 0.11 | 3.2 |
| Interference fringe | x | x | ○ | ○ | ◎ | ◎ | △ | x |

*Cylinder No.
(The * note applies to the subsequent other tables.)
x Practically unusable
△ Practically satisfactory
○ Practically very good
◎ Practically excellent

TABLE 3B

| No. | 121B | 122B | 123B | 124B | 125B | 126B | 127B | 128B |
|---|---|---|---|---|---|---|---|---|
| No.* | 101B | 102B | 103B | 104B | 105B | 106B | 107B | 108B |
| Difference in layer thickness of first layer ($\mu$m) | 0.05 | 0.041 | 0.1 | 0.19 | 0.31 | 0.22 | 0.1 | 2.6 |
| Difference in layer thickness of second layer ($\mu$m) | 0.06 | 0.07 | 0.11 | 0.22 | 0.41 | 0.32 | 0.1 | 3.6 |
| Interference fringe | x | x | ○ | ◎ | ◎ | ◎ | △ | x | x Practically unusable
△ Practically satisfactory
○ Practically very good
◎ Practically excellent

TABLE 4B

| Layer | Starting gas | Flow rate (SCCM) | High frequency power (W) | Layer thickness ($\mu$m) |
|---|---|---|---|---|
| First layer | $H_2$ | 300 | 160 | 3 |
| | $SiH_4$ | 100 | | |
| | $GeH_4$ | 50 | | |
| | $NH_3$ | 30 | | |
| Second layer | $H_2$ | 300 | 300 | 20 |
| | $SiH_4$ | 300 | | |
| Surface layer | $SiH_4$ | 20 | 300 | 0.32 |
| | $CH_4$ | 600 | | |

TABLE 5B

| No. | 401B | 402B | 403B | 404B | 405B | 406B | 407B | 408B |
|---|---|---|---|---|---|---|---|---|
| No.* | 101B | 102B | 103B | 104B | 105B | 106B | 107B | 108B |
| Difference in layer thickness ($\mu$m) | 0.07 | 0.08 | 0.17 | 0.20 | 0.42 | 0.33 | 0.11 | 2.8 |
| Interference fringe | x | x | ○ | ◎ | ◎ | ◎ | △ | x | x Practically unusable
△ Practically satisfactory
○ Practically very good
◎ Practically excellent

TABLE 6B

| Layer | Starting gas | Flow rate (SCCM) | High frequency power (W) | Layer thickness ($\mu$m) |
|---|---|---|---|---|
| First layer | $H_2$ | 300 | 160 | 5 |
| | $SiH_4$ | 100 | | |
| | $GeH_4$ | 50 | | |
| | $NH_3$ | 15 | | |
| Second layer | $H_2$ | 300 | 200 | 20 |
| | $SiH_4$ | 300 | | |
| | $NH_3$ | 15 | | |
| Surface layer | $SiH_4$ | 20 | 300 | 0.32 |
| | $CH_4$ | 600 | | |

TABLE 7B

| No. | 501B | 502B | 503B | 504B | 505B | 506B | 507B | 508B |
|---|---|---|---|---|---|---|---|---|
| No.* | 101B | 102B | 103B | 104B | 105B | 106B | 107B | 108B |
| Difference in layer thickness of first layer ($\mu$m) | 0.05 | 0.07 | 0.1 | 0.21 | 0.31 | 0.22 | 0.1 | 2.6 |
| Difference in layer thickness of second layer ($\mu$m) | 0.06 | 0.08 | 0.1 | 0.2 | 0.41 | 0.35 | 0.1 | 3.5 |
| Interference fringe | x | x | ○ | ◎ | ◎ | ◎ | △ | x | x Practically unusable
△ Practically satisfactory
○ Practically very good
◎ Practically excellent

TABLE 8B

| Layer | Starting gas | Flow rate (SCCM) | High frequency power (W) | Layer thickness ($\mu$m) |
|---|---|---|---|---|
| First layer | $H_2$ | 300 | 170 | 2.8 |
| | $SiH_4$ | 50 | | |
| | $GeH_4$ | 100 | | |
| | $N_2O$ | 15 | | |
| Second layer | $H_2$ | 300 | 200 | 21 |
| | $SiH_4$ | 300 | | |
| | $N_2O$ | 15 | | |
| Surface layer | $SiH_4$ | 20 | 300 | 0.32 |
| | $CH_4$ | 600 | | |

TABLE 9B

| No. | 901B | 902B | 903B | 904B | 905B | 906B | 907B | 908B |
|---|---|---|---|---|---|---|---|---|
| No.* | 101B | 102B | 103B | 104B | 105B | 106B | 107B | 108B |
| Difference in layer thickness of first layer (μm) | 0.07 | 0.09 | 0.16 | 0.19 | 0.46 | 0.35 | 0.1 | 3.2 |
| Interference fringe | x | x | ○ | ○ | ◎ | ◎ | Δ | x |

TABLE 10B

| Layer | Starting gas | Flow rate (SCCM) | High frequency power (W) | Layer thickness (μm) |
|---|---|---|---|---|
| First layer | $H_2$ | 300 | 170 | 5.1 |
|  | $SiH_4$ | 100 |  |  |
|  | $GeH_4$ | 60 |  |  |
|  | $N_2O$ | 16 |  |  |
| Second layer | $H_2$ | 300 | 230 | 22 |
|  | $SiH_4$ | 300 |  |  |
| Surface layer | $SiH_4$ | 20 | 300 | 0.32 |
|  | $CH_4$ | 600 |  |  |

TABLE 11B

| No. | 1101B | 1102B | 1103B | 1104B | 1105B | 1106B | 1107B | 1108 |
|---|---|---|---|---|---|---|---|---|
| No.* | 101B | 102B | 103B | 104B | 105B | 106B | 107B | 108B |
| Difference in layer thickness of first layer (μm) | 0.05 | 0.06 | 0.1 | 0.22 | 0.31 | 0.21 | 0.1 | 2.7 |
| Difference in layer thickness of second layer (μm) | 0.07 | 0.08 | 0.11 | 0.35 | 0.45 | 0.31 | 0.1 | 3.5 |
| Interference fringe | x | x | ○ | ◎ | ◎ | ◎ | Δ | x | x Practically unusable
Δ Practically satisfactory
○ Practically very good
◉ Practically excellent

TABLE 12B

| No. | 1201B | 1202B | 1203B | 1204B | 1205B | 1206B | 1207B | 1208B |
|---|---|---|---|---|---|---|---|---|
| No.* | 101B | 102B | 103B | 104B | 105B | 106B | 107B | 108B |
| Difference in layer thickness (μm) | 0.06 | 0.08 | 0.16 | 0.18 | 0.41 | 0.31 | 0.11 | 3.2 |
| Interference fringe and electrophotographic characteristics | x | x | ○ | ◎ | ◎ | ◎ | Δ | x | x Practically unusable
Δ Practically satisfactory
○ Practically very good
◉ Practically excellent

TABLE 13B

| No. | 1301B | 1302B | 1303B | 1304B | 1305B | 1306B | 1307B | 1308B |
|---|---|---|---|---|---|---|---|---|
| No.* | 101B | 102B | 103B | 104B | 105B | 106B | 107B | 108B |
| Difference in layer thickness of first layer (μm) | 0.05 | 0.041 | 0.1 | 0.19 | 0.31 | 0.22 | 0.1 | 2.6 |
| Difference in layer thickness of second layer (μm) | 0.06 | 0.07 | 0.11 | 0.22 | 0.41 | 0.32 | 0.1 | 2.6 |
| Interference fringe and electrophotographic characteristics | x | x | ○ | ◎ | ◎ | ◎ | Δ | x | x Practically unusable
Δ Practically satisfactory
○ Practically very good
◉ Practically excellent

TABLE 14B

| Layer | Starting gas | Flow rate (SCCM) | High frequency power (W) | Layer thickness (μm) |
|---|---|---|---|---|
| First layer | $H_2$ | 300 | 160 | 3 |
|  | $SiH_4$ | 50 |  |  |
|  | $GeH_4$ | 100 |  |  |
|  | $NH_3$ | 30~0 |  |  |
| Second layer | $H_2$ | 300 | 300 | 20 |
|  | $SiH_4$ | 300 |  |  |
| Surface layer | $SiH_4$ | 20 | 300 | 0.32 |
|  | $CH_4$ | 600 |  |  |

TABLE 15B

| No. | 1501B | 1502B | 1503B | 1504B | 1505B | 1506B | 1507B | 1508B |
|---|---|---|---|---|---|---|---|---|
| No.* | 101B | 102B | 103B | 104B | 105B | 106B | 107B | 108B |
| Difference in layer thickness (μm) | 0.07 | 0.08 | 0.17 | 0.20 | 0.42 | 0.33 | 0.11 | 2.8 |
| Interference fringe and electrophotographic characteristics | x | x | ○ | ⊚ | ⊚ | ⊚ | Δ | x | x Practically unusable
Δ Practically satisfactory
○ Practically very good
⊚ Practically excellent

TABLE 16B

| Layer | Starting gas | Flow rate (SCCM) | High frequency power (W) | Layer thickness (μm) |
|---|---|---|---|---|
| First layer | H$_2$<br>SiH$_4$<br>GeH$_4$<br>NH$_3$ | 300<br>100<br>50<br>15~0 | 160 | 5 |
| Second layer | H$_2$<br>SiH$_4$ | 300<br>300 | 200 | 20 |
| Surface layer | NH$_3$<br>SiH$_4$<br>CH$_4$ | 20<br>600 | 300 | 0.32 |

TABLE 17B

| No. | 1701B | 1702B | 1703B | 1704B | 1705B | 1706B | 1707B | 1708B |
|---|---|---|---|---|---|---|---|---|
| No.* | 101B | 102B | 103B | 104B | 105B | 106B | 107B | 108B |
| Difference in layer thickness of first layer (μm) | 0.05 | 0.07 | 0.1 | 0.21 | 0.31 | 0.22 | 0.1 | 2.6 |
| Difference in layer thickness of second layer (μm) | 0.06 | 0.08 | 0.1 | 0.2 | 0.41 | 0.35 | 0.1 | 3.5 |
| Interference fringe and electrophotographic characteristics | x | x | ○ | ⊚ | ⊚ | ⊚ | Δ | x | x Practically unusable
Δ Practically satisfactory
○ Practically very good
⊚ Practically excellent

TABLE 18B

| Layer | Starting gas | Flow rate (SCCM) | High frequency power (W) | Layer thickness (μm) |
|---|---|---|---|---|
| First layer | H$_2$<br>SiH$_4$<br>GeH$_4$<br>N$_2$O | 300<br>100<br>50<br>15~0 | 170 | 2.8 |
| Second layer | H$_2$<br>SiH$_4$ | 300<br>300 | 200 | 21 |
| Surface layer | SiH$_4$<br>CH$_4$ | 20<br>600 | 300 | 0.32 |

TABLE 19B

| No. | 1901B | 1902B | 1903B | 1904B | 1905B | 1906B | 1907B | 1908B |
|---|---|---|---|---|---|---|---|---|
| No.* | 101B | 102B | 103B | 104B | 105B | 106B | 107B | 108B |
| Difference in layer thickness (μm) | 0.07 | 0.09 | 0.16 | 0.19 | 0.46 | 0.35 | 0.1 | 3.2 |
| Interference fringe and electrophotographic characteristics | x | x | ○ | ○ | ⊚ | ⊚ | Δ | x | x Practically unusable
Δ Practically satisfactory
○ Practically very good
⊚ Practically excellent

TABLE 20B

| Layer | Starting gas | Flow rate (SCCM) | High frequency power (W) | Layer thickness (μm) |
|---|---|---|---|---|
| First layer | H$_2$<br>SiH$_4$<br>GeH$_4$<br>N$_2$O | 300<br>100<br>60<br>16~0 | 170 | 5.1 |
| Second layer | H$_2$<br>SiH$_4$<br>N$_2$O | 300<br>300 | 230 | 22 |
| Surface layer | SiH$_4$<br>CH$_4$ | 20<br>600 | 300 | 0.32 |

TABLE 21B

| No. | 2101B | 2102B | 2103B | 2104B | 2105B | 2106B | 2107B | 2108B |
|---|---|---|---|---|---|---|---|---|
| No.* | 101B | 102B | 103B | 104B | 105B | 106B | 107B | 108B |
| Difference in layer thickness of first layer (μm) | 0.05 | 0.06 | 0.1 | 0.22 | 0.31 | 0.21 | 0.1 | 2.7 |

TABLE 21B-continued

| No. | 2101B | 2102B | 2103B | 2104B | 2105B | 2106B | 2107B | 2108B |
|---|---|---|---|---|---|---|---|---|
| No.* | 101B | 102B | 103B | 104B | 105B | 106B | 107B | 108B |
| Difference in layer thickness of second layer ($\mu$m) | 0.07 | 0.08 | 0.11 | 0.35 | 0.45 | 0.31 | 0.1 | 3.5 |
| Interference fringe and electrophotographic characteristics | x | x | ○ | ◎ | ◎ | ◎ | Δ | x | x Practically unusable
Δ Practically satisfactory
○ Practically very good
◎ Practically excellent

TABLE 22B

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) =$<br>$3/10 \sim 0$ | 150 | 12 | 1 |
| Second layer | $SiH_4/He = 0.05$ | $SiH_4 = 50$ | | 150 | 12 | 20 |
| Surface layer | $SiH_4$<br>$CH_4$ | 20<br>600 | | 300 | 1 | 0.32 |

TABLE 23B

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) =$<br>$2/10 \sim 0$ | 150 | 12 | 0.5 |
| Second layer | $SiH_4/He = 0.05$ | $SiH_4 = 50$ | | 150 | 12 | 20 |
| Surface layer | $SiH_4$<br>$CH_4$ | 20<br>600 | | 300 | 1 | 0.32 |

TABLE 24B

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) =$<br>$1/10 \sim 1/100$ | 160 | 14 | 5 |
| Second layer | $SiH_4/He = 0.05$ | $SiH_4 = 50$ | $NO/SiH_4 = 1/100$ | 160 | 14 | 15 |
| Surface layer | $SiH_4$<br>$CH_4$ | 20<br>600 | | 300 | 1 | 0.32 |

TABLE 25B

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) =$<br>$3/10 \sim 0$ | 160 | 14 | 1.0 |
| Second layer | $SiH_4/He = 0.05$ | $SiH_4 = 50$ | | 160 | 12 | 15 |
| Surface layer | $SiH_4$<br>$CH_4$ | 20<br>600 | | 300 | 1 | 0.32 |

TABLE 26B

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) =$<br>$3/10 \sim 0$ | 170 | 15 | 1 |
| Second layer | $SiH_4/He = 0.05$ | $SiH_4 = 50$ | | 170 | 15 | 20 |

TABLE 26B-continued

| Layer constitution | Gases employed | Flow rate (SCCM) | Flow rate ratio | Discharging power (W) | Layer formation rate (Å/sec) | Layer thickness (μ) |
|---|---|---|---|---|---|---|
| Surface layer | SiH$_4$<br>CH$_4$ | 20<br>600 | | 300 | 1 | 0.32 |

TABLE 27B

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.5<br>NH$_3$ | SiH$_4$ + GeH$_4$ = 50 | NH$_3$/(SiH$_4$ + GeH$_4$) = 1/10~1/100 | 160 | 14 | 5 |
| Second layer | SiH$_4$/He = 0.05 | SiH$_4$ = 50 | NH$_3$/SiH$_4$ = 1/100 | 160 | 14 | 15 |
| Surface layer | SiH$_4$<br>CH$_4$ | 20<br>600 | | 300 | 1 | 0.32 |

TABLE 28B

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>CH$_4$ | SiH$_4$ + GeH$_4$ = 50 | CH$_4$/(SiH$_4$ + GeH$_4$) = 1/10~1/100 | 160 | 14 | 5 |
| Second layer | SiH$_4$/He = 0.05<br>CH$_4$ | SiH$_4$ = 50 | CH$_4$/SiH$_4$ = 1/100 | 160 | 14 | 15 |
| Surface layer | SiH$_4$<br>CH$_4$ | 20<br>600 | | 300 | 1 | 0.32 |

TABLE 29B

| Sample No. | 2901B | 2902B | 2903B | 2904B | 2905B | 2906B | 2907B |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | △ | ○ | ⦿ | ⦿ | ○ | △ | x |

⦿: Very good
○: Good
△: Practically satisfactory
x: Image defect formed

TABLE 30B

| Sample No. | 2701B | 2702B | 2703B | 2704B | 2705B | 2706B | 2707B | 2708B |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ○ | ⦿ | ⦿ | ⦿ | ○ | △ | x |

⦿: Very good
○: Good
△: Practically satisfactory
x: Image defect formed

TABLE 31B

| Sample No. | 2801B | 2802B | 2803B | 2804B | 2805B | 2806B | 2807B | 2808B |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality | △ | ○ | ⦿ | ⦿ | ⦿ | ○ | △ | x |

TABLE 31B-continued

| Sample No. | 2801B | 2802B | 2803B | 2804B | 2805B | 2806B | 2807B | 2808B |
|---|---|---|---|---|---|---|---|---|
| evaluation | | | | | | | | |

⊙: Very good
○: Good
Δ: Practically satisfactory
x: Image defect formed

TABLE 32B

| Sample No | Thickness of surface layer (μ) | Results |
|---|---|---|
| 801B | 0.001 | Image defect liable to be formed |
| 802B | 0.02 | No image defect formed up to successive copying for 20,000 times |
| 803B | 0.05 | Stable up to successive copying for 50,000 times |
| 804B | 1 | Stable up to successive copying for 200,000 times |

TABLE 1C

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 2C

| No. | | 201C | 202C | 203C | 204C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.51 | 0.44 | 0.41 | 0.61 |

TABLE 3C

| No. | | 301C | 302C | 303C | 304C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.45 | 0.42 | 0.39 | 0.50 |

TABLE 4C

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4 + SiH_4 = 100$ | | | |
| Second layer | $H_2$ | 300 | 300 | 24 | 20 |
| | $SiH_4$ | 300 | | | |
| Surface layer | $SiH_4$ | 20 | 300 | 1 | 0.5 |
| | $CH_4$ | 600 | | | |

TABLE 5C

| No. | | 501C | 502C | 503C | 504C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (Degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.42 | 0.40 | 0.38 | 0.48 |

TABLE 6C

| No. | | 601C | 602C | 603C | 604C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.40 | 0.38 | 0.36 | 0.45 |

TABLE 7C

| Sample No. | 501C | 502C | 503C | 504C | 505C | 506C | 507C |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◎ | ◎ | ○ | Δ | x |

⊙: Very good
○: Good
Δ: Practically satisfactory
x: Image defect formed

TABLE 8C

| Sample No. | 601C | 602C | 603C | 604C | 605C | 606C | 607C | 608C |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | x |

⊙: Very good
○: Good
Δ: Practically satisfactory
x: Image defect formed

TABLE 9C

| Sample No. | 701C | 702C | 703C | 704C | 705C | 706C | 707C | 708C |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | x |

⊙: Very good
○: Good
Δ: Practically satisfactory
x: Image defect formed

TABLE 10C

| Sample No. | Thickness of surface layer (μ) | Results |
|---|---|---|
| 801C | 0.001 | Image defect liable to be formed |
| 802C | 0.02 | No image defect formed up to successive copying for 20,000 times |
| 803C | 0.05 | Stable up to successive copying for 50,000 times |
| 804C | 1 | Stable up to successive copying for 200,000 times |

TABLE 1D

| | Starting gas | Gas flow rate (SCCM) | Discharging power (W) | Deposition rate (Å/sec) | Layer thickness (μm) |
|---|---|---|---|---|---|
| First layer | H$_2$<br>GeH$_4$<br>SiH$_4$ | 300<br>100 → 0<br>0 → 100<br>GeH$_4$ + SiH$_4$ = 100 | 100 | 9 | 3 |
| | NO | 10 | | | |
| Second layer | H$_2$<br>SiH$_4$ | 300<br>300 | 300 | 24 | 20 |
| Surface layer | SiH$_4$<br>CH$_4$ | 20<br>600 | 300 | 1 | 0.32 |

TABLE 1aD

| Sample No. | BD | CD | DD | ED |
|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |

TABLE 2D

| Sample No. | | 201D | 202D | 203D | 204D |
|---|---|---|---|---|---|
| Surface structure of Al substrate | Symbol | BD | CD | DD | ED |
| Thickness of light receiving layer | Difference in average layer thickness between center and | 3.2 | 3.2 | 3.2 | 3.2 |

TABLE 2D-continued

| Sample No. | 201D | 202D | 203D | 204D |
|---|---|---|---|---|
| both ends (μm) Difference in layer thickness of minute portion (μm) | 0.51 | 0.44 | 0.41 | 0.61 |

TABLE 3D

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4$ + $SiH_4$ = 100 | | | |
| | $N_2O$ | 10 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 4D

| Sample No. | 401D | 402D | 403D | 404D |
|---|---|---|---|---|
| Surface structure of Al substrate Symbol | BD | CD | DD | ED |
| Thickness of light receiving layer Difference in average layer thickness between center and both ends (μm) | 3.2 | 3.2 | 3.2 | 3.2 |
| Difference in layer thickness of minute portion (μm) | 0.45 | 0.42 | 0.39 | 0.50 |

TABLE 5D

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4$ + $SiH_4$ = 100 | | | |
| | $NH_3$ | 10 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 6D

| Sample No. | 601D | 602D | 603D | 604D |
|---|---|---|---|---|
| Surface structure of Al substrate Symbol | BD | CD | DD | ED |
| Thickness of light receiving layer Difference in average layer thickness between center and both ends (μm) | 3.2 | 3.2 | 3.2 | 3.2 |
| Difference in layer thickness of minute portion (μm) | 0.42 | 0.40 | 0.38 | 0.48 |

TABLE 7D

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4$ + $SiH_4$ = 100 | | | |
| | $NH_3$ | 6 | | | |
| Second layer | $H_2$ | 300 | 300 | 24 | 20 |
| | $SiH_4$ | 300 | | | |
| | $NH_3$ | 6 | | | |
| Surface layer | $SiH_4$ | 20 | 300 | 1 | 0.32 |
| | $CH_4$ | 600 | | | |

TABLE 8D

| Sample No. | 801D | 802D | 803D | 804D |
|---|---|---|---|---|
| Surface structure of Al substrate Symbol | BD | CD | DD | ED |
| Thickness of light receiving layer Difference in average layer thickness between center and both ends (μm) | 3.2 | 3.2 | 3.2 | 3.2 |
| Difference in layer thickness of minute portion (μm) | 0.40 | 0.38 | 0.36 | 0.45 |

TABLE 9D

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4$ + $SiH_4$ = 100 | | | |
| | NO | 20 → 0 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 10D

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4$ + $SiH_4$ = 100 | | | |
| | $NH_3$ | 20 → 0 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 11D

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4$ + $SiH_4$ = 100 | | | |
| | NO | 10 → * | | | |
| Second layer | $H_2$ | 300 | 300 | 24 | 20 |
| | $SiH_4$ | 300 | | | |
| | NO | * → 0 | | | |
| Surface layer | $SiH_4$ | 20 | 300 | 1 | 0.32 |

TABLE 11D-continued

| | Starting gas | Gas flow rate (SCCM) | Discharging power (W) | Deposition rate (Å/sec) | Layer thickness (μm) |
|---|---|---|---|---|---|
| layer | $CH_4$ | 600 | | | |

TABLE 12D

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4$ + $SiH_4$ = 100 | | | |
| | $N_2O$ | 10 → 0 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 13C

| Sample No. | 2701D | 2702D | 2703D | 2704D | 2705D | 2706D | 2707D | 2708D |
|---|---|---|---|---|---|---|---|---|
| $SiH_4:CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | x |

◎: Very good
○: Good
Δ: Practically satisfactory
x: Image defect formed

TABLE 14D

| Sample No. | 2801D | 2802D | 2803D | 2804D | 2805D | 2806D | 2807D | 2808D |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | x |

◎: Very good
○: Good
Δ: Practically satisfactory
x: Image defect formed

TABLE 15D

| Sample No. | 2901D | 2902D | 2903D | 2904D | 2905D | 2906D | 2907D |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◎ | ◎ | ○ | Δ | x |

◎: Very good
○: Good
Δ: Practically satisfactory
x: Image defect formed

TABLE 1E

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 3 |
| | $GeH_4$ | 100 | | | |

TABLE 1E-continued

| Layer constitution | Starting gas | Gas flow rate (SCCM) | Discharging power (W) | Deposition rate (Å/sec) | Layer thickness (μm) |
|---|---|---|---|---|---|
| | B$_2$H$_6$/H$_2$ (= 3000 vol ppm) | 100 | | | |
| Second layer | H$_2$ SiH$_4$ | 300 300 | 300 | 24 | 20 |
| Surface layer | SiH$_4$ CH$_4$ | 20 600 | 300 | 1 | 0.32 |

TABLE 2E

| | No. | 201E | 202E | 203E | 204E |
|---|---|---|---|---|---|
| Surface structure | Pitch (μm) | 50 | 40 | 25 | 10 |
| | Depth (μm) | 2.1 | 1.7 | 0.8 | 0.6 |

TABLE 2E-continued

| | No. | 201E | 202E | 203E | 204E |
|---|---|---|---|---|---|
| of Al substrate | Angle (degree) | 5.0 | 4.8 | 3.7 | 6.8 |
| Thickness of light receiving layer | Difference in average layer thickness between center and both ends in first layer (μm) | 1 | 1 | 1 | 1 |
| | Difference in layer thickness of minute portion in first layer (μm) | 0.2 | 0.15 | 0.1 | 0.25 |
| | Difference in average layer thickness between center and both ends in second layer (μm) | 3 | 3 | 3 | 3 |
| | Difference in layer thickness of minute portion in second layer (μm) | 0.55 | 0.4 | 0.3 | 0.6 |

TABLE 3E

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 1 |
| | | GeH$_4$ | 100 | | | |
| | | B$_2$H$_6$/H$_2$ (= 3000 vol ppm) | 100 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |
| Surface layer | | SiH$_4$ | 20 | 300 | 1 | 0.5 |
| | | CH$_4$ | 600 | | | |

TABLE 4E

| | No. | 401E | 402E | 403E | 404E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | <0.1 | <0.1 | <0.1 | <0.1 |
| Second layer | Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.3 | 0.6 |

TABLE 5E

| Layer constitution | | Starting gas | Gas flow rate (SCCM) | Discharging power (W) | Deposition rate (A/sec) | Layer thickness (μm) |
|---|---|---|---|---|---|---|
| First layer | | H$_2$ | 300 | 100 | 10 | 1 |
| | | GeH$_4$ | 100 | | | |
| | | B$_2$H$_6$/H$_2$ (= 3000 vol ppm) | 50 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer | H$_2$ | 300 | 300 | 24 | 20 |

TABLE 5E-continued

| Layer constitution | Starting gas | Gas flow rate (SCCM) | Discharging power (W) | Deposition rate (Å/sec) | Layer thickness (μm) |
|---|---|---|---|---|---|
| B | SiH₄ | 300 | | | |
| Surface layer | SiH₄ | 20 | 300 | 1 | 0.32 |
| | CH₄ | 600 | | | |

TABLE 6E

| | No. | 601E | 602E | 603E | 604E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.12 | 0.12 | 0.12 | 0.12 |
| | Difference in layer thickness of minute portion in first layer (μm) | <0.1 | <0.1 | <0.1 | <0.1 |
| | Second layer — Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.4 | 0.6 |

TABLE 7E

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 10 | 1 |
| | GeH₄ | 100 | | | |
| | B₂H₆/H₂ (= 3000 vol ppm) | 150 | | | |
| Second layer  Layer A | H₂ | 300 | 100 | 8 | 5 |
| | SiH₄ | 100 | | | |
| | B₂H₆/H₂ (= 3000 vol ppm) | 100 | | | |
| Layer B | H₂ | 300 | 300 | 24 | 20 |
| | SiH₄ | 300 | | | |
| Surface layer | SiH₄ | 20 | 300 | 1 | 0.7 |
| | CH₄ | 600 | | | |

TABLE 8E

| | No. | 801E | 802E | 803E | 804E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| | Difference in average layer thickness between center and both ends in first layer (μm) | 0.1 | 0.1 | 0.1 | 0.1 |
| | Difference in layer thickness of minute portion in first layer (μm) | <0.1 | <0.1 | <0.1 | <0.1 |
| Thickness of light receiving layer | Second layer — Difference in average layer thickness between center and both ends in layer A (μm) | 1.6 | 1.6 | 1.6 | 1.6 |
| | Difference in layer thickness of minute portion in layer A (μm) | 0.2 | 0.13 | 0.11 | 0.3 |
| | Difference in average layer thickness between center and both ends in layer B (μm) | 3.1 | 3.1 | 3.1 | 3.1 |
| | Difference in layer thickness of minute portion in layer B (μm) | 0.55 | 0.4 | 0.4 | 0.6 |

TABLE 9E

| Layer constitution | | Starting gas | Gas flow rate (SCCM) | Discharging | Deposition rate (Å/sec) | Layer thickness (μm) |
|---|---|---|---|---|---|---|
| First layer | | $H_2$ | 300 | 100 | 10 | 1 |
| | | $GeH_4$ | 100 | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |
| Surface layer | | $SiH_4$ | 20 | 300 | 1 | 0.23 |
| | | $CH_4$ | 600 | | | |

TABLE 10E

| | No. | 1001E | 1002E | 1003E | 1004E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average of difference in layer thickness between center and both ends in first layer (μm) | 0.12 | 0.12 | 0.12 | 0.12 |
| | Difference in layer thickness of minute portion in first layer (μm) | <0.1 | <0.1 | <0.1 | <0.1 |
| | Second layer: Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.39 | 0.6 |

TABLE 11E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 100 | | | |
| | | $B_2H_6/H_2$ (= 3000 vol ppm) | 100 | | | |
| | Layer B | $H_2$ | 300 | 100 | 10 | 2 |
| | | $GeH_4$ | 100 | | | |
| Second layer | | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 12E

| | | No. | 1201E | 1202E | 1203E | 1204E |
|---|---|---|---|---|---|---|
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.1 | 0.1 | 0.1 | 0.12 |
| | | Difference in average layer thickness between center and both ends in layer B (μm) | 0.22 | 0.22 | 0.22 | 0.22 |
| | | Difference in layer thickness of minute portion in layer B (μm) | 0.11 | 0.1 | 0.1 | 0.13 |
| | | Difference in average layer thickness between center and both ends in second layer (μm) | 3 | 3 | 3 | 3 |
| | | Difference in layer thickness of minute portion in second layer (μm) | 0.55 | 0.4 | 0.39 | 0.6 |

TABLE 13E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 100 | | | |
| | Layer B | $H_2$ | 300 | 100 | 10 | 2 |
| | | $GeH_4$ | 100 | | | |
| | | $B_2H_6/H_2$ (= 3000 vol ppm) | 100 | | | |
| Second layer | | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 14E

| | No. | 1401E | 1402E | 1403E | 1404E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer: Difference in average layer thickness between center and both ends in layer A (μm) | 0.2 | 0.2 | 0.2 | 0.2 |
| | Difference in layer thickness of minute portion in layer A (μm) | 0.1 | 0.1 | 0.1 | 0.12 |
| | Difference in average layer thickness between center and both ends in layer B (μm) | 0.22 | 0.22 | 0.22 | 0.22 |
| | Difference in layer thickness of minute portion in layer B (μm) | 0.11 | 0.1 | 0.1 | 0.13 |
| | Difference in average layer thickness between center and both ends in second layer (μm) | 3 | 3 | 3 | 3 |
| | Difference in layer thickness of minute portion in second layer (μm) | 0.55 | 0.4 | 0.39 | 0.6 |

TABLE 15E

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 5 |
| | $GeH_4$ | 50 | | | |
| | $SiH_4$ | 50 | | | |
| | $B_2H_6/H_2$ (= 3000 vol ppm) | 100 | | | |
| Second layer | $H_2$ | 300 | 300 | 24 | 20 |
| | $SiH_4$ | 300 | | | |
| Surface layer | $SiH_4$ | 20 | 300 | 1 | 0.7 |
| | $CH_4$ | 300 | | | |

TABLE 16E

| | No. | 1601E | 1602E | 1603E | 1604E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 1.5 | 1.5 | 1.5 | 1.5 |
| | Difference in layer thickness of minute portion in first layer (μm) | 0.2 | 0.12 | 0.1 | 0.3 |
| | Difference in average layer thickness between center and both ends in second layer (μm) | 3 | 3 | 3 | 3 |
| | Difference in layer thickness of minute portion in second layer (μm) | 0.55 | 0.4 | 0.3 | 0.6 |

TABLE 17E

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| Second layer | Layer A | H$_2$ | 300 | 100 | 8 | 3 |
| | | GeH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |
| Surface layer | | SiH$_4$ | 20 | 300 | 1 | 0.32 |
| | | CH$_4$ | 600 | | | |

TABLE 18E

| | No. | 1801E | 1802E | 1803E | 1804E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.14 | 0.12 | 0.1 | 0.16 |
| | Second layer Difference in average layer thickness between center and both ends in layer A (μm) | 0.3 | 0.3 | 0.3 | 0.3 |
| | Difference in layer thickness of minute portion in layer A (μm) | 0.2 | 0.14 | 0.13 | 0.21 |
| | Difference in average layer thickness between center and both ends in layer B (μm) | 3 | 3 | 3 | 3 |
| | Difference in layer thickness of minute portion in layer B (μm) | 0.57 | 0.4 | 0.3 | 0.6 |

TABLE 19E

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 50 | | | |
| Second layer | Layer A | H$_2$ | 300 | 100 | 8 | 3 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |
| Surface layer | | SiH$_4$ | 20 | 300 | 1 | 0.5 |
| | | CH$_4$ | 600 | | | |

TABLE 20E

| | No. | 2001E | 2002E | 2003E | 2004E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.13 | 0.11 | 0.1 | 0.2 |
| | Second layer Difference in average layer thickness between center and both ends in layer A (μm) | 0.4 | 0.4 | 0.4 | 0.4 |
| | Difference in layer thickness of minute portion in layer A (μm) | 0.13 | 0.12 | 0.11 | 0.2 |
| | Difference in average layer | 3 | 3 | 3 | 3 |

TABLE 20E-continued

| No. | 2001E | 2002E | 2003E | 2004E |
|---|---|---|---|---|
| thickness between center and both ends in layer B (μm) | | | | |
| Difference in layer thickness of minute portion in layer B (μm) | 0.6 | 0.5 | 0.4 | 0.7 |

TABLE 21E

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 150 | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |
| Surface layer | | $SiH_4$ | 20 | 300 | 1 | 0.32 |
| | | $CH_4$ | 600 | | | |

TABLE 22E

| | No. | 2201E | 2202E | 2203E | 2204E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.12 | 0.11 | 0.1 | 0.14 |
| | Second layer Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 23E

| Layer constitution | | Starting gas | Gas flow rate (SCCM) | Discharging power | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| Second layer | Layer A | $H_2$ | 300 | 100 | 8 | 3 |
| | | $GeH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 24E

| | No. | 2401E | 2402E | 2403E | 2404E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute | 0.12 | 0.11 | 0.1 | 0.14 |

TABLE 24E-continued

| | No. | 2401E | 2402E | 2403E | 2404E |
|---|---|---|---|---|---|
| | portion in first layer (μm) | | | | |
| Second layer | Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 25E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |
| Surface layer | | $SiH_4$ | 20 | 300 | 1 | 0.7 |
| | | $CH_4$ | 600 | | | |

TABLE 26E

| | | No. | 2601E | 2602E | 2603E | 2604E |
|---|---|---|---|---|---|---|
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.13 | 0.11 | 0.1 | 0.15 |
| | | Difference in average layer thickness between center and both ends in layer B (μm) | 0.2 | 0.2 | 0.2 | 0.2 |
| | | Difference in layer thickness of minute portion in layer B (μm) | 0.13 | 0.12 | 0.11 | 0.14 |
| | Difference in average layer thickness between center and both ends in second layer (μm) | | 3 | 3 | 3 | 3 |
| | Difference in layer thickness of minute portion in second layer (μm) | | 0.5 | 0.44 | 0.4 | 0.6 |

TABLE 27E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| Second layer | | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 28E

| | No. | 2801E | 2802E | 2803E | 2804E |
|---|---|---|---|---|---|
| Surface | Pitch (μm) | 50 | 40 | 25 | 10 |

TABLE 28E-continued

| | No. | 2801E | 2802E | 2803E | 2804E |
|---|---|---|---|---|---|
| structure of Al substrate | Depth (μm) | 2.1 | 1.7 | 0.8 | 0.6 |
| | Angle (degree) | 5.0 | 4.8 | 3.7 | 6.8 |
| Thickness of light receiving layer | First layer — Difference in average layer thickness between center and both ends in layer A (μm) | 0.2 | 0.2 | 0.2 | 0.2 |
| | Difference in layer thickness of minute portion in layer A (μm) | 0.11 | 0.11 | 0.1 | 0.13 |
| | Difference in average layer thickness between center and both ends in layer B (μm) | 0.21 | 0.21 | 0.21 | 0.21 |
| | Difference in layer thickness of minute portion in layer B (μm) | 0.13 | 0.12 | 0.11 | 0.14 |
| | Difference in average layer thickness between center and both ends in second layer (μm) | 3 | 3 | 3 | 3 |
| | Difference in layer thickness of minute portion in second layer (μm) | 0.4 | 0.35 | 0.3 | 0.5 |

TABLE 29E

| Sample No. | 2901E | 2902E | 2903E | 2904E | 2905E | 2906E | 2907E |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◎ | ◎ | ○ | Δ | x |

⊙: Very good
○: Good
Δ: Practically satisfactory
x: Image defect formed

TABLE 30E

| Sample No. | 3001E | 3002E | 3003E | 3004E | 3005E | 3006E | 3007E | 3008E |
|---|---|---|---|---|---|---|---|---|
| SiH₄:CH₄ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | x |

⊙: Very good
○: Good
Δ: Practically satisfactory
x: Image defect formed

TABLE 31E

| Sample No. | 3101E | 3102E | 3103E | 3104E | 3105E | 3106E | 3107E | 3108E |
|---|---|---|---|---|---|---|---|---|
| SiH₄:SiF₄:CH₄ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | x |

⊙: Very good
○: Good
Δ: Practically satisfactory
x: Image defect formed

TABLE 32E

| Sample No. | Thickness of surface layer (μ) | Results |
|---|---|---|
| 3201E | 0.001 | Image defect liable to be formed |
| 3202E | 0.02 | No image defect formed up to successive copying for 20,000 times |
| 3203E | 0.05 | Stable up to successive copying for 50,000 times |
| 3204E | 1 | Stable up to successive copying for 200,000 times |

TABLE 1F

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 3 |
| | $GeH_4$ | 50 | | | |
| | $SiH_4$ | 50 | | | |
| | $B_2H_6/H_2$ (= 3000 vol ppm) | 100 | | | |
| | NO | 10 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 1aF

| | Sample No. | BF | CF | DF | EF |
|---|---|---|---|---|---|
| Surface structure of Al | Pitch (μm) | 50 | 40 | 25 | 10 |
| | Depth (μm) | 2.1 | 1.7 | 0.8 | 0.6 |
| | Angle | 5.0 | 4.8 | 3.7 | 6.8 |

TABLE 1aF-continued

| | Sample No. | BF | CF | DF | EF |
|---|---|---|---|---|---|
| substrate | (degree) | | | | |

TABLE 2F

| | Sample No. | 201F | 202F | 203F | 204F |
|---|---|---|---|---|---|
| Surface structure of Al substrate | Symbol | BF | CF | DF | EF |
| Thickness of light receiving layer | Difference in average layer thickness between center and both ends in first layer (μm) | 1 | 1 | 1 | 1 |
| | Difference in layer thickness of minute portion in first layer (μm) | 0.2 | 0.15 | 0.1 | 0.25 |
| | Difference in average layer thickness between center and both ends in second layer (μm) | 3 | 3 | 3 | 3 |
| | Difference in layer thickness of minute portion in second layer (μm) | 0.55 | 0.4 | 0.3 | 0.6 |

TABLE 3F

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 1 |
| | | $GeH_4$ | 50 | | | |
| | | $SiH_4$ | 50 | | | |
| | | $B_2H_6/H_2$ (= 3000 vol ppm) | 100 | | | |
| | | $NH_3$ | 11 | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |
| Surface layer | | $SiH_4$ | 20 | 300 | 1 | 0.32 |
| | | $CH_4$ | 600 | | | |

TABLE 4F

| | Sample No. | 401F | 402F | 403F | 404F |
|---|---|---|---|---|---|
| Surface structure of Al substrate | Symbol | BF | CF | DF | EF |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | 0.04 | 0.03 | 0.02 | 0.05 |
| Second layer | Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.3 | 0.6 |

TABLE 5F

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 10 | 1 |
| | $GeH_4$ | 50 | | | |

TABLE 5F-continued

| Layer constitution | | Starting gas | Gas flow rate (SCCM) | Discharging power (W) | Deposition rate (Å/sec) | Layer thickness (μ) |
|---|---|---|---|---|---|---|
| | | SiH$_4$ | 50 | | | |
| | | B$_2$H$_6$/H$_2$ (= 3000 vol ppm) | 50 | | | |
| | | N$_2$O | 10 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |
| Surface layer | | SiH$_4$ | 20 | 300 | 1 | 0.32 |
| | | CH$_4$ | 600 | | | |

TABLE 6F

| Sample No. | | 601F | 602F | 603F | 604F |
|---|---|---|---|---|---|
| Surface structure of Al substrate | Symbol | BF | CF | DF | EF |
| Thickness of light receiving layer | Difference in average layer thickness between center and both ends in first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.4 | 0.6 |

TABLE 7F

| Layer constitution | | Starting gas | Gas flow rate (SCCM) | Discharging power (W) | Deposition rate (Å/sec) | Layer thickness (μ) |
|---|---|---|---|---|---|---|
| First layer | | H$_2$ | 300 | 100 | 10 | 1 |
| | | GeH$_4$ | 50 | | | |
| | | SiH$_4$ | 50 | | | |
| | | B$_2$H$_6$/H$_2$ (= 3000 vol ppm) | 150 | | | |
| | | NO | 10 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | | NO | 10 | | | |
| | Layer B | H$_2$ | 300 | 300 | 24 | 20 |
| | | SiH$_4$ | 300 | | | |
| | | NO | 10 | | | |
| Surface layer | | SiH$_4$ | 20 | 300 | 1 | 0.32 |
| | | CH$_4$ | 600 | | | |

TABLE 8F

| Sample No. | | 801F | 802F | 803F | 804F |
|---|---|---|---|---|---|
| Surface structure of Al substrate | Symbol | BF | CF | DF | EF |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | 0.05 | 0.04 | 0.03 | 0.06 |
| | Second layer — Difference in average layer thickness between center and both ends in layer A (μm) | 1.6 | 1.6 | 1.6 | 1.6 |
| | Difference in layer thickness of | 0.2 | 0.13 | 0.11 | 0.3 |

TABLE 8F-continued

| Sample No. | 801F | 802F | 803F | 804F |
|---|---|---|---|---|
| minute portion in layer A (μm) | | | | |
| Difference in average layer thickness between center and both ends in layer B (μm) | 3.1 | 3.1 | 3.1 | 3.1 |
| Difference in layer thickness of minute portion in layer B (μm) | 0.55 | 0.4 | 0.4 | 0.6 |

TABLE 9F

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 1 |
| | | $GeH_4$ | 50 | | | |
| | | $SiH_4$ | 50 | | | |
| | | $NH_3$ | 12 | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | | $NH_3$ | 12 | | | |
| | Layer B | $H_2$ | 300 | 300 | 24 | 20 |
| | | $SiH_4$ | 300 | | | |
| | | $NH_3$ | 12 | | | |
| Surface layer | | $SiH_4$ | 20 | 300 | 1 | 0.32 |
| | | $CH_4$ | 600 | | | |

TABLE 10F

| | Sample No. | 1001F | 1002F | 1003F | 1004F |
|---|---|---|---|---|---|
| Surface structure of Al substrate | Symbol | BF | CF | DF | EF |
| Thickness of light receiving layer | Difference in average layer thickness between center and both ends in first layer (μm) | 0.12 | 0.12 | 0.12 | 0.12 |
| | Difference in layer thickness of minute portion in first layer (μm) | 0.05 | 0.04 | 0.03 | 0.06 |
| | Second layer Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.39 | 0.6 |

TABLE 11F

| Layer constitution | | Starting gas | Gas flow rate (SCCM) | Discharging power (W) | Deposition rate (Å/sec) | Layer thickness (μ) |
|---|---|---|---|---|---|---|
| First layer | Layer A | $H_2$ | 300 | 100 | 10 | 2 |
| | | $GeH_4$ | 100 | | | |
| | | $B_2H_6/H_2$ (= 3000 vol ppm) | 100 | | | |
| | | $N_2O$ | 8 | | | |
| | Layer B | $H_2$ | 300 | 100 | 10 | 2 |
| | | $GeH_4$ | 50 | | | |
| | | $SiH_4$ | 50 | | | |
| | | $N_2O$ | 8 | | | |
| Second layer | | $H_2$ | 300 | 300 | 24 | 20 |
| | | $SiH_4$ | 300 | | | |
| | | $N_2O$ | 8 | | | |
| Surface layer | | $SiH_4$ | 20 | 300 | 1 | 0.32 |
| | | $CH_4$ | 600 | | | |

TABLE 12F

| Sample No. | 1201F | 1202F | 1203F | 1204F |
|---|---|---|---|---|
| Surface Symbol | BF | CF | DF | EF |

TABLE 12F-continued

| | | Sample No. | 1201F | 1202F | 1203F | 1204F |
|---|---|---|---|---|---|---|
| structure of Al substrate | | | | | | |
| Thickness of light receiving layer | First layer | Difference in average layer thickness between center and both ends in layer A ($\mu$m) | 0.2 | 0.2 | 0.2 | 0.2 |
| | | Difference in layer thickness of minute portion in layer A ($\mu$m) | 0.1 | 0.1 | 0.1 | 0.12 |
| | | Difference in average layer thickness between center and both ends in layer B ($\mu$m) | 0.22 | 0.22 | 0.22 | 0.22 |
| | | Difference in layer thickness of minute portion in layer B ($\mu$m) | 0.11 | 0.1 | 0.1 | 0.13 |
| | Difference in average layer thickness between center and both ends in second layer ($\mu$m) | | 3 | 3 | 3 | 3 |
| | Difference in layer thickness of minute portion in second layer ($\mu$m) | | 0.55 | 0.4 | 0.39 | 0.6 |

TABLE 13F

| Layer constitution | | Starting gas | Gas flow rate (SCCM) | Discharging power (W) | Deposition rate (Å/sec) | Layer thickness ($\mu$) |
|---|---|---|---|---|---|---|
| First layer | Layer A | H$_2$ | 300 | 100 | 10 | 2 |
| | | GeH$_4$ | 100 | | | |
| | | N$_2$O | 10~* | | | |
| | Layer B | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| | | N$_2$O | *~0 | | | |
| Second layer | | H$_2$ | 300 | 300 | 24 | 20 |
| | | SiH$_4$ | 300 | | | |
| Surface layer | | SiH$_4$ | 20 | 300 | 1 | 0.32 |
| | | CH$_4$ | 600 | | | |

TABLE 14F

| | | Sample No. | 1401F | 1402F | 1403F | 1404F |
|---|---|---|---|---|---|---|
| Surface structure of Al substrate | Symbol | | BF | CF | DF | EF |
| Thickness of light receiving layer | First layer | Difference in average layer thickness between center and both ends in layer A ($\mu$m) | 0.2 | 0.2 | 0.2 | 0.2 |
| | | Difference in layer thickness of minute portion in layer A ($\mu$m) | 0.1 | 0.1 | 0.1 | 0.12 |
| | | Difference in average layer thickness between center and both ends in layer B ($\mu$m) | 0.22 | 0.22 | 0.22 | 0.22 |
| | | Difference in layer thickness of minute portion in layer B ($\mu$m) | 0.11 | 0.1 | 0.1 | 0.13 |
| | Difference in average layer thickness between center and both ends in second layer ($\mu$m) | | 3 | 3 | 3 | 3 |
| | Difference in layer thickness of minute portion in second layer ($\mu$m) | | 0.55 | 0.4 | 0.39 | 0.6 |

TABLE 15F

| Layer constitution | Starting gas | Gas flow rate (SCCM) | Discharging power (W) | Deposition rate (Å/sec) | Layer thickness ($\mu$) |
|---|---|---|---|---|---|
| First layer | H$_2$ | 300 | 100 | 10 | 5 |
| | GeH$_4$ | 50 | | | |
| | SiH$_4$ | 50 | | | |
| | B$_2$H$_6$/H$_2$ (= 3000 vol ppm) | 100 | | | |
| | NO | 10~0 | | | |
| Second layer | H$_2$ | 300 | 300 | 24 | 20 |
| | SiH$_4$ | 300 | | | |
| Surface | SiH$_4$ | 20 | 300 | 1 | 0.32 |

TABLE 15F-continued

| Layer constitution | Starting gas | Gas flow rate (SCCM) | Discharging power (W) | Deposition rate (Å/sec) | Layer thickness (μ) |
|---|---|---|---|---|---|
| layer | CH$_4$ | 600 | | | |

TABLE 16F

| | Sample No. | 1601F | 1602F | 1603F | 1604F |
|---|---|---|---|---|---|
| Surface structure of Al substrate | Symbol | BF | CF | DF | EF |
| Thickness of light receiving layer | Difference in average layer thickness between center and both ends in first layer (μm) | 1.5 | 1.5 | 1.5 | 1.5 |
| | Difference in layer thickness of minute portion in first layer (μm) | 0.2 | 0.12 | 0.1 | 0.3 |
| | Difference in average layer thickness between center and both ends in second layer (μm) | 3 | 3 | 3 | 3 |
| | Difference in layer thickness of minute portion in second layer (μm) | 0.55 | 0.4 | 0.3 | 0.6 |

TABLE 17F

| Layer constitution | | Starting gas | Gas flow rate (SCCM) | Discharging power (W) | Deposition rate (Å/sec) | Layer thickness (μ) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| | | NH$_3$ | 10~0 | | | |
| Second layer | Layer A | H$_2$ | 300 | 100 | 8 | 3 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |
| Surface layer | | SiH$_4$ | 20 | 300 | 1 | 0.32 |
| | | CH$_4$ | 600 | | | |

TABLE 18F

| | Sample No. | 1801F | 1802F | 1803F | 1804F |
|---|---|---|---|---|---|
| Surface structure of Al substrate | Symbol | BF | CF | DF | EF |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.14 | 0.12 | 0.1 | 0.16 |
| | Second layer: Difference in average layer thickness between center and both ends in layer A (μm) | 0.3 | 0.3 | 0.3 | 0.3 |
| | Difference in layer thickness of minute portion in layer A (μm) | 0.2 | 0.14 | 0.13 | 0.21 |
| | Difference in average layer thickness between center and both ends in layer B (μm) | 3 | 3 | 3 | 3 |
| | Difference in layer thickness of minute portion in layer B (μm) | 0.57 | 0.4 | 0.3 | 0.6 |

TABLE 19F

| Layer constitution | Starting gas | Gas flow rate (SCCM) | Discharging power (W) | Deposition rate (Å/sec) | Layer thickness (μ) |
|---|---|---|---|---|---|
| First layer | H$_2$ | 300 | 100 | 10 | 2 |
| | GeH$_4$ | 50 | | | |
| | SiH$_4$ | 50 | | | |

TABLE 19F-continued

| Layer constitution | | Starting gas | Gas flow rate (SCCM) | Discharging power (W) | Deposition rate (Å/sec) | Layer thickness ($\mu$) |
|---|---|---|---|---|---|---|
| | | $B_2H_6/H_2$ (= 3000 vol ppm) | 50 | | | |
| | | $N_2O$ | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | $N_2O$ | *~** | | | |
| | Layer B | $H_2$ | 300 | 300 | 24 | 20 |
| | | $SiH_4$ | 300 | | | |
| | | $N_2O$ | **~0 | | | |
| Surface layer | | $SiH_4$ | 20 | 300 | 1 | 0.32 |
| | | $CH_4$ | 600 | | | |

NOTE:
The symbols * and ** represent continuity of change in the gas flow rate respectively. The same notes apply to the subsequent other tables.

TABLE 20F

| | Sample No. | 2001F | 2002F | 2003F | 2004F |
|---|---|---|---|---|---|
| Surface structure of Al substrate | Symbol | BF | CF | DF | EF |
| Thickness of light receiving layer | Difference in average layer thickness between center and both ends in first layer ($\mu$m) | 0.2 | 0.2 | 0.2 | 0.2 |
| | Difference in layer thickness of minute portion in first layer ($\mu$m) | 0.13 | 0.11 | 0.1 | 0.2 |
| | Second layer | Difference in average layer thickness between center and both ends in layer A ($\mu$m) | 0.4 | 0.4 | 0.4 | 0.4 |
| | | Difference in layer thickness of minute portion in layer A ($\mu$m) | 0.13 | 0.12 | 0.11 | 0.2 |
| | | Difference in average layer thickness between center and both ends in layer B ($\mu$m) | 3 | 3 | 3 | 3 |
| | | Difference in layer thickness of minute portion in layer B ($\mu$m) | 0.6 | 0.5 | 0.4 | 0.7 |

TABLE 21F

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 150 | | | |
| | | NO | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | NO | *~** | | | |
| | Layer B | $H_2$ | 300 | 300 | 24 | 20 |
| | | $SiH_4$ | 300 | | | |
| | | NO | **~0 | | | |
| Surface layer | | $SiH_4$ | 20 | 300 | 1 | 0.32 |
| | | $CH_4$ | 600 | | | |

TABLE 22F

| | Sample No. | 2201F | 2202F | 2203F | 2204F |
|---|---|---|---|---|---|
| Surface structure of Al substrate | Symbol | BF | CF | DF | EF |
| Thickness of light receiving layer | Difference in average layer thickness between center and both ends in first layer ($\mu$m) | 0.2 | 0.2 | 0.2 | 0.2 |
| | Difference in layer thickness of minute portion in first layer ($\mu$m) | 0.12 | 0.11 | 0.1 | 0.14 |
| | Second | Difference in average layer | 0.4 | 0.4 | 0.4 | 0.4 |

TABLE 22F-continued

| Sample No. | | 2201F | 2202F | 2203F | 2204F |
|---|---|---|---|---|---|
| layer | thickness between center and both ends in layer A (μm) | | | | |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 23F

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $NH_3$ | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | $NH_3$ | *~** | | | |
| | Layer B | $H_2$ | 300 | 300 | 24 | 20 |
| | | $SiH_4$ | 300 | | | |
| | | $NH_3$ | **~0 | | | |
| Surface layer | | $SiH_4$ | 20 | 300 | 1 | 0.32 |
| | | $CH_4$ | 600 | | | |

TABLE 24F

| | Sample No. | 2401F | 2402F | 2403F | 2404F |
|---|---|---|---|---|---|
| Surface structure of Al substrate | Symbol | BF | CF | DF | EF |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.12 | 0.11 | 0.1 | 0.14 |
| | Second layer — Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 25F

| Layer constitution | | Starting gas | Gas flow rate (SCCM) | Discharging power (W) | Deposition rate (Å/sec) | Layer thickness (μ) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | NO | 8 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |
| Surface layer | | $SiH_4$ | 20 | 300 | 1 | 0.32 |
| | | $CH_4$ | 600 | | | |

TABLE 26F

| Sample No. | | | 2601F | 2602F | 2603F | 2604F |
|---|---|---|---|---|---|---|
| Surface structure of Al substrate | Symbol | | BF | CF | DF | EF |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.13 | 0.11 | 0.1 | 0.15 |
| | | Difference in average layer thickness between center and both ends in layer B (μm) | 0.2 | 0.2 | 0.2 | 0.2 |
| | | Difference in layer thickness of minute portion in layer B (μm) | 0.13 | 0.12 | 0.11 | 0.14 |
| | Difference in average layer thickness between center and both ends in second layer (μm) | | 3 | 3 | 3 | 3 |
| | Difference in layer thickness of minute portion in second layer (μm) | | 0.5 | 0.44 | 0.4 | 0.6 |

TABLE 27F

| Layer constitution | | Starting gas | Gas flow rate (SCCM) | Discharging power (W) | Deposition rate (Å/sec) | Layer thickness (μ) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |
| | | NH$_3$ | 11 | | | |
| | Layer B | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| Second layer | | H$_2$ | 300 | 300 | 24 | 20 |
| | | SiH$_4$ | 300 | | | |
| Surface layer | | SiH$_4$ | 20 | 300 | 1 | 0.32 |
| | | CH$_4$ | 600 | | | |

TABLE 28F

| Sample No. | | | 2801F | 2802F | 2803F | 2804F |
|---|---|---|---|---|---|---|
| Surface structure of Al substrate | Symbol | | BF | CF | DF | EF |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.11 | 0.11 | 0.1 | 0.13 |
| | | Difference in average layer thickness between center and both ends in layer B (μm) | 0.21 | 0.21 | 0.21 | 0.21 |
| | | Difference in layer thickness of minute portion in layer B (μm) | 0.13 | 0.12 | 0.11 | 0.14 |
| | Difference in average layer thickness between center and both ends in second layer (μm) | | 3 | 3 | 3 | 3 |
| | Difference in layer thickness of minute portion in second layer (μm) | | 0.4 | 0.35 | 0.3 | 0.5 |

TABLE 29F

| Sample No. | 2901F | 2902F | 2903F | 2904F | 2905F | 2906F | 2907F | 2908F |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 30F

| Sample No. | 3001F | 3002F | 3003F | 3004F | 3005F | 3006F | 3007F | 3008F |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚: Very good
○: Good
Δ: Practically satisfactory
X: Image defect formed

TABLE 31F

| Sample No. | 3101F | 3102F | 3103F | 3104F | 3105F | 3106F | 3107F |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊚ | ⊚ | ○ | Δ | X |

⊚: Very good
○: Good
Δ: Practically satisfactory
X: Image defect formed

TABLE 1G

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | $B_2H_6/H_2$ (= 3000 vol ppm) | $GeH_4 + SiH_4 = 100$ | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 2G

| | Sample No. | 201G | 202G | 203G | 204G |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 1 | 1 | 1 | 1 |
| | Difference in layer thickness of minute portion in first layer (μm) | 0.2 | 0.15 | 0.1 | 0.25 |
| | Difference in average layer thickness between center and both ends in second layer (μm) | 3 | 3 | 3 | 3 |
| | Difference in layer thickness of minute portion in second layer (μm) | 0.51 | 0.44 | 0.41 | 0.61 |

TABLE 3G

| | Sample No. | 301G | 302G | 303G | 304G |
|---|---|---|---|---|---|
| Surface structure of Al substrate | Pitch (μm) | 55 | 45 | 20 | 15 |
| | Depth (μm) | 2.41 | 1.89 | 0.65 | 0.89 |
| | Angle (degree) | 5.0 | 4.8 | 3.7 | 6.8 |
| Thickness of light receiving layer | Difference in average layer thickness between center and both ends in first layer (μm) | 1 | 1 | 1 | 1 |
| | Difference in layer thickness of minute portion in first layer (μm) | 0.19 | 0.14 | 0.1 | 0.25 |
| | Difference in average layer thickness between center and both ends in second layer (μm) | 3.1 | 3.1 | 3.1 | 3.1 |
| | Difference in layer thickness of minute portion in second layer (μm) | 0.45 | 0.42 | 0.39 | 0.50 |

TABLE 4G

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 3 |
| | | $GeH_4$ | 100 → 0 | | | |
| | | $SiH_4$ | 0 → 100 | | | |
| | | $B_2H_6/H_2$ | 100 | | | |
| | | (= 3000 vol ppm) | $GeH_4 + SiH_4 = 100$ | | | |
| Second layer | Layer A | $H_2$ | 300 | 100 | 8 | 5 |
| | | $SiH_4$ | 100 | | | |
| | | $B_2H_6/H_2$ | 100 | | | |
| | | (= 3000 vol ppm) | | | | |
| | Layer B | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 5G

| | No. | 501G | 502G | 503G | 504G |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | <0.1 | <0.1 | <0.1 | <0.1 |
| | Second layer — Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.3 | 0.6 |

TABLE 6G

| | Sample No. | 601G | 602G | 603G | 604G |
|---|---|---|---|---|---|
| Surface structure of Al substrate | Pitch (μm) | 55 | 45 | 20 | 15 |
| | Depth (μm) | 2.41 | 1.89 | 0.65 | 0.89 |
| | Angle (degree) | 5.0 | 4.8 | 3.7 | 6.8 |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | <0.1 | <0.1 | <0.1 | <0.1 |
| | Second layer — Difference in average layer thickness between center and both ends in layer A (μm) | 1.49 | 1.49 | 1.49 | 1.49 |
| | Difference in layer thickness of minute portion in layer A (μm) | 0.2 | 0.12 | 0.1 | 0.3 |
| | Difference in average layer thickness between center and both ends in layer B (μm) | 2.9 | 2.9 | 2.9 | 2.9 |
| | Difference in layer thickness of minute portion in layer B (μm) | 0.51 | 0.44 | 0.41 | 0.61 |

TABLE 7G

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 10 | 3 |
| | $GeH_4$ | 100 → 0 | | | |
| | $SiH_4$ | 0 → 100 | | | |
| | $B_2H_6/H_2$ | 100 | | | |
| | (= 3000 vol ppm) | $GeH_4 + SiH_4 = 100$ | | | |
| Second layer | $H_2$ | 300 | 300 | 24 | 20 |
| | $SiH_4$ | 300 | | | |
| Surface | $SiH_4$ | 50 | 320 | 1.2 | 0.5 |

TABLE 7G-continued

| Layer constitution | Starting gas | Gas flow rate (SCCM) | Discharging power (W) | Deposition rate (Å/sec) | Layer thickness ($\mu$) |
|---|---|---|---|---|---|
| layer | CH$_4$ | 600 | | | |

TABLE 8G

| | Sample No. | 801G | 802G | 803G | 804G |
|---|---|---|---|---|---|
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer ($\mu$m) | 1 | 1 | 1 | 1 |
| | Difference in layer thickness of minute portion in first layer ($\mu$m) | 0.2 | 0.15 | 0.1 | 0.25 |
| | Difference in average layer thickness between center and both ends in second layer ($\mu$m) | 3 | 3 | 3 | 3 |
| | Difference in layer thickness of minute portion in second layer ($\mu$m) | 0.55 | 0.4 | 0.3 | 0.6 |

TABLE 9G

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | H$_2$ | 300 | 100 | 10 | 3 |
| | | GeH$_4$ | 50 → 0 | | | |
| | | SiH$_4$ | 50 → 100 | | | |
| | | B$_2$H$_6$/H$_2$ (= 3000 vol ppm) | 50 | | | |
| | | | GeH$_4$ + SiH$_4$ = 100 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |
| Surface layer | | SiH$_4$ | 30 | 300 | 1.1 | 0.533 |
| | | CH$_4$ | 600 | | | |

TABLE 10G

| | No. | | 1001G | 1002G | 1003G | 1004G |
|---|---|---|---|---|---|---|
| Surface structure of Al substrate | Pitch ($\mu$m) | | 50 | 40 | 25 | 10 |
| | Depth ($\mu$m) | | 2.1 | 1.7 | 0.8 | 0.6 |
| | Angle (degree) | | 5.0 | 4.8 | 3.7 | 6.8 |
| Thickness of light receiving layer | Difference in average layer thickness between center and both ends in first layer ($\mu$m) | | 0.12 | 0.12 | 0.12 | 0.12 |
| | Difference in layer thickness of minute portion in first layer ($\mu$m) | | <0.1 | <0.1 | <0.1 | <0.1 |
| | Second layer | Difference in average layer thickness between center and both ends in layer A ($\mu$m) | 1.5 | 1.5 | 1.5 | 1.5 |
| | | Difference in layer thickness of minute portion in layer A ($\mu$m) | 0.2 | 0.12 | 0.1 | 0.3 |
| | | Difference in average layer thickness between center and both ends in layer B ($\mu$m) | 3 | 3 | 3 | 3 |
| | | Difference in layer thickness of minute portion in layer B ($\mu$m) | 0.55 | 0.4 | 0.4 | 0.6 |

TABLE 11G

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | H$_2$ | 300 | 100 | 10 | 3 |
| | | GeH$_4$ | 50 → 0 | | | |
| | | SiH$_4$ | 50 → 100 | | | |
| | | | GeH$_4$ + SiH$_4$ = 100 | | | |
| Second layer | Layer A | H$_2$ | 300 | 100 | 8 | 5 |
| | | SiH$_4$ | 100 | | | |
| | | B$_2$H$_6$/H$_2$ | 100 | | | |

TABLE 11G-continued

| Layer constitution | | Starting gas | Gas flow rate (SCCM) | Discharging power (W) | Deposition rate (Å/sec) | Layer thickness ($\mu$) |
|---|---|---|---|---|---|---|
| | | (= 3000 vol ppm) | | | | |
| | Layer B | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 12G

| | No. | | 1201G | 1202G | 1203G | 1204G |
|---|---|---|---|---|---|---|
| Surface structure of Al substrate | Pitch ($\mu$m) | | 50 | 40 | 25 | 10 |
| | Depth ($\mu$m) | | 2.1 | 1.7 | 0.8 | 0.6 |
| | Angle (degree) | | 5.0 | 4.8 | 3.7 | 6.8 |
| Thickness of light receiving layer | Difference in average layer thickness between center and both ends in first layer ($\mu$m) | | 0.12 | 0.12 | 0.12 | 0.12 |
| | Difference in layer thickness of minute portion in first layer ($\mu$m) | | <0.1 | <0.1 | <0.1 | <0.1 |
| | Second layer | Difference in average layer thickness between center and both ends in layer A ($\mu$m) | 1.5 | 1.5 | 1.5 | 1.5 |
| | | Difference in layer thickness of minute portion in layer A ($\mu$m) | 0.2 | 0.12 | 0.1 | 0.3 |
| | | Difference in average layer thickness between center and both ends in layer B ($\mu$m) | 3 | 3 | 3 | 3 |
| | | Difference in layer thickness of minute portion in layer B ($\mu$m) | 0.55 | 0.4 | 0.39 | 0.6 |

TABLE 13G

| Layer constitution | | Starting gas | Gas flow rate (SCCM) | Discharging power (W) | Deposition rate (Å/sec) | Layer thickness ($\mu$) |
|---|---|---|---|---|---|---|
| First layer | Layer A | $H_2$ | 300 | 100 | 10 | 1.5 |
| | | $GeH_4$ | 100 → 50 | | | |
| | | $SiH_4$ | 0 → 50 | | | |
| | | $B_2H_6/H_2$ (= 3000 vol ppm) | 100 | | | |
| | Layer B | $H_2$ | 300 | 100 | 10 | 1.5 |
| | | $GeH_4$ | 50 → 0 | | | |
| | | $SiH_4$ | 50 → 100 | | | |
| Second layer | | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 14G

| | No. | | 1401G | 1402G | 1403G | 1404G |
|---|---|---|---|---|---|---|
| Surface structure of Al substrate | Pitch ($\mu$m) | | 50 | 40 | 25 | 10 |
| | Depth ($\mu$m) | | 2.1 | 1.7 | 0.8 | 0.6 |
| | Angle (degree) | | 5.0 | 4.8 | 3.7 | 6.8 |
| Thickness of light receiving layer | First layer | Difference in average layer thickness between center and both ends in layer A ($\mu$m) | 0.2 | 0.2 | 0.2 | 0.2 |
| | | Difference in layer thickness of minute portion in layer A ($\mu$m) | 0.1 | 0.1 | 0.1 | 0.12 |
| | | Difference in average layer thickness between center and both ends in layer B ($\mu$m) | 0.22 | 0.22 | 0.22 | 0.22 |
| | | Difference in layer thickness of minute portion in layer B ($\mu$m) | 0.11 | 0.1 | 0.1 | 0.13 |
| | Difference in average layer thickness between center and both ends in second layer ($\mu$m) | | 3 | 3 | 3 | 3 |
| | Difference in layer thickness of minute portion in second layer ($\mu$m) | | 0.55 | 0.4 | 0.39 | 0.6 |

TABLE 15G

| Sample No. | 1501G | 1502G | 1503G | 1504G | 1505G | 1506G | 1507G |
|---|---|---|---|---|---|---|---|
| Si:C Target | 9:1 | 6.5:3.5 | 4:6 | 2:8 | 1:9 | 0.5:9.5 | 0.2:9.8 |

TABLE 15G-continued

| Sample No. | 1501G | 1502G | 1503G | 1504G | 1505G | 1506G | 1507G |
|---|---|---|---|---|---|---|---|
| (Area ratio) Si:C (Content ratio) | 9.7:0.3 | 8.8:1.2 | 7.3:2.7 | 4.8:5.2 | 3:7 | 2:8 | 0.8:9.2 |
| Image quality evaluation | △ | ○ | ◎ | ◎ | ○ | △ | X |

◎: Very good
○: Good
△: Practically satisfactory
X: Image defect formed

TABLE 16G

| Sample No. | 1601G | 1602G | 1603G | 1604G | 1605G | 1606G | 1607G | 1608G |
|---|---|---|---|---|---|---|---|---|
| SiH₄:CH₄ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ○ | ◎ | ◎ | ◎ | ○ | △ | X |

◎: Very good
○: Good
△: Practically satisfactory
X: Image defect formed

TABLE 17G

| Sample No. | 1701G | 1702G | 1703G | 1704G | 1705G | 1706G | 1707G | 1708G |
|---|---|---|---|---|---|---|---|---|
| SiH₄:SiF₄:CH₄ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ○ | ◎ | ◎ | ◎ | ○ | △ | X |

◎: Very good
○: Good
△: Practically satisfactory
X: Image defect formed

TABLE 18G

| Sample No. | Thickness of surface layer (μ) | Results |
|---|---|---|
| 1801G | 0.001 | Image defect liable to be formed |
| 1802G | 0.02 | No image defect formed up to successive copying for 20,000 times |
| 1803G | 0.05 | Stable up to successive copying for 50,000 times |
| 1804G | 1 | Stable up to successive copying for 200,000 times |

TABLE 1 aH

| Cylinder symbol No. | | BH | CH | DH | EH |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |

TABLE 1 bH

| Cylinder symbol No. | | FH | GH | HH | IH |
|---|---|---|---|---|---|
| Surface structure of Al substrate | Pitch (μm) | 55 | 45 | 20 | 15 |
| | Depth (μm) | 2.41 | 1.89 | 0.65 | 0.89 |
| | Angle (degree) | 5.0 | 4.8 | 3.7 | 6.8 |

TABLE 1H

| Layer constitution | Starting gas | Gas flow rate (SCCM) | Discharging power (W) | Deposition rate (Å/sec) | Layer thickness (μ) |
|---|---|---|---|---|---|
| First layer | H₂ | 300 | 100 | 9 | 3 |
| | GeH₄ | 100 → 0 | | | |
| | SiH₄ | 0 → 100 | | | |
| | B₂H₆/H₂ (= 3000 vol ppm) | GeH₄ + SiH₄ = 100 | | | |
| | NO | 12 | | | |
| Second layer | H₂ | 300 | 300 | 24 | 20 |
| | SiH₄ | 300 | | | |
| Surface layer | SiH₄ | 20 | | 1 | 0.32 |
| | CH₄ | 600 | | | |

TABLE 2H

| Sample No. | | 201H | 202H | 203H | 204H |
|---|---|---|---|---|---|
| Surface structure of Al substrate | Symbol | BH | CH | DH | EH |
| Thickness of light receiving layer | Difference in average layer thickness between center and both ends in first layer ($\mu$m) | 1 | 1 | 1 | 1 |
| | Difference in layer thickness of minute portion in first layer ($\mu$m) | 0.2 | 0.15 | 0.1 | 0.25 |
| | Difference in average layer thickness between center and both ends in second layer ($\mu$m) | 3 | 3 | 3 | 3 |
| | Difference in layer thickness of minute portion in second layer ($\mu$m) | 0.51 | 0.44 | 0.41 | 0.61 |

TABLE 3H

| Sample No. | | 301H | 302H | 303H | 304H |
|---|---|---|---|---|---|
| Surface structure of Al substrate | Symbol | FH | GH | HH | IH |
| Thickness of light receiving layer | Difference in average layer thickness between center and both ends in first layer ($\mu$m) | 1 | 1 | 1 | 1 |
| | Difference in layer thickness of minute portion in first layer ($\mu$m) | 0.19 | 0.14 | 0.1 | 0.25 |
| | Difference in average layer thickness between center and both ends in second layer ($\mu$m) | 3.1 | 3.1 | 3.1 | 3.1 |
| | Difference in layer thickness of minute portion in second layer ($\mu$m) | 0.45 | 0.42 | 0.39 | 0.50 |

TABLE 4H

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | $H_2$ | 300 | 100 | 10 | 3 |
| | | $GeH_4$ | 50 → 0 | | | |
| | | $SiH_4$ | 50 → 100 | | | |
| | | $B_2H_6/H_2$ (= 3000 vol ppm) | 100 $GeH_4 + SiH_4 = 100$ | | | |
| | | $NH_3$ | 8 | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | | $NH_3$ | 8 | | | |
| | Layer B | $H_2$ | 300 | 300 | 24 | 20 |
| | | $SiH_4$ | 300 | | | |
| | | $NH_3$ | 8 | | | |
| Surface layer | | $SiH_4$ | 20 | | 1 | 0.32 |
| | | $CH_4$ | 600 | | | |

TABLE 5H

| Sample No. | | | 601H | 602H | 603H | 604H |
|---|---|---|---|---|---|---|
| Surface structure of Al substrate | Symbol | | BH | CH | DH | EH |
| Thickness of light receiving layer | Difference in average layer thickness between center and both ends in first layer ($\mu$m) | | 0.1 | 0.1 | 0.1 | 0.1 |
| | Difference in layer thickness of minute portion in first layer ($\mu$m) | | 0.04 | 0.03 | 0.02 | 0.05 |
| | Second layer | Difference in average layer thickness between center and both ends in layer A ($\mu$m) | 1.5 | 1.5 | 1.5 | 1.5 |
| | | Difference in layer thickness of minute portion in layer A ($\mu$m) | 0.2 | 0.12 | 0.1 | 0.3 |
| | | Difference in average layer thickness between center and both ends in layer B ($\mu$m) | 3 | 3 | 3 | 3 |
| | | Difference in layer thickness of | 0.55 | 0.4 | 0.3 | 0.6 |

TABLE 5H-continued

| Sample No. | 601H | 602H | 603H | 604H |
|---|---|---|---|---|
| minute portion in layer B (μm) | | | | |

TABLE 6H

| | Sample No. | 701H | 702H | 703H | 704H |
|---|---|---|---|---|---|
| Surface structure of Al substrate | Symbol | FH | GH | HH | IH |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | 0.04 | 0.03 | 0.02 | 0.05 |
| | Second layer — Difference in average layer thickness between center and both ends in layer A (μm) | 1.49 | 1.49 | 1.49 | 1.49 |
| | Difference in layer thickness of minute portion in layer A (μm) | 0.2 | 0.12 | 0.1 | 0.3 |
| | Difference in average layer thickness between center and both ends in layer B (μm) | 2.9 | 2.9 | 2.9 | 2.9 |
| | Difference in layer thickness of minute portion in layer B (μm) | 0.51 | 0.44 | 0.41 | 0.61 |

TABLE 7H

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 10 | 3 |
| | $GeH_4$ | 100 → 0 | | | |
| | $SiH_4$ | 0 → 100 | | | |
| | $B_2H_6/H_2$ (= 3000 vol ppm) | 100 $GeH_4 + SiH_4 = 100$ | | | |
| | $N_2O$ | 10 → 0 | | | |
| Second layer | $H_2$ | 300 | 300 | 24 | 20 |
| | $SiH_4$ | 300 | | | |
| Surface layer | $SiH_4$ | 20 | | 1 | 0.32 |
| | $CH_4$ | 600 | | | |

TABLE 8H

| | Sample No. | 1001H | 1002H | 1003H | 1004H |
|---|---|---|---|---|---|
| Surface structure of Al substrate | Symbol | BH | CH | DH | EH |
| Thickness of light receiving layer | Difference in average layer thickness between center and both ends in first layer (μm) | 1 | 1 | 1 | 1 |
| | Difference in layer thickness of minute portion in first layer (μm) | 0.2 | 0.15 | 0.1 | 0.25 |
| | Difference in average layer thickness between center and both ends in second layer (μm) | 3 | 3 | 3 | 3 |
| | Difference in layer thickness of minute portion in second layer (μm) | 0.55 | 0.4 | 0.3 | 0.6 |

TABLE 9H

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 3 |
| | | $GeH_4$ | 50 → 0 | | | |
| | | $SiH_4$ | 50 → 100 | | | |
| | | $B_2H_6/H_2$ (= 3000 vol ppm) | 50 $GeH_4 + SiH_4 = 100$ | | | |
| | | NO | 10 → * | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | | NO | * → ** | | | |
| | Layer | $H_2$ | 300 | 300 | 24 | 20 |

TABLE 9H-continued

| Layer constitution | Starting gas | Gas flow rate (SCCM) | Discharging power (W) | Deposition rate (Å/sec) | Layer thickness (μ) |
|---|---|---|---|---|---|
| B | $SiH_4$ | 300 | | | |
| | NO | ** → 0 | | | |
| Surface layer | $SiH_4$ | 20 | | 1 | 0.32 |
| | $CH_4$ | 600 | | | |

TABLE 10H

| | Sample No. | 1301H | 1302H | 1303H | 1304H |
|---|---|---|---|---|---|
| Surface structure of Al substrate | Symbol | BH | CH | DH | EH |
| Thickness of light receiving layer | Difference in average layer thickness between center and both ends in first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thicknbess between center and both ends in layer B (μm) | 3 | 3 | 3 | 3 |
| | Difference in layer thickness of minute portion in layer B (μm) | 0.55 | 0.4 | 0.4 | 0.6 |

TABLE 11H

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 3 |
| | | $GeH_4$ | 50 → 0 | | | |
| | | $SiH_4$ | 50 → 100 | | | |
| | | | $GeH_4 + SiH_4 = 100$ | | | |
| | | $NH_3$ | 10 → * | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | | $NH_3$ | * → ** | | | |
| | Layer B | $H_2$ | 300 | 300 | 24 | 20 |
| | | $SiH_4$ | 300 | | | |
| | | $NH_3$ | ** → 0 | | | |
| Surface layer | | $SiH_4$ | 20 | | 1 | 0.32 |
| | | $CH_4$ | 600 | | | |

TABLE 12H

| | Sample No. | 1401H | 1402H | 1403H | 1404H |
|---|---|---|---|---|---|
| Surface structure of Al substrate | Symbol | BH | CH | DH | EH |
| Thickness of light receiving layer | Difference in average layer thickness between center and both ends in first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Difference in average layer thickness between center and both both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.39 | 0.6 |

TABLE 13H

| Layer constitution | | Starting Gas | Gas flow rate (SCCM) | Discharging power (W) | Deposition rate (Å/sec) | Layer thickness ($\mu$) |
|---|---|---|---|---|---|---|
| First layer | Layer A | $H_2$ | 300 | 100 | 10 | 1.5 |
| | | $GeH_4$ | 100 → 0 | | | |
| | | $SiH_4$ | 0 → 100 | | | |
| | | $B_2H_6/H_2$ (= 3000 vol ppm) | 100 | | | |
| | | $N_2O$ | 10 → * | | | |
| | Layer B | $H_2$ | 300 | 100 | 10 | 1.5 |
| | | $GeH_4$ | 50 → 0 | | | |
| | | $SiH_4$ | 50 → 100 | | | |
| | | $N_2O$ | * → ** | | | |
| Second layer | | $H_2$ | 300 | 300 | 24 | 20 |
| | | $SiH_4$ | 300 | | | |
| | | $N_2O$ | ** → 0 | | | |
| Surface layer | | $SiH_4$ | 20 | | 1 | 0.32 |
| | | $CH_4$ | 600 | | | |

TABLE 14H

| Sample No. | | | 1501H | 1502H | 1503H | 1504H |
|---|---|---|---|---|---|---|
| Surface structure of Al substrate | Symbol | | BH | CH | DH | EH |
| Thickness of light receiving layer | First layer | Difference in average layer thickness between center and both ends in layer A ($\mu$m) | 0.2 | 0.2 | 0.2 | 0.2 |
| | | Difference in layer thickness of minute portion in layer A ($\mu$m) | 0.1 | 0.1 | 0.1 | 0.12 |
| | | Difference in average layer thickness between center and both ends in layer B ($\mu$m) | 0.22 | 0.22 | 0.22 | 0.22 |
| | | Difference in layer thickness of minute portion in layer B ($\mu$m) | 0.11 | 0.1 | 0.1 | 0.13 |
| | Difference in average layer thickness between center and both ends in second layer ($\mu$m) | | 3 | 3 | 3 | 3 |
| | Difference in layer thickness of minute portion in second layer ($\mu$m) | | 0.55 | 0.4 | 0.39 | 0.6 |

TABLE 15H

| Sample No. | 2701H | 2702H | 2703H | 2704H | 2705H | 2706H | 2707H | 2708H |
|---|---|---|---|---|---|---|---|---|
| $SiH_4$:$CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ◯ | ◎ | ◎ | ◎ | ◯ | Δ | X |

◎: Very good
◯: Good
Δ: Practically satisfactory
X: Image defect formed

TABLE 16H

| Sample No. | 2801H | 2802H | 2803H | 2804H | 2805H | 2806H | 2807H | 2808H |
|---|---|---|---|---|---|---|---|---|
| $SiH_4$:$SiF_4$:$CH_4$ (Flow rate ratio) | 5:4:1 | 3:3.5:3.5 | 1:1:6 | 1:1:20 | 1:0.4:30 | 1:1:100 | 1:0.5:50 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ◯ | ◎ | ◎ | ◎ | ◯ | Δ | X |

◎: Very good
◯: Good
Δ: Practically satisfactory
X: Image defect formed

TABLE 17H

| Sample No. | 2901H | 2902H | 2903H | 2904H | 2905H | 2906H | 2907H |
|---|---|---|---|---|---|---|---|
| Si:C Target | 9:1 | 6.5:3.5 | 4:6 | 2:8 | 1:9 | 0.5:9.5 | 0.2:9.8 |

TABLE 17H-continued

| Sample No. | 2901H | 2902H | 2903H | 2904H | 2905H | 2906H | 2907H |
|---|---|---|---|---|---|---|---|
| (Area ratio) Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◉ | ◎ | ○ | Δ | X |

◉: Very good
○: Good
Δ: Practically satisfactory
X: Image defect formed

TABLE 1I

| No. | 101I | 102I | 103I | 104I |
|---|---|---|---|---|
| Pitch (μm) | 50 | 40 | 25 | 10 |
| Depth (μm) | 2.1 | 1.7 | 0.8 | 0.6 |

TABLE 1I-continued

| No. | 101I | 102I | 103I | 104I |
|---|---|---|---|---|
| Angle (degree) | 5.0 | 4.8 | 3.7 | 6.8 |

TABLE 2I

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 10 | 1 |
| | $GeH_4$ | 100 | | | |
| | $SiH_4$ | 100 | | | |
| | $B_2H_6/H_2$ (= 3000 vol ppm) | $B_2H_6/(GeH_4 + SiH_4) = 3/100 \to 0$ | | | |
| Second layer | $H_2$ | 300 | 300 | 24 | 20 |
| | $SiH_4$ | 300 | | | |
| Surface layer | $SiH_4$ | 20 | 350 | 2 | 0.536 |
| | $CH_4$ | 600 | | | |

TABLE 3I

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 14 | 3 |
| | $SiH_4$ | 50 | | | |
| | $GeH_4$ | 100 | | | |
| | $B_2H_6/H_2$ (= 3000 vol ppm) | $B_2H_6/(GeH_4 + SiH_4) = 5/100 \to 0$ | | | |
| Second layer | $H_2$ | 300 | 300 | 24 | 20 |
| | $SiH_4$ | 300 | | | |
| Surface layer | $SiH_4$ | 20 | 310 | 1.5 | 0.536 |
| | $CH_4$ | 600 | | | |

TABLE 4I

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 12 | 5 |
| | $SiH_4$ | 100 | | | |
| | $GeH_4$ | 50 | | | |
| | $B_2H_6/H_2$ (= 3000 vol ppm) | $B_2H_6/(GeH_4 + SiH_4) = 1/100 \to 0$ | | | |
| Second layer | $H_2$ | 300 | 300 | 24 | 20 |
| | $SiH_4$ | 300 | | | |
| Surface layer | $SiH_4$ | 50 | 300 | 1.2 | 0.5 |
| | $CH_4$ | 500 | | | |

TABLE 5I

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 8 | 7 |
| | $SiH_4$ | 135 | | | |
| | $GeH_4$ | 15 | | | |
| | $B_2H_6/H_2$ | $B_2H_6/(GeH_4 +$ | | | |

TABLE 5I-continued

| Layer constitution | Starting gas | Gas flow rate (SCCM) | Discharging power (W) | Deposition rate (Å/sec) | Layer thickness ($\mu$) |
|---|---|---|---|---|---|
| | (= 3000 vol ppm) | $SiH_4$ = 1/100 → 0 | | | |
| Second layer | $H_2$ | 300 | 300 | 24 | 20 |
| | $SiH_4$ | 300 | | | |
| Surface layer | $SiH_4$ | 20 | 300 | 1 | 1 |
| | $CH_4$ | 600 | | | |

TABLE 6I

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ | 150 → 110 | | | |
| | | (= 3000 vol ppm) | | | | |
| Second layer | Layer A | $H_2$ | 300 | 100 | 10 | 3 |
| | | $SiH_4$ | 100 | | | |
| | | $B_2H_6/H_2$ | 110 → 0 | | | |
| | | (= 3000 vol ppm) | | | | |
| | Layer B | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 7I

| | No. | 701I | 702I | 703I | 704I |
|---|---|---|---|---|---|
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Difference in average layer between center and both ends in first layer ($\mu$m) | 0.2 | 0.2 | 0.2 | 0.2 |
| | Difference in layer thickness of minute portion in first layer ($\mu$m) | 0.12 | 0.11 | 0.1 | 0.14 |
| | Second layer — Difference in average layer thickness between center and both ends in layer A ($\mu$m) | 0.4 | 0.4 | 0.4 | 0.4 |
| | Difference in layer thickness of minute portion in layer A ($\mu$m) | 0.17 | 0.15 | 0.13 | 0.18 |
| | Difference in average layer thickness between center and both ends in layer B ($\mu$m) | 3.2 | 3.2 | 3.2 | 3.2 |
| | Difference in layer thickness of minute portion in layer B ($\mu$m) | 0.6 | 0.55 | 0.5 | 0.7 |

TABLE 8I

| Layer constitution | | Starting gas | Gas flow rate (SCCM) | Discharging power (W) | Deposition rate (Å/sec) | Layer thickness ($\mu$) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ | 100 → 0 | | | |
| | | (= 3000 vol ppm) | | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 9I

| | Sample No. | 901I | 902I | 903I | 904I |
|---|---|---|---|---|---|
| Surface structure | Pitch ($\mu$m) | 50 | 40 | 25 | 10 |
| | Depth ($\mu$m) | 2.1 | 1.7 | 0.8 | 0.6 |

TABLE 9I-continued

| | Sample No. | | 901I | 902I | 903I | 904I |
|---|---|---|---|---|---|---|
| of Al substrate | Angle (degree) | | 5.0 | 4.8 | 3.7 | 6.8 |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.13 | 0.11 | 0.1 | 0.15 |
| | | Difference in average layer thickness between center and both ends in layer B (μm) | 0.2 | 0.2 | 0.2 | 0.2 |
| | | Difference in layer thickness of minute portion in layer B (μm) | 0.13 | 0.12 | 0.11 | 0.14 |
| | Difference in average layer thickness between center and both ends in second layer (μm) | | 3 | 3 | 3 | 3 |
| | Difference in layer thickness of minute portion in second layer (μm) | | 0.5 | 0.4 | 0.4 | 0.6 |

TABLE 10I

| Layer constitution | | Starting gas | Gas flow rate (SCCM) | Discharging power (W) | Deposition rate (Å/sec) | Layer thickness (μ) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 50 → 0 | | | |
| Second layer | | $H_2$ | 300 | 300 | 24 | 20 |
| | | $SiH_4$ | 300 | | | |
| Surface layer | | $SiH_4$ | 100 | 300 | 5 | 0.7 |
| | | $CH_4$ | 2000 | | | |

TABLE 11I

| | No. | | 1101I | 1102I | 1103I | 1104I |
|---|---|---|---|---|---|---|
| Surface structure of Al substrate | Pitch (μm) | | 50 | 40 | 25 | 10 |
| | Depth (μm) | | 2.1 | 1.7 | 0.8 | 0.6 |
| | Angle (degree) | | 5.0 | 4.8 | 3.7 | 6.8 |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.11 | 0.11 | 0.1 | 0.13 |
| | | Difference in average layer thickness between center and both ends in layer B (μm) | 0.21 | 0.21 | 0.21 | 0.21 |
| | | Difference in layer thickness of minute portion in layer B (μm) | 0.13 | 0.12 | 0.11 | 0.14 |
| | Difference in average layer thickness between center and both ends in second layer (μm) | | 3 | 3 | 3 | 3 |
| | Difference in layer thickness of minute portion in second layer (μm) | | 0.4 | 0.35 | 0.3 | 0.5 |

TABLE 12I

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 50 → 25 | | | |
| Second layer | Layer A | $H_2$ | 300 | 100 | 8 | 3 |
| | | $GeH_4$ | 50 | | | |
| | | $SiH_4$ | 50 | | | |
| | | $B_2H_6/H_2$ (= 3000 vol ppm) | 25 → 0 | | | |
| | Layer B | $H_2$ | 300 | 300 | 24 | 20 |
| | | $SiH_4$ | 300 | | | |

TABLE 12I-continued

| Layer constitution | Starting gas | Gas flow rate (SCCM) | Discharging power (W) | Deposition rate (Å/sec) | Layer thickness (μ) |
|---|---|---|---|---|---|
| Surface layer | SiH₄ | 20 | 300 | 1 | 0.5 |
| | CH₄ | 600 | | | |

TABLE 13I

| | No. | 1301I | 1302I | 1303I | 1304I |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.12 | 0.11 | 0.1 | 0.14 |
| | Second layer — Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 14I

| Sample No. | 1401I | 1402I | 1403I | 1404I | 1405I | 1406I | 1407I |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | △ | ○ | ◎ | ◎ | ○ | △ | X |

◎: Very good
○: Good
△: Practically satisfactory
X: Image defect formed

TABLE 15I

| Sample No. | 1501I | 1502I | 1503I | 1504I | 1505I | 1506I | 1507I | 1508I |
|---|---|---|---|---|---|---|---|---|
| SiH₄:CH₄ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ○ | ◎ | ◎ | ◎ | ○ | △ | X |

◎: Very good
○: Good
△: Practically satisfactory
X: Image defect formed

TABLE 16I

| Sample No. | 1601I | 1602I | 1603I | 1604I | 1605I | 1606I | 1607I | 1608I |
|---|---|---|---|---|---|---|---|---|
| SiH₄:SiF₄:CH₄ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ◎ | ◎ | ◎ | ◎ | ○ | △ | X |

◎: Very good
○: Good
△: Practically satisfactory
X: Image defect formed

TABLE 17I

| Sample No. | Thickness of surface layer (μ) | Results |
|---|---|---|
| 1701I | 0.001 | Image defect liable to be formed |
| 1702I | 0.02 | No image defect formed up to successive copying for 20,000 times |
| 1703I | 0.05 | Stable up to successive copying for 50,000 times |
| 1704I | 1 | Stable up to successive copying for 200,000 times |

TABLE 1J

| Sample No. | | BJ | CJ | DJ | EJ |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |

TABLE 2J

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 10 | 1 |
| | $GeH_4$ | 100 | | | |
| | $SiH_4$ | 100 | | | |
| | $B_2H_6/H_2$ (= 3000 vol ppm) | $B_2H_6/(GeH_4 + SiH_4) = 3/100 \to 0$ | | | |
| | NO | 12 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 3J

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 14 | 3 |
| | $GeH_4$ | 100 | | | |
| | $SiH_4$ | 50 | | | |
| | $B_2H_6/H_2$ (= 3000 vol ppm) | $B_2H_6/(GeH_4 + SiH_4) = 5/100 \to 0$ | | | |
| | $NH_3$ | 10 | | | |
| Second layer | $H_2$ | 300 | 300 | 24 | 20 |
| | $SiH_4$ | 300 | | | |
| | $NH_3$ | 10 | | | |
| Surface layer | $SiH_4$ | 20 | 300 | 1 | 0.32 |
| | $CH_4$ | 600 | | | |

TABLE 4J

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 12 | 5 |
| | $GeH_4$ | 50 | | | |
| | $SiH_4$ | 100 | | | |
| | $B_2H_6/H_2$ (= 3000 vol ppm) | $B_2H_6/(GeH_4 + SiH_4) = 1/100 \to 0$ | | | |
| | $N_2O$ | 15 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 5J

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 8 | 7 |
| | $GeH_4$ | 15 | | | |
| | $SiH_4$ | 135 | | | |
| | $B_2H_6/H_2$ (= 3000 vol ppm) | $B_2H_6/(GeH_4 + SiH_4) = 1/100 \to 0$ | | | |

TABLE 5J-continued

| Layer constitution | Starting gas | Gas flow rate (SCCM) | Discharging power (W) | Deposition rate (Å/sec) | Layer thickness (μ) |
|---|---|---|---|---|---|
| | NO | 15 | | | |
| Second layer | H₂ | 300 | 300 | 24 | 20 |
| | SiH₄ | 300 | | | |
| | NO | 15 | | | |
| Surface layer | SiH₄ | 20 | 300 | 1 | 0.32 |
| | CH₄ | 600 | | | |

TABLE 6J

| Layer constitution | | Starting gas | Gas flow rate (SCCM) | Discharging power (W) | Deposition rate (Å/sec) | Layer thickness (μ) |
|---|---|---|---|---|---|---|
| First layer | | H₂ | 300 | 100 | 10 | 2 |
| | | GeH₄ | 50 | | | |
| | | SiH₄ | 50 | | | |
| | | B₂H₆/H₂ | 100 → 110 | | | |
| | | (= 3000 vol ppm) | 10 → 0 | | | |
| | | NH₃ | | | | |
| Second layer | Layer A | H₂ | 300 | 100 | 10 | 3 |
| | | SiH₄ | 100 | | | |
| | | B₂H₆/H₂ | 110 → 0 | | | |
| | | (= 3000 vol ppm) | | | | |
| | Layer B | H₂ | 300 | 300 | 24 | 20 |
| | | SiH₄ | 300 | | | |
| Surface layer | | SiH₄ | 20 | 300 | 1 | 0.32 |
| | | CH₄ | 600 | | | |

TABLE 7J

| | Sample No. | 701J | 702J | 703J | 704J |
|---|---|---|---|---|---|
| Surface structure of Al substrate | Symbol | BJ | CJ | DJ | EJ |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.12 | 0.11 | 0.1 | 0.14 |
| | Second layer — Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 8J

| Layer constitution | | Starting gas | Gas flow rate (SCCM) | Discharging power (W) | Deposition rate (Å/sec) | Layer thickness (μ) |
|---|---|---|---|---|---|---|
| First layer | Layer A | H₂ | 300 | 100 | 10 | 2 |
| | | GeH₄ | 50 | | | |
| | | SiH₄ | 50 | | | |
| | | B₂H₆/H₂ | 100 | | | |
| | | (= 3000 vol ppm) | 10 → 0 | | | |
| | | N₂O | | | | |
| | Layer B | H₂ | 300 | 100 | 10 | 2 |
| | | GeH₄ | 50 | | | |
| | | SiH₄ | 50 | | | |
| Second layer | | H₂ | 300 | 300 | 24 | 20 |
| | | SiH₄ | 300 | | | |
| Surface layer | | SiH₄ | 20 | 300 | 1 | 0.32 |
| | | CH₄ | 600 | | | |

TABLE 9J

| Sample No. | | | 1001J | 1002J | 1003J | 1004J |
|---|---|---|---|---|---|---|
| Surface structure of Al substrate | Symbol | | BJ | CJ | DJ | EJ |
| Thickness of light receiving layer | First layer | Difference in average layer thickness between center and both ends in layer A ($\mu$m) | 0.2 | 0.2 | 0.2 | 0.2 |
| | | Difference in layer thickness of minute portion in layer A ($\mu$m) | 0.13 | 0.11 | 0.1 | 0.15 |
| | | Difference in average layer thickness between center and both ends in layer B ($\mu$m) | 0.2 | 0.2 | 0.2 | 0.2 |
| | | Difference in layer thickness of minute portion in layer B ($\mu$m) | 0.13 | 0.12 | 0.11 | 0.14 |
| | Difference in average layer thickness between center and both ends in second layer ($\mu$m) | | 3 | 3 | 3 | 3 |
| | Difference in layer thickness of minute portion in second layer ($\mu$m) | | 0.5 | 0.44 | 0.4 | 0.6 |

TABLE 10J

| Layer constitution | | Starting gas | Gas flow rate (SCCM) | Discharging power (W) | Deposition rate (Å/sec) | Layer thickness ($\mu$) |
|---|---|---|---|---|---|---|
| First layer | Layer A | $H_2$ | 300 | 100 | 10 | 2 |
| | | $SiH_4$ | 50 | | | |
| | | $GeH_4$ | 50 | | | |
| | | NO | 10 → * | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | NO | * → ** | | | |
| Second layer | | $H_2$ | 300 | 300 | 24 | 20 |
| | | $SiH_4$ | 300 | | | |
| | | NO | ** → 0 | | | |
| Surface layer | | $SiH_4$ | 20 | 300 | 1 | 0.32 |
| | | $CH_4$ | 600 | | | |

TABLE 11J

| Sample No. | | | 1301J | 1302J | 1303J | 1304J |
|---|---|---|---|---|---|---|
| Surface structure of Al substrate | Symbol | | BJ | CJ | DJ | EJ |
| Thickness of light receiving layer | First layer | Difference in average layer thickness between center and both ends in layer A ($\mu$m) | 0.2 | 0.2 | 0.2 | 0.2 |
| | | Difference in layer thickness of minute portion in layer A ($\mu$m) | 0.11 | 0.11 | 0.1 | 0.13 |
| | | Difference in average layer thickness between center and both ends in layer B ($\mu$m) | 0.21 | 0.21 | 0.21 | 0.21 |
| | | Difference in layer thickness of minute portion in layer B ($\mu$m) | 0.13 | 0.12 | 0.11 | 0.14 |
| | Difference in average layer thickness between center and both ends in second layer ($\mu$m) | | 3 | 3 | 3 | 3 |
| | Difference in layer thickness of minute portion in second layer ($\mu$m) | | 0.4 | 0.35 | 0.3 | 0.5 |

TABLE 12J

| Layer constitution | | Starting gas | Gas flow rate (SCCM) | Discharging power (W) | Deposition rate (Å/sec) | Layer thickness ($\mu$) |
|---|---|---|---|---|---|---|
| First layer | Layer A | $H_2$ | 300 | 100 | 10 | 2 |
| | | $SiH_4$ | 50 | | | |
| | | $GeH_4$ | 50 | | | |
| | | $B_2H_6/H_2$ (= 3000 vol ppm) | 100 → 110 | | | |
| | | $NH_3$ | 10 → * | | | |
| | Layer | $H_2$ | 300 | 100 | 8 | 3 |

TABLE 12J-continued

| Layer constitution | Starting gas | Gas flow rate (SCCM) | Discharging power (W) | Deposition rate (Å/sec) | Layer thickness (μ) |
|---|---|---|---|---|---|
| B | GeH$_4$ | 50 | | | |
| | SiH$_4$ | 50 | | | |
| | B$_2$H$_6$/H$_2$ (= 3000 vol ppm) | 100 | | | |
| | NH$_3$ | * → ** | | | |
| Second layer | H$_2$ | 300 | 300 | 24 | 20 |
| | SiH$_4$ | 300 | | | |
| | NH$_3$ | ** → 0 | | | |
| Surface layer | SiH$_4$ | 20 | 300 | 1 | 0.32 |
| | CH$_4$ | 600 | | | |

TABLE 13J

| | Sample No. | | 1601J | 1602J | 1603J | 1604J |
|---|---|---|---|---|---|---|
| Surface structure of Al substrate | Symbol | | BJ | CJ | DJ | EJ |
| Thickness of light receiving layer | Difference in average layer thickness between center and both ends in first layer (μm) | | 0.2 | 0.2 | 0.2 | 0.2 |
| | Difference in layer thickness of minute portion in first layer (μm) | | 0.12 | 0.11 | 0.1 | 0.14 |
| | Second layer | Difference in average layer thickness between center and both ends in layer A (μm) | 0.4 | 0.4 | 0.4 | 0.4 |
| | | Difference in layer thickness of minute portion in layer A (μm) | 0.17 | 0.15 | 0.12 | 0.18 |
| | | Difference in average layer thickness between center and both ends in layer B (μm) | 3.2 | 3.2 | 3.2 | 3.2 |
| | | Difference in layer thickness of minute portion in layer B (μm) | 0.6 | 0.55 | 0.5 | 0.7 |

TABLE 14J

| Sample No. | 2701J | 2702J | 2703J | 2704J | 2705J | 2706J | 2707J | 2708J |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 15J

| Sample No. | 2801J | 2802J | 2803J | 2804J | 2805J | 2806J | 2807J | 2808J |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 16J

| Sample No. | 2901J | 2902J | 2903J | 2904J | 2905J | 2906J | 2907J |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality | Δ | ○ | ◎ | ◎ | ○ | Δ | X |

TABLE 16J-continued

| Sample No. | 2901J | 2902J | 2903J | 2904J | 2905J | 2906J | 2907J |
|---|---|---|---|---|---|---|---|
| evaluation | | | | | | | |

⊚: Very good
○: Good
Δ: Practically satisfactory
X: Image defect formed

TABLE 1K

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | $B_2H_6/H_2$ (= 3000 vol ppm) | 150 → 0 | | | |
| Second layer | $H_2$ | 300 | 300 | 24 | 20 |
| | $SiH_4$ | 300 | | | |
| Surface layer | $SiH_4$ | 20 | 300 | 1 | 0.5 |
| | $CH_4$ | 600 | | | |

TABLE 2K

| | Sample No. | 201K | 202K | 203K | 204K |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) symbol | 0.51 | 0.44 | 0.41 | 0.61 |

TABLE 3K

| | Sample No. | 301K | 302K | 303K | 304K |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) symbol | 0.45 | 0.42 | 0.39 | 0.50 |

TABLE 5K

| | Sample No. | 501K | 502K | 503K | 504K |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) symbol | 0.42 | 0.40 | 0.38 | 0.48 |

TABLE 6K

| | Sample No. | 601K | 602K | 603K | 604K |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) symbol | 0.40 | 0.38 | 0.36 | 0.45 |

TABLE 4K

| Layer constitution | Starting gas | Gas flow rate (SCCM) | Discharging power (W) | Deposition rate (Å/Sec) | Layer thickness (μm) |
|---|---|---|---|---|---|
| First layer | $H_2$ | 300 | 100 | 9 | 3 |
| | $GeH_4$ | 50 → 0 | | | |
| | | 50 → 100 | | | |
| | $SiH_4$ | $GeH_4 + SiH_4$ | | | |
| | $B_2H_6/H_2$ | = 100 | | | |
| | (= 3000 vol ppm) | 50 → 0 | | | |
| Second layer | $H_2$ | 300 | 300 | 24 | 20 |
| | $SiH_4$ | 300 | | | |
| Surface layer | $SiH_4$ | 20 | 300 | 1 | 1 |
| | $CH_4$ | 600 | | | |

TABLE 7K

| Layer constitution | Starting gas | Gas flow rate (SCCM) | Discharging power (W) | Deposition rate (Å/Sec) | Layer thickness (μm) |
|---|---|---|---|---|---|
| First layer | $H_2$ | 300 | 100 | 10 | 2 |
| | $GeH_4$ | 50 → 0 | | | |
| | $SiH_4$ | 50 → 100 | | | |
| Second Layer | $H_2$ | 300 | 100 | 10 | 3 |

TABLE 7K-continued

| Layer constitution | | Starting gas | Gas flow rate (SCCM) | Discharging power (W) | Deposition rate (Å/Sec) | Layer thickness (μm) |
|---|---|---|---|---|---|---|
| layer | A | SiH$_4$ | 100 | | | |
| | | B$_2$H$_6$/H$_2$ | 100 → 0 | | | |
| | | (= 3000 vol ppm) | | | | |
| | Layer | H$_2$ | 300 | 300 | 24 | 20 |
| | B | SiH$_4$ | 300 | | | |
| Surface layer | | SiH$_4$ | 20 | 300 | 1 | 0.5 |
| | | CH$_4$ | 600 | | | |

TABLE 8K

| | Sample No. | 801K | 802K | 803K | 804K |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.13 | 0.11 | 0.1 | 0.2 |
| | Second layer — Difference in average layer thickness between center and both ends in layer A (μm) | 0.4 | 0.4 | 0.4 | 0.4 |
| | Difference in layer thickness of minute portion in layer A (μm) | 0.13 | 0.12 | 0.11 | 0.2 |
| | Difference in average layer thickness between center and both ends in layer B (μm) | 3 | 3 | 3 | 3 |
| | Difference in layer thickness of minute portion in layer B (μm) | 0.6 | 0.5 | 0.4 | 0.7 |

TABLE 9K

| Layer constitution | | Starting gas | Gas flow rate (SCCM) | Discharging power (W) | Deposition rate (Å/Sec) | Layer thickness (μm) |
|---|---|---|---|---|---|---|
| First layer | | H$_2$ | 300 | 100 | 10 | 2 |
| | | GeH$_4$ | 50 → 0 | | | |
| | | SiH$_4$ | 50 → 100 | | | |
| | | B$_2$H$_6$/H$_2$ | 100 | | | |
| | | (= 3000 vol ppm) | | | | |
| Second layer | Layer A | H$_2$ | 300 | 100 | 10 | 3 |
| | | SiH$_4$ | 100 | | | |
| | | B$_2$H$_6$/H$_2$ | 100 → 0 | | | |
| | | (= 3000 vol ppm) | | | | |
| | Layer B | H$_2$ | 300 | 300 | 24 | 20 |
| | | SiH$_4$ | 300 | | | |
| Surface layer | | SiH$_4$ | 20 | 300 | 1 | 0.5 |
| | | CH$_4$ | 600 | | | |

TABLE 10K

| | Sample No. | 1001K | 1002K | 1003K | 1004K |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.14 | 0.12 | 0.1 | 0.16 |
| | Second layer — Difference in average layer thickness between center and both ends | 0.3 | 0.3 | 0.3 | 0.3 |

TABLE 10K-continued

| Sample No. | 1001K | 1002K | 1003K | 1004K |
|---|---|---|---|---|
| in layer A (μm) | | | | |
| Difference in layer thickness of minute portion in layer A (μm) | 0.2 | 0.14 | 0.13 | 0.21 |
| Difference in average layer thickness between center and both ends in layer B (μm) | 3 | 3 | 3 | 3 |
| Difference in layer thickness of minute portion in layer B (μm) | 0.57 | 0.4 | 0.3 | 0.6 |

TABLE 11K

| Layer constitution | | Starting gas | Gas flow rate (SCCM) | Discharging power (W) | Deposition rate (Å/Sec) | Layer thickness (μm) |
|---|---|---|---|---|---|---|
| First layer | Layer A | $H_2$ | 300 | 100 | 10 | 2 |
| | | $GeH_4$ | 50 → 25 | | | |
| | | $SiH_4$ | 50 → 75 | | | |
| | | $B_2H_6/H_2$ (= 3000 vol ppm) | 100 → 0 | | | |
| | Layer B | $H_2$ | 300 | 100 | 10 | 2 |
| | | $GeH_4$ | 25 → 0 | | | |
| | | $SiH_4$ | 75 → 100 | | | |
| Second layer | | $H_2$ | 300 | 300 | 24 | 20 |
| | | $SiH_4$ | 300 | | | |
| Surface layer | | $SiH_4$ | 20 | 300 | 1 | 0.5 |
| | | $CH_4$ | 600 | | | |

TABLE 12K

| | | Sample No. | 1201K | 1202K | 1203K | 1204K |
|---|---|---|---|---|---|---|
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.1 | 0.1 | 0.1 | 0.12 |
| | | Difference in average layer thickness between center and both ends in layer B (μm) | 0.22 | 0.22 | 0.22 | 0.22 |
| | | Difference in layer thickness of minute portion in layer B (μm) | 0.11 | 0.1 | 0.1 | 0.13 |
| | Difference in average layer thickness between center and both ends in second layer (μm) | | 3 | 3 | 3 | 3 |
| | Difference in layer thickness of minute portion in second layer (μm) | | 0.55 | 0.4 | 0.39 | 0.6 |

TABLE 13K

| Sample No. | 1301K | 1302K | 1303K | 1304K | 1305K | 1306K | 1307K |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◎ | ◎ | ○ | Δ | X |

◎: Very good
○: Good
Δ: Practically satisfactory
X: Image defect formed

TABLE 14K

| Sample No. | 1401K | 1402K | 1403K | 1404K | 1405K | 1406K | 1407K | 1408K |
|---|---|---|---|---|---|---|---|---|
| $SiH_4:CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ◯ | ◎ | ◎ | ◎ | ◯ | Δ | X |

◎: Very good
◯: Good
Δ: Practically satisfactory
X: Image defect formed

TABLE 15K

| Sample No. | 1501K | 1502K | 1503K | 1504K | 1505K | 1506K | 1507K | 1508K |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ◯ | ◎ | ◎ | ◎ | ◯ | Δ | X |

◎: Very good
◯: Good
Δ: Practically satisfactory
X: Image defect formed

TABLE 16K

| Sample No. | Thickness of surface layer (μ) | Results |
|---|---|---|
| 1601K | 0.001 | Image defect liable to be formed |
| 1602K | 0.02 | No image defect formed up to successive copying for 20,000 times |
| 1603K | 0.05 | Stable up to successive copying for 50,000 times |
| 1604K | 1 | Stable up to successive copying for 200,000 times |

TABLE 1L

| Layer constitution | Starting gas | Gas flow rate (SCCM) | Discharging power (W) | Deposition rate (Å/Sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | $B_2H_6/H_2$ (= 3000 vol ppm) | 150 → 0 | | | |
| | NO | 12 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 1a L

| | Symbol | BL | CL | DL | EL |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |

TABLE 2L

| | Sample No. | 101L | 102L | 103L | 104L |
|---|---|---|---|---|---|
| Surface structure of Al substrate | Symbol | BL | CL | DL | EL |
| Thickness of light receiving layer | Difference in average layer thickness between center and both ends (μm) | 3.2 | 3.2 | 3.2 | 3.2 |
| | Difference in layer thickness of minute portion (μm) | 0.51 | 0.44 | 0.41 | 0.61 |

TABLE 3L

| | Sample No. | 201L | 202L | 203L | 204L |
|---|---|---|---|---|---|
| Surface structure of Al substrate | Symbol | BL | CL | DL | EL |
| Thickness of light receiving layer | Difference in average layer thickness between center and both ends (μm) | 3.2 | 3.2 | 3.2 | 3.2 |
| | Difference in layer thickness of minute portion (μm) | 0.45 | 0.42 | 0.39 | 0.50 |

TABLE 4L

| Layer constitution | Starting gas | Gas flow rate (SCCM) | Discharging power (W) | Deposition rate (Å/Sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4 + SiH_4 = 100$ | | | |
| | $B_2H_6/H_2$ | 50 → 0 | | | |

TABLE 4L-continued

| Layer constitution | Starting gas | Gas flow rate (SCCM) | Discharging power (W) | Deposition rate (Å/Sec) | Layer thickness (μm) |
|---|---|---|---|---|---|
| | (= 3000 vol ppm) | | | | |
| | NH$_3$ | 12 | | | |
| Second layer | H$_2$ | 300 | 300 | 24 | 20 |
| | SiH$_4$ | 300 | | | |
| | NH$_3$ | 12 | | | |
| Surface layer | SiH$_4$ | 20 | 300 | 1 | 0.32 |
| | CH$_4$ | 600 | | | |

TABLE 5L

| Sample No. | | 301L | 302L | 303L | 304L |
|---|---|---|---|---|---|
| Surface structure of Al substrate | Symbol | BL | CL | DL | EL |
| Thickness of light receiving layer | Difference in average layer thickness between center and both ends (μm) | 3.2 | 3.2 | 3.2 | 3.2 |
| | Difference in layer thickness of minute portion (μm) | 0.42 | 0.40 | 0.38 | 0.48 |

TABLE 6L

| Sample No. | | 401L | 402L | 403L | 404L |
|---|---|---|---|---|---|
| Surface structure of Al substrate | Symbol | BL | CL | DL | EL |
| Thickness of light receiving layer | Difference in average layer thickness between center and both ends (μm) | 3.2 | 3.2 | 3.2 | 3.2 |
| | Difference in layer thickness of minute portion (μm) | 0.40 | 0.38 | 0.36 | 0.45 |

TABLE 7L

| Layer constitution | | Starting gas | Gas flow rate (SCCM) | Discharging power (W) | Deposition rate (Å/Sec) | Layer thickness (μm) |
|---|---|---|---|---|---|---|
| First layer | | H$_2$ | 300 | 100 | 10 | 2 |
| | | GeH$_4$ | 50 → 0 | | | |
| | | SiH$_4$ | 50 → 100 | | | |
| | | N$_2$ | 15 | | | |
| Second layer | Layer A | H$_2$ | 300 | 100 | 10 | 3 |
| | | SiH$_4$ | 100 | | | |
| | | B$_2$H$_6$/H$_2$ (= 3000 vol ppm) | 100 → 0 | | | |
| | Layer B | H$_2$ | 300 | 300 | 24 | 20 |
| | | SiH$_4$ | 300 | | | |
| Surface layer | | SiH$_4$ | 20 | 300 | 1 | 0.32 |
| | | CH$_4$ | 600 | | | |

TABLE 8L

| Sample No. | | 501L | 502L | 503L | 504L |
|---|---|---|---|---|---|
| Surface structure of Al substrate | Symbol | BL | CL | DL | EL |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.13 | 0.11 | 0.1 | 0.2 |
| Second layer | Difference in average layer thickness between center and both ends in layer A (μm) | 0.4 | 0.4 | 0.4 | 0.4 |
| | Difference in layer thickness of minute portion in layer A (μm) | 0.13 | 0.12 | 0.11 | 0.2 |
| | Difference in average layer thickness between center and both ends in layer B (μm) | 3 | 3 | 3 | 3 |
| | Difference in layer thickness of minute portion in layer B (μm) | 0.6 | 0.5 | 0.4 | 0.7 |

TABLE 9L

| Layer constitution | | Starting gas | Gas flow rate (SCCM) | Discharging power (W) | Deposition rate (Å/Sec) | Layer thickness (μm) |
|---|---|---|---|---|---|---|
| First layer | | H$_2$ | 300 | 100 | 10 | 2 |
| | | GeH$_4$ | 50 → 0 | | | |
| | | SiH$_4$ | 50 → 100 | | | |
| | | B$_2$H$_6$/H$_2$ (= 3000 vol ppm) | 100 | | | |
| | | NO | 10 | | | |
| Second layer | Layer A | H$_2$ | 300 | 100 | 10 | 3 |
| | | SiH$_4$ | 100 | | | |
| | | B$_2$H$_6$/H$_2$ (= 3000 vol ppm) | 100 → 0 | | | |
| | | NO | 10 | | | |
| | Layer B | H$_2$ | 300 | 300 | 24 | 20 |
| | | SiH$_4$ | 300 | | | |
| | | NO | 10 | | | |
| Surface layer | | SiH$_4$ | 20 | 300 | 1 | 0.32 |
| | | CH$_4$ | 600 | | | |

TABLE 10L

| Sample No. | | 601L | 602L | 603L | 604L |
|---|---|---|---|---|---|
| Surface structure of Al substrate | Symbol | BL | CL | DL | EL |
| Thickness of light receiving layer | Difference in average layer thickness between center and both ends in first layer ($\mu$m) | 0.2 | 0.2 | 0.2 | 0.2 |
| | Difference in layer thickness of minute portion in first layer ($\mu$m) | 0.14 | 0.12 | 0.1 | 0.16 |
| | Second layer — Difference in average layer thickness between center and both ends in layer A ($\mu$m) | 0.3 | 0.3 | 0.3 | 0.3 |
| | Difference in layer thickness of minute portion in layer A ($\mu$m) | 0.2 | 0.14 | 0.13 | 0.21 |
| | Difference in average layer thickness between center and both ends in layer B ($\mu$m) | 3 | 3 | 3 | 3 |
| | Difference in layer thickness of minute portion in layer B ($\mu$m) | 0.57 | 0.4 | 0.3 | 0.6 |

TABLE 11L

| Layer constitution | | Starting gas | Gas flow rate (SCCM) | Discharging power (W) | Deposition rate (Å/Sec) | Layer thickness ($\mu$m) |
|---|---|---|---|---|---|---|
| First layer | Layer A | H$_2$ | 300 | 100 | 10 | 2 |
| | | GeH$_4$ | 50 → 25 | | | |
| | | SiH$_4$ | 50 → 75 | | | |
| | | B$_2$H$_6$/H$_2$ (= 3000 vol ppm) | 100 → 0 | | | |
| | | NH$_3$ | 10 | | | |
| | Layer B | H$_2$ | 300 | 100 | 10 | 2 |
| | | GeH$_4$ | 25 → 0 | | | |
| | | SiH$_4$ | 75 → 100 | | | |
| | | NH$_3$ | 10 | | | |
| Second layer | | H$_2$ | 300 | 300 | 24 | 20 |
| | | SiH$_4$ | 300 | | | |
| Surface layer | | SiH$_4$ | 20 | 300 | 1 | 0.32 |
| | | CH$_4$ | 600 | | | |

TABLE 12L

| Sample No. | | 701L | 702L | 703L | 704L |
|---|---|---|---|---|---|
| Surface structure of Al substrate | Symbol | BL | CL | DL | EL |
| Thickness of light receiving layer | First layer — Difference in average layer thickness between center and both ends in layer A ($\mu$m) | 0.2 | 0.2 | 0.2 | 0.2 |
| | Difference in layer thickness of minute portion in layer A ($\mu$m) | 0.1 | 0.1 | 0.1 | 0.12 |
| | Difference in average layer thickness between center and both ends in layer B ($\mu$m) | 0.22 | 0.22 | 0.22 | 0.22 |
| | Difference in layer thickness of minute portion in layer B ($\mu$m) | 0.11 | 0.1 | 0.1 | 0.13 |
| | Difference in average layer thickness between center and both ends in second layer ($\mu$m) | 3 | 3 | 3 | 3 |
| | Difference in layer thickness of minute portion in second layer ($\mu$m) | 0.55 | 0.4 | 0.39 | 0.6 |

TABLE 13L

| Layer constitution | | Starting gas | Gas flow rate (SCCM) | Discharging power (W) | Deposition rate (Å/Sec) | Layer thickness (μm) |
|---|---|---|---|---|---|---|
| First layer | | H₂ | 300 | 100 | 10 | 2 |
| | | GeH₄ | 50 → 0 | | | |
| | | SiH₄ | 50 → 100 | | | |
| | | B₂H₆/H₂ (= 3000 vol ppm) | 100 → 110 | | | |
| | | NH₃ | 10 → 0 | | | |
| Second layer | Layer A | H₂ | 300 | 100 | 10 | 3 |
| | | SiH₄ | 100 | | | |
| | | B₂H₆/H₂ (= 3000 vol ppm) | 110 → 0 | | | |
| | Layer B | H₂ | 300 | 300 | 24 | 20 |
| | | SiH₄ | 300 | | | |
| Surface layer | | SiH₄ | 20 | 300 | 1 | 0.32 |
| | | CH₄ | 600 | | | |

TABLE 14L

| | Sample No. | 1401L | 1402L | 1403L | 1404L |
|---|---|---|---|---|---|
| Surface structure of Al substrate | Symbol | BL | CL | DL | EL |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.12 | 0.11 | 0.1 | 0.14 |
| | Second layer — Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 15L

| Layer constitution | | Starting gas | Gas flow rate (SCCM) | Discharging power (W) | Deposition rate (Å/Sec) | Layer thickness (μm) |
|---|---|---|---|---|---|---|
| First layer | Layer A | H₂ | 300 | 100 | 10 | 2 |
| | | GeH₄ | 50 → * | | | |
| | | SiH₄ | 50 → ** | | | |
| | | B₂H₆/H₂ (= 3000 vol ppm) | 100 | | | |
| | | N₂ | 10 → 0 | | | |
| | Layer B | H₂ | 300 | 100 | 10 | 2 |
| | | GeH₄ | * → 0 | | | |
| | | SiH₄ | ** → 100 | | | |
| Second layer | | H₂ | 300 | 300 | 24 | 20 |
| | | SiH₄ | 300 | | | |
| Surface layer | | SiH₄ | 20 | 300 | 1 | 0.32 |
| | | CH₄ | 600 | | | |

TABLE 16L

| | | Sample No. | 1701L | 1702L | 1703L | 1704L |
|---|---|---|---|---|---|---|
| Surface structure of Al substrate | | Symbol | BL | CL | DL | EL |
| Thickness of light receiving layer | First layer | Difference in average layer thickness between center and both ends in layer A (μm) | 0.2 | 0.2 | 0.2 | 0.2 |
| | | Difference in layer thickness of minute | 0.13 | 0.11 | 0.1 | 0.15 |

TABLE 16L-continued

| Sample No. | | 1701L | 1702L | 1703L | 1704L |
|---|---|---|---|---|---|
| | portion in layer A (μm) | | | | |
| | Difference in average layer thickness between center and both ends in layer B (μm) | 0.2 | 0.2 | 0.2 | 0.2 |
| | Difference in layer thickness of minute portion in layer B (μm) | 0.13 | 0.12 | 0.11 | 0.14 |
| Difference in average layer thickness between center and both ends in second layer (μm) | | 3 | 3 | 3 | 3 |
| Difference in layer thickness of minute portion in second layer (μm) | | 0.5 | 0.44 | 0.4 | 0.6 |

TABLE 17L

| Layer constitution | | Starting gas | Gas flow rate (SCCM) | Discharging power (W) | Deposition rate (Å/Sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | NO | 10 → * | | | |
| | Layer B | $H_2$ | 300 | 100 | 10 | 2 |
| | | $GeH_4$ | 50 → 0 | | | |
| | | $SiH_4$ | 50 → 100 | | | |
| | | $B_2H_6/H_2$ (= 3000 vol ppm) | 100 | | | |
| | | NO | * → ** | | | |
| Second layer | | $H_2$ | 300 | 300 | 24 | 20 |
| | | $SiH_4$ | 300 | | | |
| | | NO | ** → 0 | | | |
| Surface layer | | $SiH_4$ | 20 | 300 | 1 | 0.32 |
| | | $CH_4$ | 600 | | | |

TABLE 18L

| | Sample No. | | 2001L | 2002L | 2003L | 2004L |
|---|---|---|---|---|---|---|
| Surface structure of Al substrate | Symbol | | BL | CL | DL | EL |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.11 | 0.11 | 0.1 | 0.13 |
| | | Difference in average layer thickness between center and both ends in layer B (μm) | 0.21 | 0.21 | 0.21 | 0.21 |
| | | Difference in layer thickness of minute portion in layer B (μm) | 0.13 | 0.12 | 0.11 | 0.14 |
| | Difference in average layer thickness between center and both ends in second layer (μm) | | 3 | 3 | 3 | 3 |
| | Difference in layer thickness of minute portion in second layer (μm) | | 0.4 | 0.35 | 0.3 | 0.5 |

TABLE 19L

| Layer constitution | Starting gas | Gas flow rate (SCCM) | Discharging power (W) | Deposition rate (Å/Sec) | Layer thickness (μm) |
|---|---|---|---|---|---|
| First layer | $H_2$ | 300 | 100 | 10 | 2 |
| | $GeH_4$ | 50 | | | |
| | $SiH_4$ | 50 | | | |
| | $B_2H_6/H_2$ | 100 | | | |

TABLE 19L-continued

| Layer constitution | | Starting gas | Gas flow rate (SCCM) | Discharging power (W) | Deposition rate (Å/Sec) | Layer thickness (μm) |
|---|---|---|---|---|---|---|
| Second layer | Layer A | NH$_3$ (= 3000 vol ppm) | 10 → * | 100 | 8 | 3 |
| | | H$_2$ | 300 | | | |
| | | GeH$_4$ | 50 → 0 | | | |
| | | SiH$_4$ | 50 → 100 | | | |
| | | B$_2$H$_6$/H$_2$ (= 3000 vol ppm) | 100 | | | |
| | Layer B | NH$_3$ | * → ** | 300 | 24 | 20 |
| | | H$_2$ | 300 | | | |
| | | SiH$_4$ | 300 | | | |
| | | NH$_3$ | ** → 0 | | | |
| Surface layer | | SiH$_4$ | 20 | 300 | 1 | 0.32 |
| | | CH$_4$ | 600 | | | |

TABLE 20L

| | Sample No. | 2301L | 2302L | 2303L | 2304L |
|---|---|---|---|---|---|
| Surface structure of Al substrate | Symbol | BL | CL | DL | EL |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.12 | 0.11 | 0.1 | 0.14 |
| Second layer | Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 21L

| Sample No. | 2701L | 2702L | 2703L | 2704L | 2705L | 2706L | 2707L | 2708L |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 22L

| Sample No. | 2801L | 2802L | 2803L | 2804L | 2805L | 2806L | 2807L | 2808L |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 23L

| Sample No. | 2901L | 2902L | 2903L | 2904L | 2905L | 2906L | 2907L |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | △ | ○ | ⊚ | ⊚ | ○ | △ | X |

⊚: Very good
○: Good
△: Practically satisfactory
X: Image defect formed

TABLE 1M

| Cylinder No. | 101M | 102M | 103M | 104M | 105M | 106M | 107M | 108M |
|---|---|---|---|---|---|---|---|---|
| Pitch ($\mu$m) | 600 | 200 | 100 | 50 | 40 | 25 | 10 | 5.0 |
| Depth ($\mu$m) | 1.0 | 10 | 1.8 | 2.1 | 1.7 | 0.8 | 0.2 | 2 |
| Angle (degree) | 0.2 | 5.7 | 2.1 | 5.0 | 4.8 | 3.7 | 2.3 | 38 |

TABLE 2M

| Sample No. | 111M | 112M | 113M | 114M | 115M | 116M | 117M | 118M |
|---|---|---|---|---|---|---|---|---|
| Cylinder No. | 101M | 102M | 103M | 104M | 105M | 106M | 107M | 108M |
| Difference in layer thickness ($\mu$m) | 0.05 | 0.07 | 0.15 | 0.17 | 0.4 | 0.3 | 0.1 | 3 |
| Interference fringe | X | X | ○ | ○ | ⊚ | ⊚ | △ | X |

X Practically unusable
△ Practically satisfactory
○ Practically very good
⊚ Practically excellent

TABLE 3M

| Sample No. | 121M | 122M | 123M | 124M | 125M | 126M | 127M | 128M |
|---|---|---|---|---|---|---|---|---|
| Cylinder No. | 101M | 102M | 103M | 104M | 105M | 106M | 107M | 108M |
| Difference in layer thickness of first layer ($\mu$m) | 0.04 | 0.04 | 0.04 | 0.18 | 0.3 | 0.2 | 0.7 | 2.5 |
| Difference in layer thickness of second layer ($\mu$m) | 0.05 | 0.05 | 0.09 | 0.02 | 0.4 | 0.3 | 0.8 | 3 |
| Interference fringe | X | X | ○ | ⊚ | ⊚ | ⊚ | △ | X |

TABLE 4M

| Cylinder No. | 201M | 202M | 203M | 204M | 205M | 206M | 207M |
|---|---|---|---|---|---|---|---|
| Pitch ($\mu$m) | 40 | 30 | 25 | 20 | 10 | 5 | 2 |
| Depth ($\mu$m) | 3.5 | 2.5 | 0.87 | 1 | 0.7 | 0.1 | 0.5 |
| Angle (degree) | 10 | 7.5 | 4 | 6 | 8 | 2.3 | 26 |

X Practically unusable
△ Practically satisfactory
○ Practically very good
⊚ Practically excellent

TABLE 5M

| Sample No. | 211M | 212M | 213M | 214M | 215M | 216M | 217M |
|---|---|---|---|---|---|---|---|
| Cylinder No. | 201M | 202M | 203M | 204M | 205M | 206M | 207M |
| Difference in layer thickness ($\mu$m) | 0.1 | 0.1 | 0.3 | 0.25 | 0.7 | 0.1 | 2.1 |
| Interference fringe | △ | ○ | ⊚ | ⊚ | ⊚ | △ | X |

TABLE 6M

| Sample No. | 221M | 222M | 223M | 224M | 225M | 226M | 227M |
|---|---|---|---|---|---|---|---|
| Cylinder No. | 201M | 202M | 203M | 204M | 205M | 206M | 207M |
| Difference in layer thickness ($\mu$m) | 0.05 | 0.1 | 0.1 | 0.3 | 0.5 | 0.05 | 2.05 |
| Interference fringe | X | Δ | ○ | ◎ | ◎ | X | X |

X Practically unusable
Δ Practically satisfactory
○ Practically very good
◎ Practically excellent

TABLE 7M

| Sample No. | 231M | 232M | 233M | 234M | 235M | 236M | 237M |
|---|---|---|---|---|---|---|---|
| Cylinder No. | 201M | 202M | 203M | 204M | 205M | 206M | 207M |
| Difference in layer thickness ($\mu$m) | 0.1 | 0.3 | 0.35 | 0.3 | 1.0 | 0.1 | 2.5 |
| Interference fringe | Δ | ◎ | ◎ | ◎ | ◎ | ○ | X |

X Practically unusable
Δ Practically satisfactory
○ Practically very good
◎ Practically excellent

TABLE 8M

| Sample No. | 701M | 702M | 703M | 704M | 705M | 706M | 707M |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◎ | ◎ | ○ | Δ | X |

◎: Very good
○: Good
Δ: Practically satisfactory
X: Image defect formed

TABLE 9M

| Sample No. | 801M | 802M | 803M | 804M | 805M | 806M | 807M | 808M |
|---|---|---|---|---|---|---|---|---|
| $SiH_4$:$CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evalution | Δ | ○ | ◎ | ◎ | ◎ | ○ | Δ | X |

◎: Very good
○: Good
Δ: Practically satisfactory
X: Image defect formed

TABLE 10M

| Sample No. | 901M | 902M | 903M | 904M | 905M | 906M | 907M | 908M |
|---|---|---|---|---|---|---|---|---|
| $SiH_4$:$SiF_4$:$CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 11M

| Sample No. | Thickness of surface layer ($\mu$) | Results |
|---|---|---|
| 1001M | 0.001 | Image defect liable to be formed |
| 1002M | 0.02 | No image defect formed up to successive copying for 20,000 times |
| 1003M | 0.05 | Stable up to successive copying for 50,000 times |
| 1004M | 1 | Stable up to successive |

TABLE 11M-continued

| Sample No. | Thickness of surface layer (μ) | Results |
|---|---|---|
| | | copying for 200,000 times |

TABLE 1N

| Cylinder No. | 101N | 102N | 103N | 104N | 105N | 106N | 107N | 108N |
|---|---|---|---|---|---|---|---|---|
| Pitch (μm) | 600 | 200 | 100 | 50 | 40 | 25 | 10 | 5.0 |
| Depth (μm) | 1.0 | 10 | 1.8 | 2.1 | 1.7 | 0.8 | 0.2 | 2 |
| Angle (degree) | 0.2 | 5.7 | 2.1 | 5.0 | 4.8 | 3.7 | 2.3 | 38 |

TABLE 2N

| Sample No. | 111N | 112N | 113N | 114N | 115N | 116N | 117N | 118N |
|---|---|---|---|---|---|---|---|---|
| Cylinder No. | 101N | 102N | 103N | 104N | 105N | 106N | 107N | 108N |
| Difference in layer thickness (μm) | <0.1 | <0.1 | 0.16 | 0.18 | 0.41 | 0.31 | 0.11 | 3.2 |
| Interference fringe and electrophotographic characterstics | X | X | ⊙ | ○ | ◎ | ◎ | Δ | X |

X Practically unusable
Δ Practically satisfactory
○ Practically very good
◎ Practically excellent

TABLE 3N

| Sample No. | 121N | 122N | 123N | 124N | 125N | 126N | 127N | 128N |
|---|---|---|---|---|---|---|---|---|
| Cylinder No. | 101N | 102N | 103N | 104N | 105N | 106N | 107N | 108N |
| Difference in layer thickness of first layer (μm) | <0.1 | <0.1 | 0.1 | 0.19 | 0.31 | 0.22 | 0.1 | 2.6 |
| Difference in layer thickness of second layer (μm) | <0.1 | <0.1 | 0.11 | 0.22 | 0.41 | 0.32 | 0.1 | 3.6 |
| Interference fringe and electrophotographic characteristics | X | X | ○ | ◎ | ◎ | ◎ | Δ | X |

X Practically unusable
Δ Practically satisfactory
○ Practically very good
◎ Practically excellent

TABLE 4N

| Layer | Starting gas | Flow rate (SCCM) | High frequency power (W) | Layer thickness (μm) |
|---|---|---|---|---|
| Charge injection preventive layer | $H_2$ | 300 | 160 | 3 |
| | $SiH_4$ | 150 | | |
| | $NH_3$ | 30 | | |
| | $B_2H_6$ | 0.24 | | |
| Photosensitive layer | $H_2$ | 300 | 300 | 20 |
| | $SiH_4$ | 300 | | |
| Surface layer | $SiH_4$ | 20 | 300 | 0.32 |
| | $CH_4$ | 600 | | |

TABLE 5N

| Sample No. | 401N | 402N | 403N | 404N | 405N | 406N | 407N | 408N |
|---|---|---|---|---|---|---|---|---|
| Cylinder No. | 101N | 102N | 103N | 104N | 105N | 106N | 107N | 108N |
| Difference in layer thickness (μm) | <0.1 | <0.1 | 0.17 | 0.20 | 0.42 | 0.33 | 0.11 | 2.8 |
| Interference fringe and electrophotographic characteristics | X | X | ○ | ◎ | ◎ | ◎ | Δ | X |

X Practically unusable
Δ Practically satisfactory
○ Practically very good
◎ Practically excellent

TABLE 6N

| Layer | Starting gas | Flow rate (SCCM) | High frequency power (W) | Layer thickness (μm) |
|---|---|---|---|---|
| Charge injection preventive layer | $H_2$ | 300 | 160 | 5 |
| | $SiH_4$ | 150 | | |
| | $NH_3$ | 15 | | |
| | $B_2H_6$ | 0.3 | | |
| Photosensitive layer | $H_2$ | 300 | 200 | 20 |
| | $SiH_4$ | 300 | | |
| Surface layer | $SiH_4$ | 50 | 300 | 0.5 |
| | $CH_4$ | 400 | | |

TABLE 7N

| Sample No. | 501N | 502N | 503N | 504N | 505N | 506N | 507N | 508N |
|---|---|---|---|---|---|---|---|---|
| Cylinder No. | 101N | 102N | 103N | 104N | 105N | 106N | 107N | 108N |
| Difference in layer thickness of first layer (μm) | <0.1 | <0.1 | 0.1 | 0.21 | 0.31 | 0.22 | 0.1 | 2.6 |
| Difference in layer thickness of second layer (μm) | <0.1 | <0.1 | 0.1 | 0.2 | 0.41 | 0.35 | 0.1 | 3.5 |
| Interference fringe and electrophotographic characteristics | X | X | ○ | ◎ | ◎ | ◎ | Δ | X |

X Practically unusable
Δ Practically satisfactory
○ Practically very good
◎ Practically excellent

TABLE 8N (Sample No. 1201N)

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$ NO | $SiH_4 = 50$ | $NO/SiH_4 = 3/10 \sim 0$ | 150 | 12 | 1 |
| Second layer | $SiH_4/He = 0.05$ | $SiH_4 = 50$ | $NO/SiH_4 = 3/10 \sim 0$ | 150 | 12 | 20 |
| Surface layer | $SiH_4/He = 0.05$ $C_2H_4$ | $SiH_4 = 50$ 500 | | 300 | 1.0 | 0.32 |

TABLE 9N (Sample No. 1202N)

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 4 \times 10^{-3}$ $NO/SiH_4 = 2/10 \sim 0$ | 150 | 12 | 0.5 |
| Second layer | $SiH_4/He = 0.05$ | $SiH_4 = 50$ | $NO/SiH_4 = 3/10 \sim 0$ | 150 | 12 | 20 |
| Surface layer | $SiH_4/He = 0.05$ $CH_4$ | $SiH_4 = 20$ 600 | | 300 | 1 | 0.5 |

TABLE 10N (Sample No. 1203N)

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 2 \times 10^{-4}$ $NO/SiH_4 = 1/10 \sim 1/100$ | 160 | 14 | 5 |
| Second layer | $SiH_4/He = 0.05$ | $SiH_4 = 50$ | $NO/SiH_4 = 1/100$ | 160 | 14 | 15 |
| Surface layer | $SiH_4/He = 0.05$ $CH_4$ | $SiH_4 = 20$ 600 | | 300 | 1 | 0.32 |

TABLE 11N (Sample No. 1204N)

| Layer constitution | Gases employed | Flow rate (SCCM) | Flow rate ratio | Discharging power (W) | Layer formation rate (Å/Sec) | Layer thickness ($\mu$) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 2 \times 10^{-4}$ $NO/SiH_4 = 3/10 \sim 0$ | 160 | 14 | 1.0 |
| Second layer | $SiH_4/He = 0.05$ $B_2H_6/He = 10^{-3}$ | $SiH_4 = 50$ | $B_2H_6/SiH_4 = 2 \times 10^{-4}$ | 160 | 12 | 15 |
| Surface layer | $SiH_4/He = 0.05$ $CH_4$ | $SiH_4 = 50$ 300 | | 300 | 1.5 | 0.7 |

TABLE 12N (Sample No. 1205N)

| Layer constitution | Gases employed | Flow rate (SCCM) | Flow rate ratio | Discharging power (W) | Layer formation rate (Å/Sec) | Layer thickness ($\mu$) |
|---|---|---|---|---|---|---|
| First layer | $SiH_4/He = 0.05$ $PH_3/He = 10^{-3}$ NO | $SiH_4 = 50$ | $PH_3/SiH_4 = 3 \times 10^{-4}$ $NO/SiH_4 = 3/10 \sim 0$ | 170 | 15 | 1 |
| Second layer | $SiH_4/He = 0.05$ | $SiH_4 = 50$ | | 170 | 15 | 20 |
| Surface layer | $SiH_4/He = 0.05$ $CH_4$ | $SiH_4 = 20$ 600 | | 300 | 1 | 0.32 |

TABLE 13N

| Sample No. | 701N | 702N | 703N | 704N | 705N | 706N | 707N |
|---|---|---|---|---|---|---|---|
| Si:C Target (Area ratio) | 9:1 | 8.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality | Δ | ○ | ◉ | ◉ | ○ | Δ | X |

TABLE 13N-continued

| Sample No. | 701N | 702N | 703N | 704N | 705N | 706N | 707N |
|---|---|---|---|---|---|---|---|
| evaluation | | | | | | | |

◎: Very good
○: Good
Δ: Practically satisfactory
X: Image defect formed

TABLE 14N

| Sample No. | 801N | 802N | 803N | 804N | 805N | 806N | 807N | 808N |
|---|---|---|---|---|---|---|---|---|
| SiH₄:CH₄ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 15N

| Sample No. | 901N | 902N | 903N | 904N | 905N | 906N | 907N | 908N |
|---|---|---|---|---|---|---|---|---|
| SiH₄:SiF₄:CH₄ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 16N

| Sample No. | Thickness of surface layer (μ) | Results |
|---|---|---|
| 1001N | 0.001 | Image defect liable to be formed |
| 1002N | 0.02 | No image defect formed up to successive copying for 20,000 times |
| 1003N | 0.05 | Stable up to successive copying for 50,000 times |
| 1004N | 1 | Stable up to successive copying for 200,000 times |

TABLE 1P

| Cylinder No. | 101P | 102P | 103P | 104P | 105P | 106P | 107P | 108P |
|---|---|---|---|---|---|---|---|---|
| Pitch (μm) | 600 | 200 | 100 | 50 | 40 | 25 | 10 | 5.0 |
| Depth (μm) | 1.0 | 10 | 1.8 | 2.1 | 1.7 | 0.8 | 0.2 | 2 |
| Angle (degree) | 0.2 | 5.7 | 2.1 | 5.0 | 4.8 | 3.7 | 2.3 | 38 |

TABLE 2P

| Sample No. | 111P | 112P | 113P | 114P | 115P | 116P | 117P | 118P |
|---|---|---|---|---|---|---|---|---|
| Cylinder No. | 101P | 102P | 103P | 104P | 105P | 106P | 107P | 108P |
| Difference in layer thickness (μm) | <0.1 | <0.1 | 0.16 | 0.18 | 0.41 | 0.31 | 0.11 | 3.2 |
| Interference fringe | X | X | ○ | ○ | ◎ | ◎ | Δ | X |

X Practically unusable
Δ Practically satisfactory
◎ Practically very good
○ Practically excellent

TABLE 3P

| Sample No. | 121P | 122P | 123P | 124P | 125P | 126P | 127P | 128P |
|---|---|---|---|---|---|---|---|---|
| Cylinder No. | 101P | 102P | 103P | 104P | 105P | 106P | 107P | 108P |
| Difference in layer thickness of first layer (μm) | <0.1 | <0.1 | 0.1 | 0.19 | 0.31 | 0.22 | 0.1 | 2.6 |
| Difference in layer thickness of second layer (μm) | <0.1 | <0.1 | 0.11 | 0.22 | 0.41 | 0.32 | 0.1 | 3.6 |
| Interference fringe | X | X | ○ | ◎ | ◎ | ◎ | Δ | X |

X Practically unusable
Δ Practically satisfactory
◎ Practically very good
○ Practically excellent

TABLE 4P

| Layer | Starting gas | Flow rate (SCCM) | High frequency power (W) | Layer thickness (μm) |
|---|---|---|---|---|
| Charge injection preventive layer | H₂<br>SiH₄<br>NH₃<br>B₂H₆ | 300<br>150<br>30<br>0.24 | 160 | 3 |
| Photosensitive layer | H₂<br>SiH₄ | 300<br>300 | 300 | 20 |
| Surface layer | SiH₄<br>CH₄ | 20<br>600 | 300 | 0.32 |

TABLE 5P

| Sample No. | 401P | 402P | 403P | 404P | 405P | 406P | 407P | 408P |
|---|---|---|---|---|---|---|---|---|
| Cylinder No. | 101P | 102P | 103P | 104P | 105P | 106P | 107P | 108P |
| Difference in layer | <0.1 | <0.1 | 0.17 | 0.20 | 0.42 | 0.33 | 0.11 | 2.8 |

TABLE 5P-continued

| Sample No. | 401P | 402P | 403P | 404P | 405P | 406P | 407P | 408P |
|---|---|---|---|---|---|---|---|---|
| Cylinder No. | 101P | 102P | 103P | 104P | 105P | 106P | 107P | 108P |
| thickness (μm) | | | | | | | | |
| Interference fringe | X | X | ○ | ◎ | ◎ | ◎ | Δ | X |

X Practically unusable
Δ Practically satisfactory
○ Practically very good
◎ Practically excellent

TABLE 6P

| Layer | gas | Starting Flow rate (SCCM) | High frequency power (W) | Layer thickness (μm) |
|---|---|---|---|---|
| Charge injection preventive layer | $H_2$<br>$SiH_4$<br>$NH_3$<br>$B_2H_6$ | 300<br>150<br>15<br>0.3 | 160 | 5 |
| Photosensitive layer | $H_2$<br>$SiH_4$ | 300<br>300 | 200 | 20 |
| Surface layer | $SiH_4$<br>$CH_4$ | 50<br>400 | 300 | 0.5 |

TABLE 7P

| Sample No. | 501P | 502P | 503P | 504P | 505P | 506P | 507P | 508P |
|---|---|---|---|---|---|---|---|---|
| Cylinder No. | 101P | 102P | 103P | 104P | 105P | 106P | 107P | 108P |
| Difference in layer thickness of first layer (μm) | <0.1 | <0.1 | 0.1 | 0.21 | 0.31 | 0.22 | 0.1 | 2.6 |
| Difference in layer thickness of second layer (μm) | <0.1 | <0.1 | 0.1 | 0.2 | 0.41 | 0.35 | 0.1 | 3.5 |
| Interference fringe | X | X | ○ | ◎ | ◎ | ◎ | Δ | X |

X Practically unusable
Δ Practically satisfactory
○ Practically very good
◎ Practically excellent

TABLE 8P

| Sample No. | 701P | 702P | 703P | 704P | 705P | 706P | 707P |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◎ | ◎ | ○ | Δ | X |

◎: Very good
○: Good
Δ: Practically satisfactory
X: Image defect formed

TABLE 9P

| Sample No. | 801P | 802P | 803P | 804P | 805P | 806P | 807P | 808P |
|---|---|---|---|---|---|---|---|---|
| $SiH_4:CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 10P

| Sample No. | 901P | 902P | 903P | 904P | 905P | 906P | 907P | 908P |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 11P

| Sample No. | Thickness of surface layer (μ) | Results |
|---|---|---|
| 1001P | 0.001 | Image defect liable to be formed |
| 1002P | 0.02 | No image defect formed up to successive copying for 20,000 times |
| 1003P | 0.05 | Stable up to successive copying for 50,000 times |
| 1004P | 1 | Stable up to successive copying for 200,000 times |

What is claimed is:
1. A light-receiving member comprising a substrate for light-receiving member and a light-receiving layer of a multi-layer structure having a first layer comprising an amorphous material containing silicon atoms and germanium atoms, a second layer comprising an amorphous material containing silicon atoms and exhibiting a photoconductivity, and a surface layer comprising an amorphous material containing silicon atoms and carbon atoms provided on the substrate successively from the substrate side, said light-receiving layer having at least one pair of non-parallel interfaces within a short range and said non-parallel interfaces being arranged in a large number in at least one direction within the plane perpendicular to the layer thickness direction.

2. An electrophotographic system comprising a light-receiving member comprising a substrate for light-receiving member and a light-receiving layer of a multi-layer structure having a first layer comprising an amorphous material containing silicon atoms and germanium atoms, a second layer comprising an amorphous material containing silicon atoms and exhibiting photoconductivity, and a surface layer comprising an amorphous material containing silicon atoms and carbon atoms provided on the substrate successively from the substrate side, said light-receiving layer having at least one pair of non-parallel interfaces within a short range and said non-parallel interfaces being arranged in a large number in at least one direction within the plane perpendicular to the layer thickness direction.

3. A light-receiving member comprising a substrate for light-receiving member and a light-receiving layer of a multi-layer structure having at least one photosensitive layer comprising an amorphous material containing silicon atoms, and a surface layer comprising an amorphous material containing silicon atoms and carbon atoms provided on the substrate successively from the substrate side, said light-receiving layer having at least one pair of non-parallel interfaces within a short range and said non-parallel interfaces being arranged in a large number in at least one direction within the plane perpendicular to the layer thickness direction.

4. An electrophotographic system comprising a light-receiving member comprising a substrate for light-receiving member and a light-receiving layer of a multi-layer structure having at least one photosensitive layer comprising an amorphous material containing silicon atoms, and a surface layer comprising an amorphous material containing silicon atoms and carbon atoms provided on the substrate successively from the substrate side, said light-receiving layer having at least one pair of non-parallel interfaces within a short range and said non-parallel interfaces being arranged in a large number in at least one direction within the plane perpendicular to the layer thickness direction.

5. The invention according to claim 1, 2, 3, or 4, wherein the non-parallel interfaces are arranged regularly.

6. The invention according to claim 1, 2, 3 or 4, wherein the non-parallel interfaces are arranged in cycles.

7. The invention according to claim 1, 2, 3 or 4, wherein the short range in 0.3 to 500 μ.

8. The invention according to claim 1, 2, 3, 4, wherein the non-parallel interfaces are formed on the basis of the uneveness arranged regularly provided on the surface of said substrate.

9. The invention according to claim 8, wherein the said uneveness is formed by reverse-V-shaped linear projections, 10. The invention according to claim 9, wherein the longitudinal section of said reverse-V-shaped linear projection is substanially an isosceles triangle.

11. The invention according to claim 9, wherein the longitudinal section of said reverse-V-shaped linear projection is substanially a right triangle.

12. The invention according to claim 9, wherein the longitudinal section of said reverse-V-shaped linear projection is substanially a scalene triangle.

13. The invention according to claim 1, 2, 3, or 4, wherein the substrate is cylindrical.

14. The invention according to claim 13, wherein the reverse-v-shaped linear projection has a spiral structure within the plane of said substrate.

15. The invention according to claim 14, wherein the spiral structure is a multiple spiral structure.

16. The invention according to claim 9, wherein the reverse-V-shaped linear projection is divided in its edge line direction.

17. The invention according to claim 13, wherein the edge line direction of the revese-V-shaped linear projection is along the center axis of the cylindrical substrate.

18. The invention according to claim 8, wherein the uneveness has slanted planes.

19. The invention according to claim 18, wherein the slanted plane are mirror finished.

20. The invention according to claim 8, wherein on the free surface of the light receiving layer is formed an unevenness arranged with the same pitch as the uneveness provided on the substrate surface.

21. The invention according to claim 1 or 2, wherein the distribution state of germanium atoms in the first layer is ununiform in the layer thickness direction.

22. The invention according to claim 21, the ununiform distribution state of germanium atoms is more enriched toward the substrate side.

23. The invention according to claim 1 or 2, wherein a substance for controlling conductivity is contained in the first layer.

24. The invention according to claim 23, wherein a substance for controlling conductivity is an atom belonging to the group III or the group V of the periodic table.

25. The invention according to claim 1 or 2, wherein a substance for controlling conductivity is contained in the second layer.

26. The invention according to claim 25, wherein the substance for controlling conductivity is an atom belonging to the group III or the group V of the periodic table.

27. The invention according to claim 1 or 2, wherein either of the first layer and the second layer has a layer region (PN) containing a substance for controlling conductivity.

28. The invention according to claim 27, wherein the distribution state of the substance for controlling conductivity in the layer region (PN) is ununiform in the layer thickness direction.

29. The invention according to claim 27, wherein the distribution state of the substance for controlling conductivity in the layer region (PN) is uniform in the layer thickness direction.

30. The invention according to claim 27, wherein the substance for controlling conductivity is an atom belonging to the group III or the group V of the periodic table.

31. The invention according to claim 27, wherein the layer region (PN) is provided in the first layer.

32. The invention according to claim 27, wherein the layer region (PN) is provided in the second layer.

33. The invention according to claim 27, wherein the layer region (PN) is provided at the end portion on the substrate side of the light-receiving layer.

34. The invention according to claim 27, wherein the layer region (PN) is provided over both the first layer and the second layer.

35. The invention according to claim 27, wherein the layer region (PN) occupies a layer region in the light-receiving layer.

36. The invention according to claim 35, wherein the content of the substrate for controlling conductivity in the layer region (PN) is 0.01 to $5 \times 10^4$ atomic ppm.

37. The invention according to claim 1, or 2, wherein at least one of hydrogen atoms halogen atoms are contained in the first layer.

38. The invention according to claim 1 or 2, wherein 0.01 to 40 atomic % of halogen atoms are contained in the first layer.

39. THe invention according to claim 1 or 2, wherein 0.01 to 40 atomic % of halogen atoms are contained in the first layer.

40. The invention according to claim 1 or 2, wherein 0.01 to 40 atomic % as a total of hydrogen atoms and halogen atoms are contained in the first layer.

41. The invention according to claim 1 or 2, wherein 1 to 40 atomic % of hydrogen atoms are contained in the second layer.

42. The invention according to claim 1 or 2, wherein 1 to 40 atomic % of halogen atoms are contained in the second layer.

43. The invention according to claim 1 or 2, wherein 1 to 40 atomic % as a total of hydrogen atoms and halogens atoms are contained in the second layer.

44. The invention according to claim 1 or 2, wherein at least one of hydrogen atoms and halogen atoms are contained in the second layer.

45. The invention according to claim 1, 2, 3 or 4, wherein the ight-receiving layer contains at least one kind of atoms selected from oxygen atoms and nitrogen atoms.

46. The invention according to claim 1, 2, 3 or 4, wherein the light-receiving layer has a layer region (ON) containing at least one kind of atoms selected from oxygen atoms and nitrogen atoms.

47. The invention according to claim 46, wherein the layer region (ON) is provided at the end portion on the substrate side of the light-receiving layer.

48. The invention according to claim 47, wherein the layer region (ON) conatains 0.001 to 50 atomic % of oxygen atoms.

49. The invention according to claim 47, wherein the layer region (ON) contains 0.001 to 50 atomic % of nitrogen atoms.

50. The invention according to claim 47, wherein oxygen atoms are contained in the layer region (ON) in ununiform distribution state in the layer thickness direction.

51. The invention according to claim 47, wherein oxygen atoms are contained in the layer region (ON) in uniform distribution state in the layer thickness direction.

52. The invention according to claim 47, wherein nitrogen atoms are contained in the layer region (ON) in ununiform distribution state in the layer thickness direction.

53. The invention according to claim 47, wherein nitrogen atoms are contained in the layer region (ON) in uniform distribution state in the layer thickness direction.

54. The invention according to claim 1, or 2, wherein the first layer has a layer thickness of 30 A to 50 u.

55. The invention according to claim 1 or 2, wherein the second layer has a layer thickness of 0.5 to 90 u.

56. The invention according to claim 1, 2, 3 or 4 wherein the light-receiving layer has a thickness of 1 to 100 u.

57. The invention according to claim 1 or 2, wherein the layer thickness $T_B$ of the first layer and the layer thickness T of the second layer satisfy the relationship of $TB/T \leq 1$.

58. The invention according to claim 1, 2, 3 or 4, wherein hydrogen atoms are contained in the surface layer.

59. The invention according to claim 1, 2, 3 or 4, wherein halogen atoms are contained in the surface layer.

60. The invention according to claim 1, 2, 3 or 4, wherein hydrogen atoms and halogen atoms are contained in the surface layer.

61. The invention according to claim 1, 2, 3 or 4, wherein the amorphous material containing silicon atoms and carbon atoms is selected from amorphorous materials shown by the following formulae:

(1)

(2)

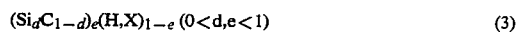
(3)

62. The invention according to claim 1, 2, 3 or 4, wherein the surface layer contains $1 \times 10^{-3}$ to 90 atomic % of carbon atoms.

63. The invention according to claim 1, 2, 3 or 4, wherein the surface layer has a layer thickness of 0.003 to 30u.

64. The invention according to claim 2 or 4, further comprising an exposure means.

65. The invention according to claim 64, wherein the exposure means includes a semiconductor laser.

66. The invention according to claim 3 or 4, wherein a charge injection preventive layer exists between the substrate and the photosensitive layer.

67. The invention according to claim 66, wherein the charge injection preventive layer comprises an amorphorous material containing silicon atoms.

68. The invention according to claim 67, wherein charge injection preventive layer contains a substance (C) for controlling conductivity.

69. The invention according to claim 68, wherein the content of the substance (C) for controlling conductivity is 0.001 to $5 \times 10^4$ atomic ppm.

70. The invention according to claim 68, wherein the substance (C) for controlling conductivity is a p-type impurity.

71. The invention according to claim 68, wherein the substance (C) for controlling conductivity is a n-type impurity.

72. The invention according to claim 67, wherein the charge injection preventive layer has a layer thickness of 30 A to 10u.

73. An electrophotgraphic image froming process comprising:
(a) applying a charging treatment to the light receiving member of claim 1 or 3;
(b) irraditing the light receiving member with a laser beam carrying information to form an electrostatic latent image; and
(c) developing said electrostatic latent image.

* * * * *

UNITED STATES PATENT AND TRADEMARK OFFICE
CERTIFICATE OF CORRECTION

PATENT NO. : 4,720,443            Page 1 of 4
DATED : January 19, 1988
INVENTOR(S) : KEISHI SAITOH, ET AL.

It is certified that error appears in the above-identified patent and that said Letters Patent is hereby corrected as shown below:

AT [30] IN FOREIGN APPLICATION PRIORITY DATA

Line 5, "Apr. 18, 1984    [JP]    Japan   ..... 59-77284"
           should read
           --Apr. 17, 1984    [JP]    Japan   ..... 59-77284--

AT [56] IN FOREIGN PATENT DOCUMENTS

"60031144    2/1985    Japan   ..... 430/69" should read
    --60-31144    2/1985    Japan   ..... 430/69--.

COLUMN 26

Lines 17-21, "(ON) are contained in the layer region (ON) to be formed while the distribution concentration of the atoms (ON) taking formed contacts the surface of said layer region (ON) to the position of $t_1$, the atoms (ON) is" should read --(ON) is formed contacts the surface of said layer region (ON) to the position $t_1$, the atoms (ON) are contained in the layer region (ON) to be formed while the distribution concentration of the atoms (ON) taking--.

COLUMN 231

Line 64, "uneveness" should read --unevenness--.
    Line 67, "uneveness" should read --unevenness--.

UNITED STATES PATENT AND TRADEMARK OFFICE
CERTIFICATE OF CORRECTION

PATENT NO. : 4,720,443

DATED : January 19, 1988

INVENTOR(S) : KEISHI SAITOH, ET AL.

It is certified that error appears in the above-identified patent and that said Letters Patent is hereby corrected as shown below:

COLUMN 232

Line 3, "substanially" should read --substantially--.
Line 6, "substanially" should read --substantially--.
Line 9, "substanially" should read --substantially--.
Line 13, "reverse-v-shaped" should read
        --reverse-V-shaped--.
Line 21, "revese-V-shaped" should read
        --reverse-V-shaped--.
Line 25, "uneveness" should read --unevenness--.
Line 27, "plane" should read --planes--.
Line 30, "uneve-" should read --uneven---.
Line 35, "the" should read --wherein the--.
Line 41, "a" should read --the--.

COLUMN 233

Line 15, "substrate" should read --substance--.
Line 18, "halogen" should read --and halogen--.
Line 21, "halogen" should read --hydrogen--.
Line 23, "THe" should read --The--.
Line 37, "halogens" should read --halogen--.
Line 42, "ight-receiving" should read --light-receiving--.
Line 54, "conatains" should read --contains--.

UNITED STATES PATENT AND TRADEMARK OFFICE
CERTIFICATE OF CORRECTION

PATENT NO. : 4,720,443                               Page 3 of 4

DATED      : January 19, 1988

INVENTOR(S) : KEISHI SAITOH, ET AL.

It is certified that error appears in the above-identified patent and that said Letters Patent is hereby corrected as shown below:

<u>COLUMN 234</u>

```
Line  8, "50 u." should read --50 µ.--.
Line 10, "90 u." should read --90 µ.--.
Line 11, "4" should read --4,--.
Line 12, "thickness" should read --layer thickness--.
Line 13, "100 u." should read --100 µ.--.
Line 17, "TB/T<1." should read --T_B/T<1.--.
Line 29, "amorphorous" should read --the amorphous--.
Line 42, "30 u." should read --30 µ.--.
Line 53, "phorous" should read --phous--.
Line 64, "a" should read --an--.
Line 68, "10 u." should read --10 µ.--.
```

UNITED STATES PATENT AND TRADEMARK OFFICE
CERTIFICATE OF CORRECTION

PATENT NO. : 4,720,443

DATED : January 19, 1988

INVENTOR(S) : KEISHI SAITOH, ET AL.

It is certified that error appears in the above-identified patent and that said Letters Patent is hereby corrected as shown below:

<u>COLUMN 235</u>

Line 1, "electrophotgraphic" should read
        --electrophotographic--.
    Line 1, "froming" should read --forming--.
    Line 5, "irraditing" should read --irradiating--.

Signed and Sealed this

Nineteenth Day of July, 1988

Attest:

DONALD J. QUIGG

*Attesting Officer*     *Commissioner of Patents and Trademarks*